US006984576B1

(12) United States Patent
Lin et al.

(10) Patent No.: US 6,984,576 B1
(45) Date of Patent: *Jan. 10, 2006

(54) METHOD OF CONNECTING AN ADDITIVELY AND SUBTRACTIVELY FORMED CONDUCTIVE TRACE AND AN INSULATIVE BASE TO A SEMICONDUCTOR CHIP

(75) Inventors: Charles W. C. Lin, Singapore (SG); Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 314 days.

This patent is subject to a terminal disclaimer.

(21) Appl. No.: 10/356,800

(22) Filed: Feb. 1, 2003

Related U.S. Application Data

(63) Continuation-in-part of application No. 09/972,796, filed on Oct. 6, 2001, now Pat. No. 6,667,229, which is a continuation-in-part of application No. 09/962,754, filed on Sep. 24, 2001, now Pat. No. 6,673,710, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835, said application No. 09/972,796 is a continuation-in-part of application No. 09/917,339, filed on Jul. 27, 2001, now Pat. No. 6,537,851, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835.

(51) Int. Cl.
*H01L 21/44* (2006.01)

(52) U.S. Cl. ............. 438/611; 438/612; 438/613; 438/617; 438/106; 438/107; 438/108; 438/118; 438/125

(58) Field of Classification Search .......... 438/611, 438/612, 613, 614, 615, 616, 617, 618, 620, 438/106, 107, 108, 118, 125
See application file for complete search history.

(56) References Cited

U.S. PATENT DOCUMENTS 4,442,967 A 4/1984 van de Pas et al. ........ 228/159

(Continued)

FOREIGN PATENT DOCUMENTS

EP  EP 0718 882 A1  6/1996

(Continued)

OTHER PUBLICATIONS

Markstein et al., "Controlling the Variables in Stencil Printing," Electronic Packaging & Production, Feb. 1997, pp. 48-56.

(Continued)

*Primary Examiner*—B. William Baumeister
*Assistant Examiner*—Renee R. Berry
(74) *Attorney, Agent, or Firm*—David M. Sigmond

(57) ABSTRACT

A method of connecting a conductive trace and an insulative base to a semiconductor chip includes providing a semiconductor chip, a metal base, an insulative base, a routing line and an interconnect, wherein the chip includes a conductive pad, the metal base is disposed on a side of the insulative base that faces away from the chip, the routing line is disposed on a side of the insulative base that faces towards the chip, and the interconnect extends through a via in the insulative base and electrically connects the metal base and the routing line, forming an opening that extends through the insulative base and exposes the pad, forming a connection joint that electrically connects the routing line and the pad, and etching the metal base such that an unetched portion of the metal base forms a pillar that overlaps and is aligned with the via and contacts the interconnect, wherein a conductive trace includes the routing line, the interconnect and the pillar. Preferably, the opening extends through an insulative adhesive that attaches the routing line to the chip.

300 Claims, 118 Drawing Sheets

U.S. PATENT DOCUMENTS

| | | | |
|---|---|---|---|
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/779 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |

FOREIGN PATENT DOCUMENTS

| WO | WO 97/38563 | 10/1997 |
|---|---|---|
| WO | WO 99/57762 | 11/1999 |

OTHER PUBLICATIONS

Elenius, "Choosing a Flip Chip Bumping Supplier - Technology an IC Package Contractor Should Look for," Advanced Packaging, Mar./Apr. 1998, pp. 70-73.

Erickson, "Wafer Bumping: The Missing Link for DCA," Electronic Packaging & Production, Jul. 1998, pp. 43-46.

Kuchenmeister et al., "Film Chip Interconnection Systems

Prepared By Wet Chemical Metallization," IEEE publication 0-7803-4526-6/98, Jun. 1998, 5 pages.

Ghaffarian, "Long Time BGA Assembly Reliability," Advancing Microelectronics, vol. 25, No. 6, Sep./Oct. 1998, pp. 20-23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips and Via-Fill".

U.S. Appl. No. 09/464,561, filed Dec. 16, 1999, entitled "Bumpless Flip Chip Assembly With Strips-In-Via And Plating".

U.S. Appl. No. 09/120,408, filed Jul. 22, 1998, entitled "Flip Chip Assembly With Via Interconnection".

U.S. Appl. No. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly with Simultaneously Electrolessly Plated Contact Terminal and Connection Joint".

U.S. Appl. No. 09/643,213, filed Aug. 22, 2000, entitled "Method Of Making A Support Circuit For A Semiconductor Chip Assembly".

U.S. Appl. No. 09/643,445, filed Aug. 22, 2000, entitled "Method Of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through-Hole For A Semiconductor Chip Assembly".

U.S. Appl. No. 09/677,207, filed Oct. 2, 2000, entitled "Method of Making A Semiconductor Chip Assembly With A Conductive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

METHOD OF CONNECTING AN ADDITIVELY AND SUBTRACTIVELY FORMED CONDUCTIVE TRACE AND AN INSULATIVE BASE TO A SEMICONDUCTOR CHIP

CROSS-REFERENCE TO RELATED APPLICATIONS

This application is a continuation-in-part of U.S. application Ser. No. 09/972,796 filed Oct. 6, 2001, U.S. Pat. No. 6,667,229, which is incorporated by reference.

The '796 application is a continuation-in-part of U.S. application Ser. No. 09/962,754 filed Sep. 24, 2001 U.S. Pat. No. 6,673,710 which is a continuation-in-part of U.S. application Ser. No. 09/878,626 filed Jun. 11, 2001, U.S. Pat. No. 6,653,217, which is a continuation-in-part of U.S. application Ser. No. 09/687,619 filed Oct. 13, 2000, U.S. Pat. No. 6,440,835, each of which is incorporated by reference.

The '796 application is also a continuation-in-part of U.S. application Ser. No. 09/917,339 filed Jul. 27, 2001 U.S. Pat. No. 6,537,851, which is a continuation-in-part of U.S. application Ser. No. 09/878,626 filed Jun. 11, 2001 U.S. Pat. No. 6,653,217, which is a continuation-in-part of U.S. application Ser. No. 09/687,619 filed Oct. 13, 2000 U.S. Pat. No. 6,440,835, each of which is incorporated by reference.

BACKGROUND OF THE INVENTION

1. Field of the Invention

The present invention relates to a semiconductor chip assembly, and more particularly to a method of connecting a conductive trace and an insulative base to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be compatible with common tooling and handling techniques.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Furthermore, photoresist residue on the underlying metal might cause the pillar to have poor quality or even prevent the pillar from being formed. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, and provides excellent mechanical and electrical performance.

SUMMARY OF THE INVENTION

An object of the present invention is to provide a semiconductor chip assembly with a chip, a conductive trace and an insulative base that provides a low cost, high performance, high reliability package.

Another object of the present invention is to provide a convenient, cost-effective method for manufacturing semiconductor chip assemblies as grid arrays or other structures.

In accordance with an aspect of the invention, a method of connecting a conductive trace and an insulative base to a semiconductor chip includes providing a semiconductor chip, a metal base, an insulative base, a routing line and an interconnect, wherein the chip includes a conductive pad, the metal base is disposed on a side of the insulative base that faces away from the chip, the routing line is disposed on a side of the insulative base that faces towards the chip, and the interconnect extends through a via in the insulative base and electrically connects the metal base and the routing line, forming an opening that extends through the insulative base and exposes the pad, forming a connection joint that electrically connects the routing line and the pad, and etching the metal base such that an unetched portion of the metal base forms a pillar that overlaps and is aligned with the via and contacts the interconnect, wherein a conductive trace includes the routing line, the interconnect and the pillar.

The method may include mechanically attaching the routing line to the chip using an insulative adhesive, and then exposing the routing line and the pad through the opening.

The method may also include providing a laminated structure that includes the metal base, the insulative base and a metal layer, wherein the metal base and the metal layer are disposed on opposite sides of the insulative base, and selectively etching the metal layer such that the routing line includes an unetched portion of the metal layer.

The method may also include forming the via through the metal layer and the insulative base to the metal base, and then depositing the interconnect into the via.

The method may also include forming the via by applying a wet chemical etch to the metal layer, thereby exposing the insulative base, and then applying a laser that ablates the insulative base, thereby exposing the metal base.

The method may also include depositing the interconnect into the via by electroplating a metal on the metal base and the metal layer, or alternatively, by depositing solder paste into the via and then reflowing the solder paste, or alternatively, by depositing conductive adhesive paste into the via and then curing the conductive adhesive paste.

The method may also include forming the pillar by applying a wet chemical etch to the metal base using an etch mask disposed in a recess in the metal base to define the pillar. Preferably, the etch mask is solder.

The method may also include forming the pillar by applying a wet chemical etch to the metal base in order to electrically isolate the pillar from other pillars and thus the pad from other pads of the chip.

The method may also include forming the opening by applying a wet chemical etch to the metal base, thereby exposing the insulative base, and then applying a laser that ablates the insulative base and the adhesive, thereby exposing the routing line and the pad. The metal base can be etched before or after mechanically attaching the routing line to the chip.

The method may also include depositing an insulator in the opening that contacts the insulative base and the connection joint, thereby protecting the connection joint from a wet chemical etch that forms the pillar.

Preferably, the metal base, the metal layer and the connection joint are copper.

An advantage of the present invention is that the semiconductor chip assembly can include a conductive trace with an additively formed interconnect and a subtractively formed pillar that can be manufactured conveniently and cost effectively. Another advantage is that the insulative base can be provided before the routing line is attached to the chip, thereby enhancing the mechanical support and protection for the conductive trace when the pillar is formed. Another advantage is that the pillar can be formed using etching (i.e., subtractively) rather than by electroplating or electroless plating (i.e., additively) which improves uniformity and reduces manufacturing time and cost. Another advantage is that the connection joint need not include wire bonds, TAB leads or solder joints, although the process is flexible enough to accommodate these techniques if desired. Another advantage is that the metal base, the metal layer and the connection joint can be copper. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
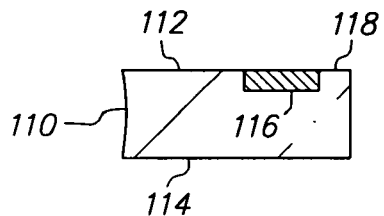
FIGS. 1A–1S are cross-sectional views showing a method of making a semiconductor chip assembly in accordance with a first embodiment of the present invention.
Figure 2A:
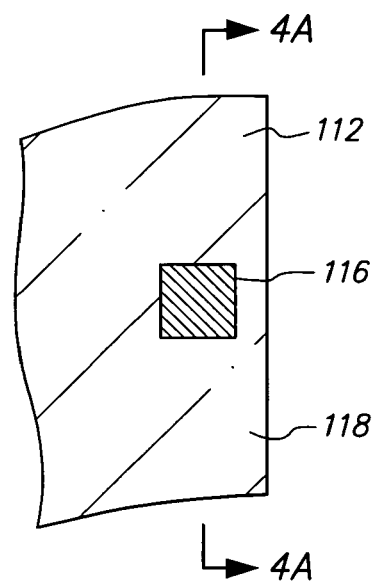
FIGS. 2A–2S are top plan views corresponding to FIGS. 1A–1S, respectively.
Figure 3A:
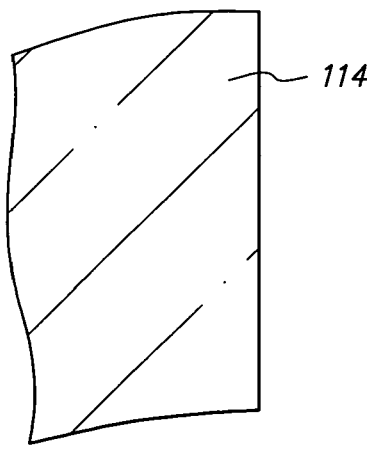
FIGS. 3A–3S are bottom plan views corresponding to FIGS. 1A–1S, respectively.
Figure 1B:
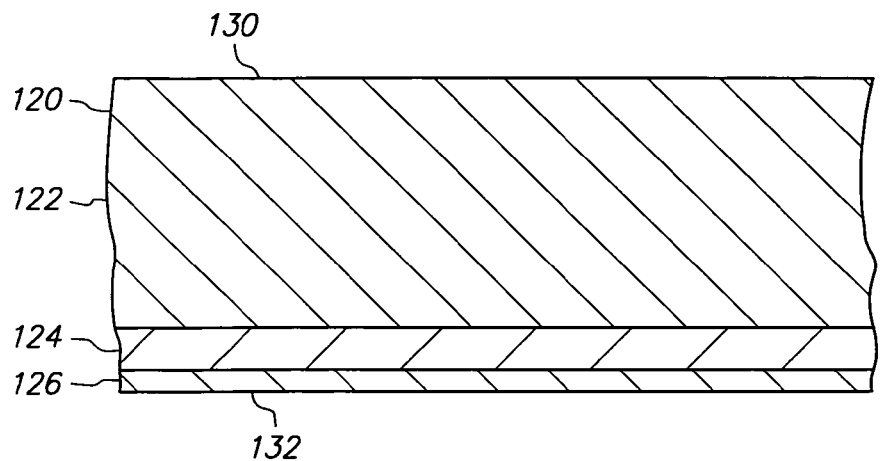
Figure 2B:
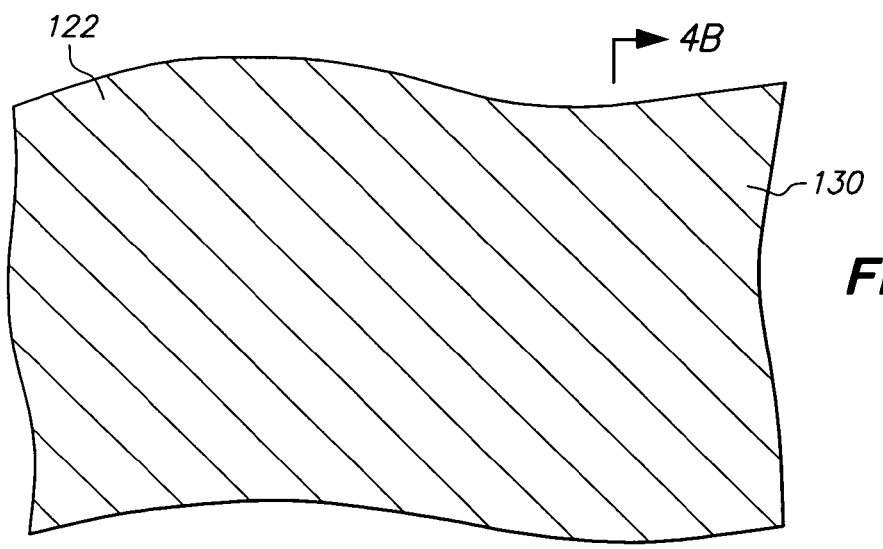
Figure 3B:
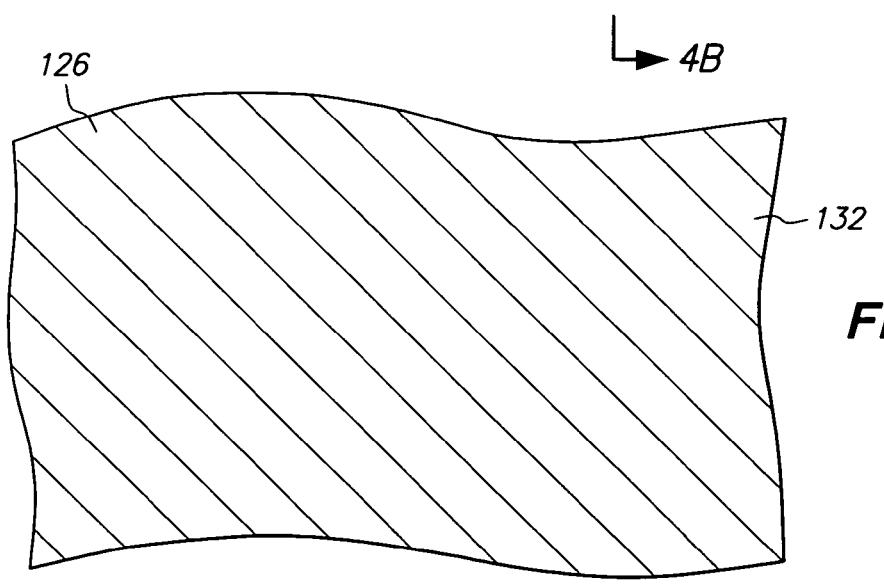
Figure 1C:
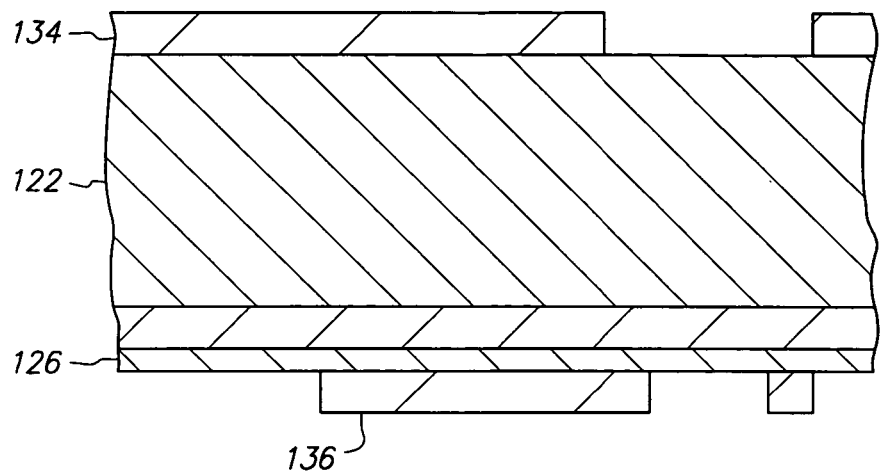
Figure 2C:
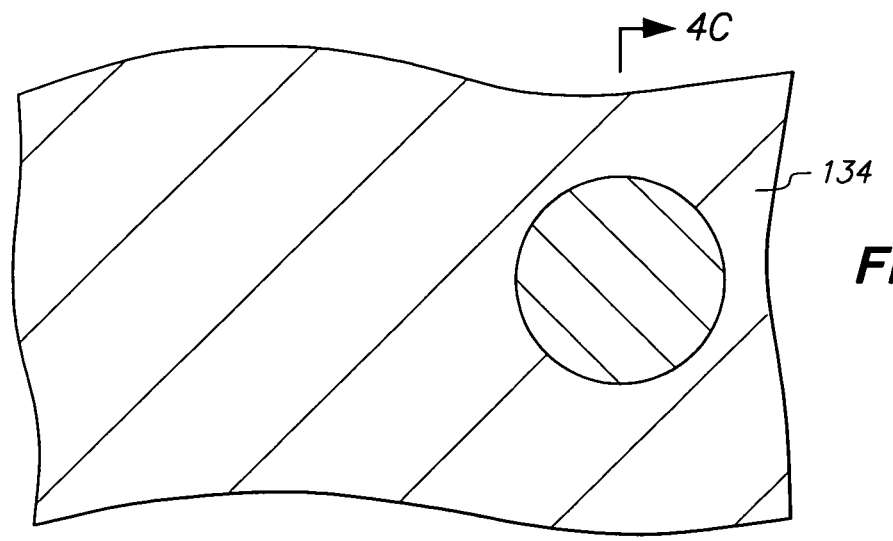
Figure 3C:
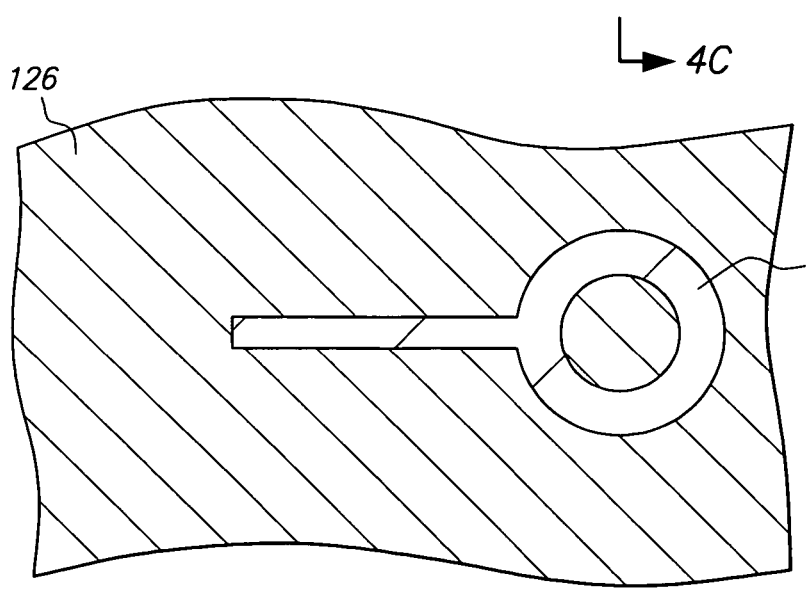
Figure 1D:
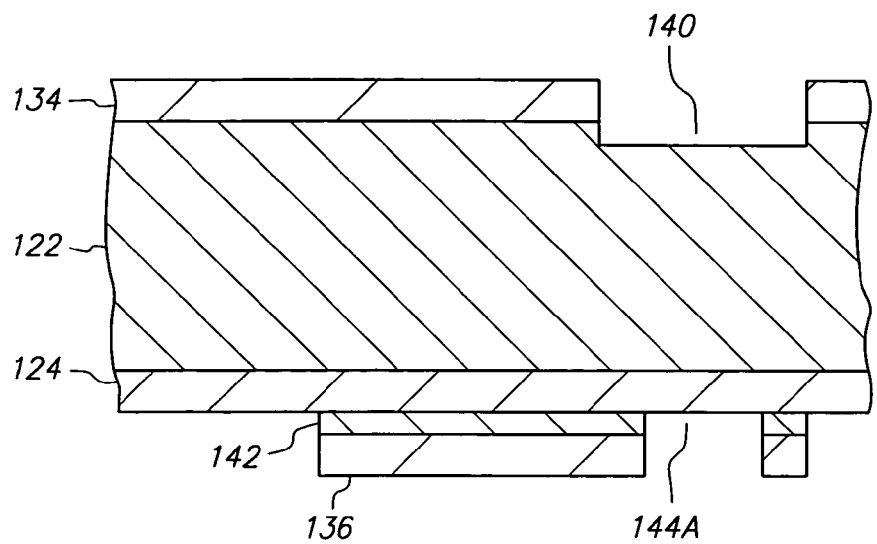
Figure 2D:
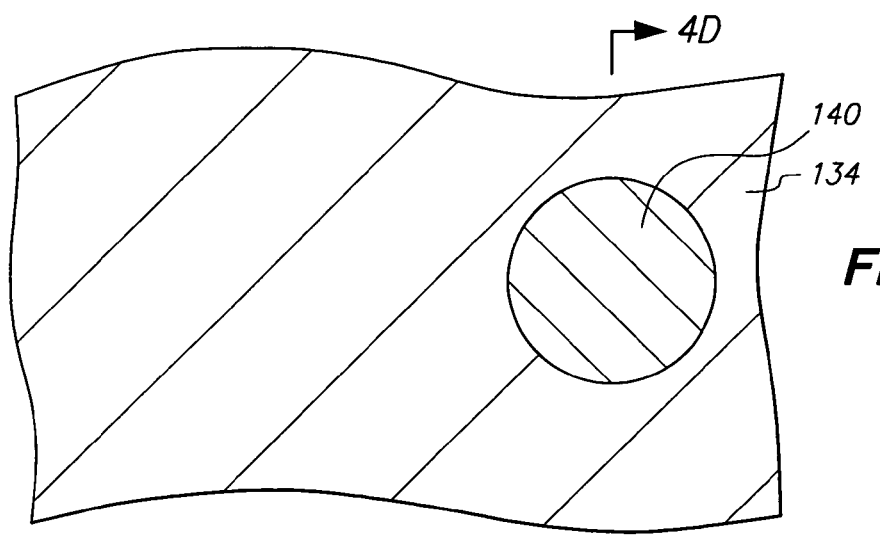
Figure 3D:
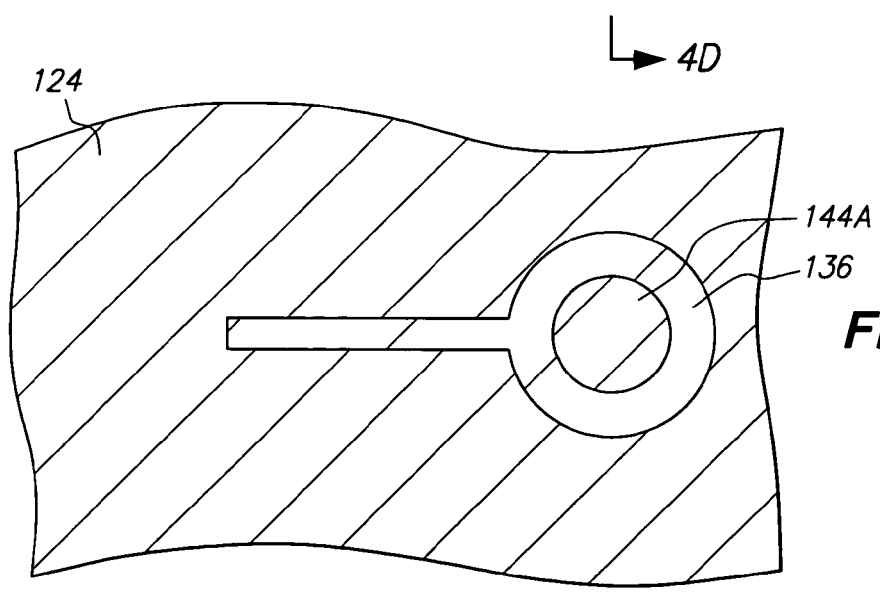
Figure 1E:
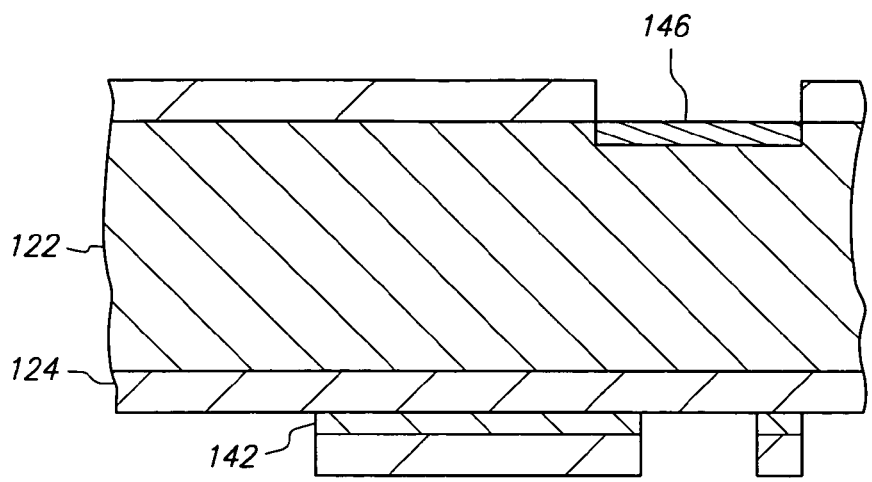
Figure 2E:
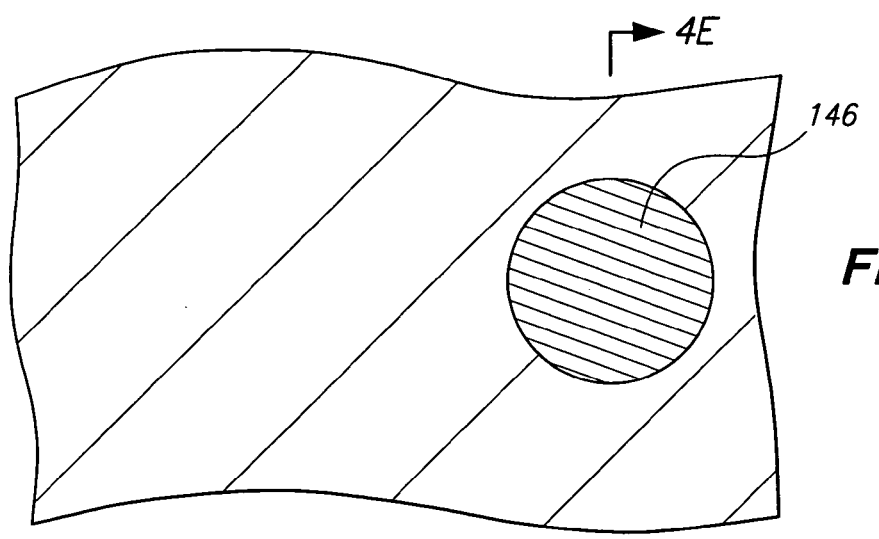
Figure 3E:
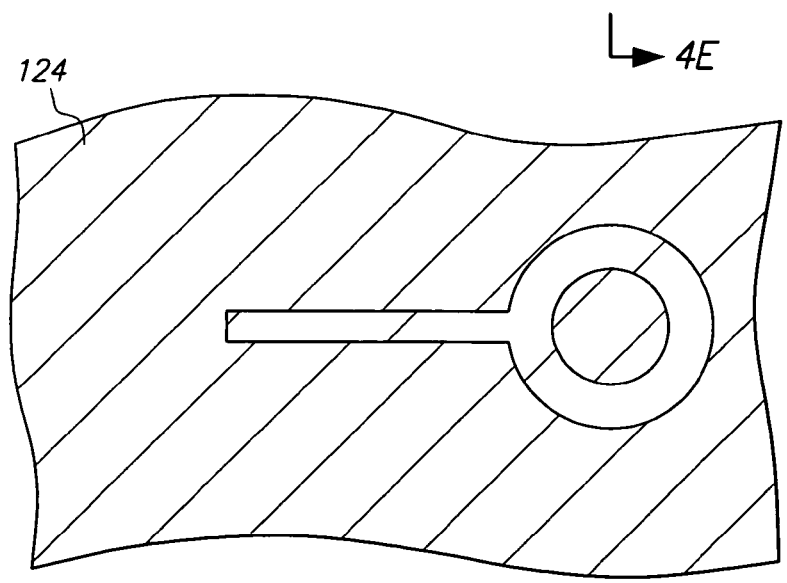
Figure 1F:
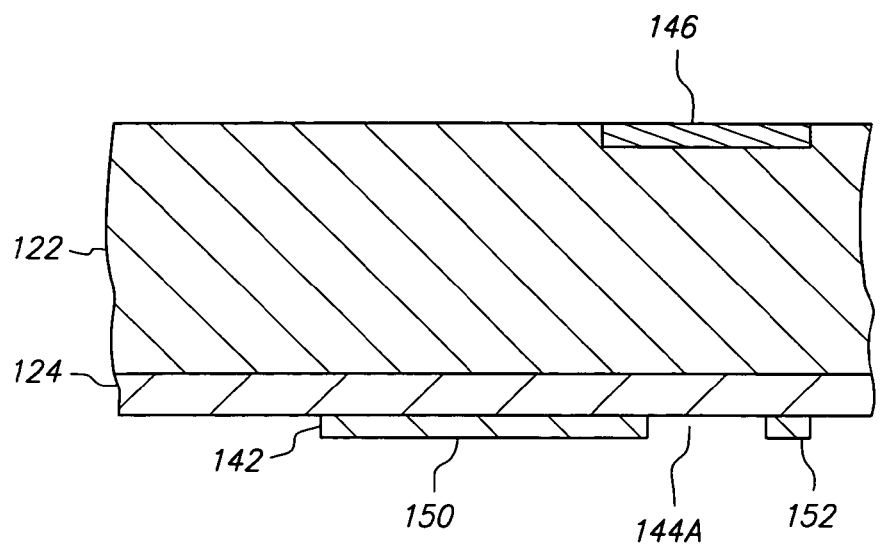
Figure 2F:
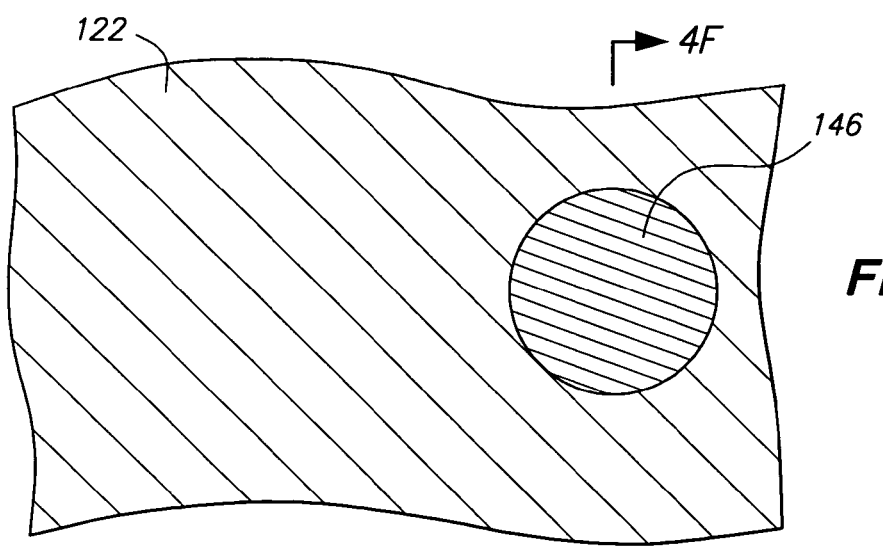
Figure 3F:
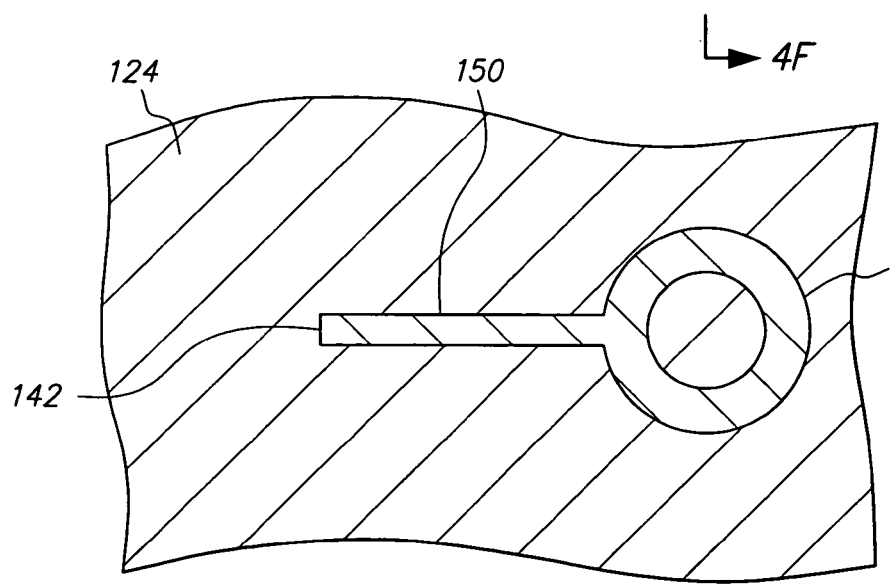
Figure 1G:
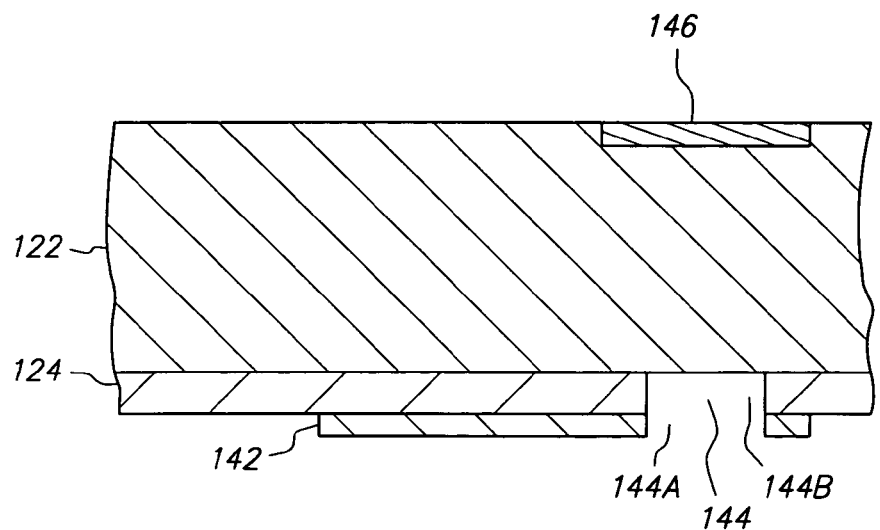
Figure 2G:
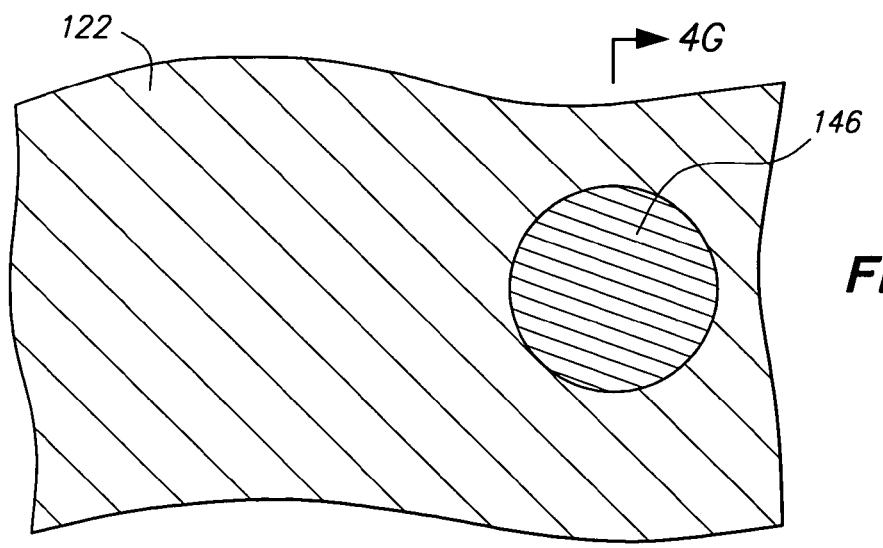
Figure 3G:
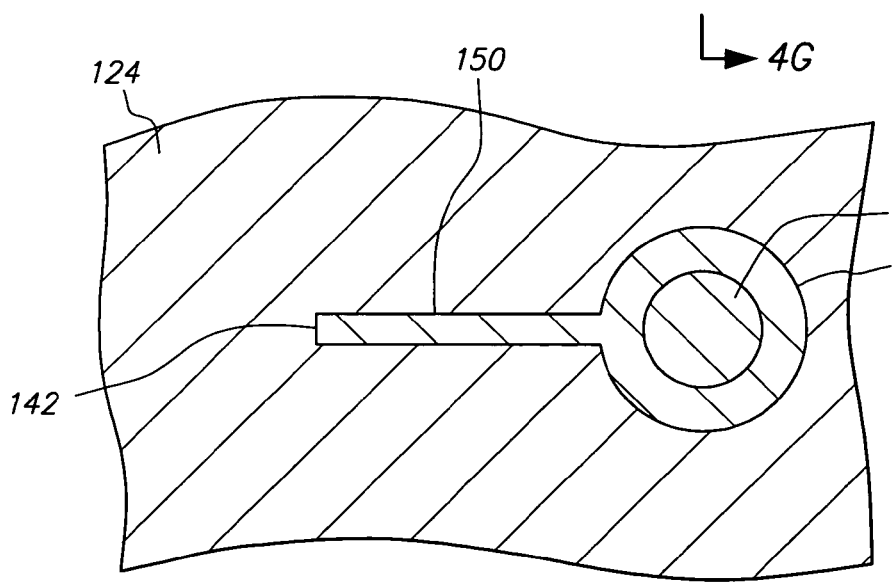
Figure 1H:
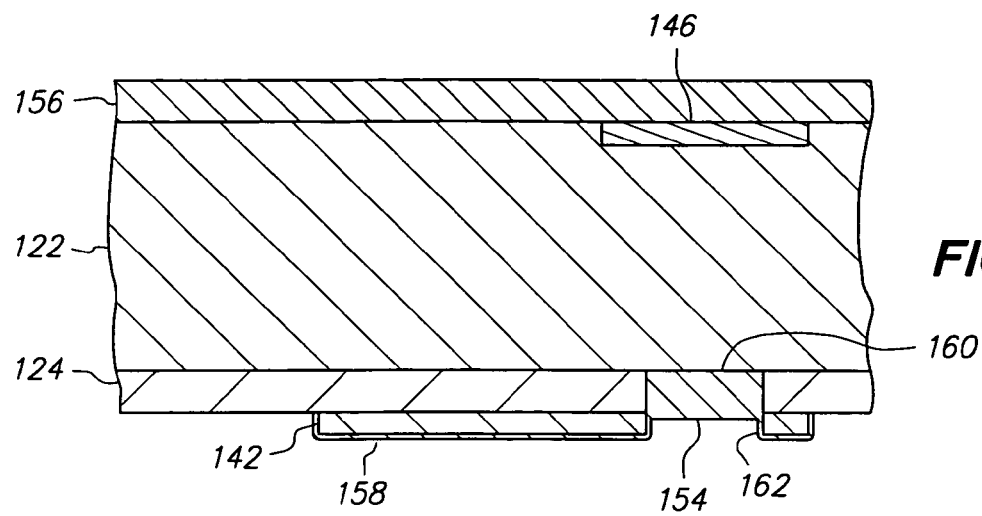
Figure 2H:
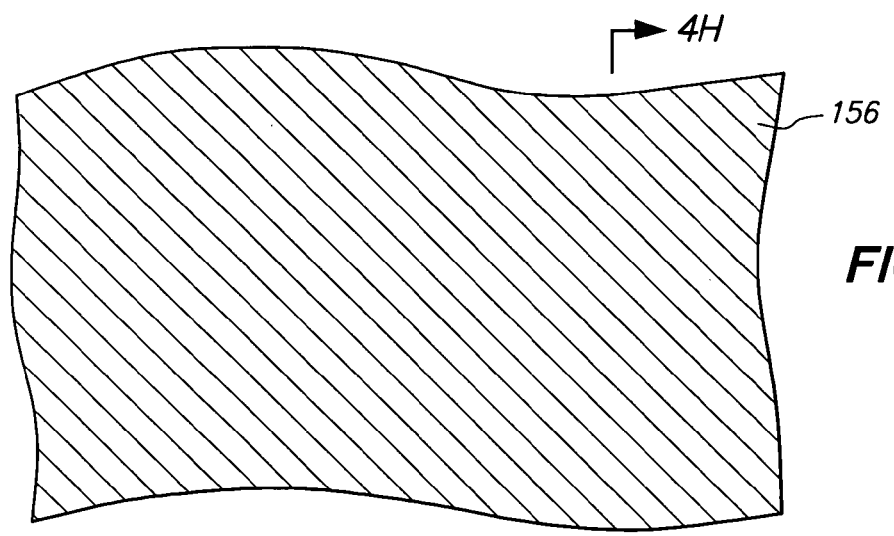
Figure 3H:
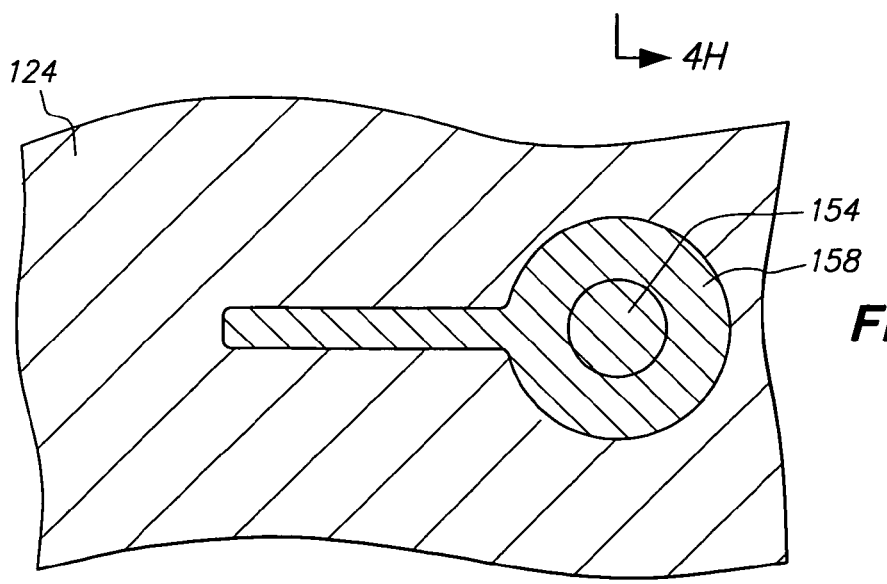
Figure 1I:
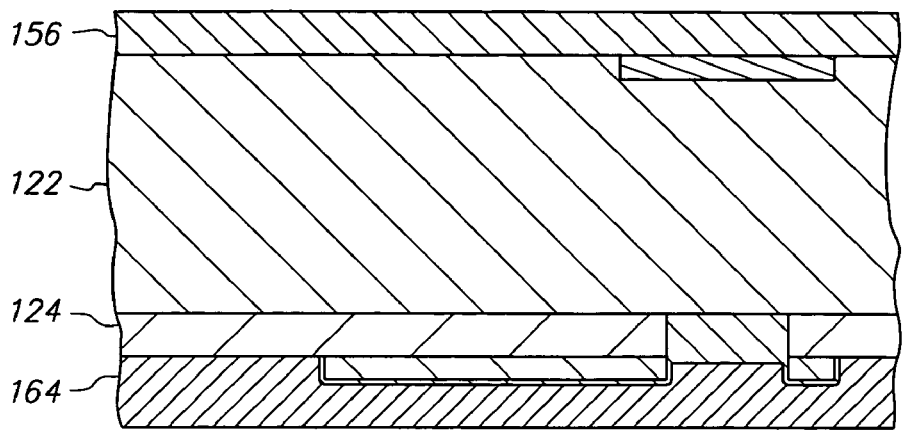
Figure 2I:
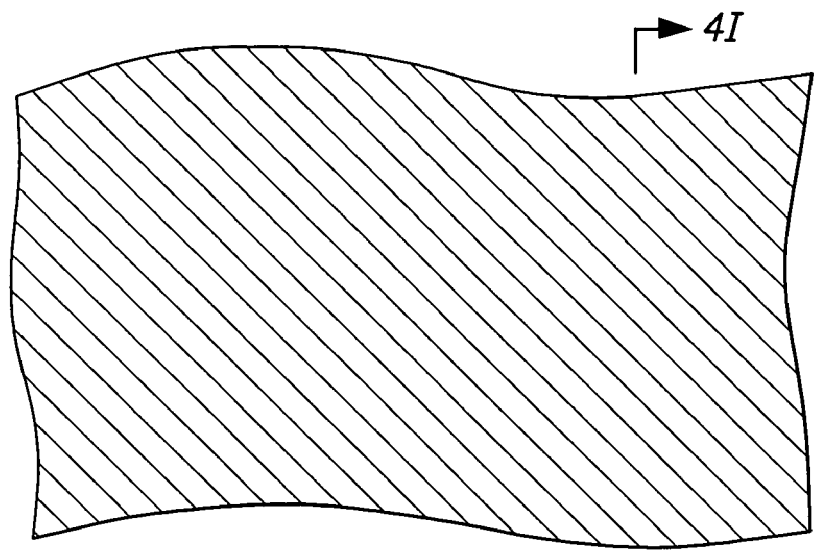
Figure 3I:
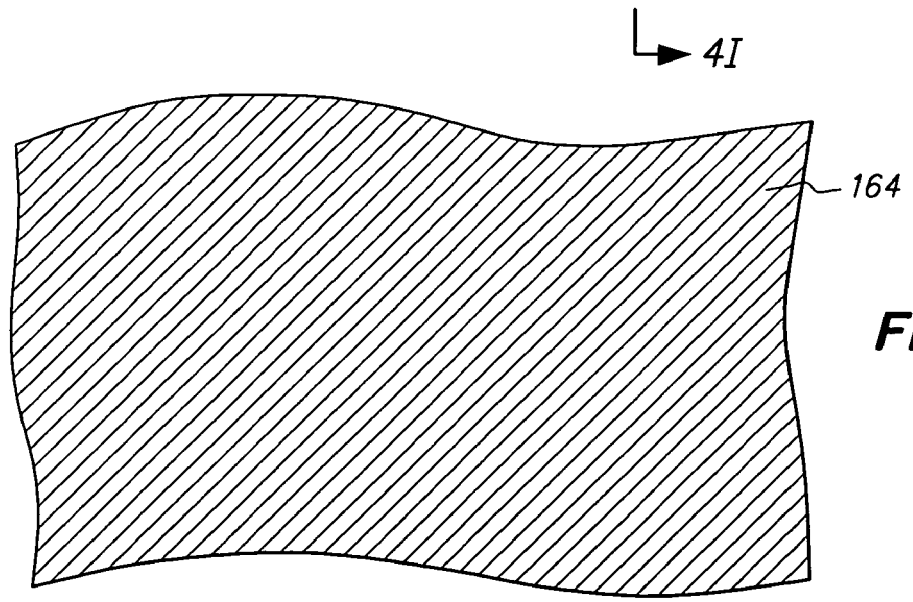
Figure 1J:
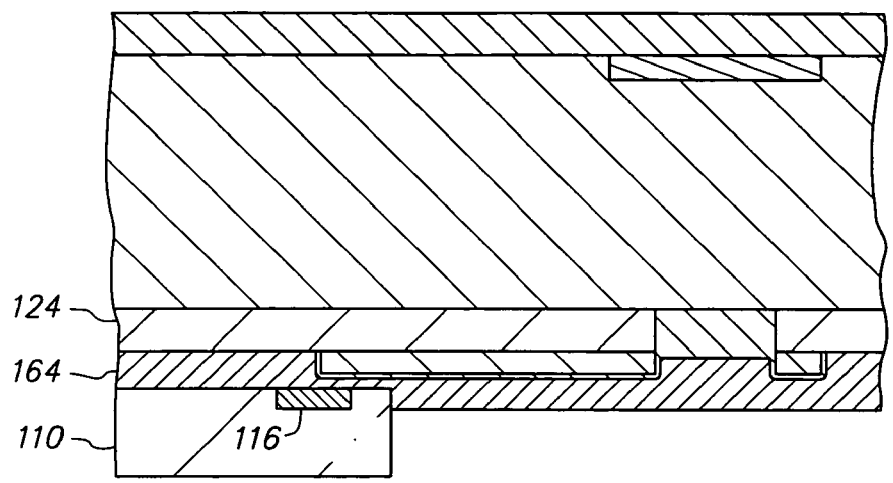
Figure 2J:
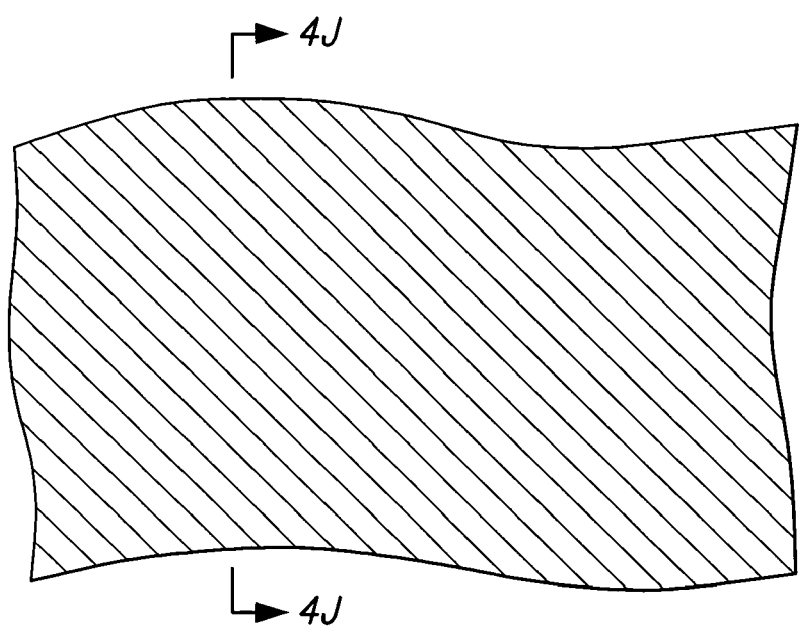
Figure 3J:
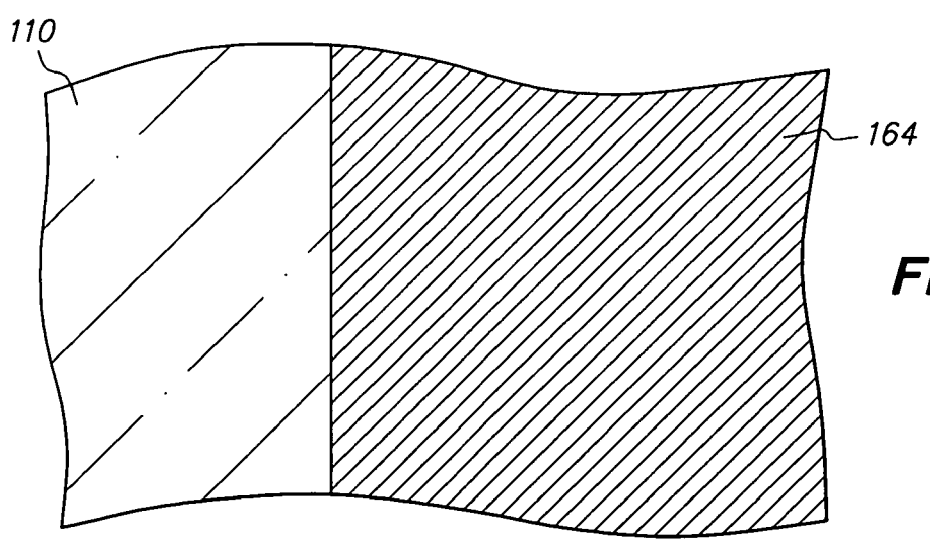
Figure 1K:
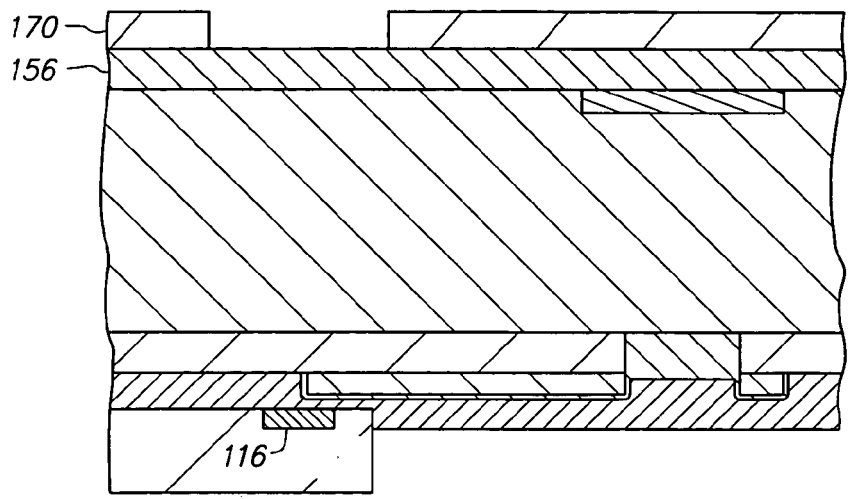
Figure 2K:
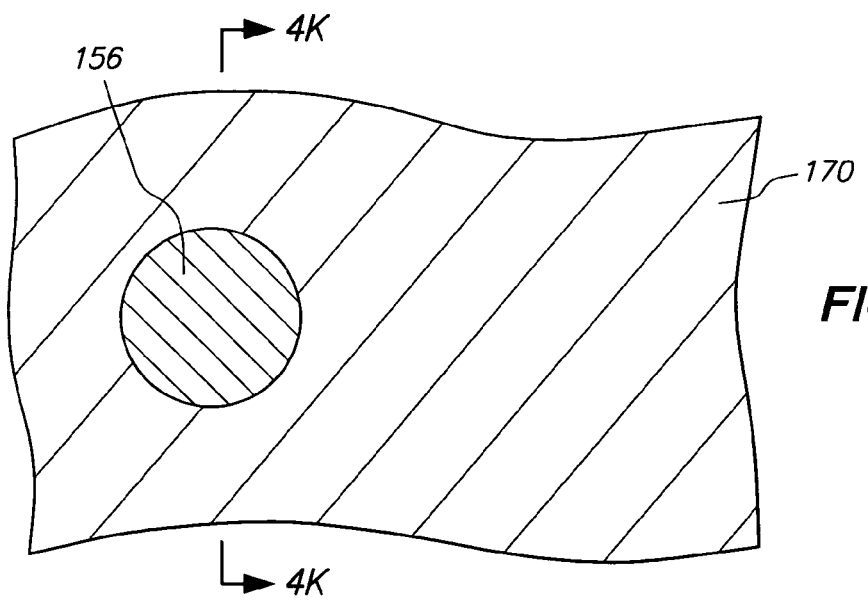
Figure 3K:
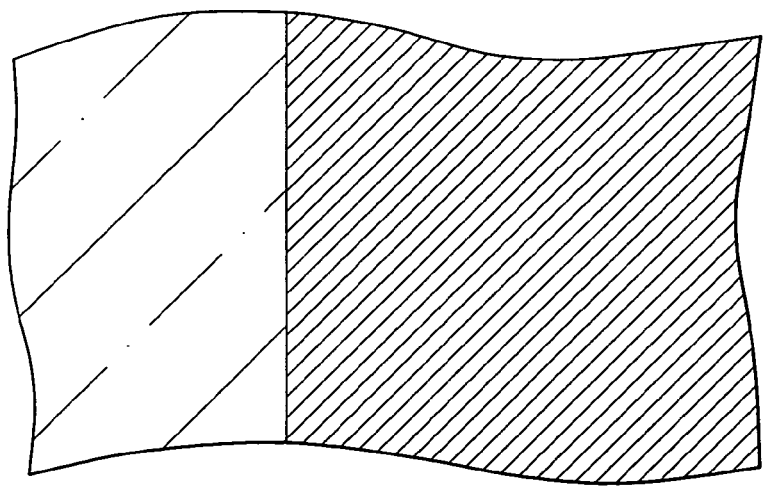
Figure 1L:
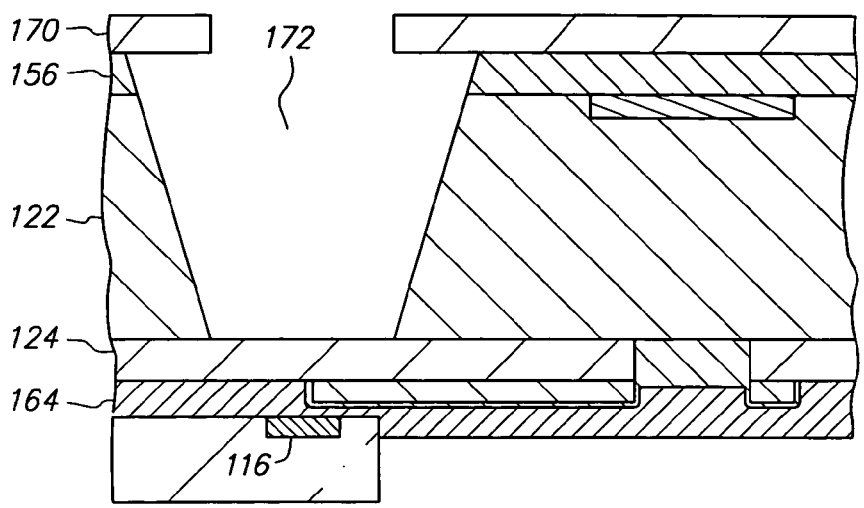
Figure 2L:
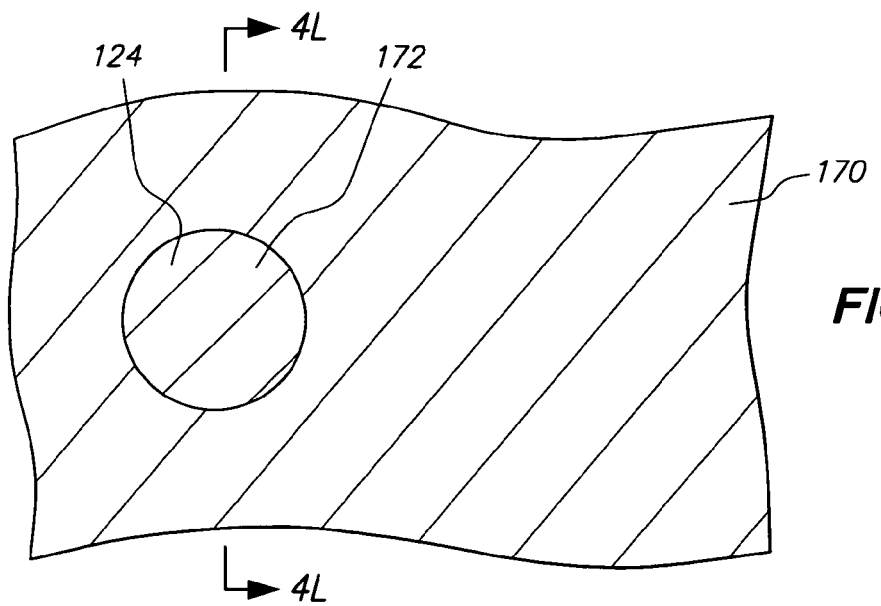
Figure 3L:
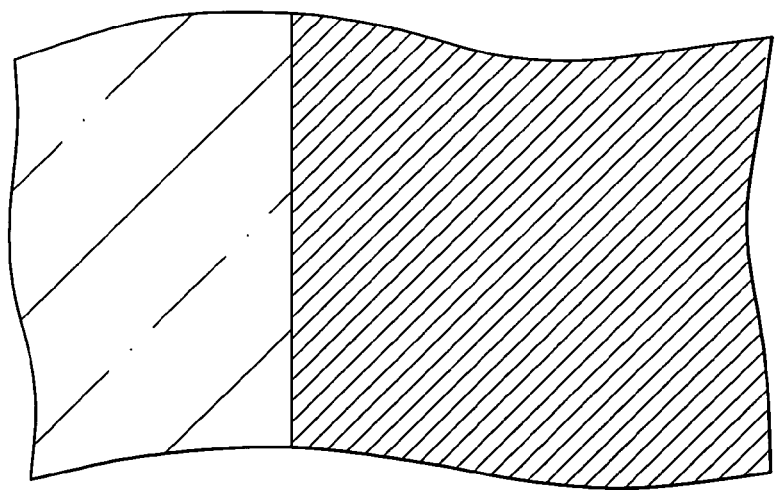
Figure 1M:
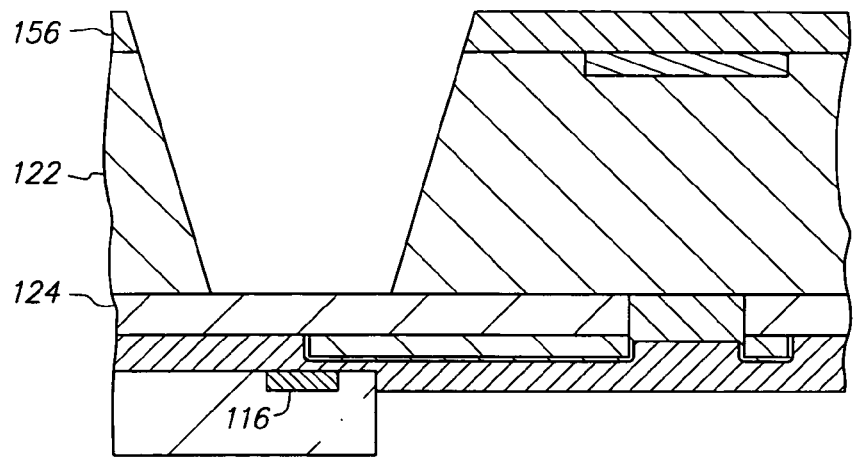
Figure 2M:
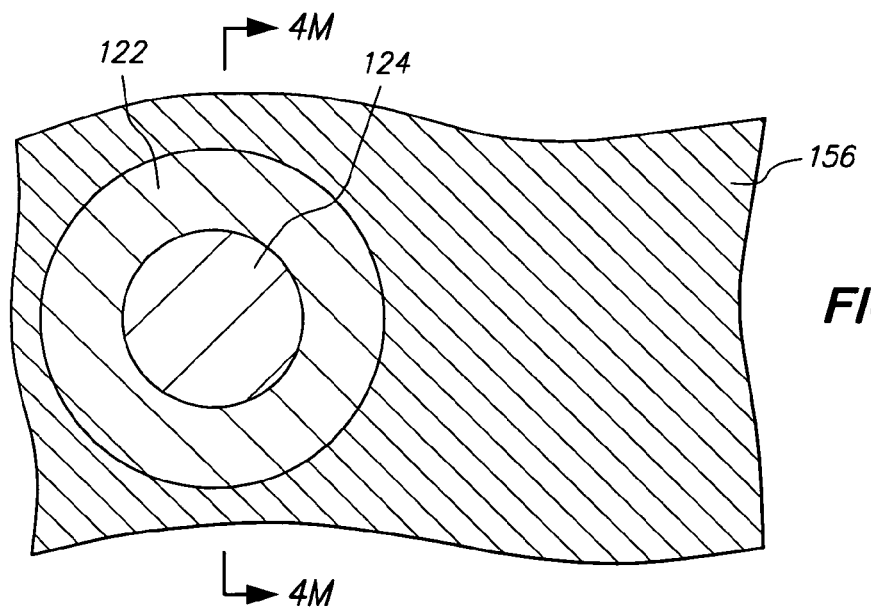
Figure 3M:
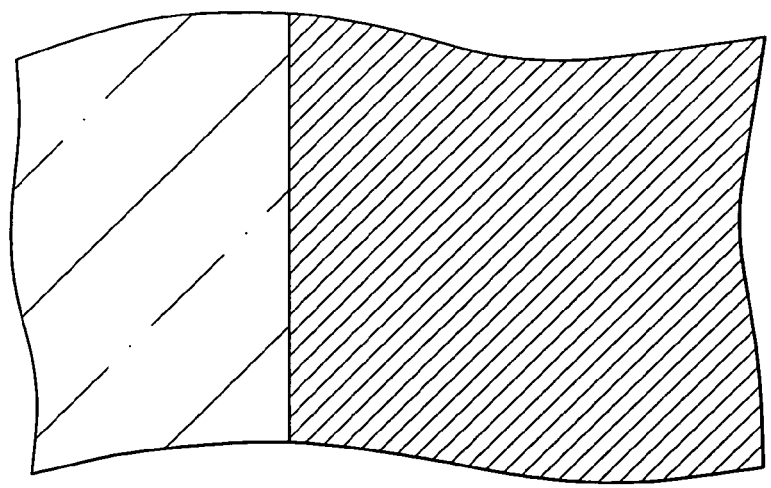
Figure 1N:
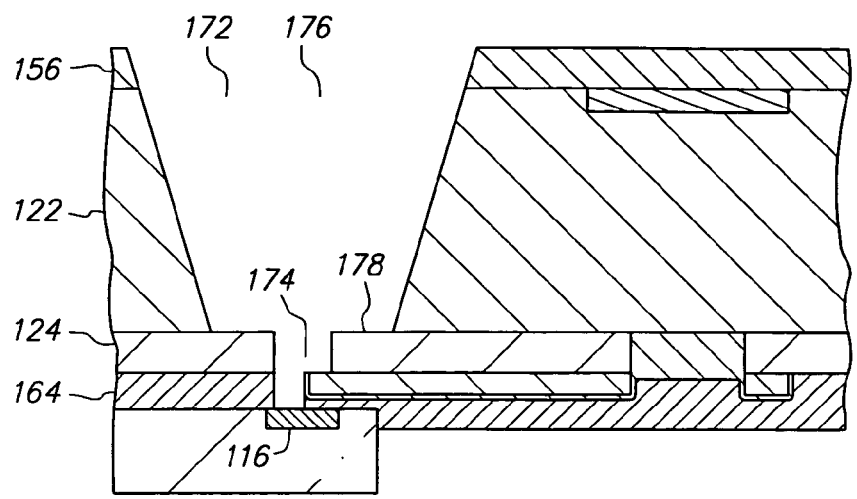
Figure 2N:
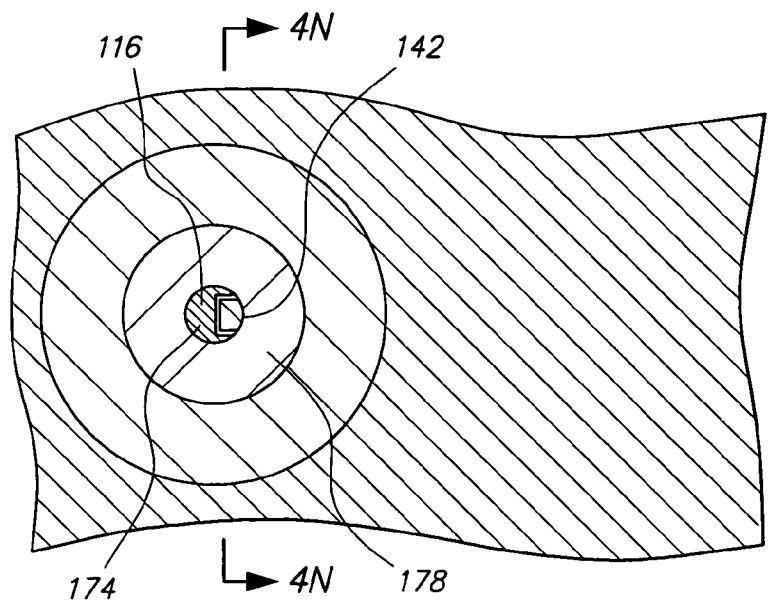
Figure 3N:
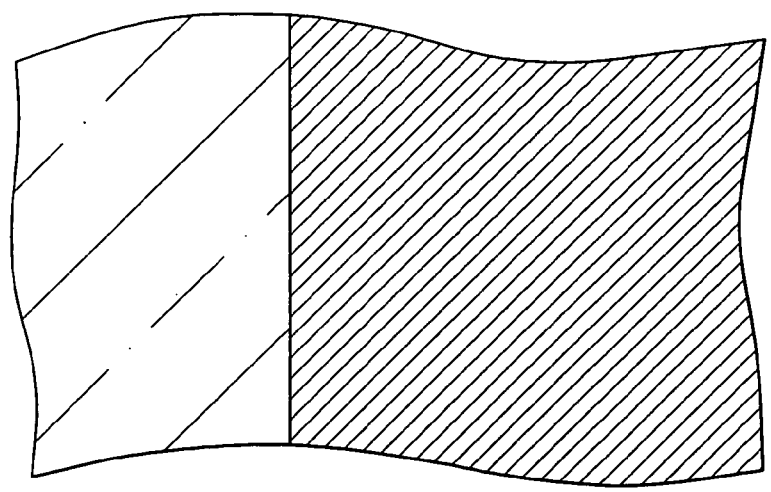
Figure 1O:
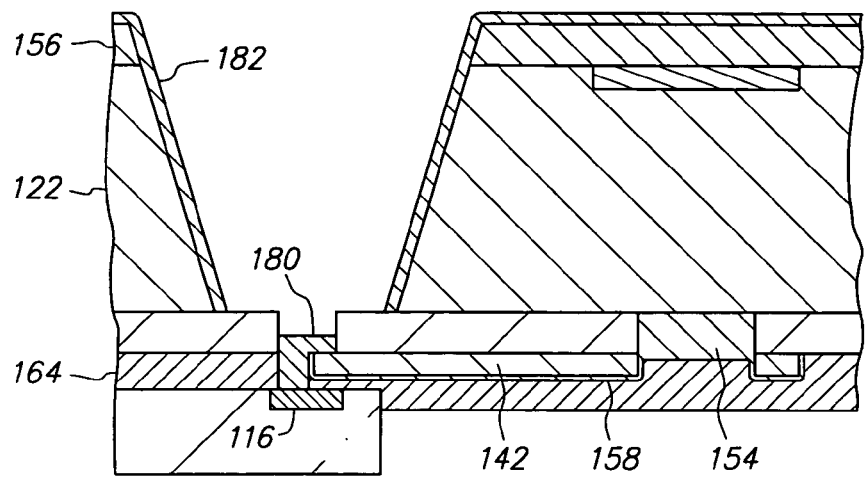
Figure 2O:
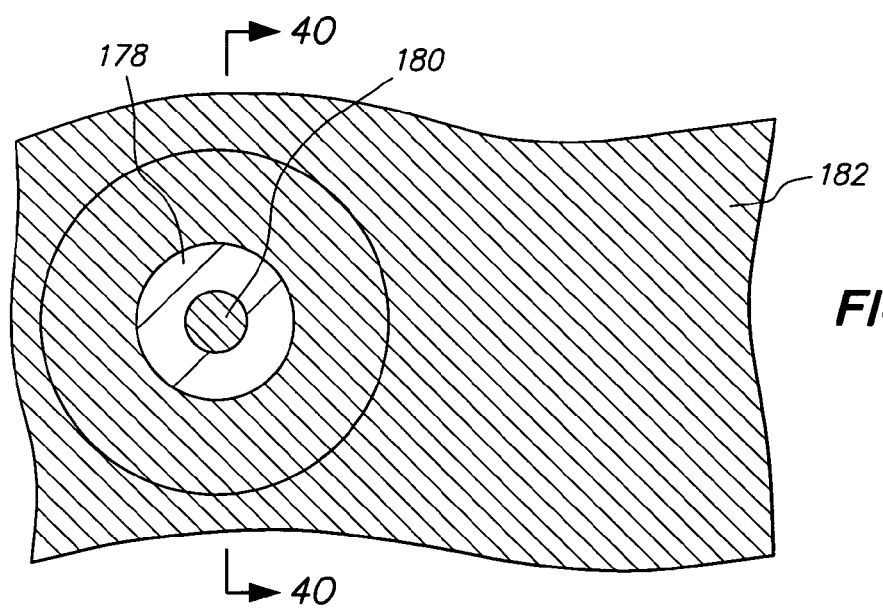
Figure 3O:
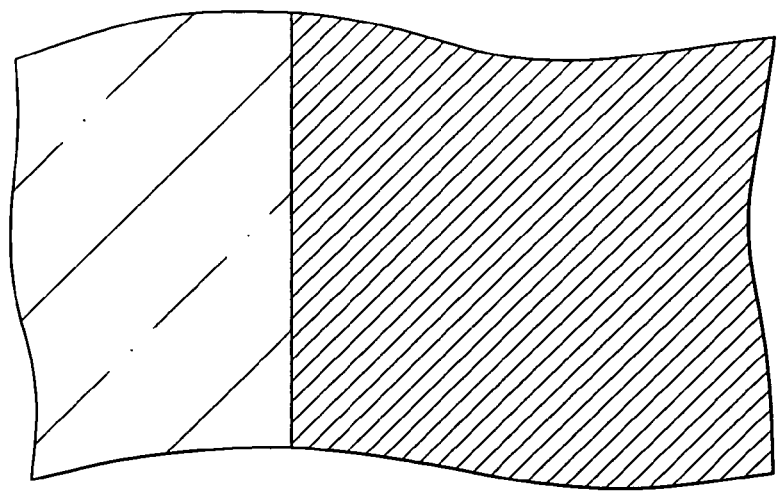
Figure 1P:
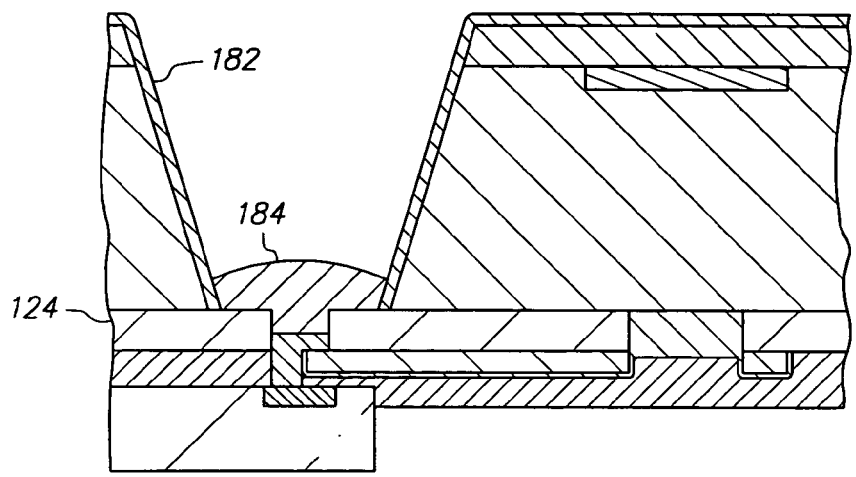
Figure 2P:
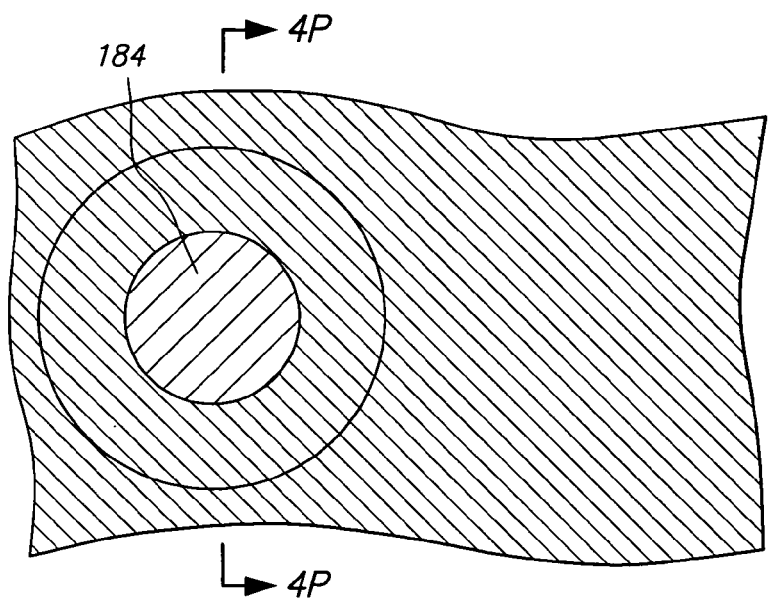
Figure 3P:
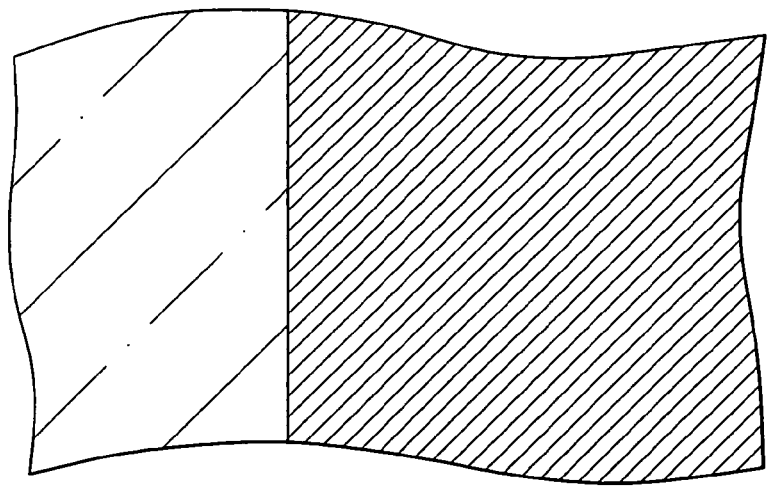
Figure 1Q:
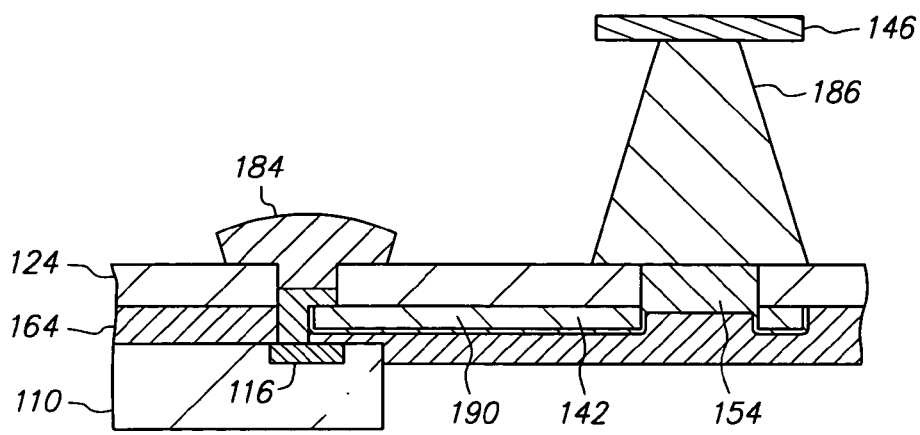
Figure 2Q:
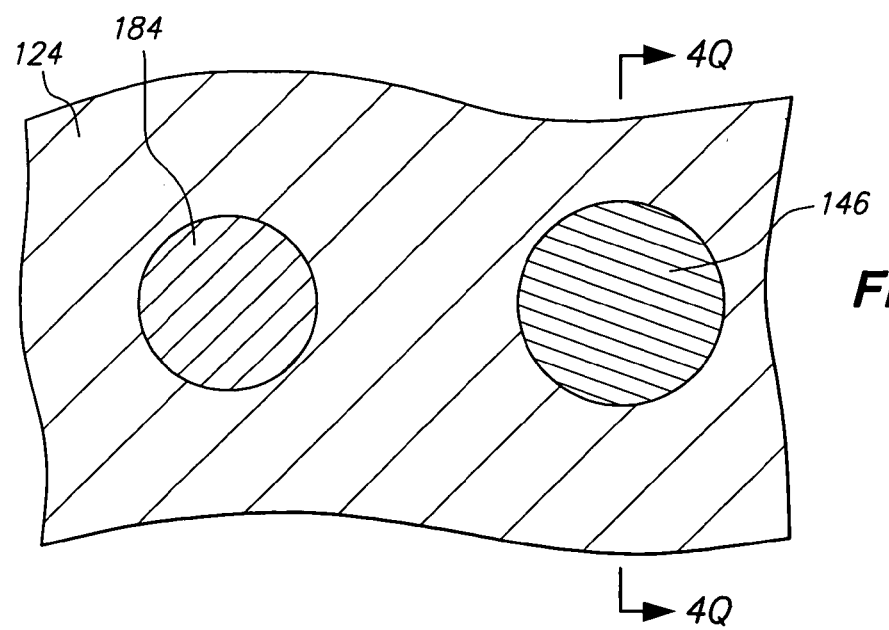
Figure 3Q:
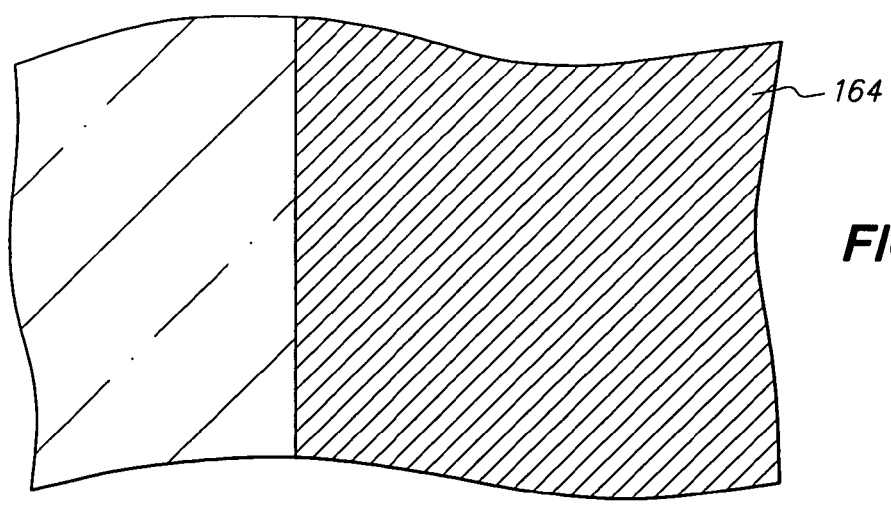
Figure 1R:
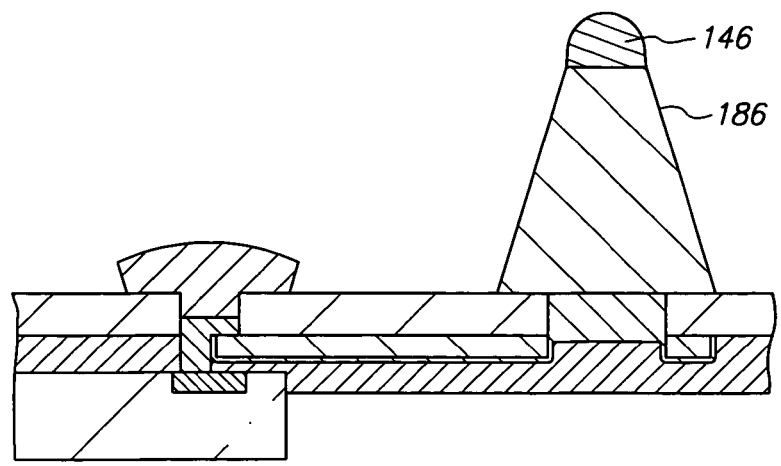
Figure 2R:
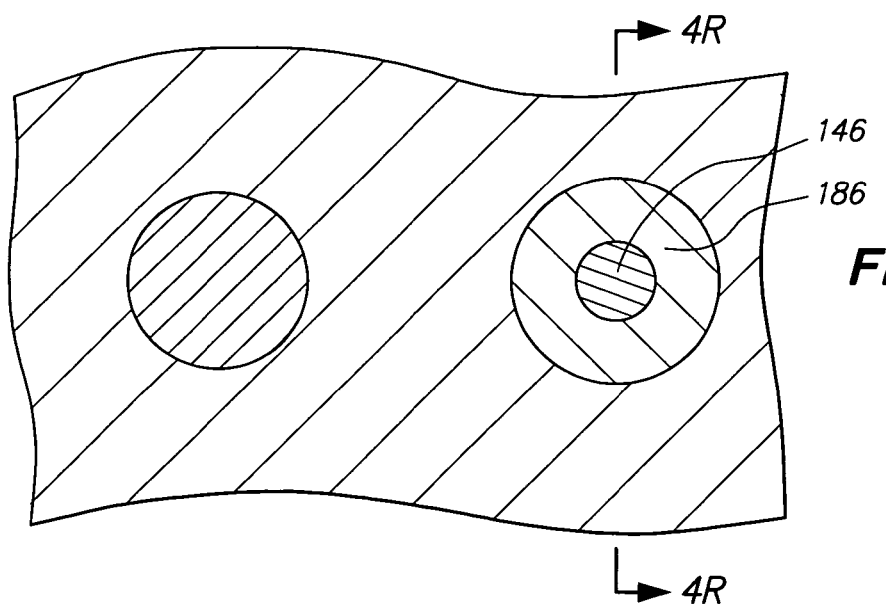
Figure 3R:
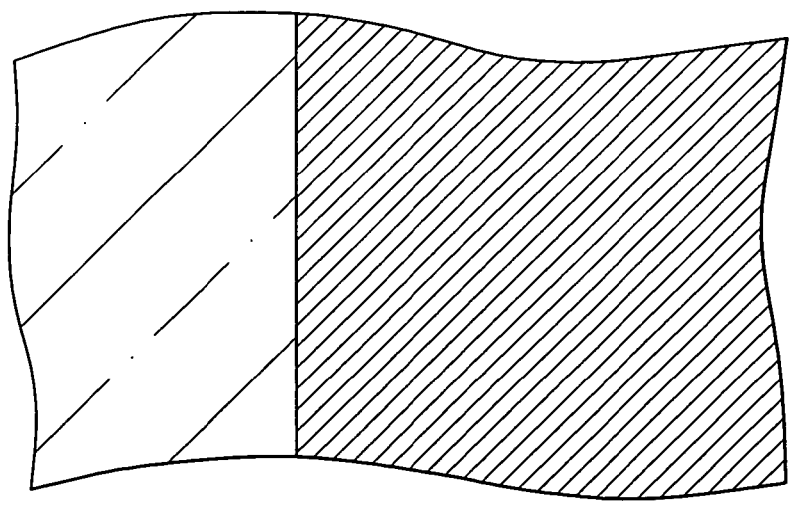
Figure 1S:
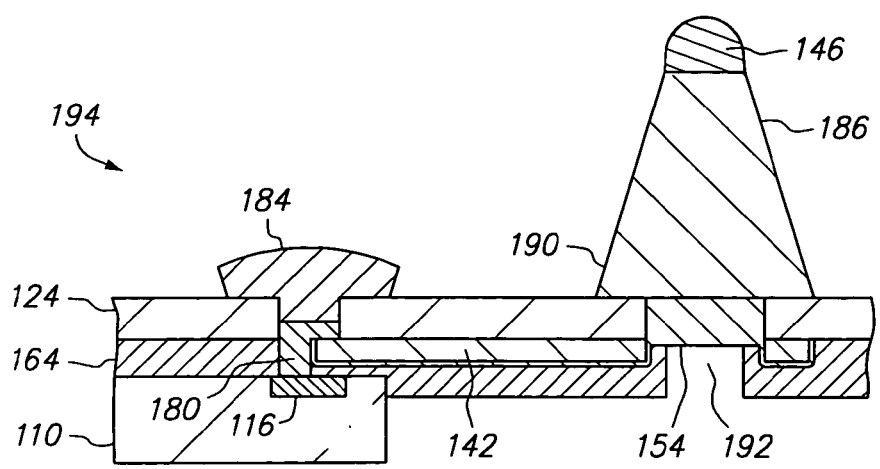
Figure 2S:
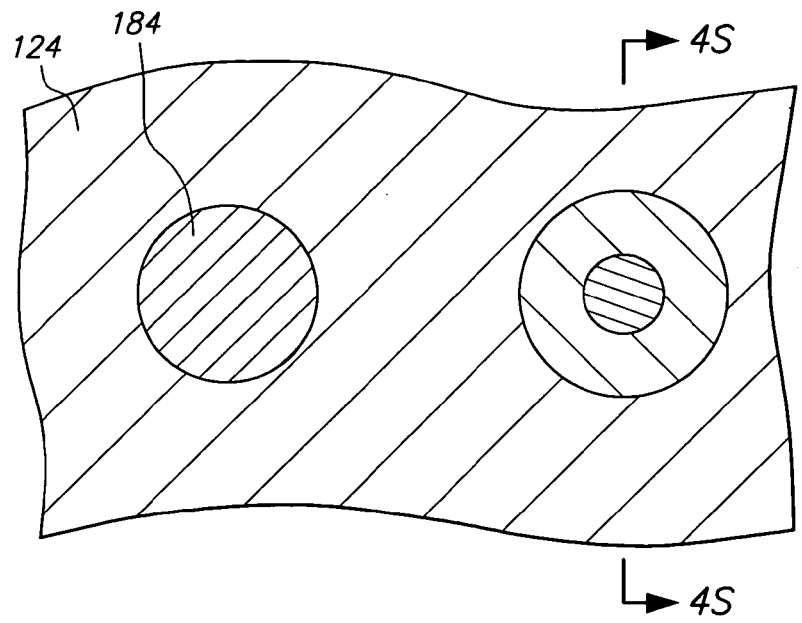
Figure 3S:
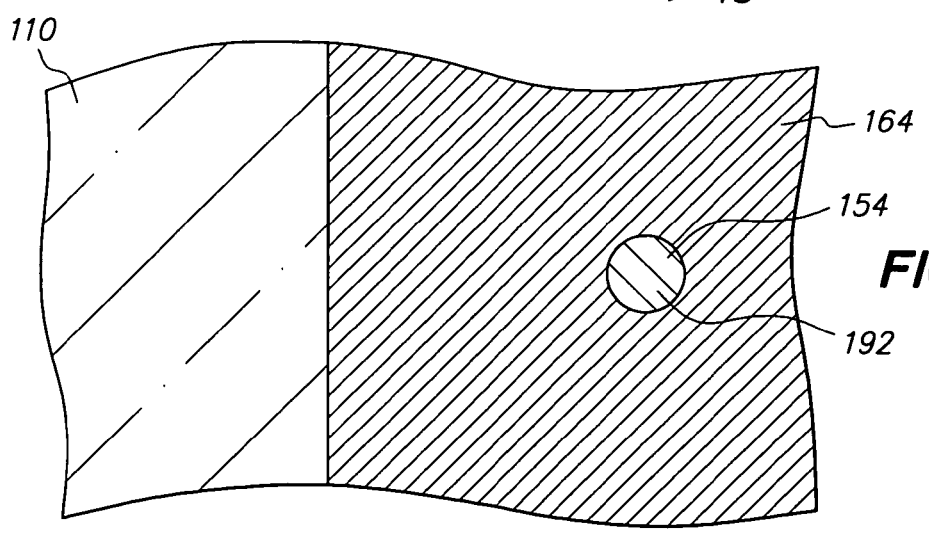
Figure 4A:
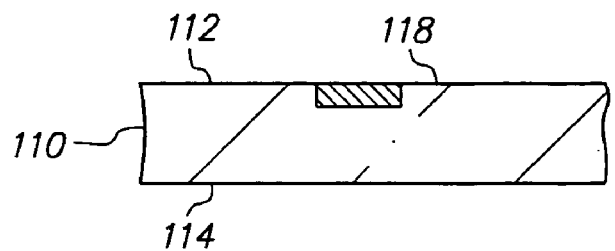
FIGS. 4A–4S are cross-sectional views corresponding to FIGS. 1A–1S, respectively.
Figure 4B:
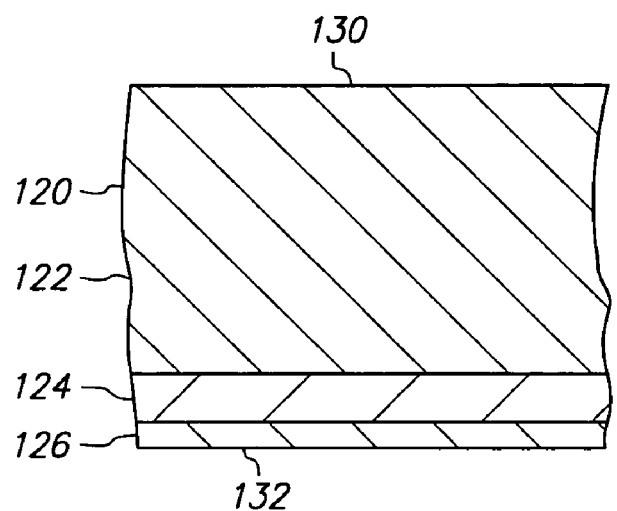
Figure 4C:
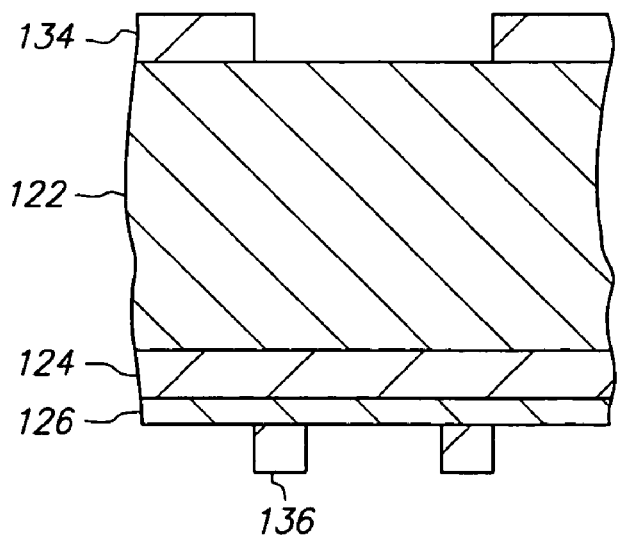
Figure 4D:
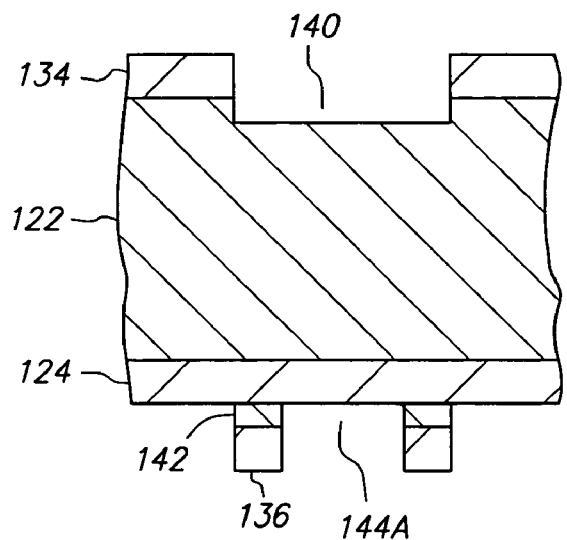
Figure 4E:
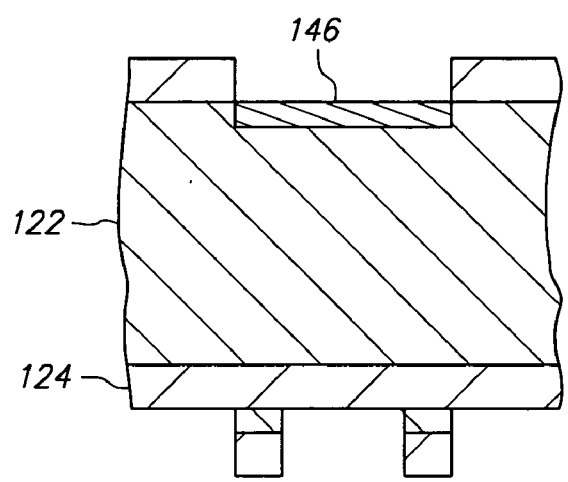
Figure 4F:
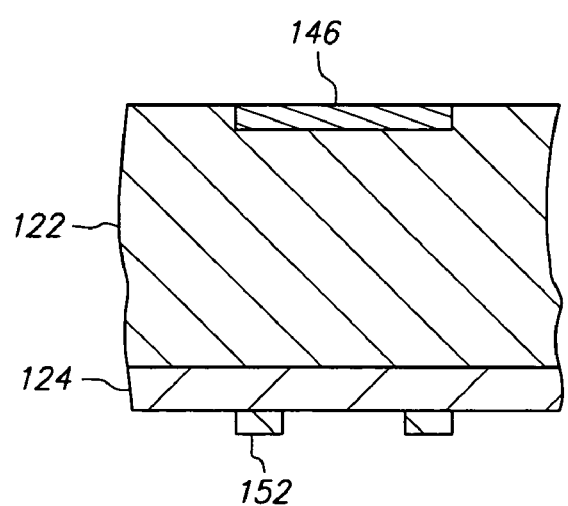
Figure 4G:
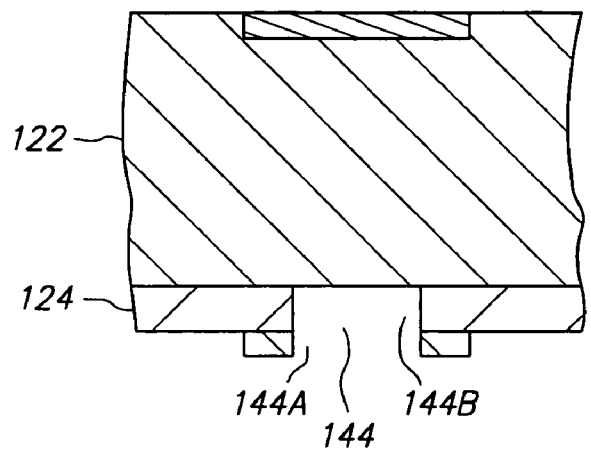
Figure 4H:
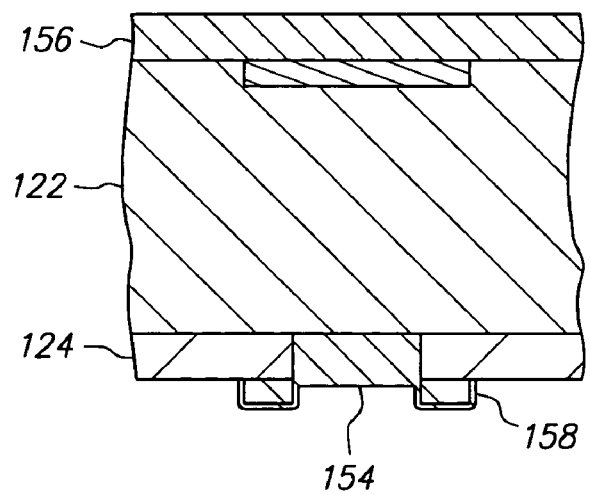
Figure 4I:
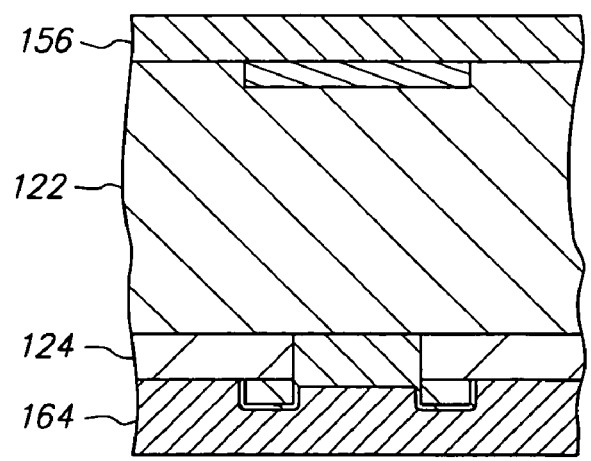
Figure 4J:
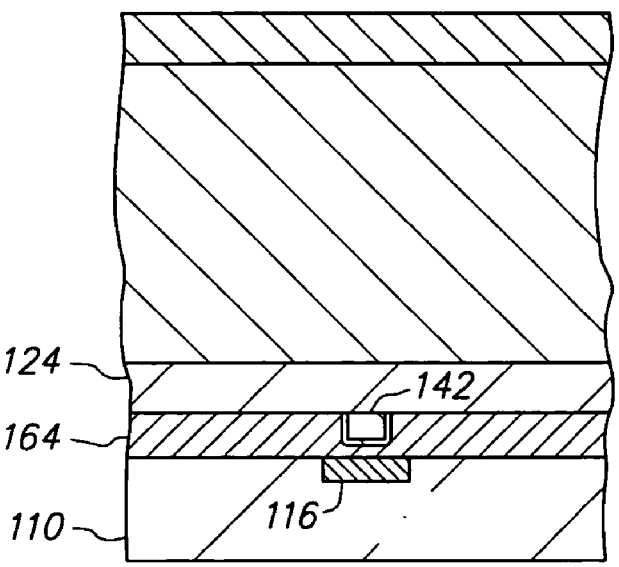
Figure 4K:
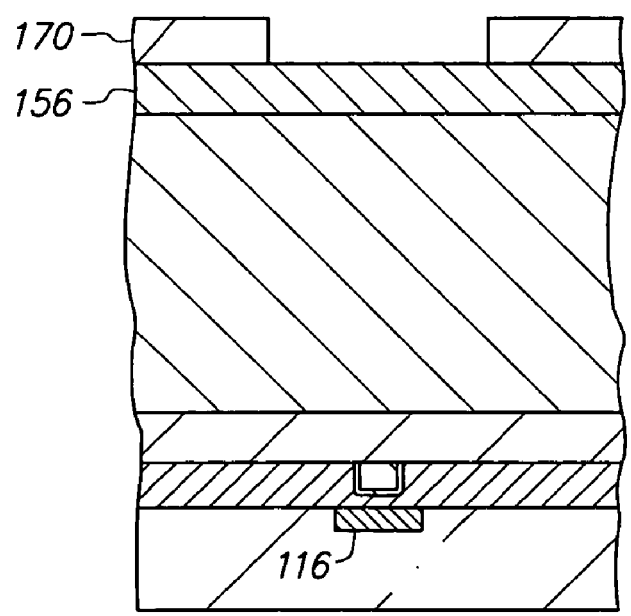
Figure 4L:
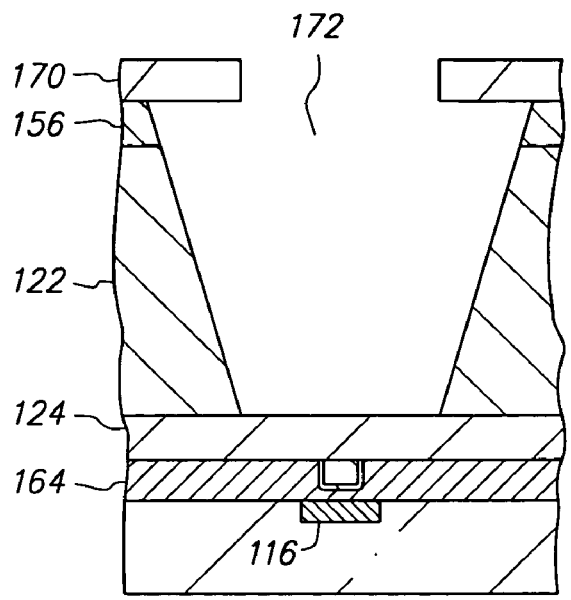
Figure 4M:
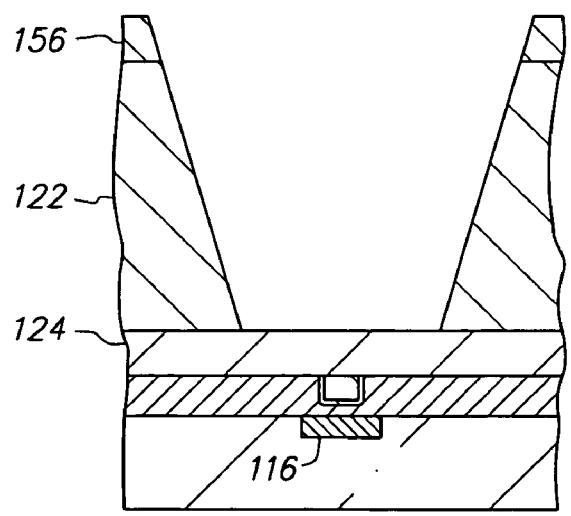
Figure 4N:
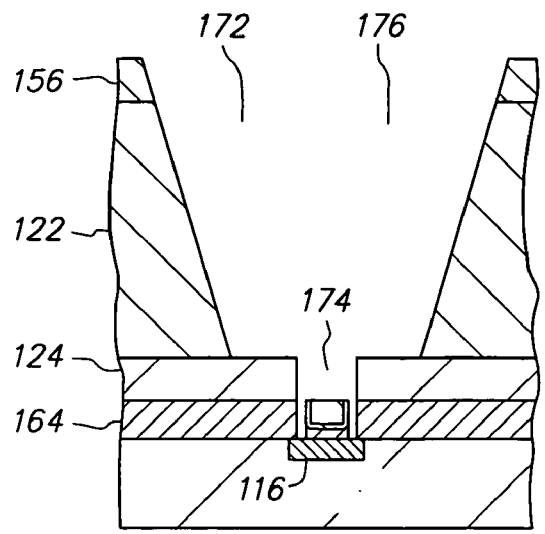
Figure 4O:
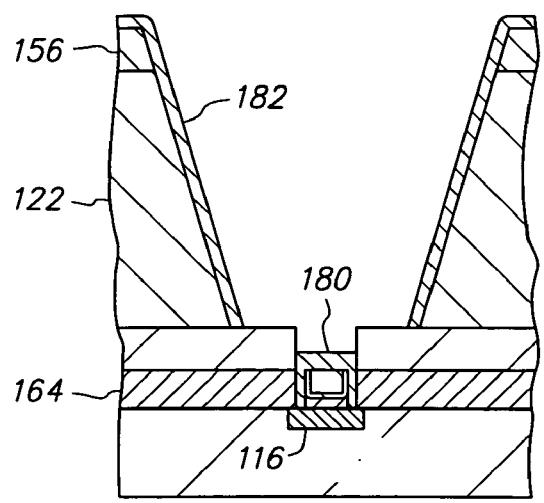
Figure 4P:
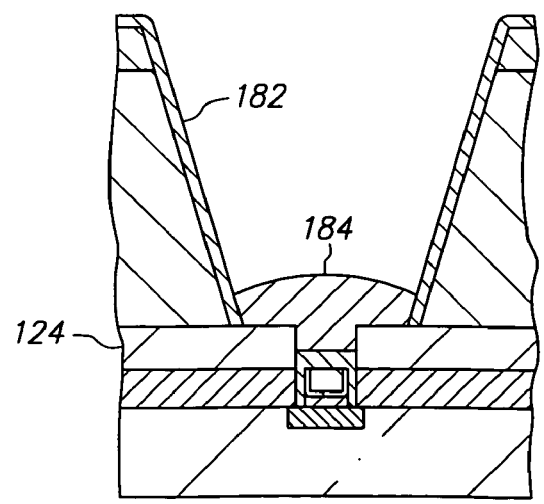
Figure 4Q:
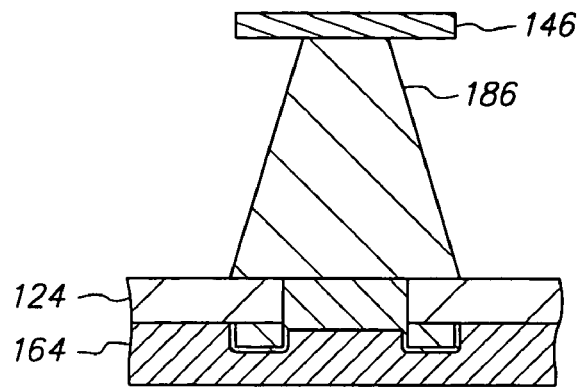
Figure 4R:
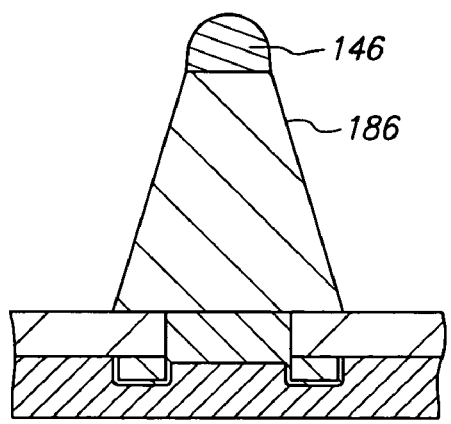
Figure 4S:
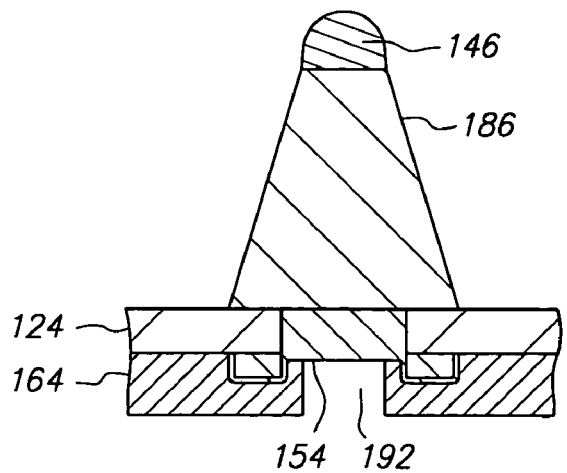
Figure 5A:
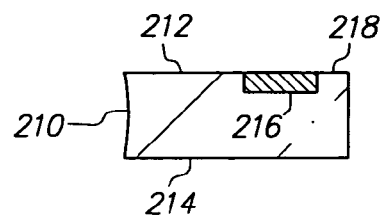
FIGS. 5A–5R are cross-sectional views showing a method of making a semiconductor chip assembly in accordance with a second embodiment of the present invention.
Figure 6A:
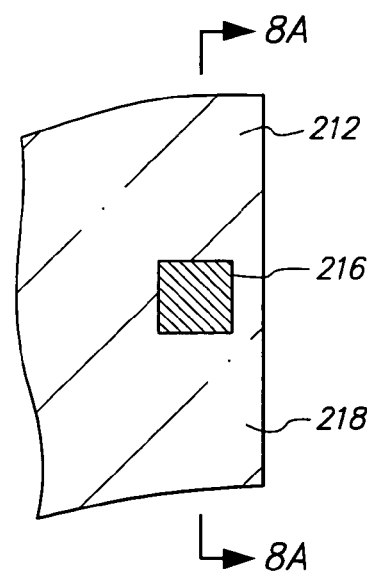
FIGS. 6A–6R are top plan views corresponding to FIGS. 5A–5R, respectively.
Figure 7A:
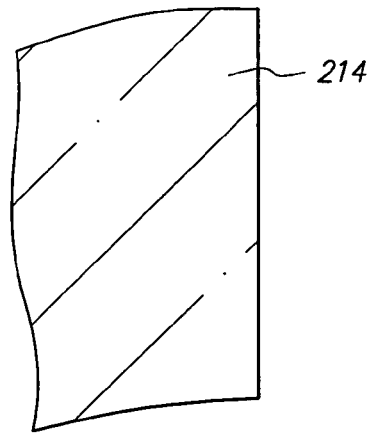
FIGS. 7A–7R are bottom plan views corresponding to FIGS. 5A–5R, respectively.
Figure 5B:
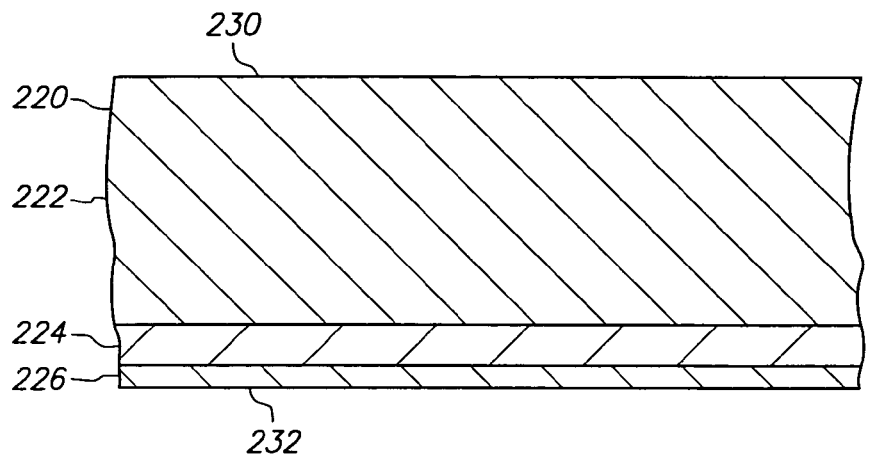
Figure 6B:
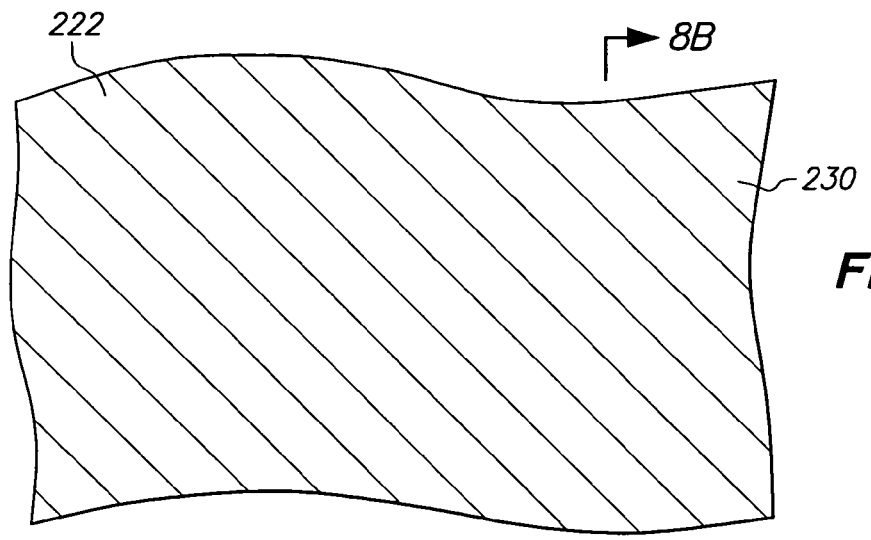
Figure 7B:
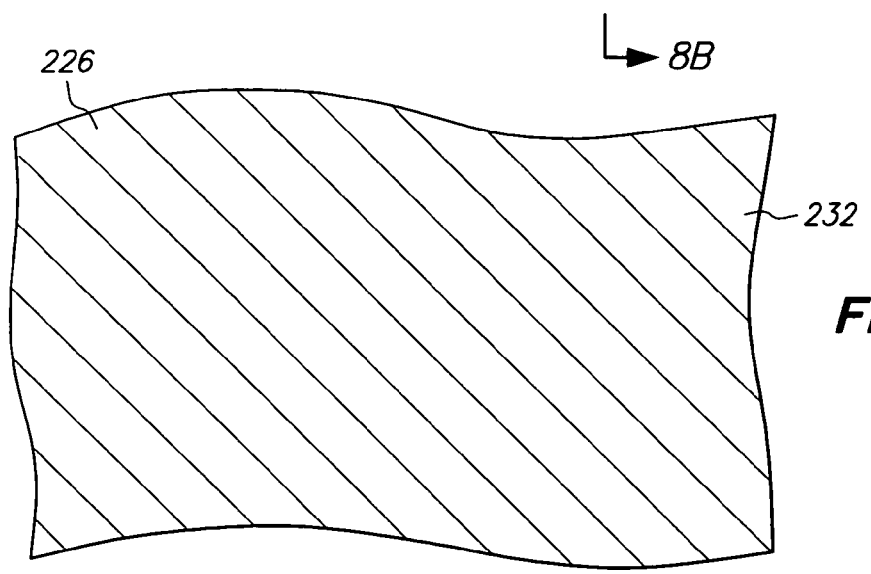
Figure 5C:
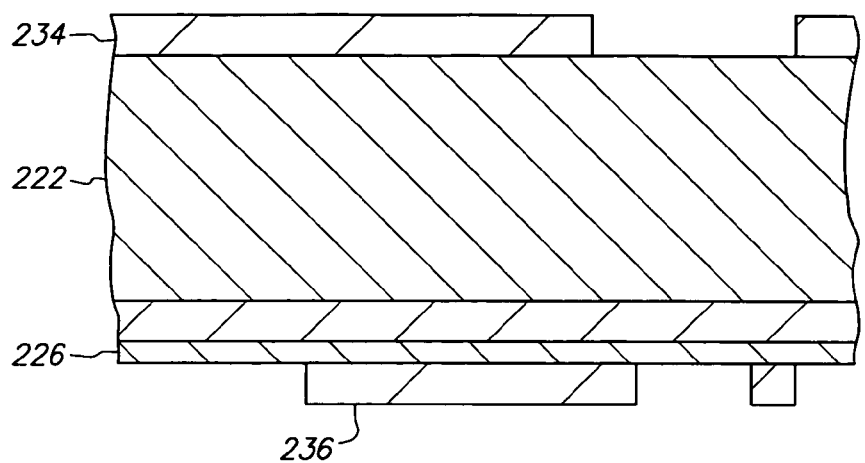
Figure 6C:
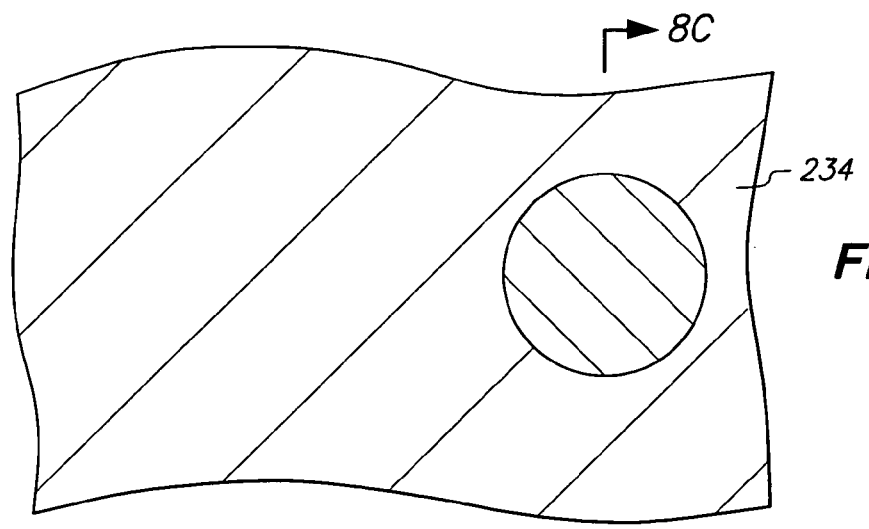
Figure 7C:
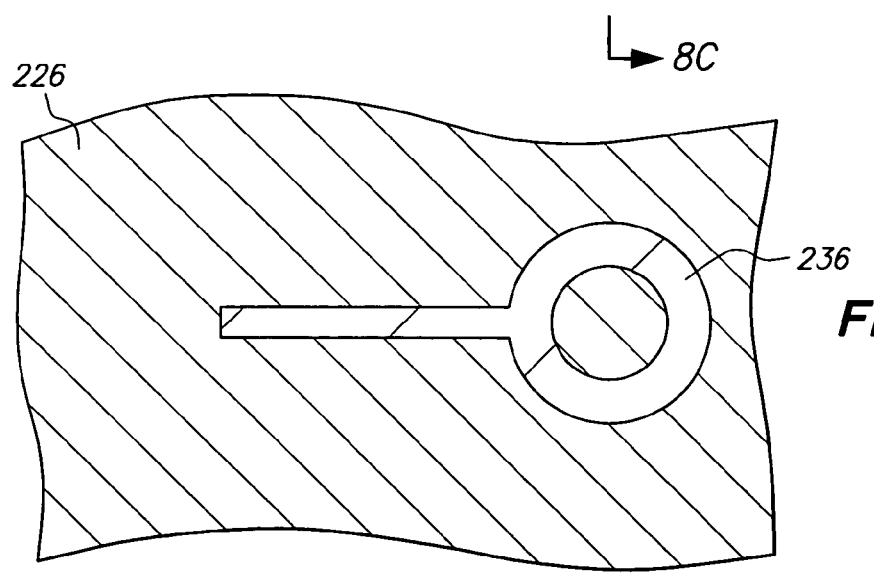
Figure 5D:
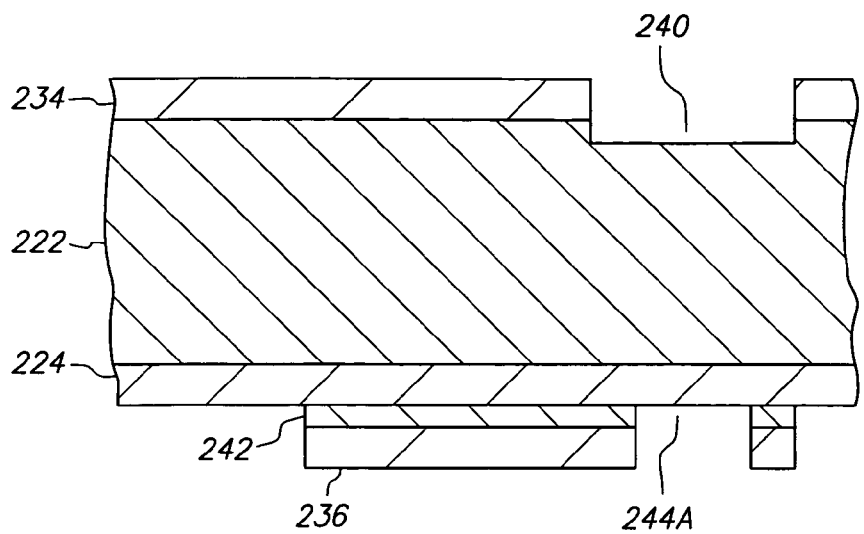
Figure 6D:
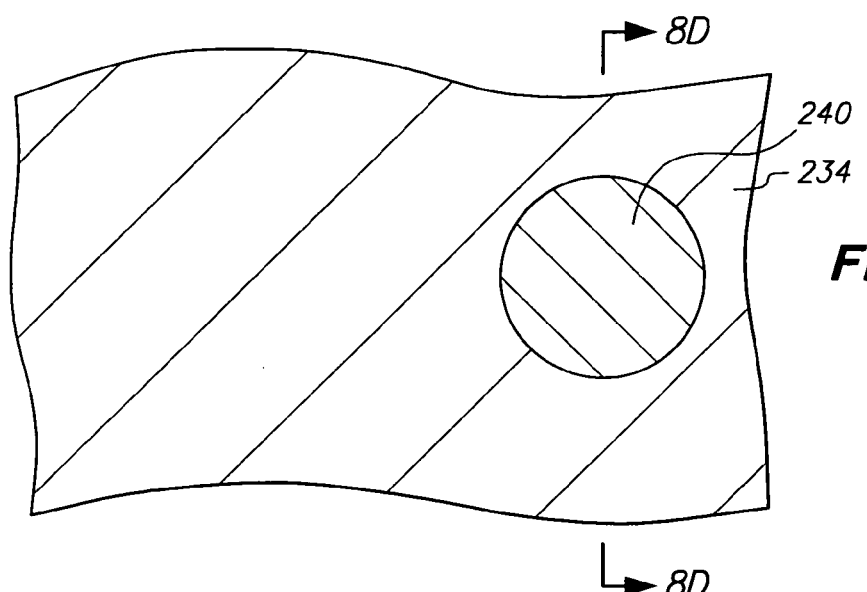
Figure 7D:
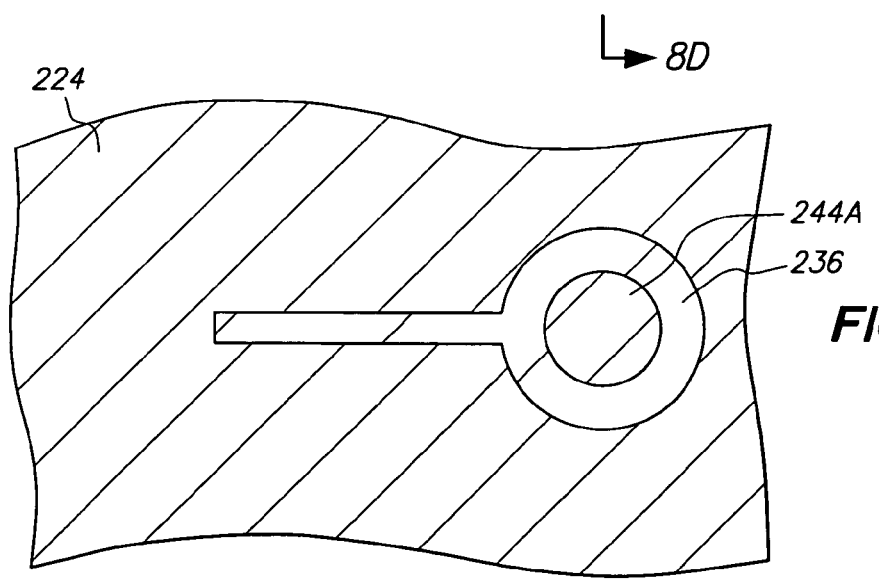
Figure 5E:
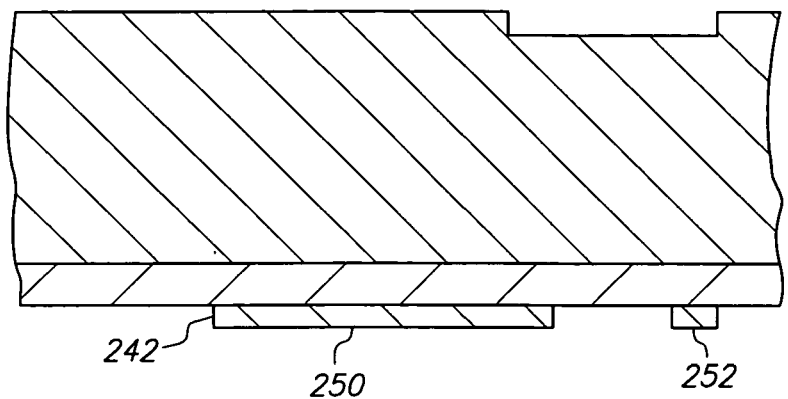
Figure 6E:
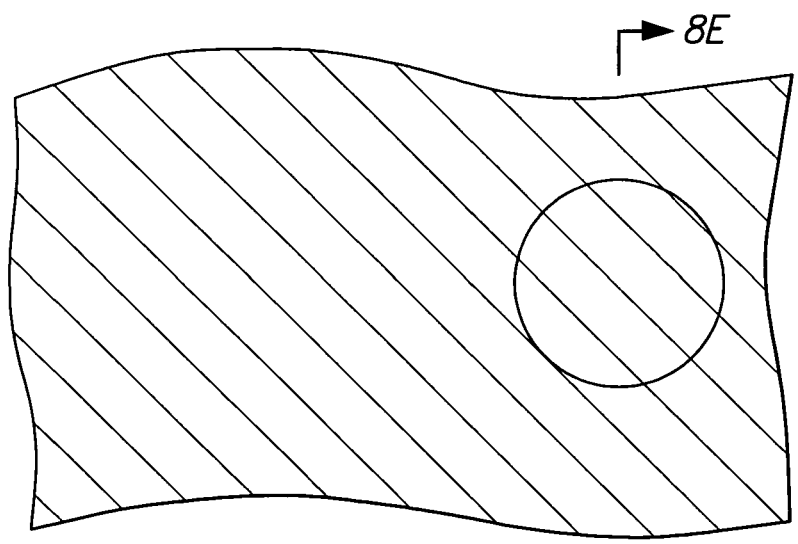
Figure 7E:
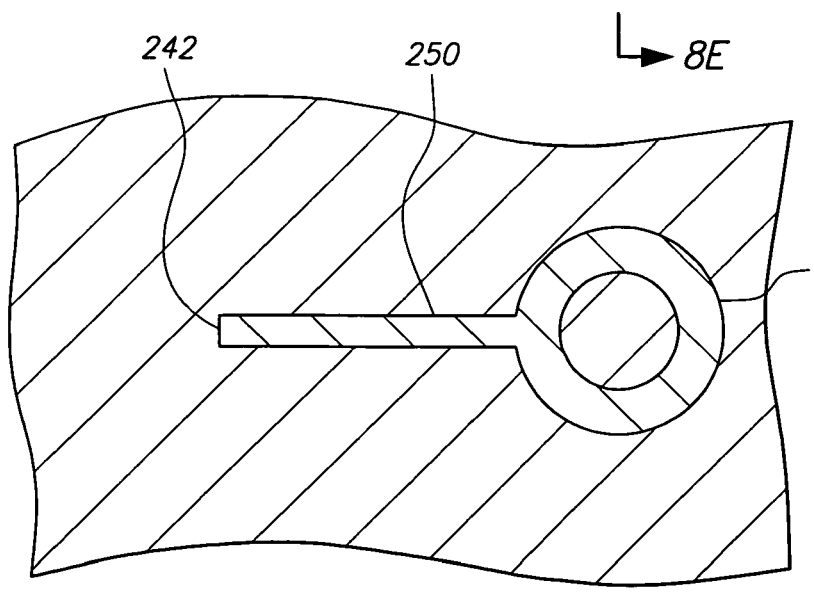
Figure 5F:
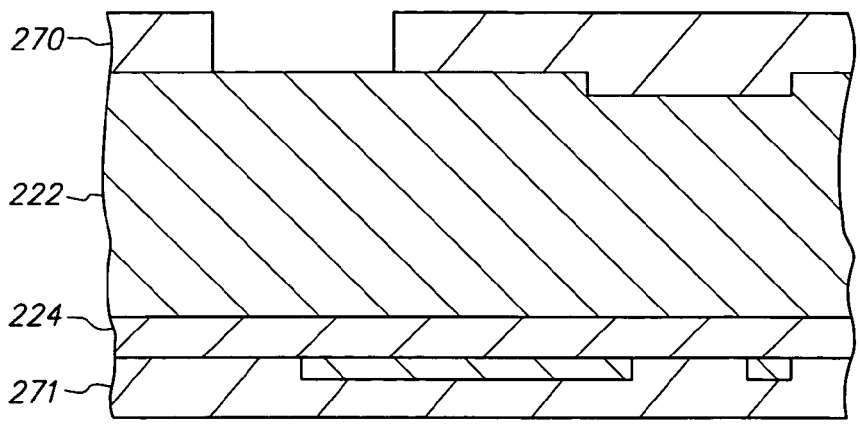
Figure 6F:
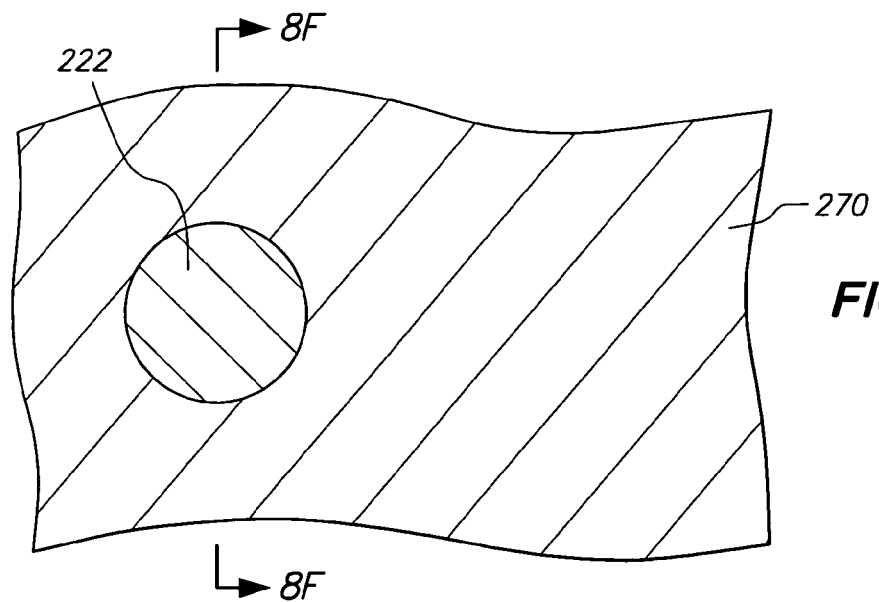
Figure 7F:
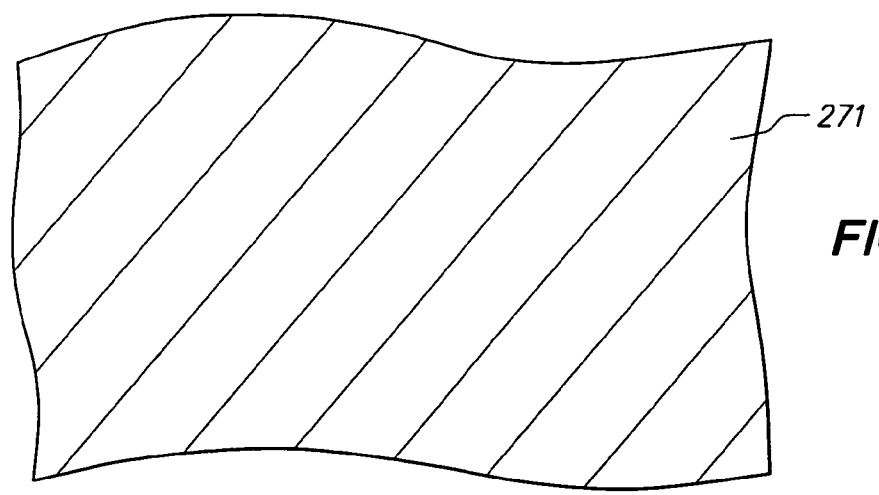
Figure 5G:
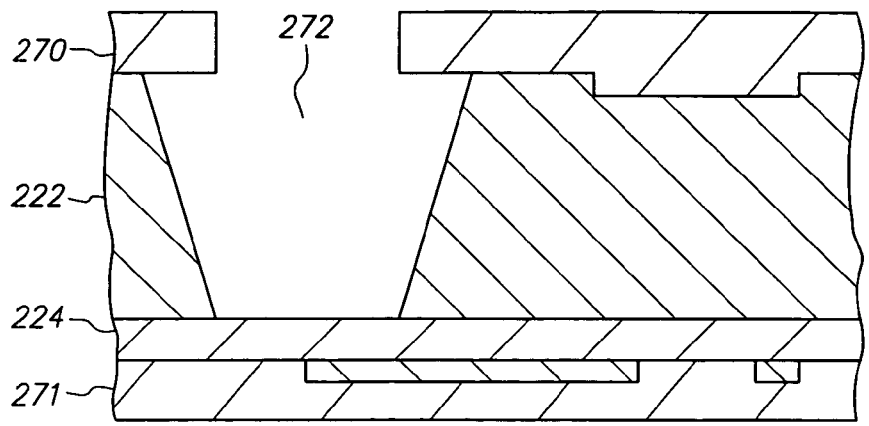
Figure 6G:
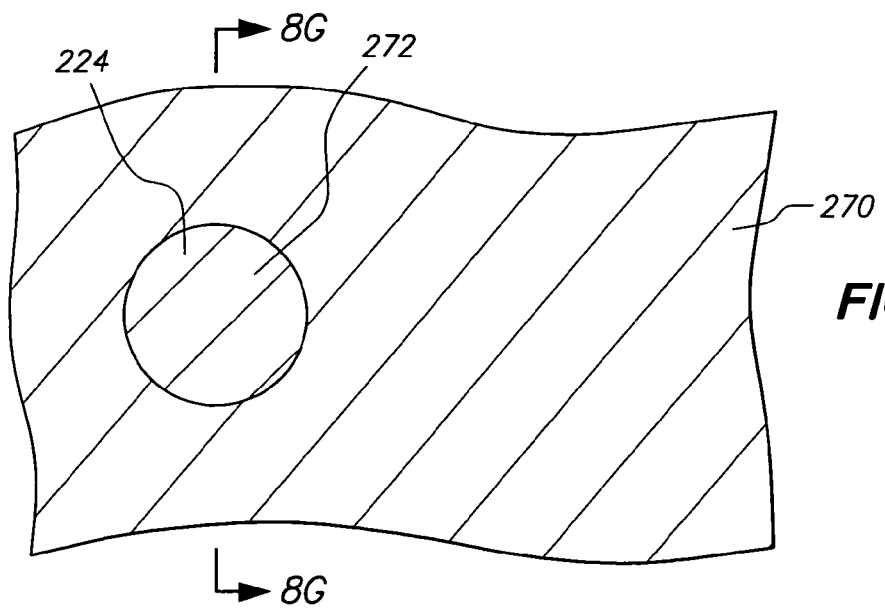
Figure 7G:
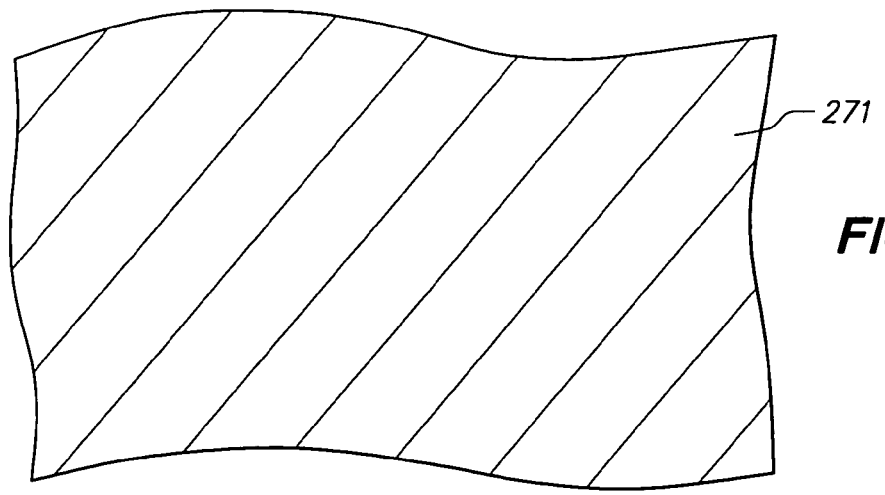
Figure 5H:
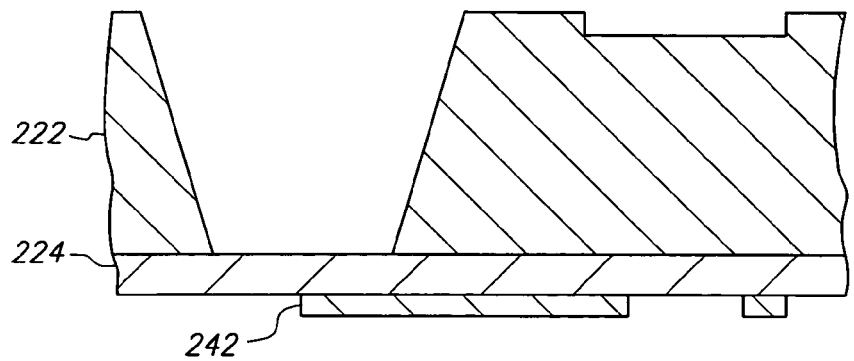
Figure 6H:
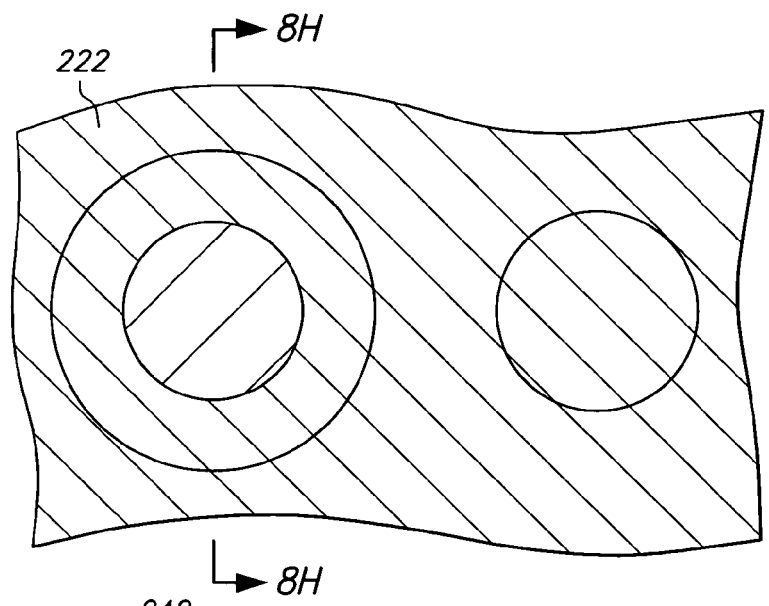
Figure 7H:
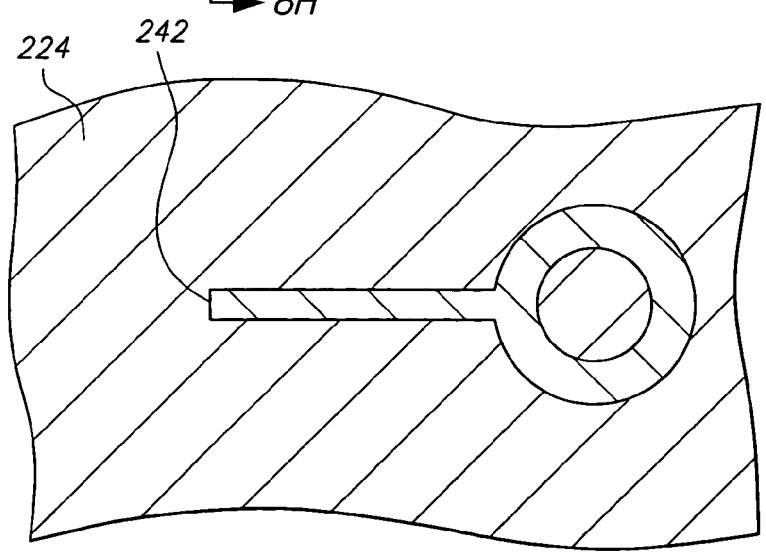
Figure 5I:
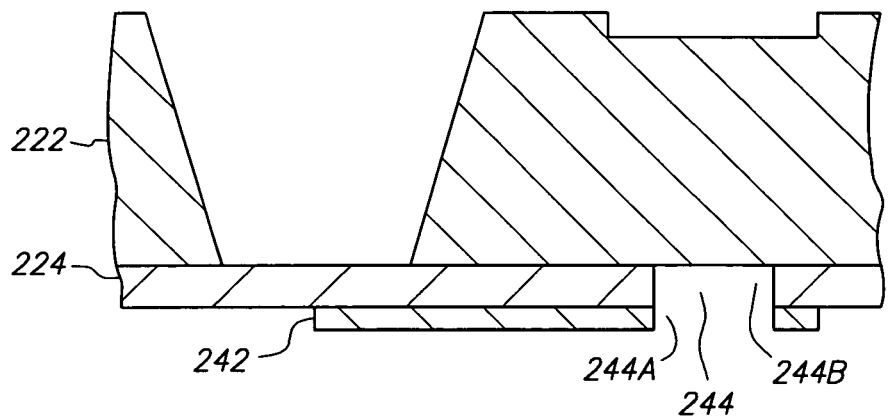
Figure 6I:
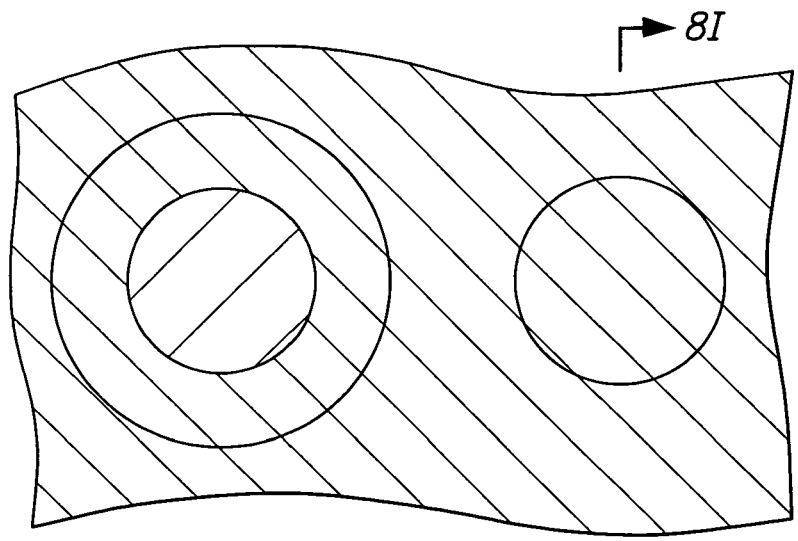
Figure 7I:
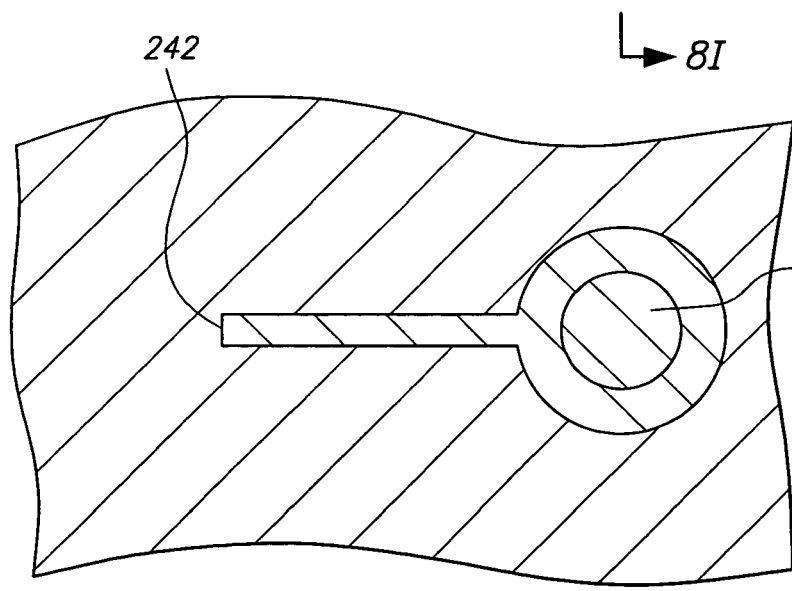
Figure 5J:
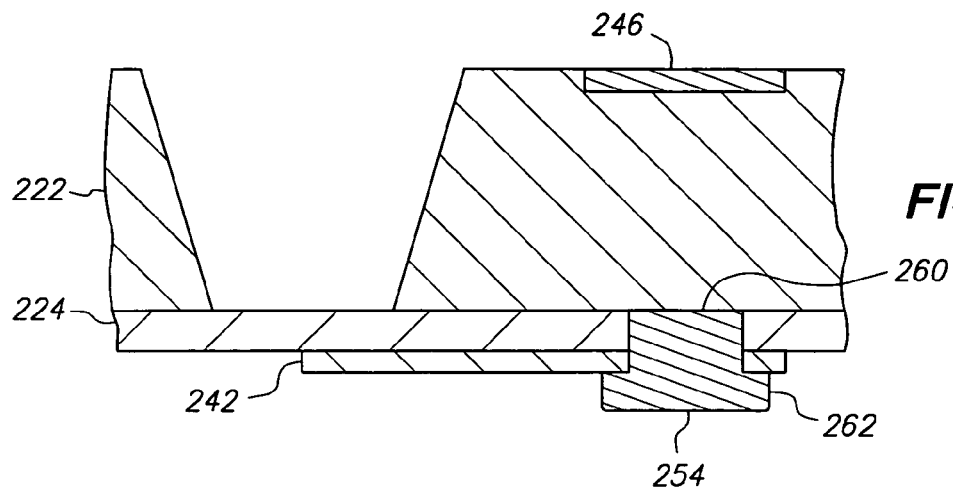
Figure 6J:
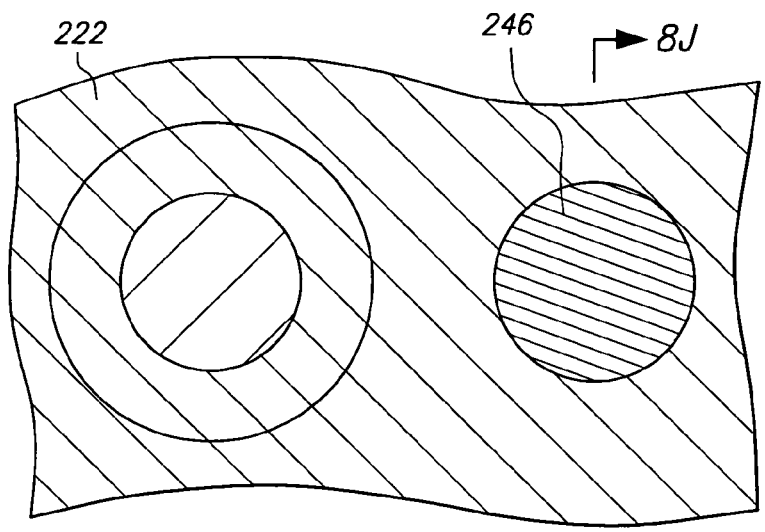
Figure 7J:
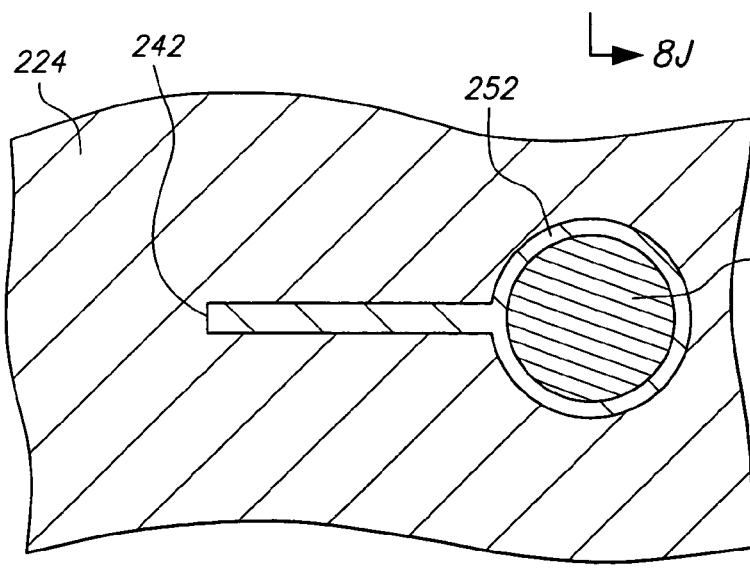
Figure 5K:
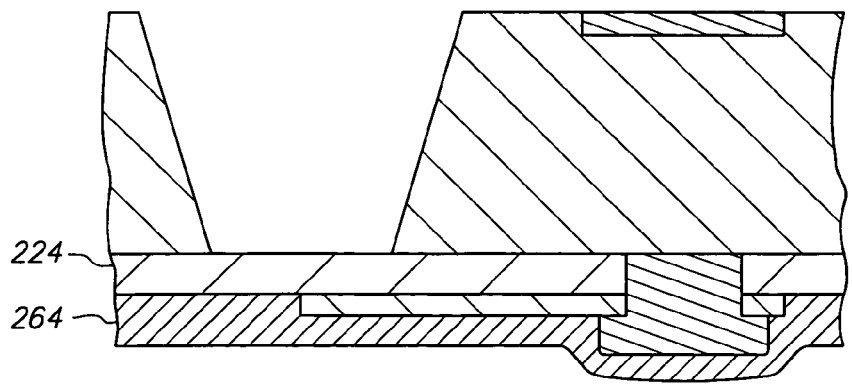
Figure 6K:
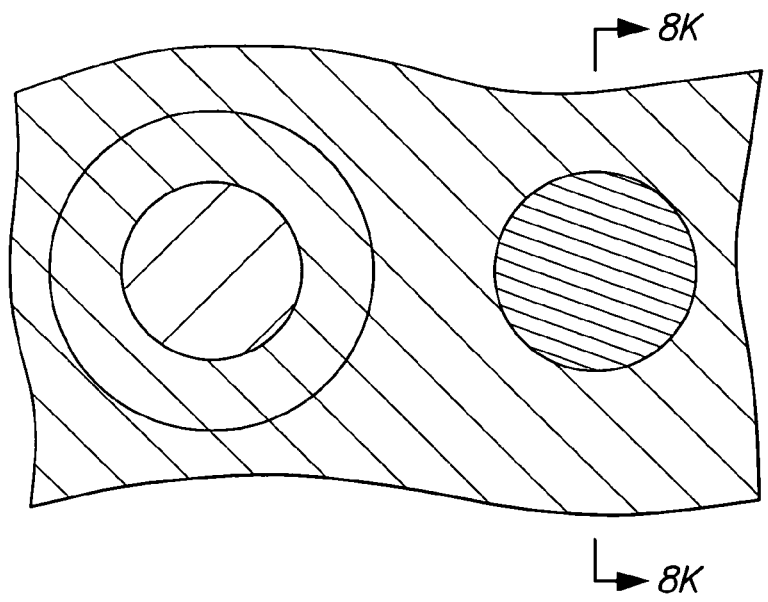
Figure 7K:
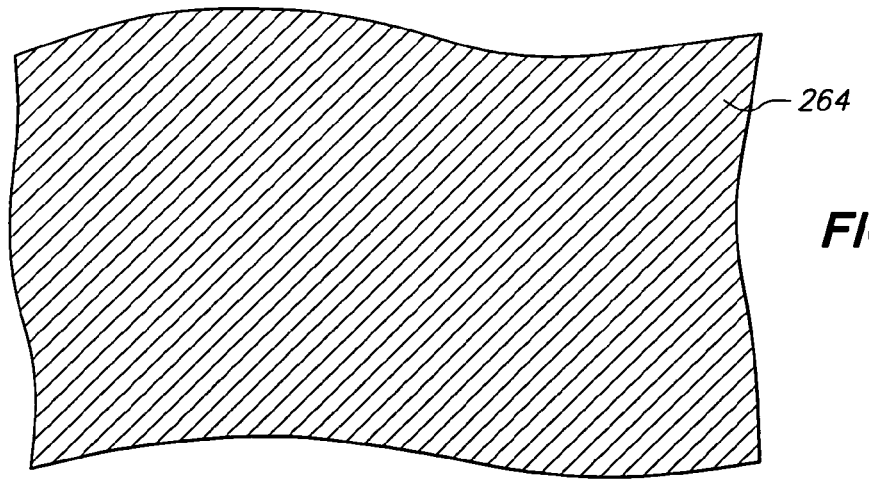
Figure 5L:
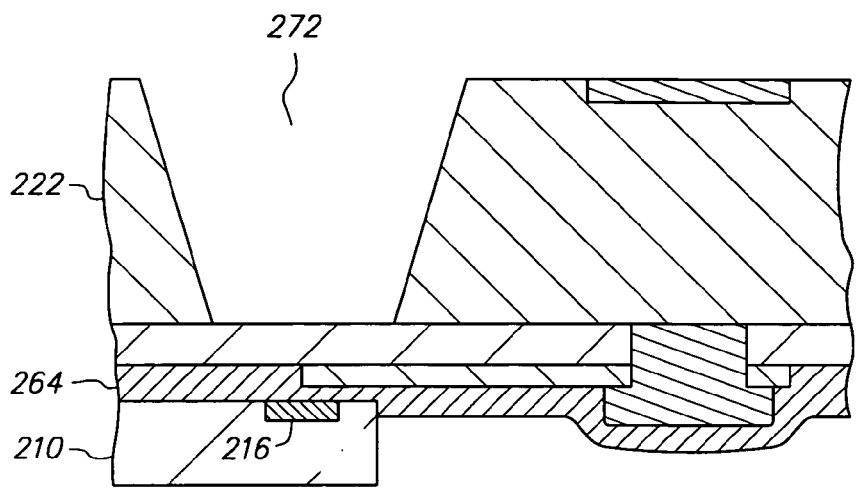
Figure 6L:
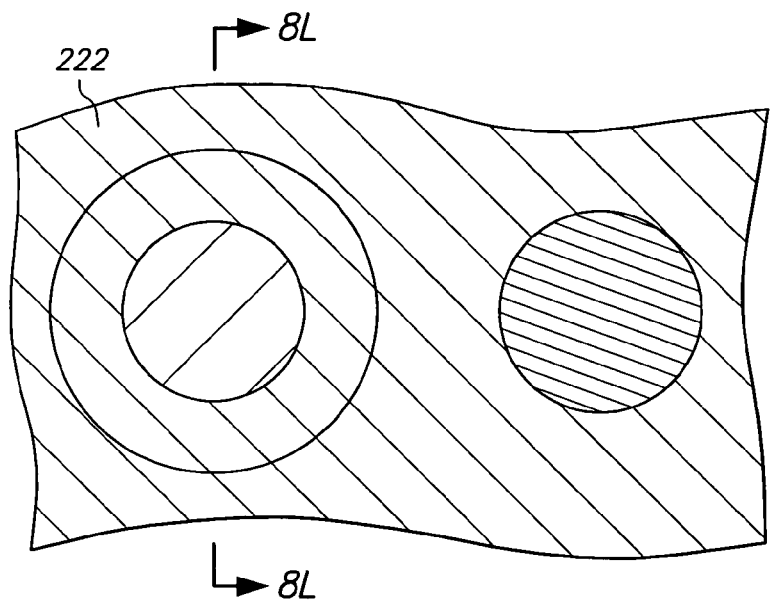
Figure 7L:
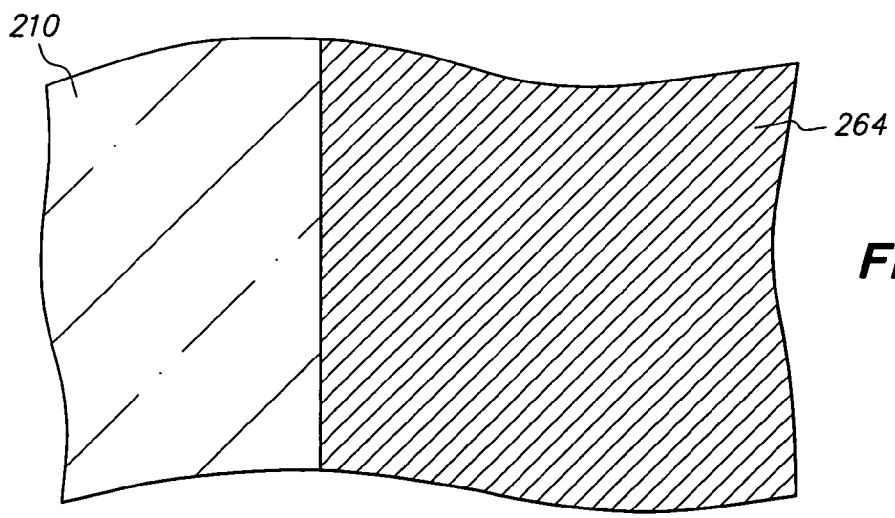
Figure 5M:
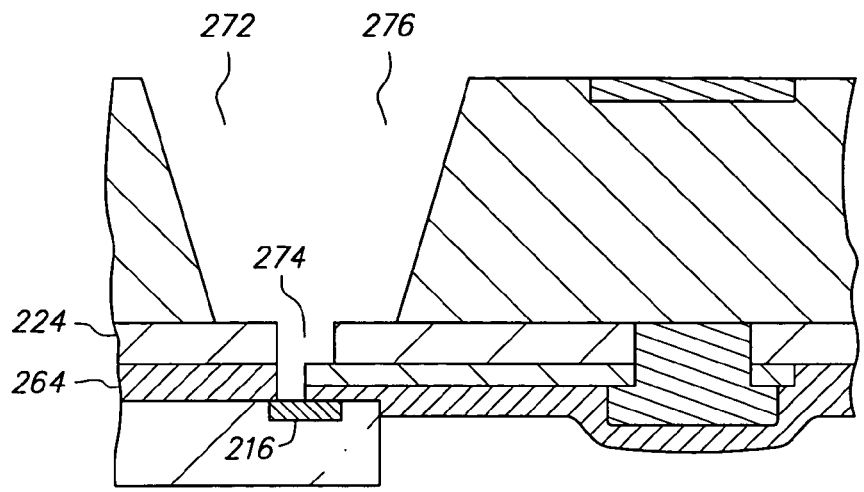
Figure 6M:
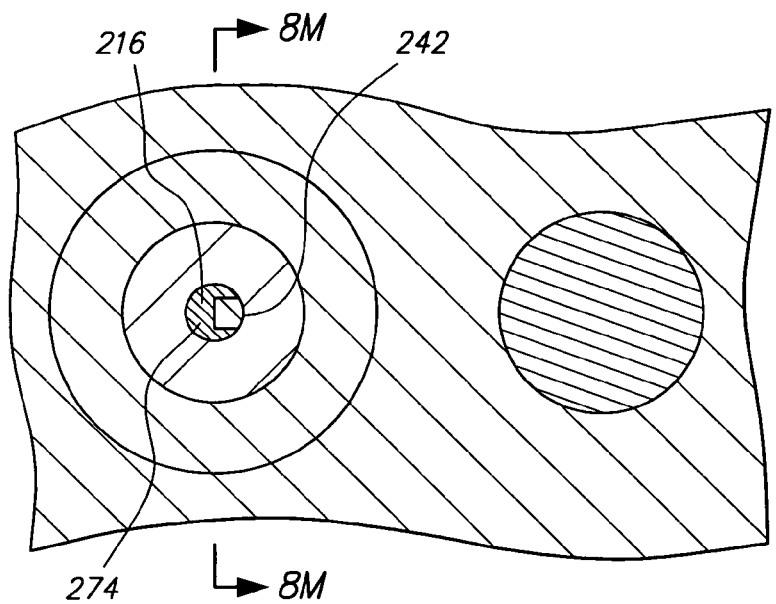
Figure 7M:
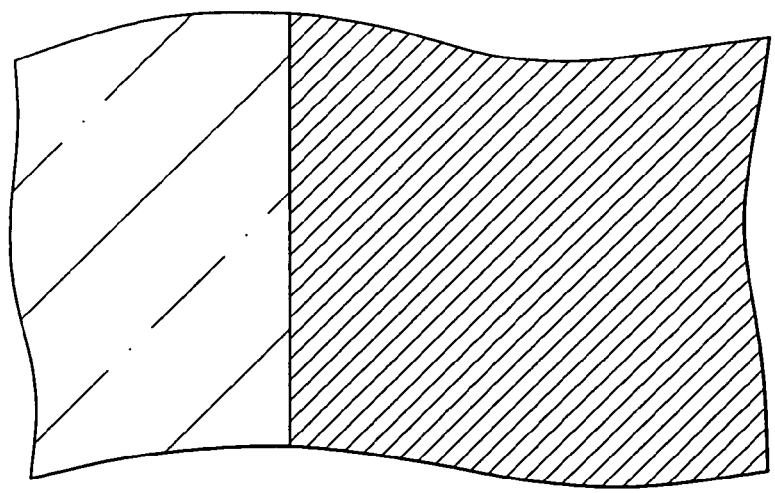
Figure 5N:
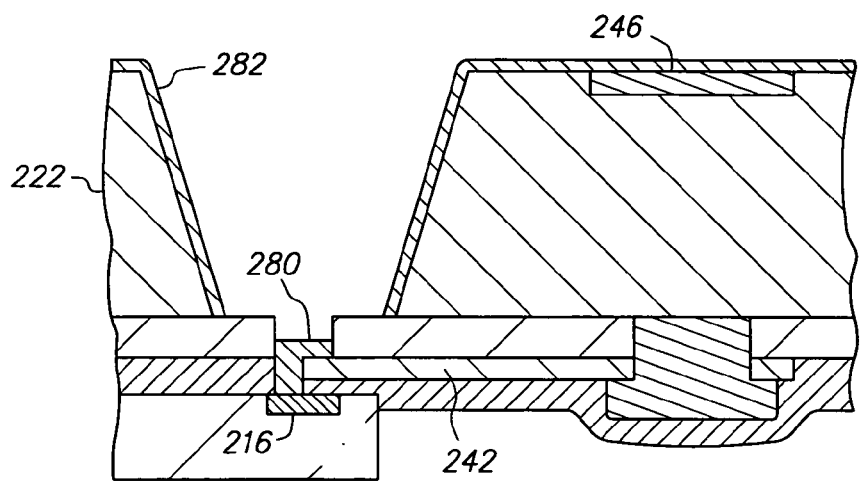
Figure 6N:
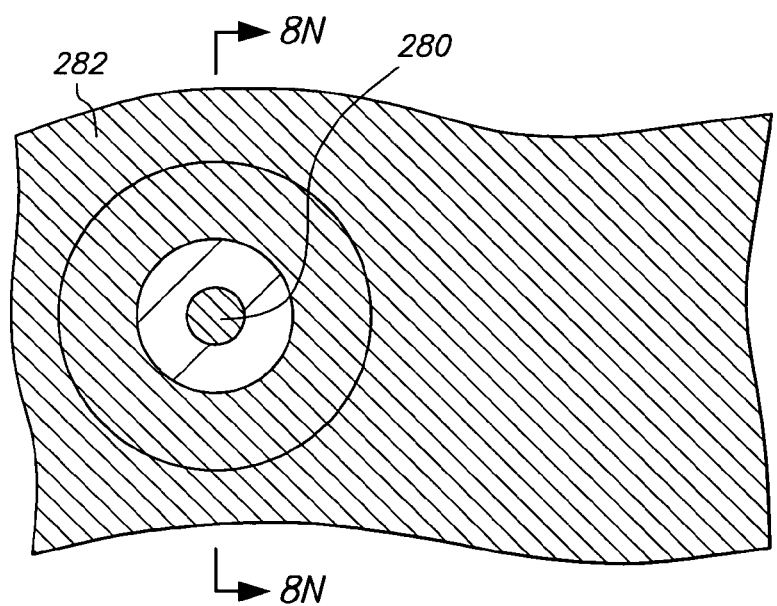
Figure 7N:
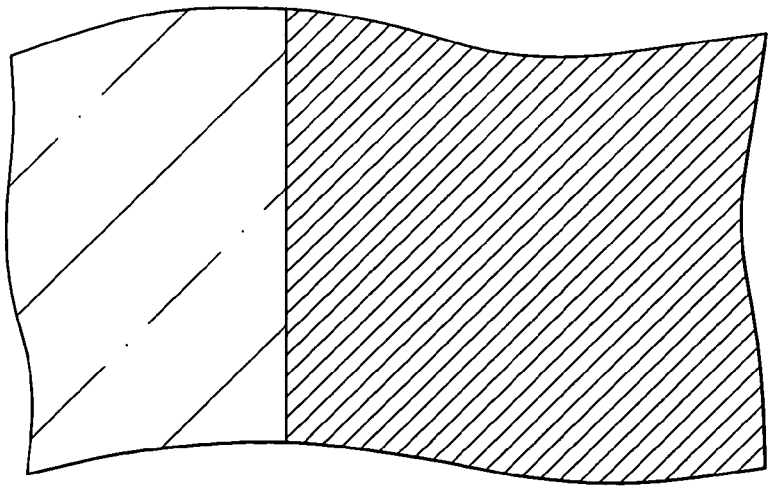
Figure 5O:
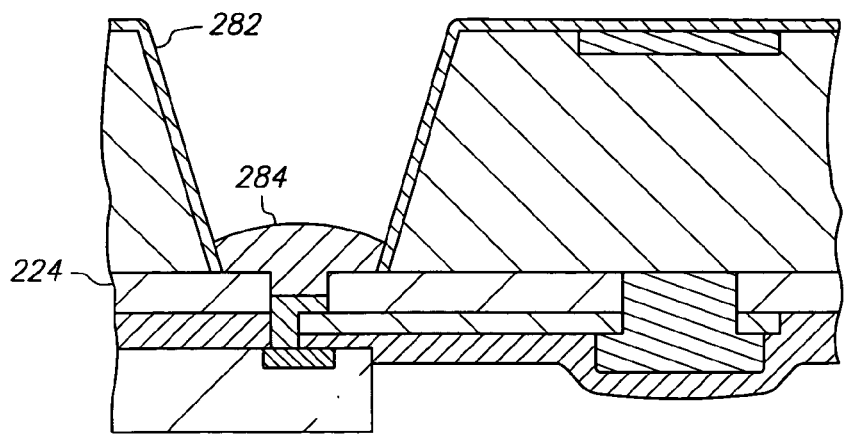
Figure 6O:
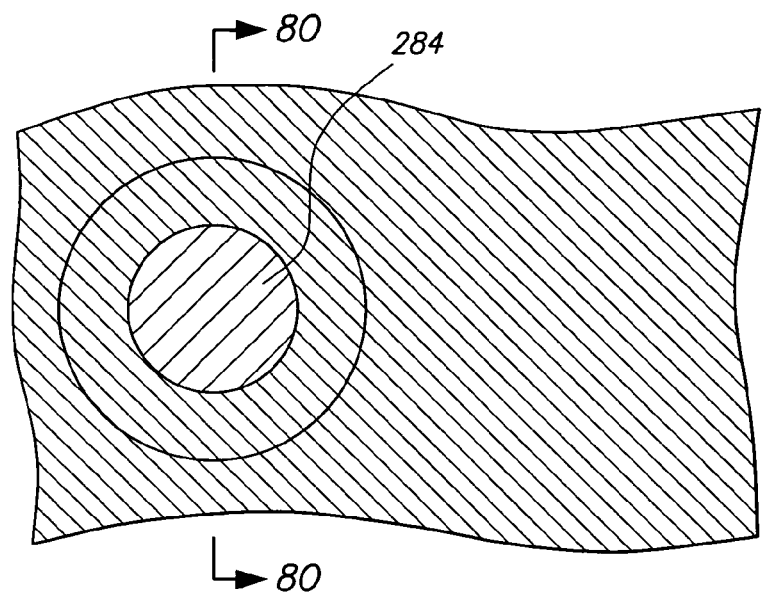
Figure 7O:
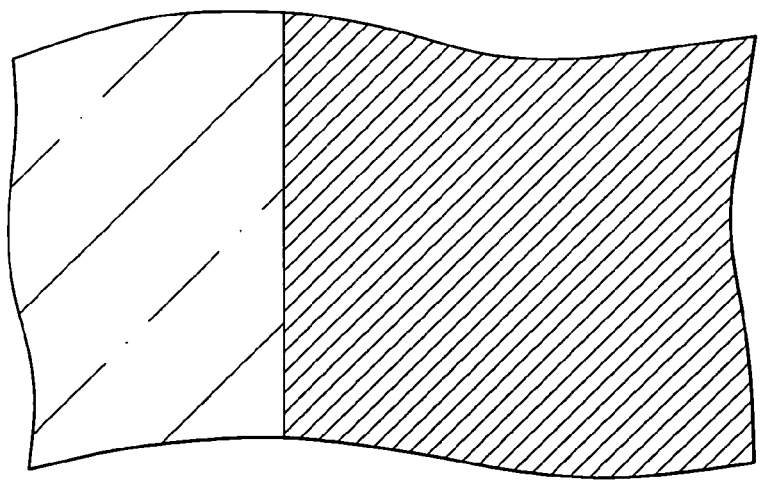
Figure 5P:
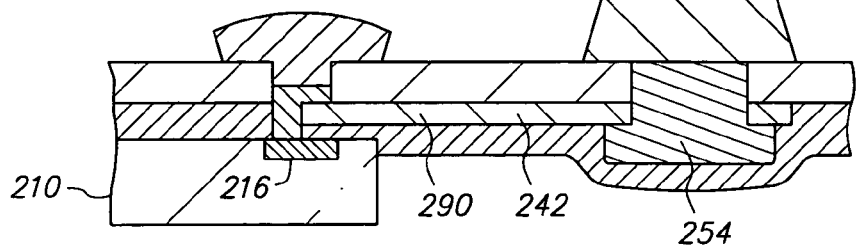
Figure 6P:
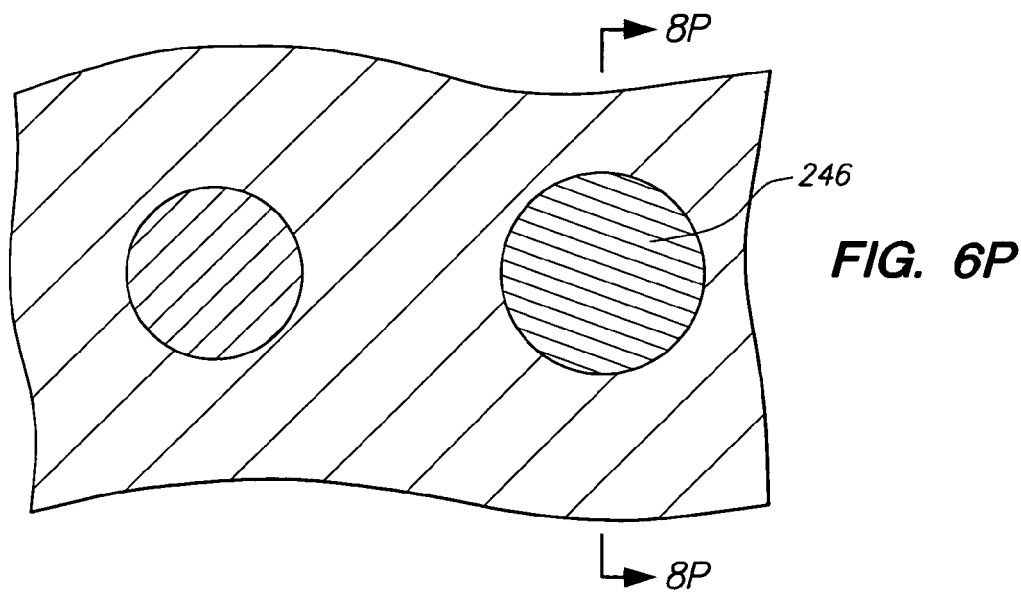
Figure 7P:
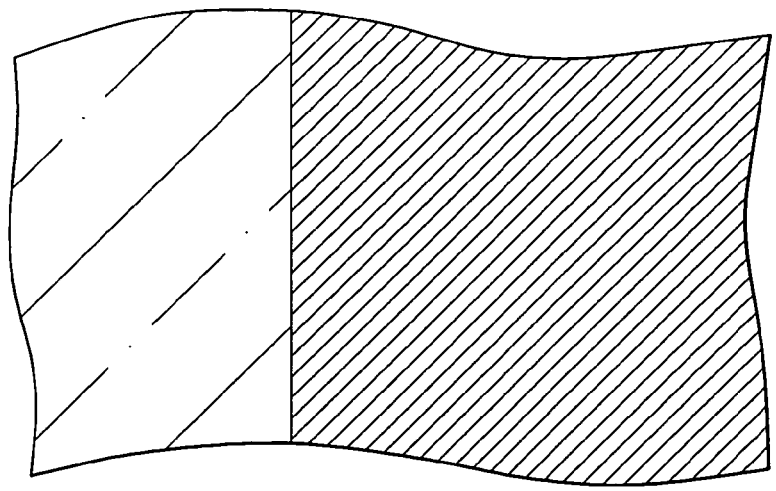
Figure 5Q:
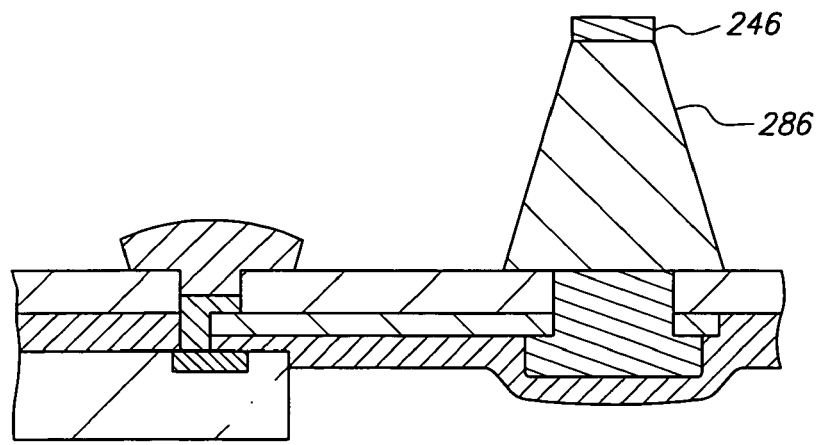
Figure 6Q:
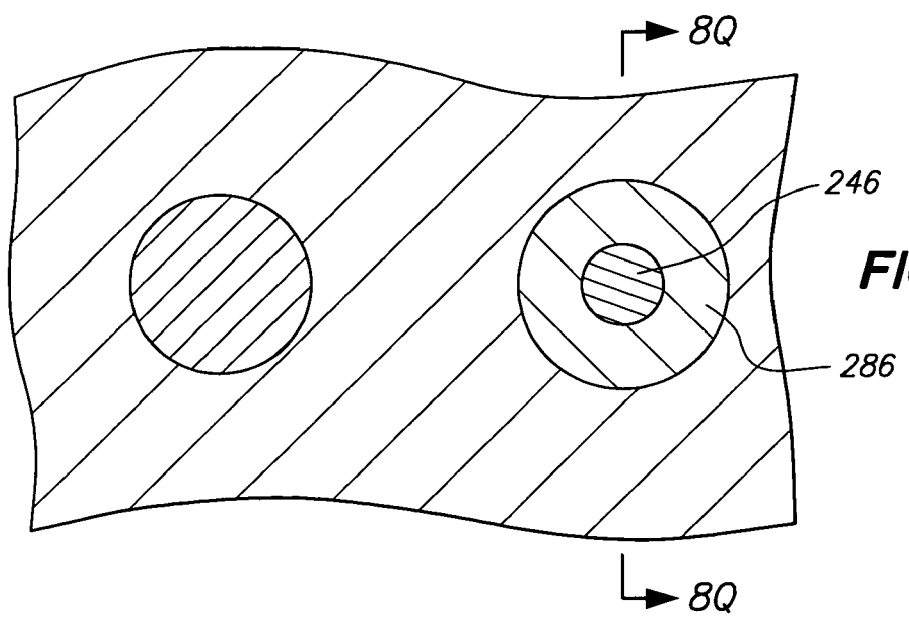
Figure 7Q:
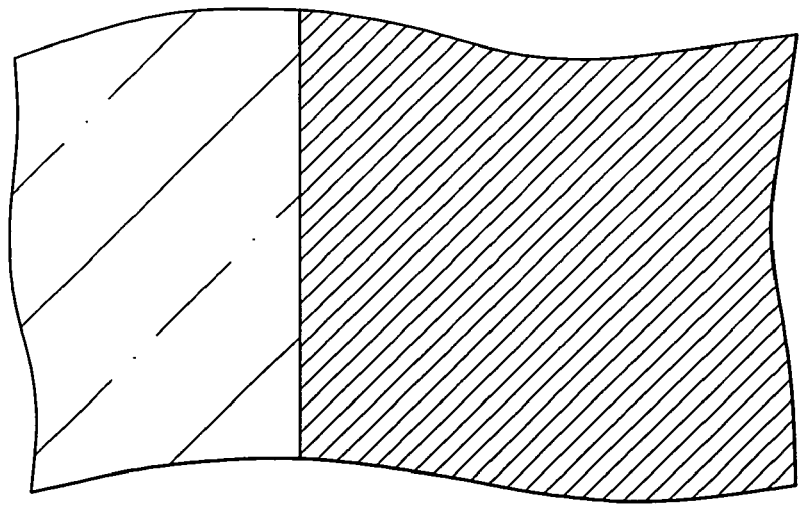
Figure 5R:
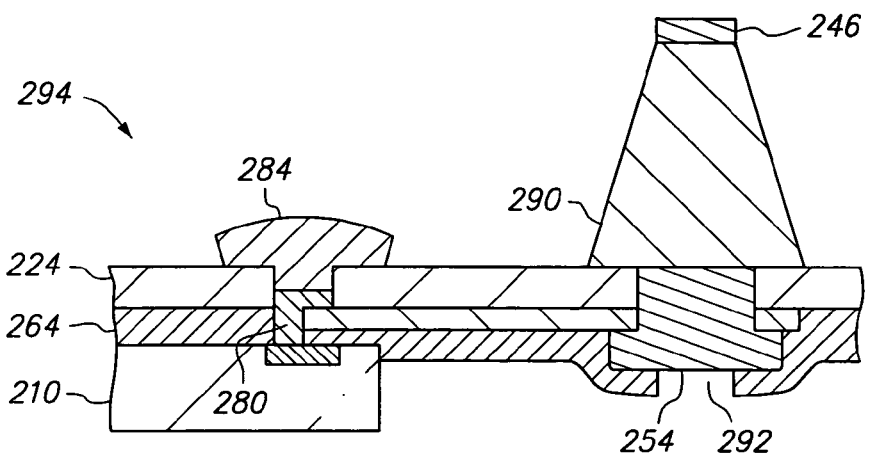
Figure 6R:
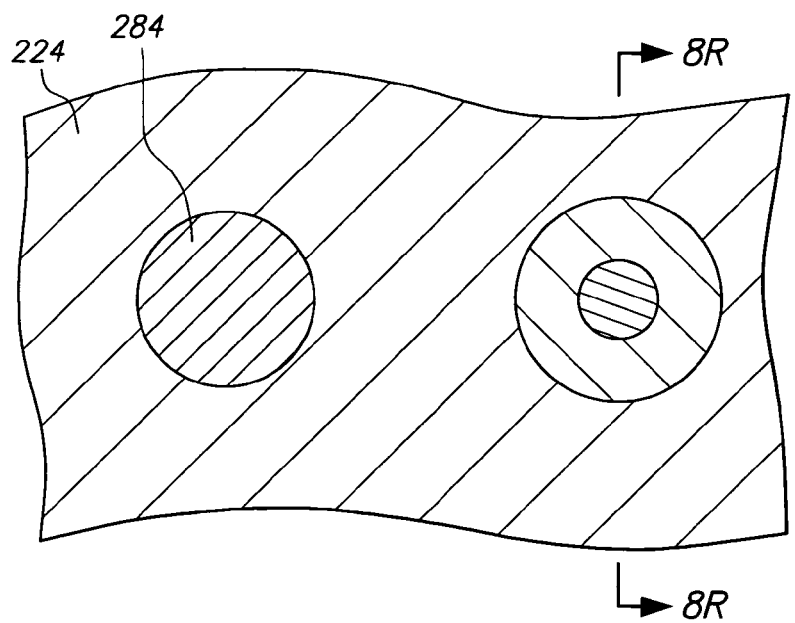
Figure 7R:
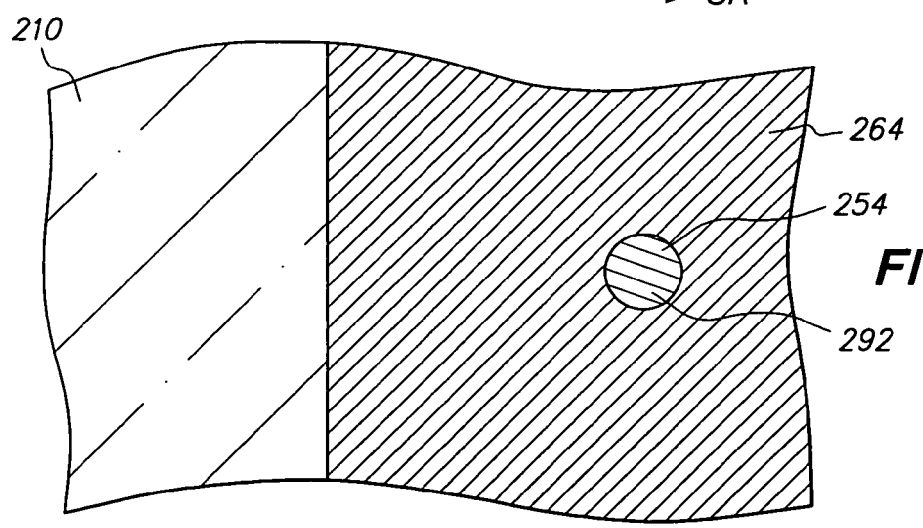

FIGS. 1A–1S, 2A–2S, 3A–3S and 4A–4S are cross-sectional, top, bottom and cross-sectional views, respectively, of a method of making a semiconductor chip assembly in accordance with a first embodiment of the present invention. FIGS. 4A–4S are oriented orthogonally with respect to FIGS. 1A–1S and depict FIGS. 1A–1S as viewed from left-to-right.

FIGS. 1A, 2A, 3A and 4A are cross-sectional, top, bottom and cross-sectional views, respectively, of semiconductor chip 110 which is an integrated circuit in which various transistors, circuits, interconnect lines and the like are formed (not shown). Chip 110 includes opposing major surfaces 112 and 114 and has a thickness of 200 microns between these surfaces. Surface 112 includes conductive pad 116 and passivation layer 118. Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 70 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, pad 116 can be treated to include a surface layer that covers the aluminum base, depending on the nature of a connection joint that shall subsequently contact the surface layer. In this embodiment, an electroplated copper connection joint is used. Therefore, pad 116 is treated to provide a surface layer that will accommodate this connection joint. Pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 can be treated by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, a nickel surface layer is electrolessly deposited on the zincated aluminum base. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

FIGS. 1B, 2B, 3B and 4B are cross-sectional, top, bottom and cross-sectional views, respectively, of laminated structure 120 which includes metal base 122, insulative base 124 and metal layer 126. Laminated structure 120 also includes opposing major surfaces 130 and 132 at metal base 122 and metal layer 126, respectively. Thus, laminated structure 120 is a diclad laminate in which insulative base 124 adhesively attaches metal base 122 and metal layer 126, and metal base 122 and metal layer 126 are separated from one another. Metal base 122 is a copper foil with a thickness of 200 microns, insulative base 124 is a polyimide layer with a thickness of 25 microns, and metal layer 126 is a copper foil with a thickness of 12 microns.

FIGS. 1C, 2C, 3C and 4C are cross-sectional, top, bottom and cross-sectional views, respectively, of photoresist layers 134 and 136 formed on metal base 122 and metal layer 126, respectively. Photoresist layers 134 and 136 are deposited using a dry film lamination process in which hot rolls simultaneously press photoresist layers 134 and 136 onto metal base 122 and metal layer 126, respectively. Reticles (not shown) are positioned proximate to photoresist layers 134 and 136. Thereafter, photoresist layers 134 and 136 are patterned by selectively applying light through the reticles, applying a developer solution to remove the photoresist portions rendered soluble by the light, and then hard baking, as is conventional. As a result, photoresist layer 134 contains an opening that selectively exposes surface 130 of metal base 122, and photoresist layer 136 contains openings that selectively expose surface 132 of metal layer 126. Photoresist layers 134 and 136 each have a thickness of 25 microns.

FIGS. 1D, 2D, 3D and 4D are cross-sectional, top, bottom and cross-sectional views, respectively, of recess 140 formed in metal base 122, routing line 142 formed from metal layer 126, and first via portion 144A formed through metal layer 126 by wet chemical etching using photoresist layers 134 and 136 as etch masks. In particular, the structure is dipped in a wet chemical etch that provides a front-side etch through the opening in photoresist layer 134 to the exposed portion of surface 130 and a back-side etch through the openings in photoresist layer 136 to the exposed portions of surface 132. The structure is submerged in the wet chemical etch long enough to etch 15 microns into metal base 122 and to etch completely through metal layer 126. The wet chemical etch etches partially through metal base 122 and completely through metal layer 126, thereby effecting a pattern transfer of photoresist layers 134 and 136 onto metal base 122 and metal layer 126, respectively. Thus, routing line 142 constitutes a remaining or unetched portion of metal layer 126 after the wet chemical etch is applied. The front-side and back-side etches are applied simultaneously, and recess 140, routing line 142 and first via portion 144A are formed simultaneously.

The wet chemical etch is highly selective of copper with respect to polyimide, and therefore, after the wet chemical etch etches through metal layer 126 and contacts insulative base 124, no appreciable amount of insulative base 124 is removed.

A suitable wet chemical etch can be provided by a solution containing alkaline ammonia. The optimal etch time for exposing metal base 122 and metal layer 126 to the wet chemical etch to provide the desired depth for recess 140 without significantly undercutting routing line 142 can be established through trial and error.

FIGS. 1E, 2E, 3E and 4E are cross-sectional, top, bottom and cross-sectional views, respectively, of solder 146 deposited in recess 140 using photoresist layer 134 as a plating mask.

Solder 146 is formed by an electroplating operation. Initially, metal base 122 is connected to a plating bus (not shown), current is applied to the plating bus from an external power source, and the structure is submerged in an electrolytic solder plating solution such as Technic Solder NF 72 BC at room temperature to electroplate solder 146 in recess 140. Thereafter, the structure is removed from the electrolytic solder plating solution and rinsed in distilled water to remove contaminants.

The solder does not deposit on routing line 142. To elaborate, insulative base 124 is an electrical insulator, and therefore cannot supply current from the plating bus to generate electroplating. Metal base 122 is connected to the plating bus, however routing line 142 is electrically isolated from metal base 122 by insulative base 124.

FIGS. 1F, 2F, 3F and 4F are cross-sectional, top, bottom and cross-sectional views, respectively, of the structure after photoresist layers 134 and 136 are stripped. Photoresist layers 134 and 136 are removed using a solvent, such as a mild alkaline solution with a pH of 9, that is highly selective of photoresist with respect to copper, polyimide and solder. Therefore, no appreciable amount of metal base 122, insulative base 124, routing line 142 or solder 146 is removed.

Recess 140 has a diameter of 400 microns and a depth of 15 microns. Solder 146 fills recess 140 and is aligned with surface 130 of metal base 122. Thus, solder 146 has a diameter of 400 microns and a thickness of 15 microns.

Routing line 142 includes elongated routing region 150 with a width (orthogonal to its elongated length) of 40 microns, and enlarged annular region 152 with an inner diameter of 200 microns and an outer diameter of 400 microns. First via portion 144A is axially aligned with and centered within enlarged annular region 152 and has a diameter of 200 microns. Thus, enlarged annular region 152 has a width between its inner and peripheral sidewalls of 100 microns ((400−200)/2). Furthermore, enlarged annular region 152 is axially aligned with solder 146, and first via portion 144A is axially aligned with and centered relative to solder 146. Routing line 142 has a thickness of 12 microns, and first via portion 144A extends through routing line 142 and extends to but not into insulative base 124 and has a depth of 12 microns.

FIGS. 1G, 2G, 3G and 4G are cross-sectional, top, bottom and cross-sectional views, respectively, of the structure after via 144 is formed through insulative base 124 and routing line 142. A portion of insulative base 124 exposed by first via portion 144A is selectively removed to form second via portion 144B in insulative base 124. The combination of via portions 144A and 144B forms via 144 that exposes metal base 122.

Second via portion 144B is formed by applying a suitable etch that is highly selective of insulative base 124 with respect to metal base 122 and routing line 142. In this instance, a selective TEA $CO_2$ laser etch is applied using multiple laser direct writes. The laser is aimed at first via portion 144A and ablates insulative base 124 exposed by first via portion 144A. The laser has a spot size of 150 microns and first via portion 144A has a diameter of 200 microns. Therefore, the laser direct writes are offset relative to one another yet overlap so that the laser scans all of first via portion 144A. The laser also strikes enlarged annular region 152 but does not strike insulative base 124 outside and adjacent to enlarged annular region 152.

Thereafter, a brief oxygen plasma cleaning step can be applied to metal base 122 exposed by via 144. Alternatively, a brief wet chemical cleaning step using a solution containing potassium permanganate can be applied to metal base 122 exposed by via 144. The use of oxygen plasmas and chemical solutions to clean copper surfaces in semiconductor chip assemblies is well-known in the art.

Second via portion 144B has a diameter of 200 microns, is axially aligned with first via portion 144A, extends through insulative base 124 and extends to but not into metal base 122 and has a depth of 25 microns. Furthermore, enlarged annular region 152 shields the underlying insulative base 124 from the laser etch so that the portion of insulative base 124 sandwiched between metal base 122 and routing line 142 remains intact. Second via portion 144B is formed in insulative base 124 without damaging metal base 122 or routing line 142.

Second via portion 144B may extend slightly beneath enlarged annular region 152 and have a diameter that is slightly larger than 200 microns due to the beam angle of the laser, the thermal effects of the laser, and/or the isotropic nature of the oxygen plasma or wet chemical cleaning step. For convenience of explanation, this slight enlargement is ignored.

Via 144 has a diameter of 200 microns, is axially aligned with and centered relative to solder 146 and enlarged annular region 152, extends through routing line 142 and insulative base 124 and extends to but not into metal base 122 and has a depth of 37 microns (12+25).

FIGS. 1H, 2H, 3H and 4H are cross-sectional, top, bottom and cross-sectional views, respectively, of interconnect 154, metal layer 156 and metal layer 158 formed on the structure. Interconnect 154 is formed on metal base 122 and routing line 142 in via 144. Metal layer 156 is formed on metal base 122 outside via 144 and on solder 146. Metal layer 158 is formed on routing line 142 outside via 144. Interconnect 154 and metal layer 158 are contiguous with one another and spaced from metal layer 156.

Interconnect 154 extends through insulative base 124 and routing line 142 in via 144, extends to but not into metal base 122 at via 144, and contacts and electrically connects metal base 122 and routing line 142 at via 144.

Interconnect 154, metal layer 156 and metal layer 158 are composed of copper. Interconnect 154 has an inverted bowl-shape that includes cylindrical base 160 and annular rim 162. Cylindrical base 160 has a thickness of 30 microns and a diameter of 200 microns, annular rim 162 has a width between its inner and peripheral sidewalls of 5 microns, an inner diameter of 190 microns (200−5−5) and an outer diameter of 200 microns, metal layer 156 has a thickness of 30 microns, and metal layer 158 has a thickness of 5 microns.

Interconnect 154, metal layer 156 and metal layer 158 are formed by an electroplating operation. Initially, metal base 122 is connected to a plating bus (not 30 shown), current is applied to the plating bus from an external power source, and the structure is submerged in an electrolytic copper plating solution such as Sel-Rex CUBATH M™ at room temperature.

At the initial stage, interconnect 154 is deposited on metal base 122 in via 144, and metal layer 156 is deposited on metal base 122 outside via 144 and on solder 146. However, interconnect 154 and metal layer 158 do not deposit on insulative base 124 or routing line 142 since insulative base 124 is an electrical insulator and therefore cannot supply current from the plating bus to generate electroplating, routing line 142 is not connected to the plating bus, and interconnect 154 does not extend across insulative base 124 or contact routing line 142.

The copper electroplating operation continues, and as during the initial stage, metal base 122 receives current from the plating bus and the structure is submerged in the electrolytic copper plating solution. Interconnect 154 continues to plate on metal base 122 and expand axially in via 144 towards routing line 142, and metal layer 156 continues to plate on metal base 122 and solder 146. Eventually interconnect 154 and metal layer 156 reach a thickness of 25 microns. At this stage, interconnect 154 consists of cylindrical base 160, metal layer 156 covers metal base 122 and solder 146, and metal layer 158 and annular rim 162 are non-existent. However, unlike the initial stage, interconnect 154 extends through insulative base 124 and contacts routing line 142 in via 144. As a result, routing line 142 is connected to the plating bus by metal base 122 and interconnect 154. Therefore, as the copper electroplating operation continues, interconnect 154 begins to plate on routing line 142 in via 144 and metal layer 158 begins to plate on routing line 142 outside via 144. The copper electroplating operation deposits another 5 microns of copper on the structure after the plating begins on routing line 142. As a result, cylindrical base 160 increases in thickness from 25 to 30 microns, metal layer 156 increases in thickness from 25 to 30 microns, metal layer 158 forms with a thickness of 5 microns, and annular rim 162 forms with a width of 5 microns. Thereafter, the structure is removed from the electrolytic copper plating solution and rinsed in distilled water to remove contaminants.

FIGS. 1I, 2I, 3I and 4I are cross-sectional, top, bottom and cross-sectional views, respectively, of adhesive 164 formed on insulative base 124, interconnect 154 and metal layer 158. Adhesive 164 may include an organic surface protectant such as HK 2000 which is promptly applied to the structure after interconnect 154 and metal layers 156 and 158 are formed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is applied over a predetermined portion of the structure using stencil printing. The liquid resin flows over insulative base 124, interconnect 154 and metal layer 158. Adhesive 164 has a thickness of 50 microns as measured from insulative base 124 outside metal layer 158. Adhesive 164 does not contact metal base 122 or metal layer 156.

For convenience of illustration, adhesive 164 is shown below insulative base 124 to retain a single orientation throughout the figures for ease of comparison between the figures, although in this step the structure would be inverted so that gravitational force would assist the liquid resin flow.

FIGS. 1J, 2J, 3J and 4J are cross-sectional, top, bottom and cross-sectional views, respectively, of chip 110 mechanically attached to laminated structure 120 by adhesive 164. Adhesive 164 is disposed between and contacts chip 110 and insulative base 124, and likewise, adhesive 164 is disposed between and contacts chip 110 and metal layer 158. Thus, chip 110 and insulative base 124 do not contact one another, and chip 110 and metal layer 158 do not contact one another.

Preferably, adhesive 164 is sandwiched between chip 110 and laminated structure 120 using relatively low pressure while a pick-up head that places chip 110 on adhesive 164 is heated to a relatively low temperature such as 150° C. so that adhesive 164 is partially polymerized (B stage) and forms a gel but is not fully cured. In addition, chip 110 and routing line 142 are positioned relative to one another so that routing line 142 is disposed above and overlaps and is electrically isolated from pad 116. In particular, routing line 142 (and metal layer 158) overlaps the center of pad 116 and one peripheral edge of pad 116 (but not the other three peripheral edges of pad 116), and the peripheral sidewalls of routing line 142 (and metal layer 158) overlap pad 116. Chip 110 and routing line 142 can be aligned using an automated pattern recognition system. Thereafter, the structure is placed in an oven and adhesive 164 is fully cured (C stage) at relatively low temperature in the range of 200 to 250° C. to form a solid adhesive insulative thermosetting polyimide layer that is 5 microns thick between chip 110 and metal layer 158 and mechanically fastens chip 110 to routing line 142.

At this stage, insulative base 124 and interconnect 154 are covered from above by metal base 122, routing line 142 is covered from above by insulative base 124 and covered from below by metal layer 158, interconnect 154 and metal layer 158 are covered from below by adhesive 164, pad 116 is covered from above by adhesive 164, pad 116 is separated from metal layer 158 by the thickness of adhesive 164, and pad 116 is separated from routing line 142 by the thickness of metal layer 158 and adhesive 164.

FIGS. 1K, 2K, 3K and 4K are cross-sectional, top, bottom and cross-sectional views, respectively, of etch ink 170 formed on metal layer 156. Etch ink 170 is deposited as a liquid resin (A stage) using stencil printing. Thereafter, the liquid resin is cured or hardened at relatively low temperature of about 120° C. to form a solid epoxy layer. Etch ink 170 contains an opening that selectively exposes a portion of metal layer 156. Furthermore, the opening is above pad 116. Etch ink 170 has a thickness of 50 microns.

FIGS. 1L, 2L, 3L and 4L are cross-sectional, top, bottom and cross-sectional views, respectively, of the structure after portions of metal base 122 and metal layer 156 are selectively removed to form opening 172 in metal base 122 and metal layer 156 that exposes insulative base 124. Opening 172 is formed by applying a wet chemical etch to metal base 122 and metal layer 156 using etch ink 170 as an etch mask.

The wet chemical etch can be sprayed on metal layer 156, or the structure can be dipped in the wet chemical etch since routing line 142, interconnect 154 and metal layer 158 are protected by insulative base 124 and adhesive 164.

The wet chemical etch etches completely through metal base 122 and metal layer 156, thereby effecting a pattern transfer of etch ink 170 onto metal base 122 and metal layer 156. The wet chemical etch is highly selective of copper with respect to polyimide. Therefore, no appreciable amount of insulative base 124 or adhesive 164 is removed.

The wet chemical etch removes portions of metal base 122 and metal layer 156 that overlap pad 116. However, the wet chemical etch does not remove portions of metal base 122 and metal layer 156 that overlap via 144 or interconnect 154.

A suitable wet chemical etch can be provided by the same solution used for etching metal base 122 and metal layer 126 to form recess 140 and routing line 142. The optimal etch time for exposing the structure to the wet chemical etch in order to form opening 172 with the desired dimensions can be established through trial and error.

Opening 172 has a diameter at insulative base 124 of 700 microns, a diameter at metal layer 156 of 1000 microns, and tapered sidewalls therebetween that slant inwardly as the vertical distance from the open end increases due to the isotropic nature of the wet chemical etch. Thus, opening 172 has a diameter between 700 to 1000 microns.

Opening 172 overlaps pad 116 but does not overlap via 144 and is spaced from interconnect 154. Opening 172 also overlaps other pads of chip 110. For convenience of illustration, these other pads are not shown.

FIGS. 1M, 2M, 3M and 4M are cross-sectional, top, bottom and cross-sectional views, respectively, of the structure after etch ink 170 is stripped. Etch ink 170 is removed using a solvent, such as a mild alkaline solution with a pH of 9, that is highly selective of epoxy with respect to copper and polyimide. Therefore, no appreciable amount of metal base 122, insulative base 124 or metal layer 156 is removed.

FIGS. 1N, 2N, 3N and 4N are cross-sectional, top, bottom and cross-sectional views, respectively, of the structure after portions of insulative base 124 and adhesive 164 are selectively removed to form opening 174 in insulative base 124 and adhesive 164. The combination of openings 172 and 174 form opening 176 that exposes pad 116, routing line 142 and metal layer 158.

Opening 174 is formed by applying a suitable etch that is highly selective of insulative base 124 and adhesive 164 with respect to pad 116, routing line 142 and metal layer 158. In this instance, a selective TEA $CO_2$ laser etch is applied using a single direct write.

The laser is directed into opening 172, aimed at pad 116 and ablates insulative base 124 and adhesive 164. The laser has a spot size of 50 microns and pad 116 has a length and width of 70 microns. The laser is aimed at a central portion of pad 116 within the periphery of pad 116. The laser strikes pad 116 and portions of insulative base 124, routing line 142, metal layer 158 and adhesive 164 that overlap pad 116 but does not strike passivation layer 118.

The laser removes a portion of insulative base 124 above routing line 142 and metal layer 158 within the periphery of pad 116 and removes portions of insulative base 124 and adhesive 164 within the periphery of pad 116 and outside routing line 142 and metal layer 158. However, the portions of insulative base 124 and adhesive 164 that overlap the peripheral edges of pad 116 are outside the scope of the laser and remain intact. Likewise, routing line 142 and metal layer 158 shield the underlying adhesive 164 from the laser etch, and the portions of adhesive 164 sandwiched between pad 116 and routing line 142 and between pad 116 and metal layer 158 remain intact.

The laser does not remove annular region 178 of insulative base between metal base 122 and opening 174. Thus, annular region 178 forms a ledge beneath opening 172 with a width of 325 microns ((700−50)/2).

Thereafter, a brief oxygen plasma cleaning step can be applied to pad 116, routing line 142 and metal base 158 exposed by opening 174. Alternatively, a brief wet chemical cleaning step using a solution containing potassium permanganate can be applied to pad 116, routing line 142 and metal base 158 exposed by opening 174.

Opening 174 has a diameter of 50 microns and is within the periphery of opening 172. Furthermore, opening 174 is axially aligned with and centered relative to and partially exposes pad 116. Opening 174 is formed in insulative base 124 and adhesive 164 without damaging pad 116, passivation layer 118, routing line 142 or metal layer 158.

Opening 174 may extend slightly beneath metal layer 158 and have a diameter that is slightly larger than 50 microns due to the beam angle of the laser, the thermal effects of the laser, and/or the isotropic nature of the oxygen plasma or wet chemical cleaning step. For convenience of explanation, this slight enlargement is ignored.

Opening 176 extends through laminated structure 120, metal layer 156 and adhesive 164 and extends to but not into chip 110.

FIGS. 1O, 2O, 3O and 4O are cross-sectional, top, bottom and cross-sectional views, respectively, of connection joint 180 formed on pad 116, routing line 142 and metal layer 158, and metal layer 182 formed on metal base 122 and metal layer 156.

Connection joint 180 and metal layer 182 are formed by an electroplating operation. Initially, metal base 122 is connected to a plating bus (not shown), current is applied to the plating bus from an external power source, and the structure is submerged in an electrolytic copper plating solution such as Sel-Rex CUBATH M™ at room temperature. As a result, metal layer 182 electroplates on the exposed portions of metal base 122 and metal layer 156. In addition, since the plating bus provides the current to metal base 122, which provides the current to interconnect 154, which in turn provides the current to routing line 142 and metal layer 158, connection joint 180 electroplates on the exposed portions of routing line 142 and metal layer 158 in opening 174. At the initial stage, since adhesive 164 is an electrical insulator and pad 116 is not connected to the plating bus, connection joint 180 does not electroplate on pad 116 and is spaced from pad 116. However, as the copper electroplating continues, connection joint 180 continues to plate on routing line 142 and metal layer 158, extends through adhesive 164 and contacts pad 116. As a result, pad 116 is connected to the plating bus by metal base 122, interconnect 154, routing line 142 and metal layer 158, and connection joint 180, and therefore connection joint 180 begins to electroplate on pad 116 as well. The copper electroplating continues until connection joint 180 has the desired thickness. Thereafter, the structure is removed from the electrolytic copper plating solution and rinsed in distilled water to remove contaminants.

Connection joint 180 is formed in opening 176 and contacts and electrically connects pad 116 and routing line 142 (and metal layer 158). Connection joint 180 contacts and covers portions of pad 116 beneath opening 174 and outside routing line 142 and metal layer 158, the surface of routing line 142 that overlaps and faces away from pad 116, and the outer edges (or peripheral sidewalls) of metal layer 158 that overlap and are orthogonal to pad 116. Thus, connection joint 180 provides a robust, permanent electrical connection between pad 116 and routing line 142.

Connection joint 180 is the only electrical conductor external to chip 110 that contacts pad 116, adhesive 164 and connection joint 180 are the only materials external to chip 110 that contact pad 116, and adhesive 164 and connection joint 180 are the only materials that contact both pad 116 and metal layer 158.

Connection joint 180 and metal layer 182 are composed of copper and remain spaced and separated from one another. That is, the copper electroplating operation is discontinued before connection joint 180 and metal layer 182 become thick enough to contact one another in opening 176. Furthermore, connection joint 180 is confined to opening 174 and does not extend into opening 172, and a portion of annular region 178 between opening 174 and metal layer 182 remains exposed.

FIGS. 1P, 2P, 3P and 4P are cross-sectional, top, bottom and cross-sectional views, respectively, of insulator 184 formed on insulative base 124, connection joint 180 and metal layer 182 in opening 176.

Preferably, insulator 184 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively deposited into opening 176 using stencil printing, then the epoxy paste is cured or hardened at a relatively low temperature in the range of 100 to 250° C. to form a solid adherent insulator that provides a protective seal for connection joint 180. Insulator 184 contacts and covers annular region 178 and connection joint 180 and extends 30 microns above insulative base 124.

Insulator 184 also contacts and covers other connection joints within the periphery of opening 172 that are formed in respective openings in insulative base 124 and adhesive 164 and contact and electrically connect respective routing lines and pads. For convenience of illustration, these other connection joints, openings, routing lines and pads are not shown.

FIGS. 1Q, 2Q, 3Q and 4Q are cross-sectional, top, bottom and cross-sectional views, respectively, of the structure after a selected portion of metal base 122 and metal layers 156 and 182 are removed and a remaining portion of metal base 122 outside the periphery of chip 110 forms pillar 186 that overlaps and is aligned with via 144 and interconnect 154. This is accomplished by applying a wet chemical etch to metal base 122 and metal layers 156 and 182 using solder 146 as an etch mask. The wet chemical etch can be sprayed on metal layer 182, or the structure can be dipped in the wet chemical etch since routing line 142, interconnect 154 and metal layer 158 are protected by insulative base 124 and adhesive 164. A suitable wet chemical etch can be provided by the same solution used for etching metal base 122 and metal layer 126 to form recess 140 and routing line 142. The wet chemical etch is highly selective of copper with respect to solder, polyimide and epoxy. Therefore, no appreciable amount of insulative base 124, solder 146, adhesive 164 or insulator 184 is removed. The optimal etch time for exposing the structure to the wet chemical etch in order to form pillar 186 with the desired dimensions can be established through trial and error.

The wet chemical etch initially removes metal layers 156 and 182, thereby exposing metal base 122 and solder 146.

Thereafter, the wet chemical etch etches completely through metal base 122, thereby effecting a pattern transfer of solder 146 onto metal base 122. Furthermore, the wet chemical etch removes all remaining portions of metal base 122 within the periphery of chip 110. However, the wet chemical etch does not remove a portion of metal base 122 outside the periphery of chip 110 that overlaps and is aligned with via 144 and interconnect 154 and forms pillar 186.

Since the wet chemical etch laterally undercuts metal base 122 beneath solder 146, pillar 186 has a conical shape and tapers inwardly with increasing height. A suitable taper is between 45 and slightly less than 90 degrees, such as approximately 75 degrees. Furthermore, pillar 186 has a flat top surface or tip that faces away from chip 110 and contacts solder 146.

Pillar 186 has a thickness of 185 microns, a diameter at insulative base 124 of 400 microns, a diameter at solder 146 of 150 microns, and tapered sidewalls therebetween that slant inwardly as the vertical distance from insulative base 124 increases due to the isotropic nature of the wet chemical etch. Pillar 186 overlaps and is axially aligned with and centered relative to via 144 and interconnect 154.

Routing line 142, interconnect 154 and pillar 186 in combination provide conductive trace 190 that is adapted for providing horizontal and vertical routing between pad 116 and a terminal on a printed circuit board (not shown) in a next level assembly. Routing line 142 is disposed beneath insulative base 124 and provides horizontal routing, interconnect 154 is disposed in insulative base 124 and routing line 142 and provides vertical routing, and pillar 186 is disposed above insulative base 124 and provides vertical routing. Interconnect 154 contacts and electrically connects routing line 142 and pillar 186.

Advantageously, since the wet chemical etch is not selective of insulative base 124, solder 146, adhesive 164 or insulator 184, there is a wide window of acceptable etch times. Another advantage is that metal base 122 and metal layers 156 and 182 are composed of copper, and therefore the removal can be provided by a single wet chemical etch step using a copper etching solution. Another advantage is that insulative base 124 provides mechanical support for the structure, and therefore reduces the mechanical strain on adhesive 164. The enhanced mechanical strength is particularly useful after metal base 122 is etched to form pillar 186. A further advantage is that pillar 186 tapers inwardly with increasing height.

A still further advantage is that insulative base 124 protects routing line 142 and interconnect 154 from chemical and mechanical damage by the wet chemical etch and subsequent cleaning steps (such as rinsing in distilled water and air blowing). For instance, insulative base 124 protects routing line 142 from chemical attack by the wet chemical etch, protects routing line 142 from the physical force of the wet chemical etch and cleaning steps that might otherwise cause routing line 142 to separate from adhesive 164, and protects interconnect 154 from the physical force of the wet chemical etch and cleaning steps that might otherwise cause interconnect 154 to separate from routing line 142. Accordingly, insulative base 124 improves the structural integrity and allows the wet chemical etch and subsequent cleaning steps to be applied more vigorously, thereby improving manufacturing throughput.

Still another advantage is that insulator 184 protects connection joint 180 from the wet chemical etch, thereby permitting connection joint 180 to be copper.

FIGS. 1R, 2R, 3R and 4R are cross-sectional, top, bottom and cross-sectional views, respectively, of the structure after solder 146 is reflowed so that it is confined to the tip of pillar 186. Solder 146 is reflowed by heating the structure to a temperature of about 210° C. The heat causes solder 146 to become molten, however there is not enough flux for solder 146 to wet pillar 186. As a result, solder 146 coalesces and contracts into a hemisphere-like shape disposed on the tip of pillar 186.

FIGS. 1S, 2S, 3S and 4S are cross-sectional, top, bottom and cross-sectional views, respectively, of the structure after opening 192 is formed through adhesive 164 to expose interconnect 154. Opening 192 is formed by applying a suitable etch that is highly selective of adhesive 164 with respect to interconnect 154. In this instance, a selective TEA $CO_2$ laser etch is applied using a single direct write. The laser is aimed at interconnect 154 and ablates adhesive 164. The laser has a spot size of 150 microns and opening 192 has a diameter of 150 microns. Thereafter, a brief oxygen plasma cleaning step can be applied to interconnect 154 exposed by opening 192. Alternatively, a brief wet chemical cleaning step using a solution containing potassium permanganate can be applied to interconnect 154 exposed by opening 192.

Opening 192 has a diameter of 150 microns, is axially aligned with and centered relative to via 144 and interconnect 154, extends through adhesive 164 and extends to but not into interconnect 154. Opening 192 is formed without damaging interconnect 154. Advantageously, opening 192 provides back-side exposure for interconnect 154 to facilitate electrical connection to conductive trace 190 in a stacked arrangement.

At this stage, the manufacture of semiconductor chip assembly 194 that includes chip 110, insulative base 124, solder 146, adhesive 164, connection joint 180, insulator 184 and conductive trace 190 can be considered complete. Conductive trace 190 is mechanically coupled to chip 110 by adhesive 164, and is electrically coupled to chip 110 by connection joint 180. Conductive trace 190 extends beyond an outer edge of chip 110 and provides horizontal fan-out routing (via routing line 142) and vertical routing (via interconnect 154 and pillar 186) between pad 116 and external circuitry. Insulative base 124 and insulator 184 provide mechanical support and environmental protection for the assembly. Moreover, insulative base 124 protects routing line 142 from unwanted solder reflow during the next level assembly.

The semiconductor chip assembly includes other conductive traces embedded in insulative base 124 and adhesive 164, and only a single conductive trace 190 is shown for convenience of illustration. The conductive traces each include a routing line, an interconnect and a pillar, the interconnect extends through a respective via in the insulative base, and the pillar overlaps and is aligned with a respective via in the insulative base. The conductive traces are each connected to a respective pad on chip 110 by a respective connection joint. Furthermore, the conductive traces each extend horizontally from their respective pads outside the periphery of chip 110 to provide horizontal fan-out routing and vertical routing for their respective pads. The pillars are the only electrical conductors that extend beyond the surface of insulative base 124 that faces away from chip 110. Thus, all horizontal routing for the pads that is external to chip 110 occurs at the routing lines between chip 110 and insulative base 124, and substantially all vertical routing for the pads (but for the connection joints) that is external to chip 110 occurs at the interconnects and the pillars outside the periphery of chip 110.

Chip 110 is designed with the pads electrically isolated from one another. However, the pads are electrically connected to one another through the connection joints, the routing lines, the interconnects and metal base 122 before the pillars are formed. Thereafter, metal base 122 is etched to simultaneously form the pillars, which are spaced and separated from one another, and since metal base 122 no longer electrically connects the interconnects to one another, the conductive traces are electrically isolated from one another and the pads are electrically isolated from one another.

Advantageously, there is no plating bus or related circuitry that need be disconnected or severed from chip 110 or the conductive traces after the connection joints are formed and metal base 122 is etched to form the pillars.

If desired, solder paste can be screen printed over the pillars to provide connections to the next level assembly. However, solder 146 disposed on the pillars can also serve this purpose.

Figure 8A:
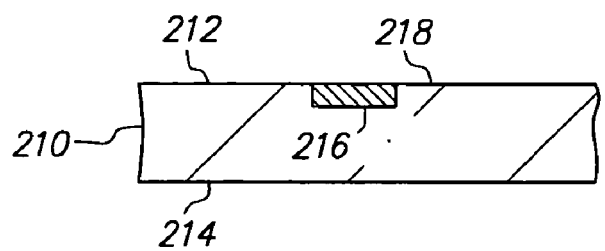
FIGS. 8A–8R are cross-sectional views corresponding to FIGS. 5A–5R, respectively.
Figure 8B:
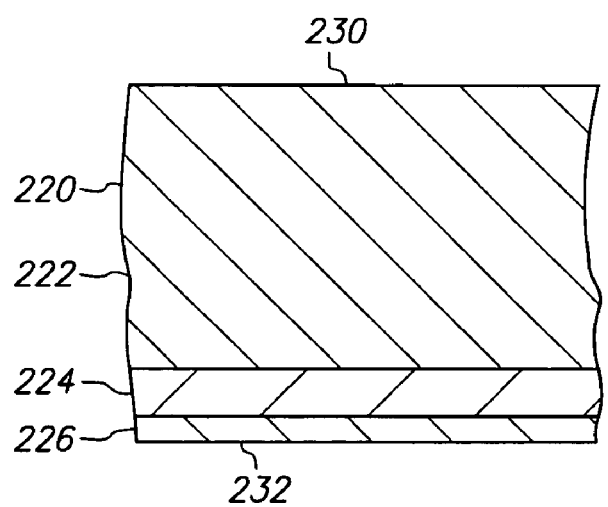
Figure 8C:
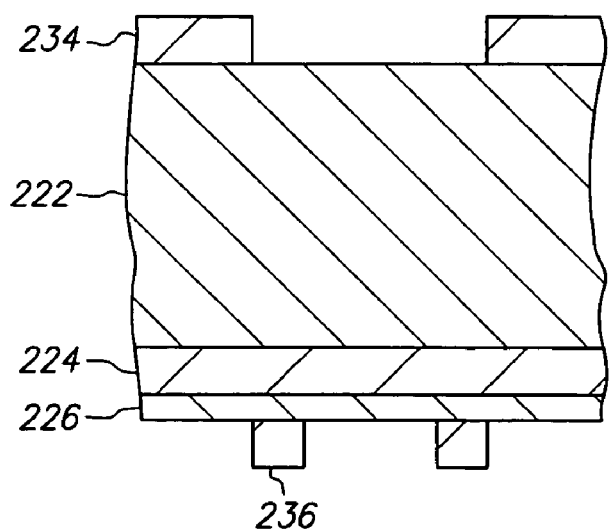
Figure 8D:
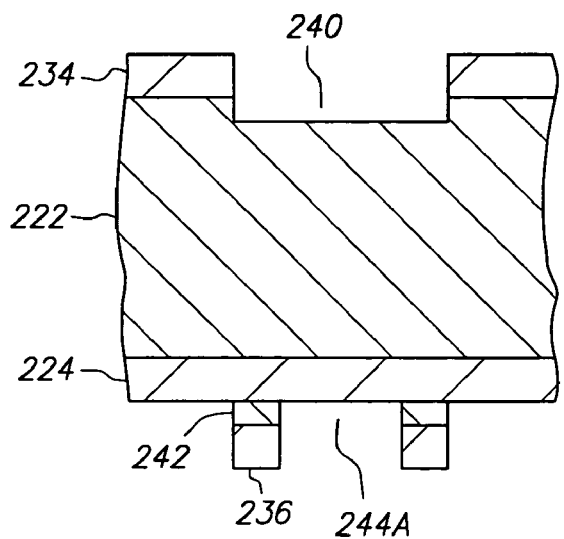
Figure 8E:
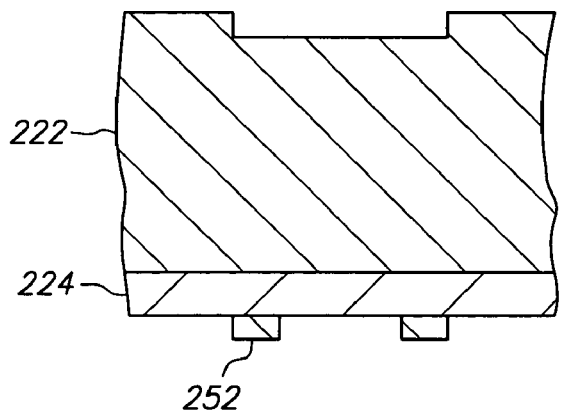
Figure 8F:
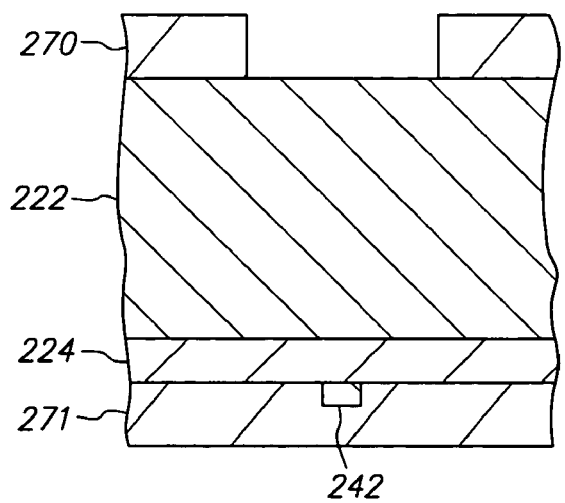
Figure 8G:
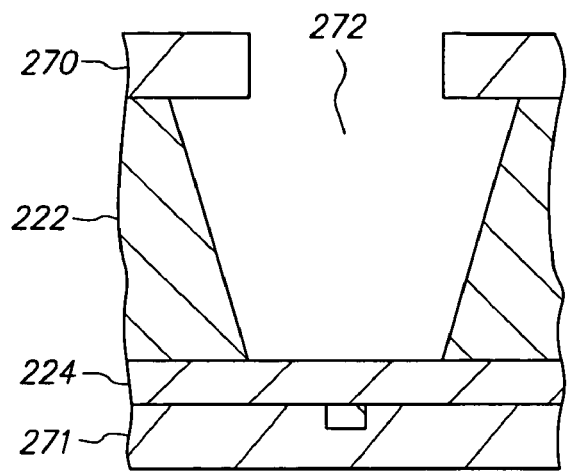
Figure 8H:
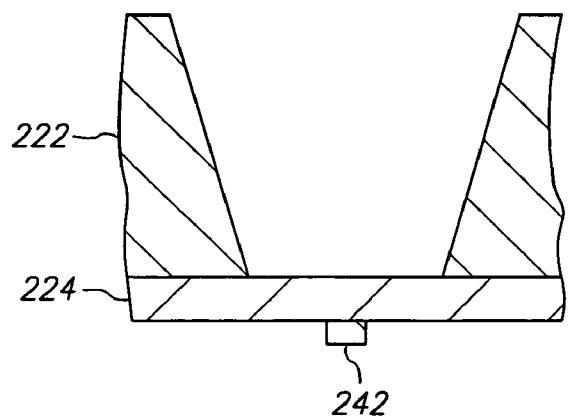
Figure 8I:
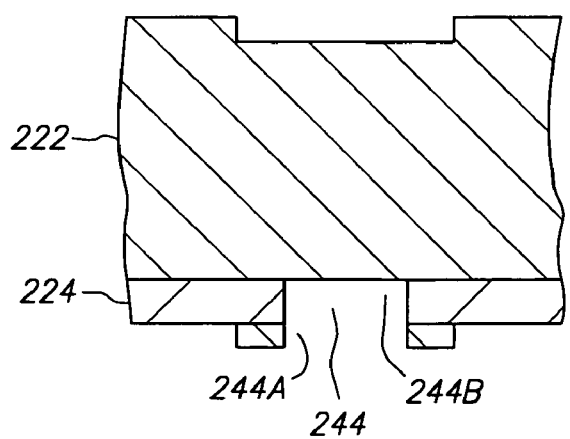
Figure 8J:
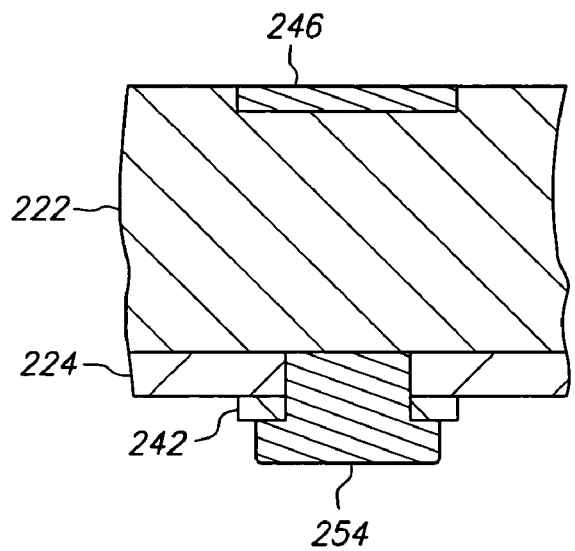
Figure 8K:
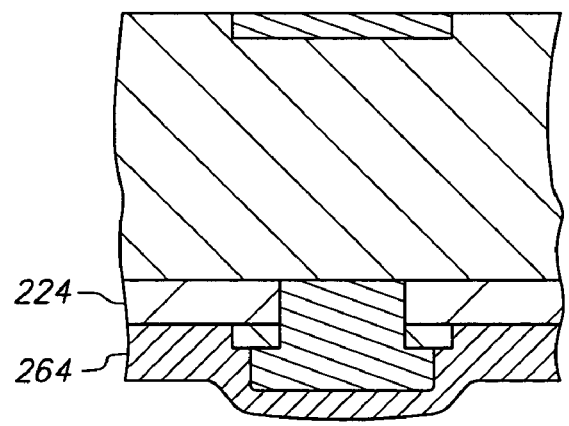
Figure 8L:
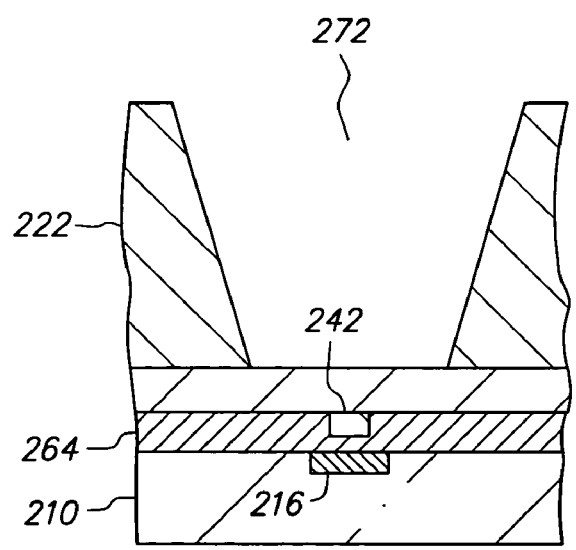
Figure 8M:
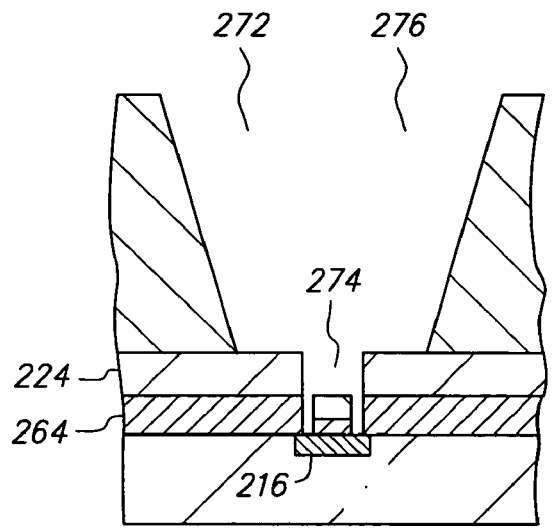
Figure 8N:
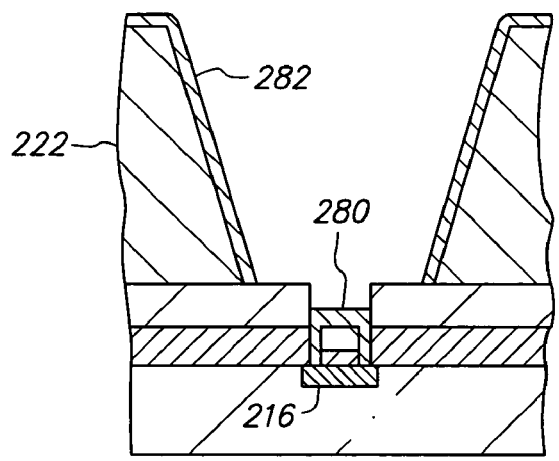
Figure 8O:
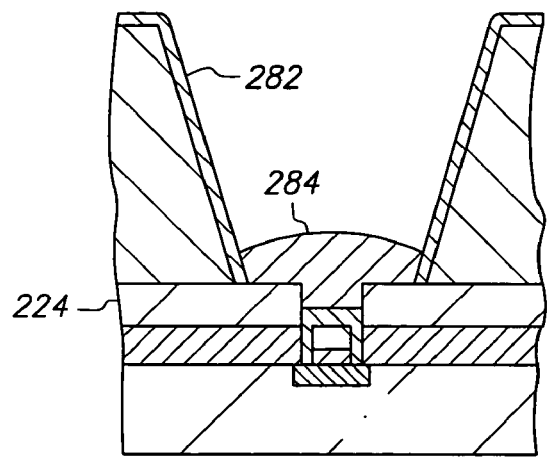
Figure 8P:
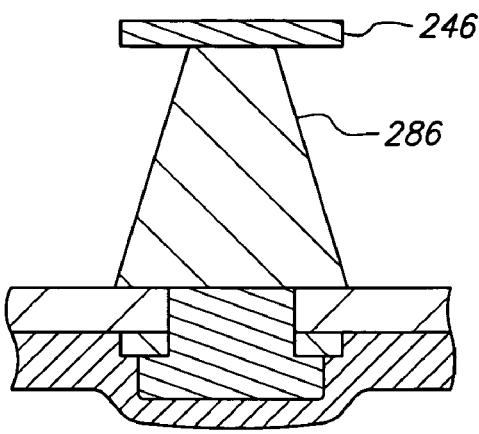
Figure 8Q:
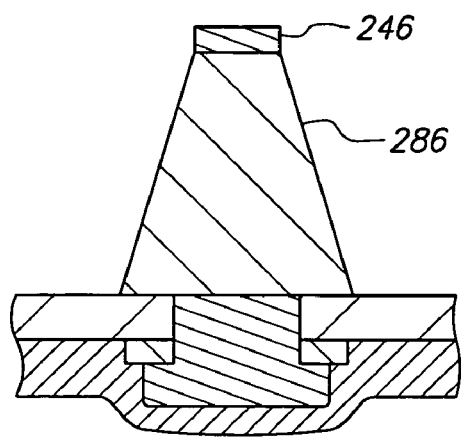
Figure 8R:
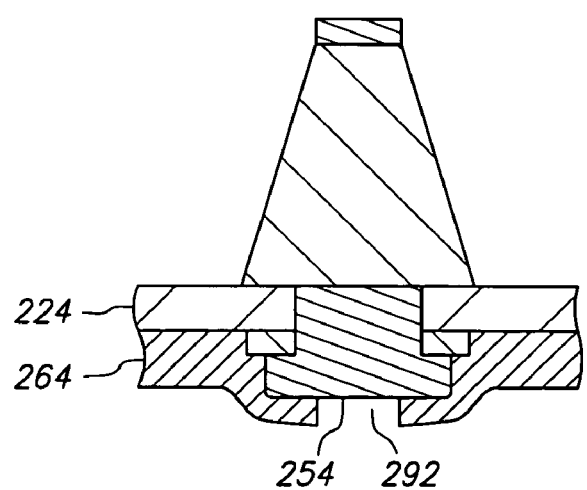
Figure 9A:
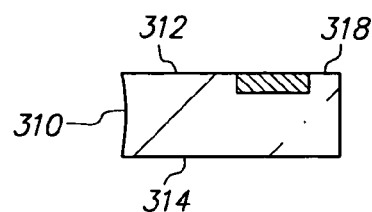
FIGS. 9A–9P are cross-sectional views showing a method of making a semiconductor chip assembly in accordance with a third embodiment of the present invention.
Figure 10A:
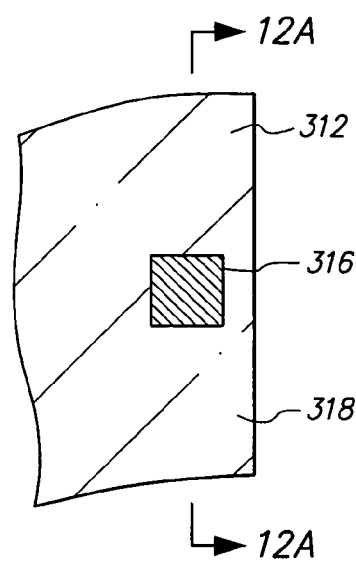
FIGS. 10A–10P are top plan views corresponding to FIGS. 9A–9P, respectively.
Figure 11A:
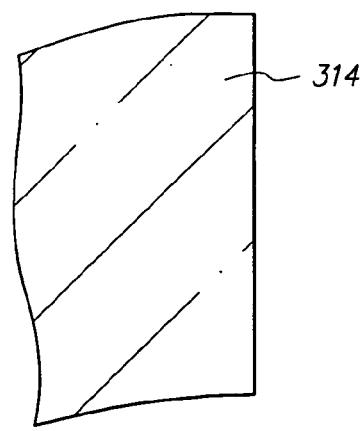
FIGS. 11A–11P are bottom plan views corresponding to FIGS. 9A–9P, respectively.
Figure 9B:
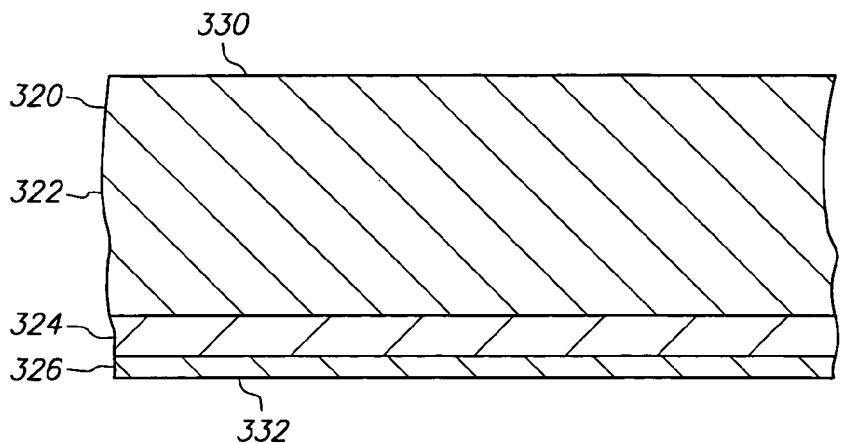
Figure 10B:
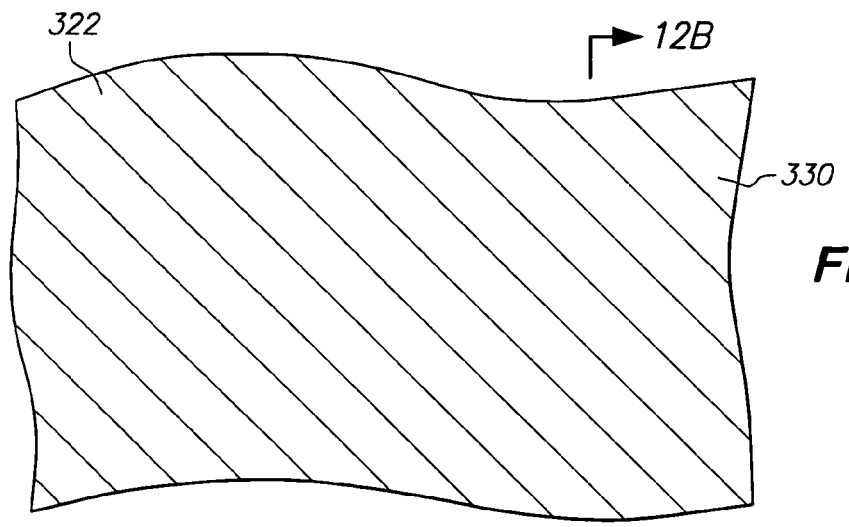
Figure 11B:
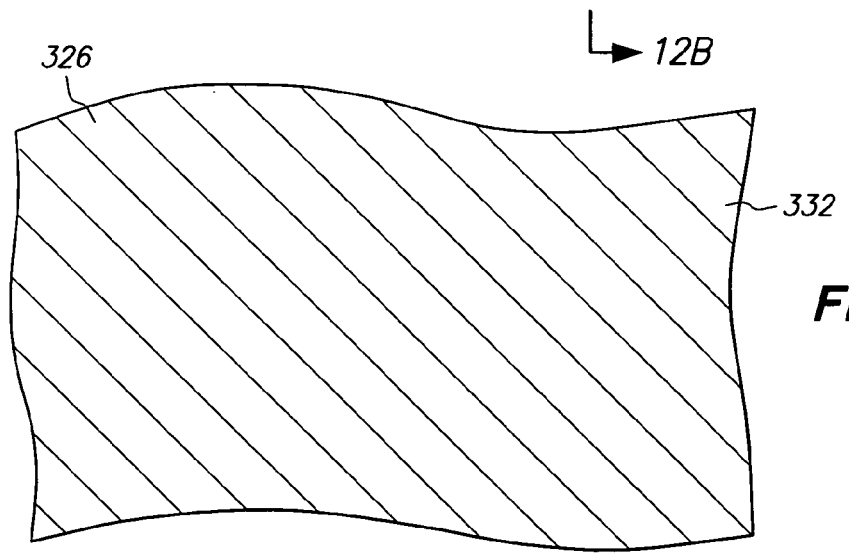
Figure 9C:
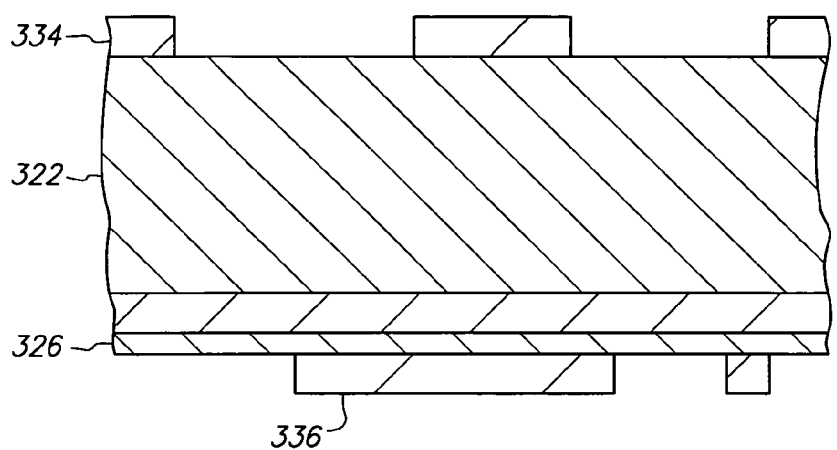
Figure 10C:
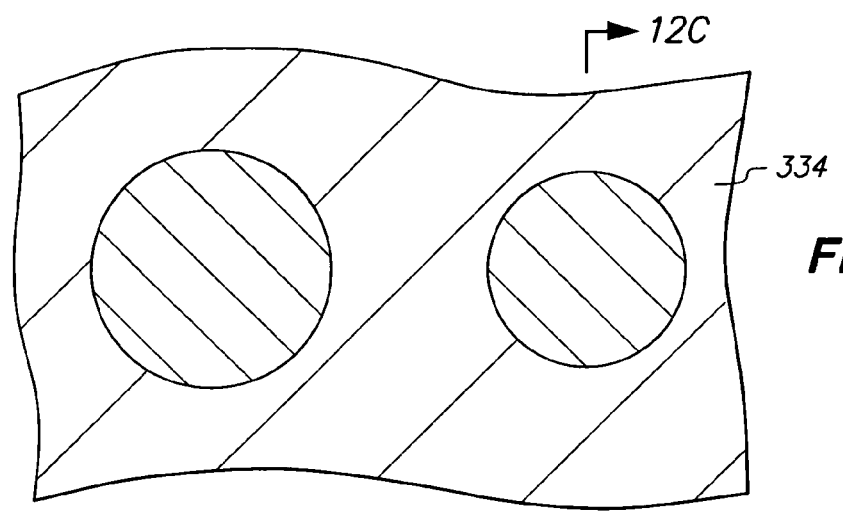
Figure 11C:
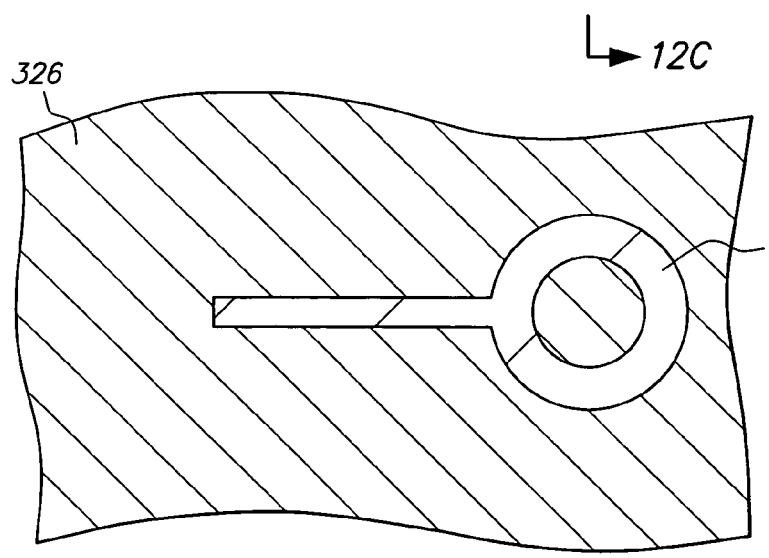
Figure 9D:
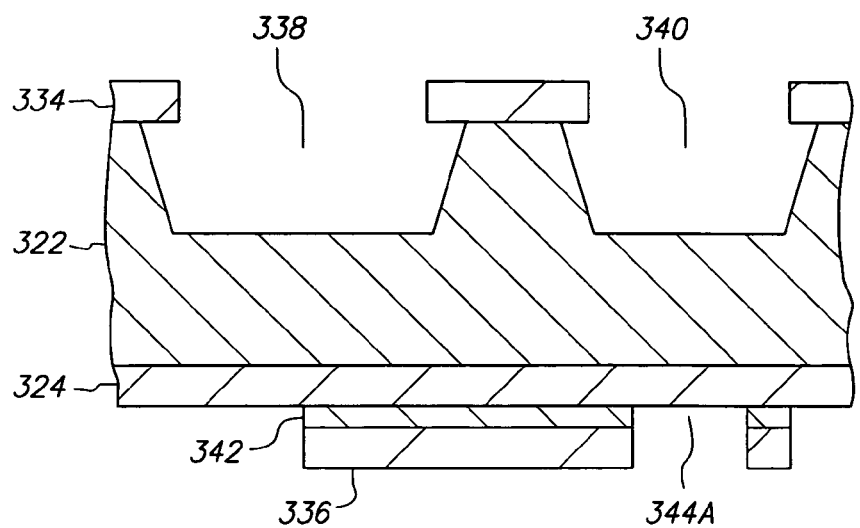
Figure 10D:
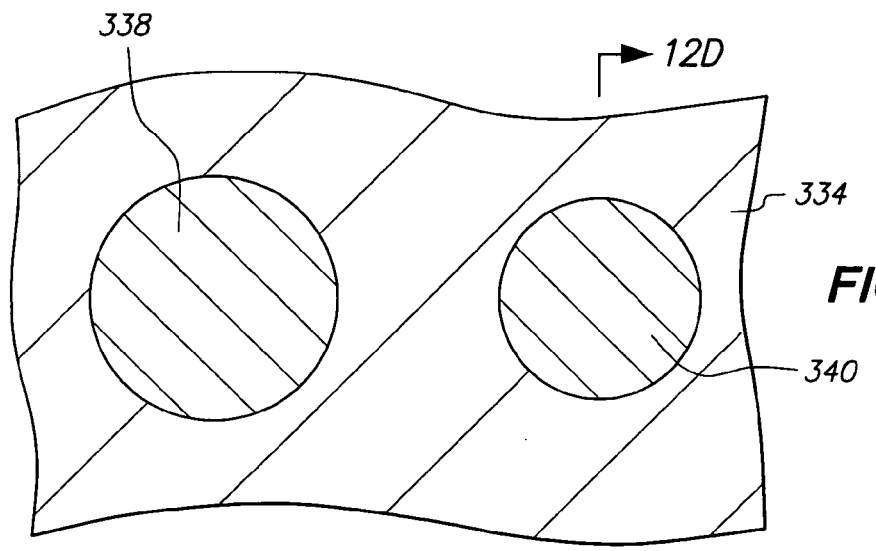
Figure 11D:
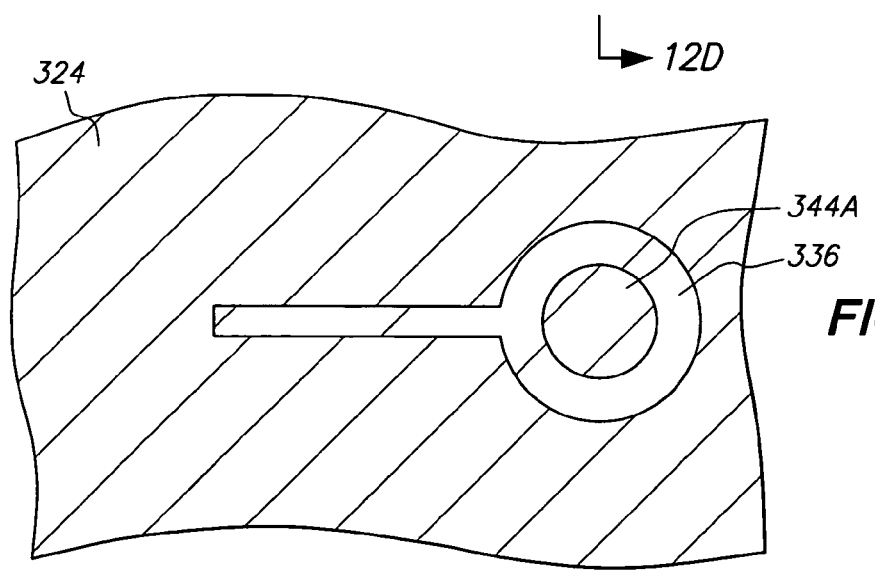
Figure 9E:
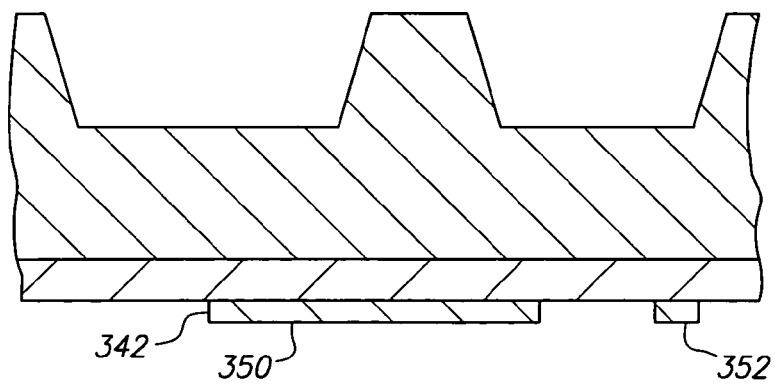
Figure 10E:
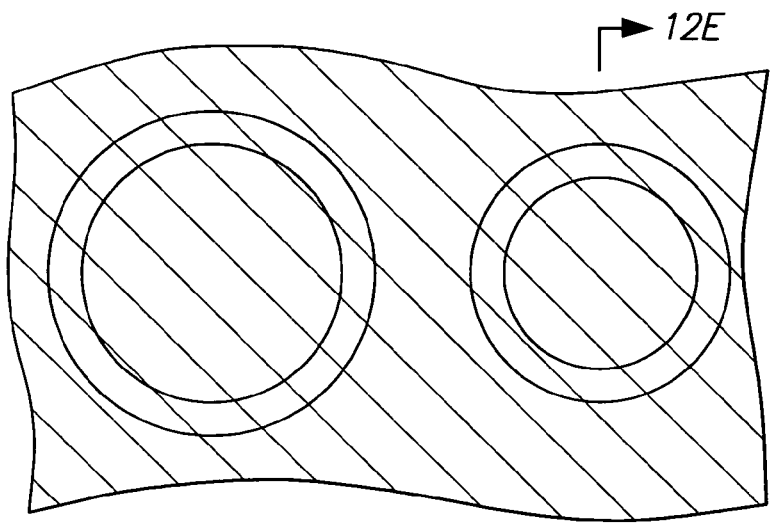
Figure 11E:
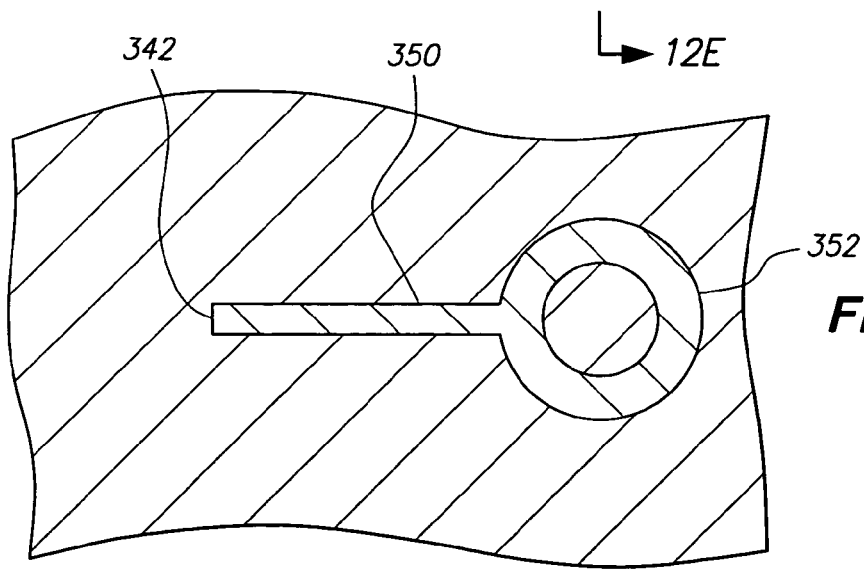
Figure 9F:
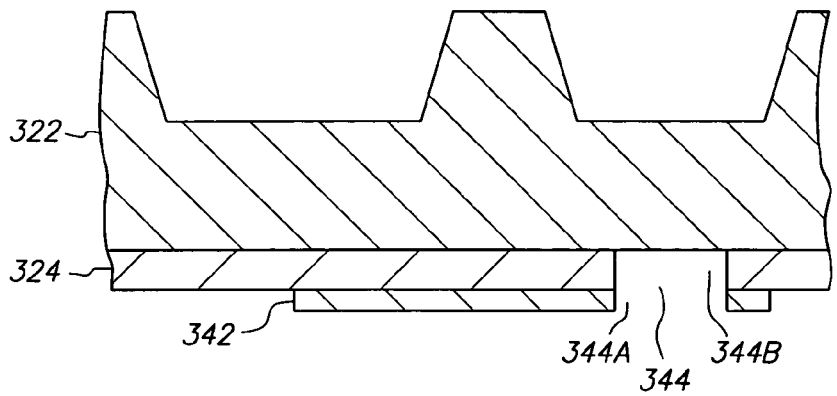
Figure 10F:
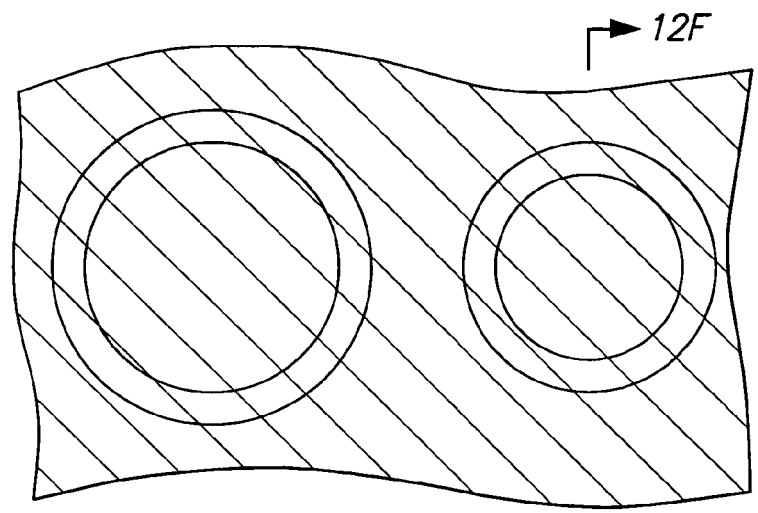
Figure 11F:
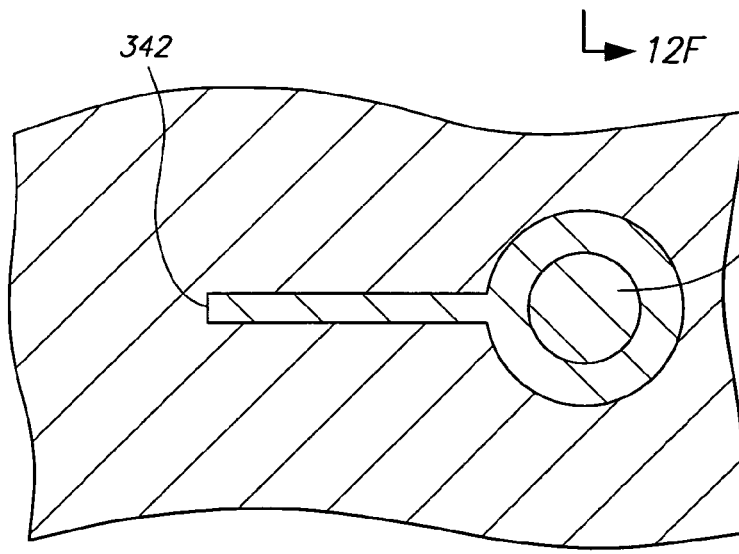
Figure 9G:
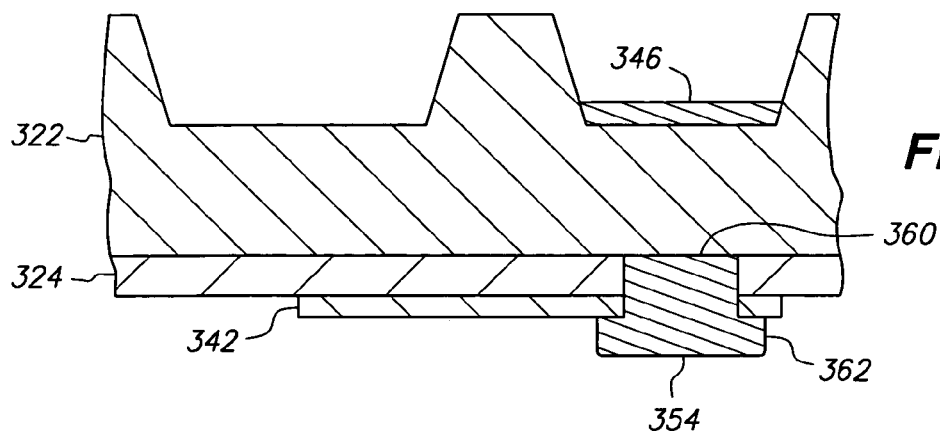
Figure 10G:
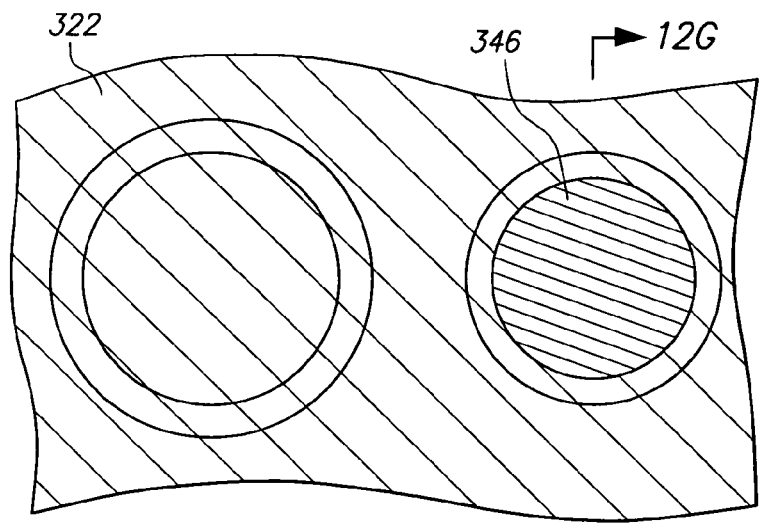
Figure 11G:
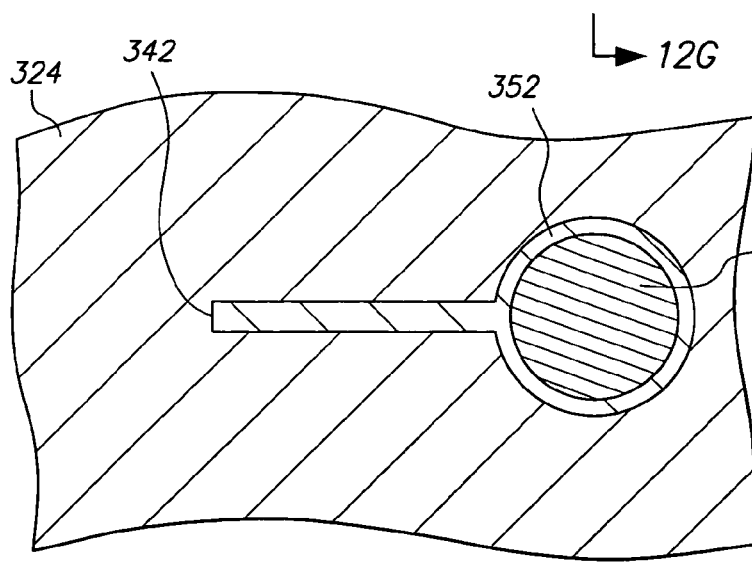
Figure 9H:
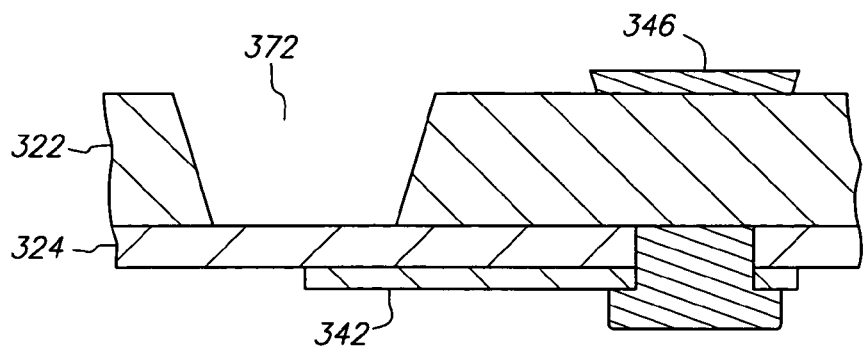
Figure 10H:
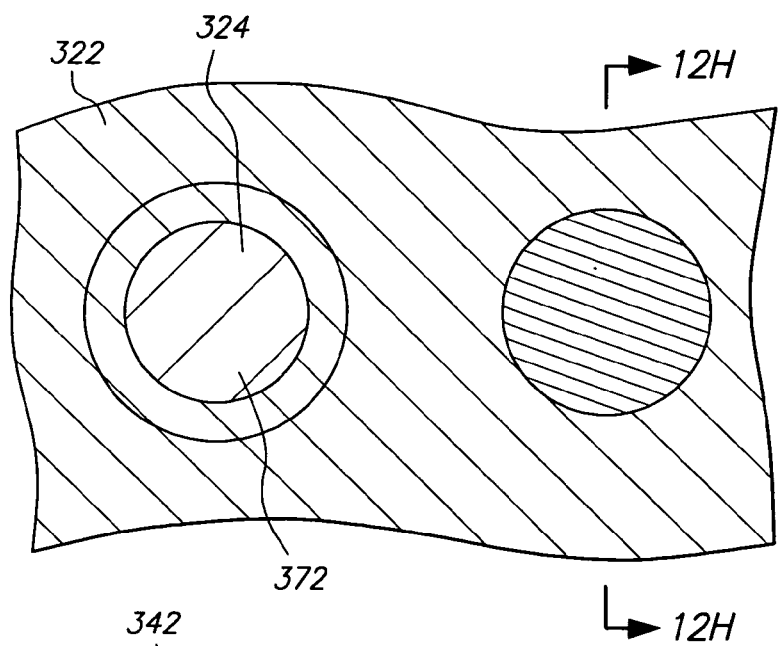
Figure 11H:
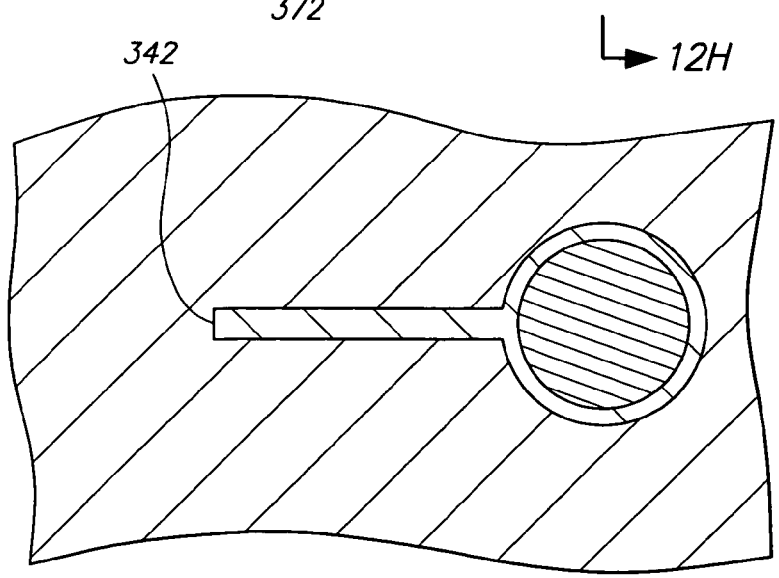
Figure 9I:
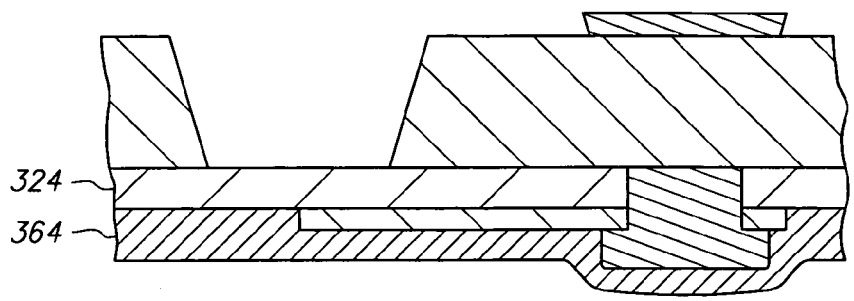
Figure 10I:
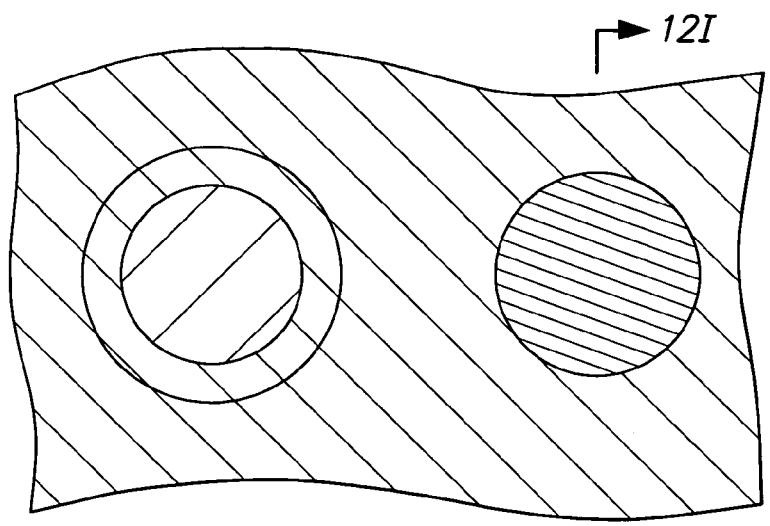
Figure 11I:
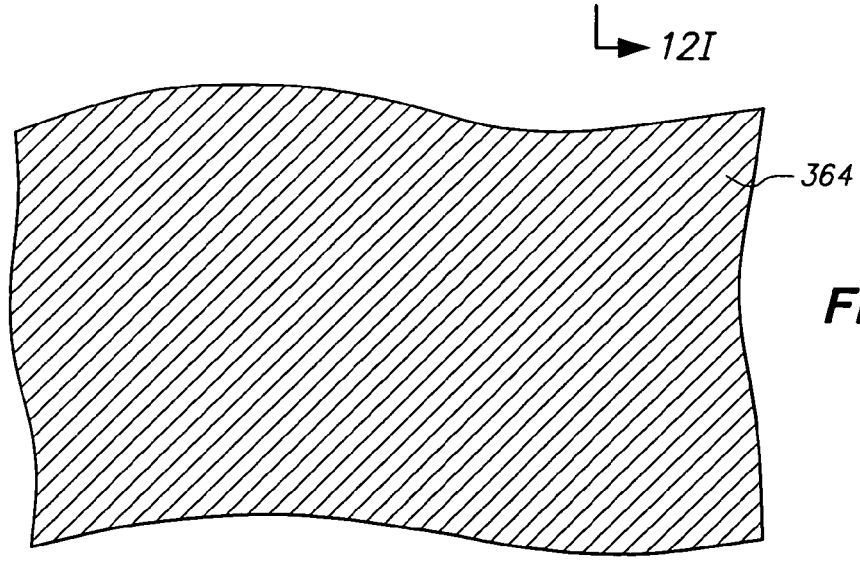
Figure 9J:
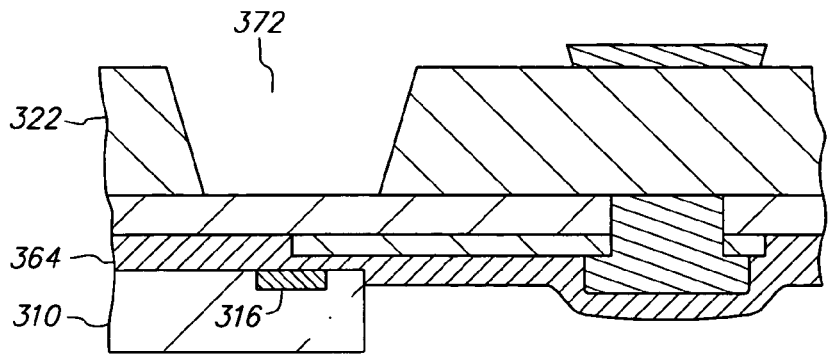
Figure 10J:
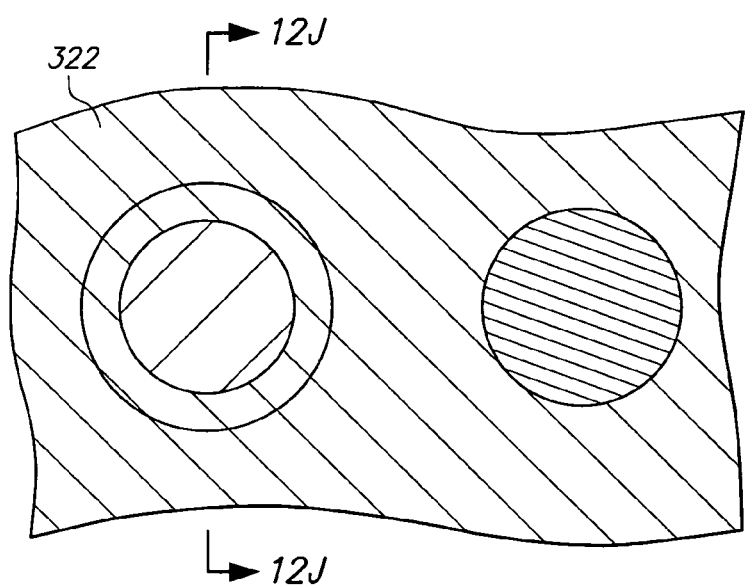
Figure 11J:
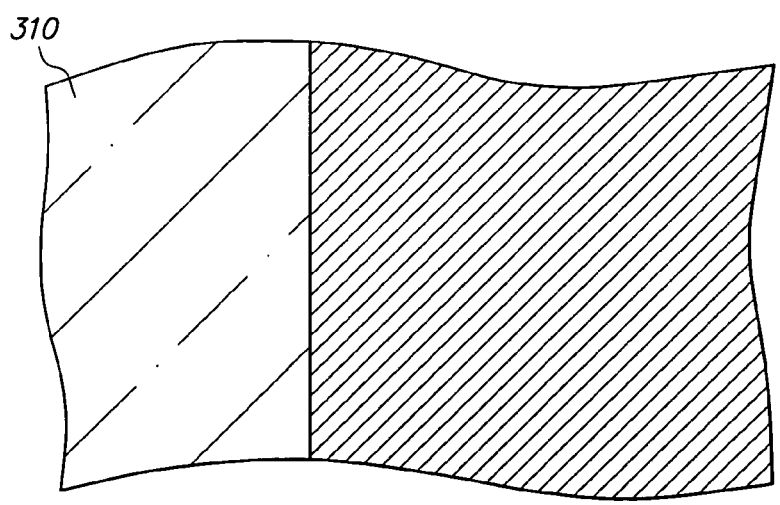
Figure 9K:
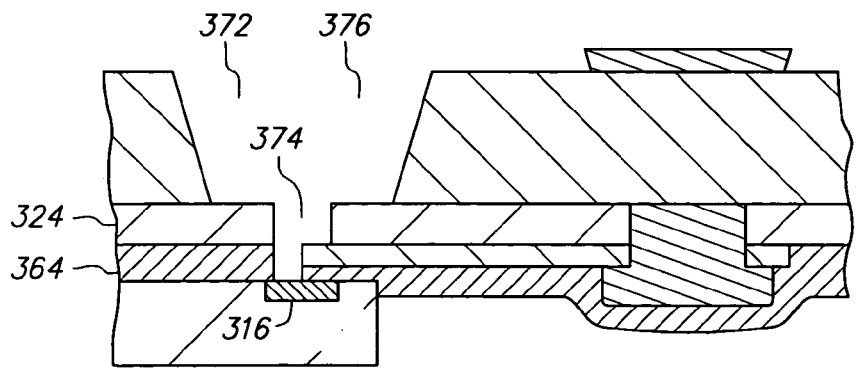
Figure 10K:
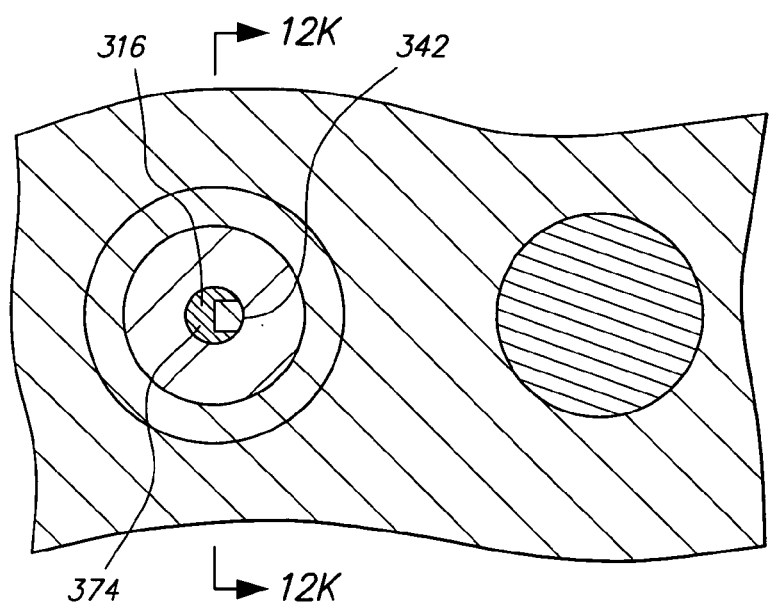
Figure 11K:
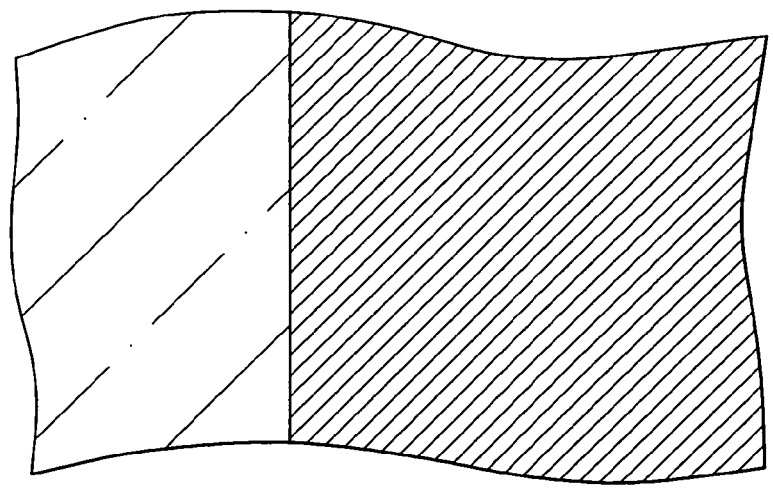
Figure 9L:
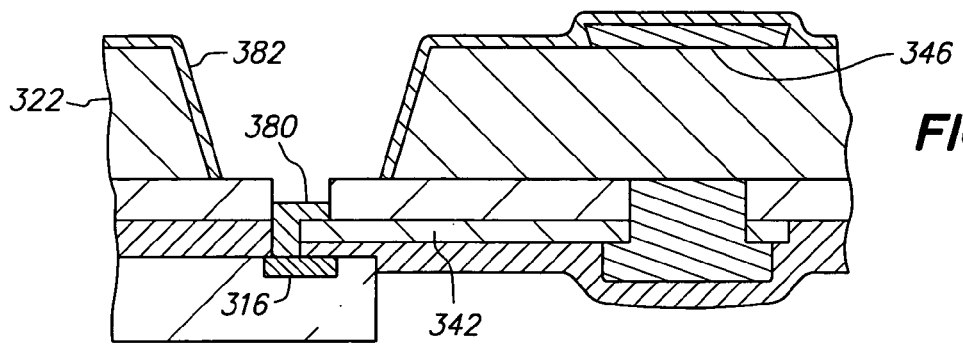
Figure 10L:
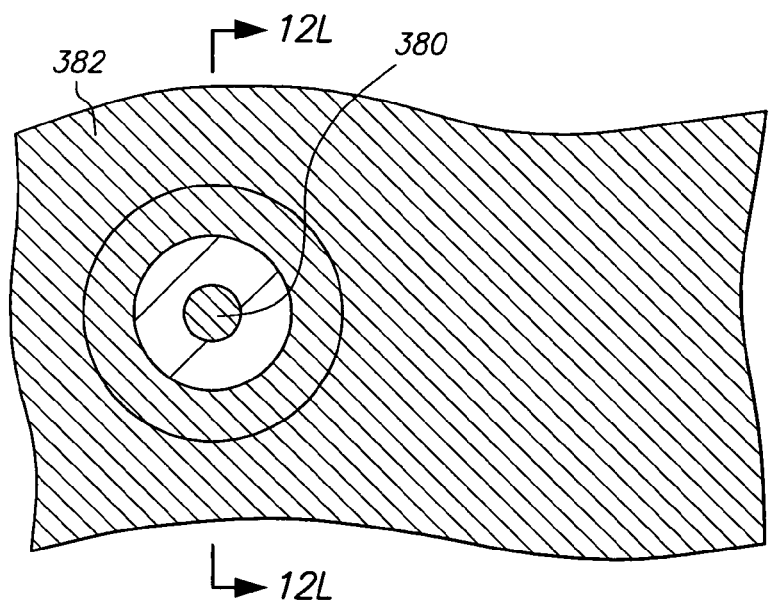
Figure 11L:
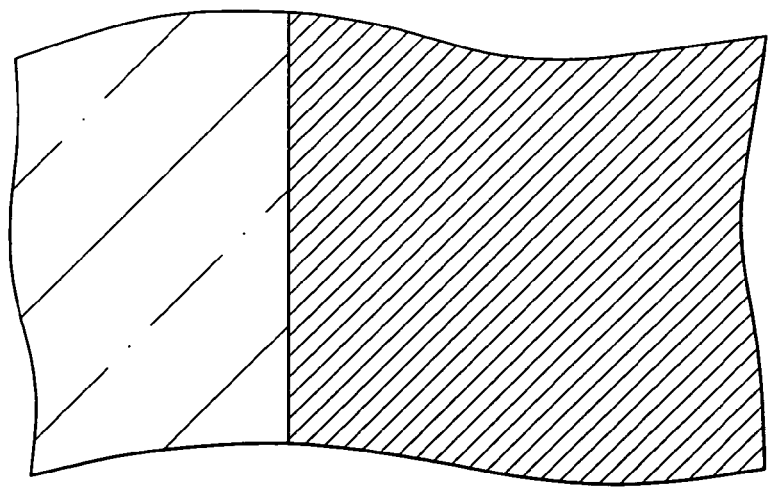
Figure 9M:
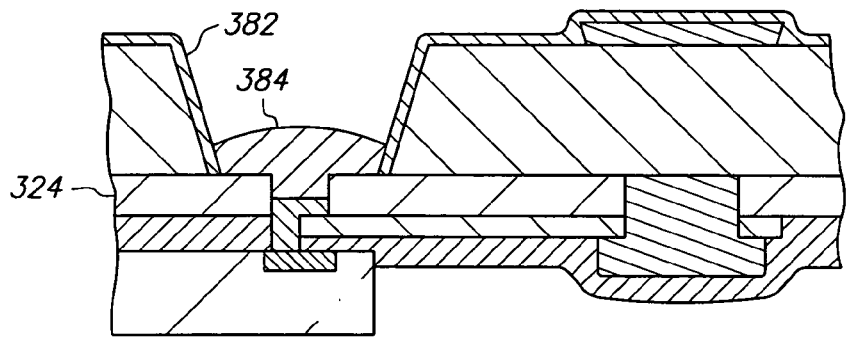
Figure 10M:
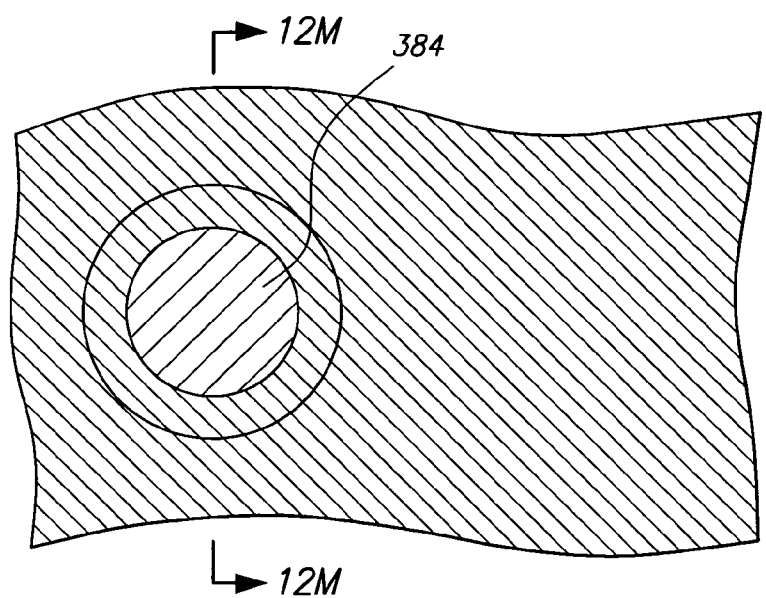
Figure 11M:
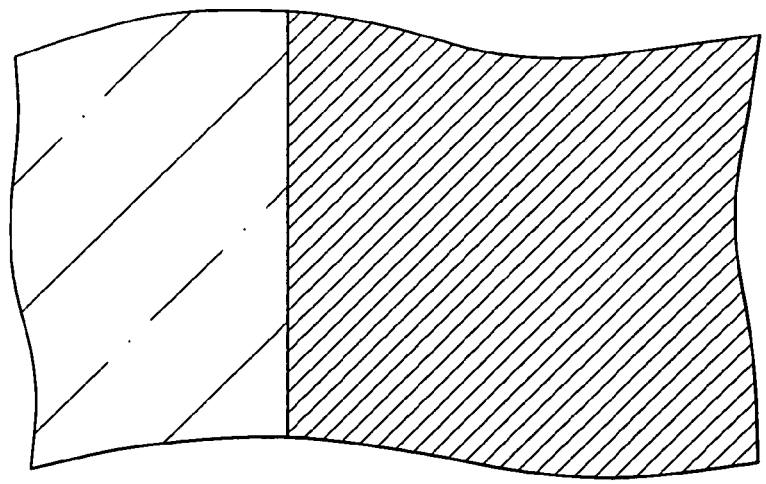
Figure 9N:
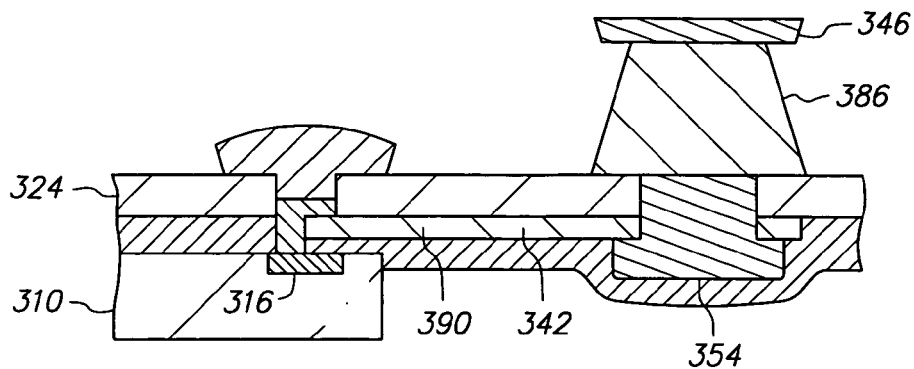
Figure 10N:
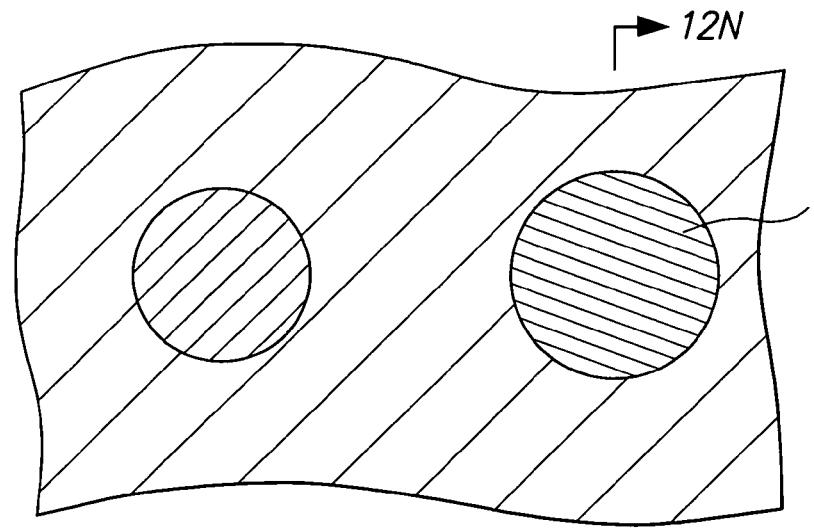
Figure 11N:
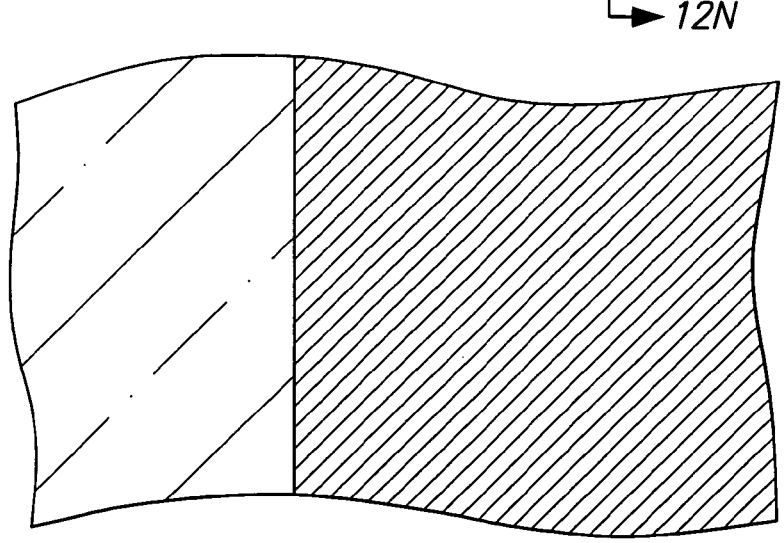
Figure 9O:
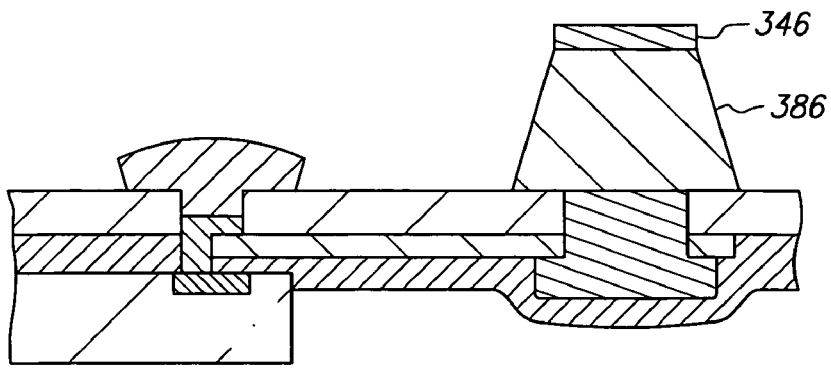
Figure 10O:
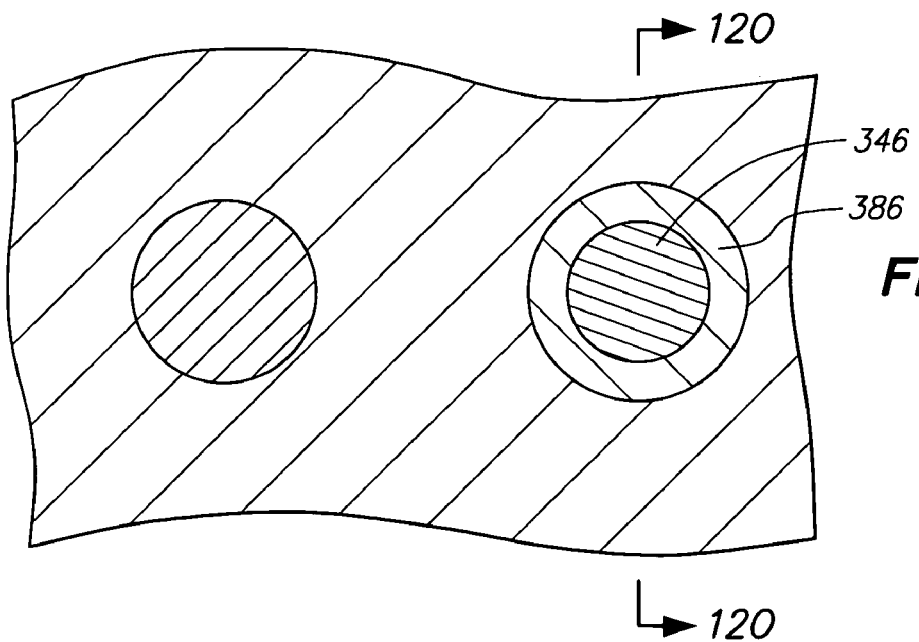
Figure 11O:
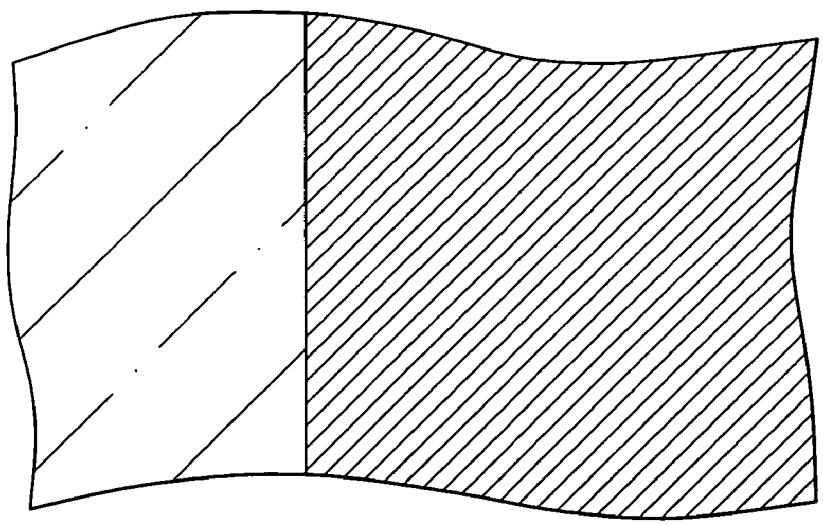
Figure 9P:
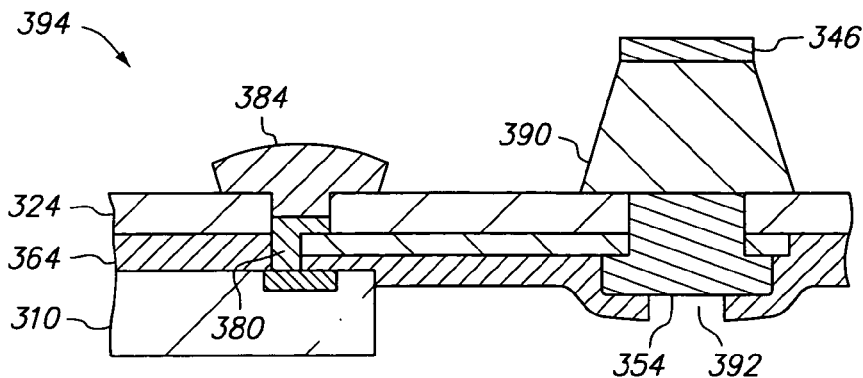
Figure 10P:
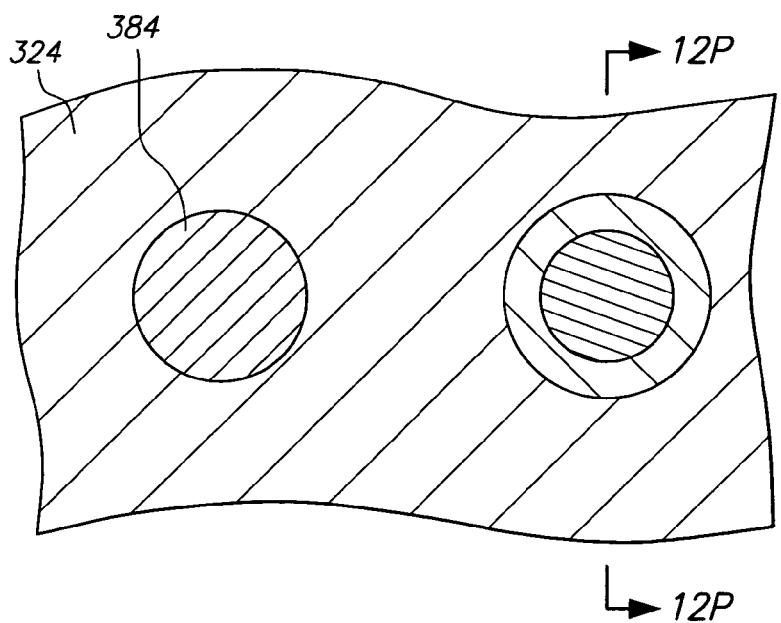
Figure 11P:
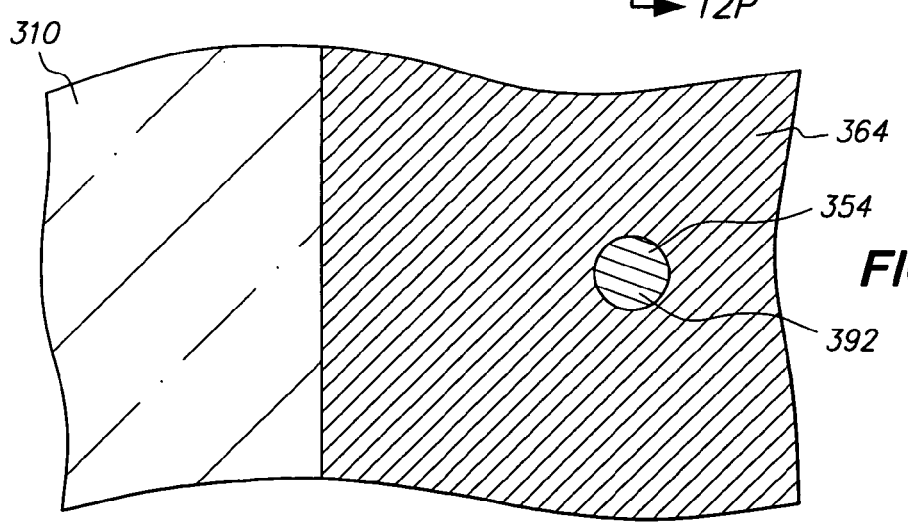

FIGS. 5A–5R, 6A–6R, 7A–7R and 8A–8R are cross-sectional, top, bottom and cross-sectional views, respectively, of a method of making a semiconductor chip assembly in accordance with a second embodiment of the present invention. FIGS. 8A–8R are oriented orthogonally with respect to FIGS. 5A–5R and depict FIGS. 5A–5R as viewed from left-to-right. In the second embodiment, the opening in the metal base is formed using selective etching before mechanically attaching the chip to the laminated structure. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, metal base 222 corresponds to metal base 122, etc.

FIGS. 5A, 6A, 7A and 8A are cross-sectional, top, bottom and cross-sectional views, respectively, of semiconductor chip 210 which includes opposing major surfaces 212 and 214. Surface 212 includes conductive pad 216 and passivation layer 218.

FIGS. 5B, 6B, 7B and 8B are cross-sectional, top, bottom and cross-sectional views, respectively, of laminated structure 220 that includes metal base 222, insulative base 224 and metal layer 226. Metal base 222 includes surface 230, and metal layer 226 includes surface 232.

FIGS. 5C, 6C, 7C and 8C are cross-sectional, top, bottom and cross-sectional views, respectively, of photoresist layers 234 and 236 formed on metal base 222 and metal layer 226, respectively. Photoresist layer 234 contains an opening that selectively exposes metal base 222, and photoresist layer 236 contains openings that selectively expose metal layer 226.

FIGS. 5D, 6D, 7D and 8D are cross-sectional, top, bottom and cross-sectional views, respectively, of recess 240 formed in metal base 222, routing line 242 formed from metal layer 226, and first via portion 244A formed through routing line 242 by wet chemical etching using photoresist layers 234 and 236 as etch masks.

FIGS. 5E, 6E, 7E and 8E are cross-sectional, top, bottom and cross-sectional views, respectively, of the structure after photoresist layers 234 and 236 are stripped. Routing line 242 includes elongated routing region 250 and enlarged annular region 252.

FIGS. 5F, 6F, 7F and 8F are cross-sectional, top, bottom and cross-sectional views, respectively, of etch ink 270 formed on metal base 222 and cover sheet 271 formed on insulative base 224 and routing line 242. Etch ink 270 is a solid epoxy layer 10 that contains an opening that selectively exposes a portion of metal base 222. Cover sheet 271 is a low cost epoxy film that is unpatterned and covers the entire routing line 242. Etch ink 270 and cover sheet 271 have a thickness of 50 microns.

FIGS. 5G, 6G, 7G and 8G are cross-sectional, top, bottom and cross-sectional views, respectively, of the structure after a portion of metal base 222 is selectively removed to form opening 272 in metal base 222 that exposes insulative base 224. Opening 272 is formed by applying a wet chemical etch to metal base 222 using etch ink 270 and cover sheet 271 as etch masks. The wet chemical etch etches completely through metal base 222, thereby effecting a pattern transfer of etch ink 270 onto metal base 222 while cover sheet 271 protects routing line 242 from the wet chemical etch. Etch ink 270 and cover sheet 271 also protect recess 240 and first via portion 244A, respectively, from the wet chemical etch.

FIGS. 5H, 6H, 7H and 8H are cross-sectional, top, bottom and cross-sectional views, respectively, of the structure after etch ink 270 and cover sheet 271 are stripped. Etch ink 270 and cover sheet 271 are removed using a solvent, such as a mild alkaline solution with a pH of 9, that is highly selective of epoxy with respect to copper and polyimide. Therefore, no appreciable amount of metal base 222, insulative base 224 or routing line 242 is removed.

FIGS. 5I, 6I, 7I and 8I are cross-sectional, top, bottom and cross-sectional views, respectively, of the structure after via 244 is formed through insulative base 224 and routing line 242. A portion of insulative base 224 exposed by first via portion 244A is selectively removed using a laser etch to form second via portion 244B in insulative base 224. The combination of via portions 244A and 244B forms via 244 that exposes metal base 222.

FIGS. 5J, 6J, 7J and 8J are cross-sectional, top, bottom and cross-sectional views, respectively, of solder 246 deposited in recess 240 and interconnect 254 deposited in via 244. Solder 246 fills recess 240 and is aligned with surface 230 of metal base 222. Interconnect 254 fills via 244 and contacts and electrically connects metal base 222 and routing line 242. Furthermore, interconnect 254 is composed of solder.

Interconnect 254 has a mushroom-shape that includes cylindrical base 260 and pileus or cap 261. Cylindrical base 260 fills via 244, and cap 261 extends outside via 244 and contacts enlarged annular region 252 without contacting insulative base 224 or elongated routing region 250. Cylindrical base 260 has a thickness of 37 microns and a diameter of 200 microns, and cap 261 has a thickness of 50 microns and a diameter of 300 microns. Cap 261 is axially aligned with via 244 and enlarged annular region 252. Thus, cap 261 is spaced from the peripheral sidewalls of enlarged annular region 252 by 50 microns ((400–300)/2).

Solder 246 is deposited into recess 240 by solder paste printing followed by solder reflow. The solder paste includes finely powdered tin-lead solder particles mixed in a viscous organic resin containing a fluxing agent. The solder paste is deposited into recess 240 using stencil printing. During the stencil printing process, a stencil (not shown) with a thickness of 100 microns is placed on metal base 222, a stencil opening with a diameter of 300 microns is axially aligned with recess 240, and then a squeegee (not shown) pushes the solder paste along the surface of the stencil opposite metal base 222, through the stencil opening and into recess 240. The solder paste is compliant enough at room temperature to conform to virtually any shape. As a result, the solder paste fills recess 240 and extends above recess 240 in the stencil opening. However, the solder paste contacts little or none of surface 230 of metal base 222. Thereafter, the structure is heated to a temperature of about 210° C. The heat causes the flux in the solder paste to react with and remove oxides from metal base 222 and the solder particles in the solder paste, renders the solder particles in the solder paste molten such that they coalesce, and vaporizes the organic resin in the solder paste. As a result, the solder paste contracts from its original size and solder reflow occurs. Thereafter, the heat is removed and the molten solder particles cool and solidify into a hardened solder joint that provides solder 246.

Interconnect 254 is deposited into via 244 and onto routing line 242 outside via 244 by solder paste printing followed by solder reflow. Interconnect 254 is formed in substantially the same way as solder 246. Namely, solder paste (with the same composition as that used for solder 246) is deposited into via 244 using stencil printing. During the stencil printing process, a stencil (not shown, the same stencil used to form solder 246) with a thickness of 100 microns is placed on routing line 242, a stencil opening with a diameter of 300 microns is axially aligned with via 244 and enlarged annular region 252, and then a squeegee (not shown) pushes the solder paste along the surface of the stencil opposite routing line 242, through the stencil opening and into via 244 and onto enlarged annular region 252. The solder paste is compliant enough at room temperature to conform to virtually any shape. As a result, the solder paste fills via 244 and extends above via 244 in the stencil opening. Thereafter, the structure is heated to a temperature of about 210° C. The heat causes the flux in the solder paste to react with and remove oxides from metal base 222, routing line 242 and the solder particles in the solder paste, renders the solder particles in the solder paste molten such that they coalesce, and vaporizes the organic resin in the solder paste. As a result, the solder paste contracts from its original size and solder reflow occurs. Thereafter, the heat is removed and the molten solder particles cool and solidify into a hardened solder joint that provides interconnect 254.

Solder 246 and interconnect 254 are deposited in sequence. That is, solder paste is deposited into recess 240 and then reflowed to form solder 246, and then solder paste is deposited into via 244 and onto enlarged annular region 252 and then reflowed to form interconnect 254. For convenience of illustration, metal base 222 is shown above insulative base 224 to retain a single orientation throughout the figures for ease of comparison between the figures, although the structure would be inverted during the formation of interconnect 254 so that gravitational force would assist with the solder paste deposition and reflow.

FIGS. 5K, 6K, 7K and 8K are cross-sectional, top, bottom and cross-sectional views, respectively, of adhesive 264 formed on insulative base 224, routing line 242 and interconnect 254.

FIGS. 5L, 6L, 7L and 8L are cross-sectional, top, bottom and cross-sectional views, respectively, of chip 210 mechanically attached to laminated structure 220 by adhesive 264. Chip 210 and routing line 242 are positioned relative to one another so that routing line 242 is disposed above and overlaps and is electrically isolated from pad 216. In addition, chip 210 and metal base 222 are positioned relative to one another so that pad 216 is within the periphery of opening 272.

FIGS. 5M, 6M, 7M and 8M are cross-sectional, top, bottom and cross-sectional views, respectively, of opening 274 formed in insulative base 224 and adhesive 264 by laser ablation. Opening 274 exposes pad 216 and the peripheral sidewalls and top surface of routing line 242, and adhesive 264 remains in contact with and sandwiched between pad 216 and routing line 242. The combination of openings 272 and 274 form opening 276 that exposes pad 216 and routing line 242.

FIGS. 5N, 6N, 7N and 8N are cross-sectional, top, bottom and cross-sectional views, respectively, of connection joint 280 formed on pad 216 and routing line 242, and metal layer 282 formed on metal base 222 and solder 246. Connection joint 280 and metal layer 282 are formed by a copper electroplating operation.

FIGS. 5O, 6O, 7O and 8O are cross-sectional, top, bottom and cross-sectional views, respectively, of insulator 284 formed on insulative base 224, connection joint 280 and metal layer 282 in opening 276.

FIGS. 5P, 6P, 7P and 8P are cross-sectional, top, bottom and cross-sectional views, respectively, of the structure after a selected portion of metal base 222 and metal layer 282 are removed and a remaining portion of metal base 222 outside the periphery of chip 210 forms pillar 286 that overlaps and is aligned with via 244 and interconnect 254. This is accomplished by applying a wet chemical etch to metal base 222 and metal layer 282 using solder 246 as an etch mask.

The wet chemical etch initially removes metal layer 282, thereby exposing metal base 222 and solder 246. Thereafter, the wet chemical etch etches completely through metal base 222, thereby effecting a pattern transfer of solder 246 onto metal base 222. The wet chemical etch removes all remaining portions of metal base 222 within the periphery of chip 210 but does not remove a portion of metal base 222 outside the periphery of chip 210 that overlaps and is aligned with via 244 and interconnect 254 and forms pillar 286. Pillar 286 overlaps and is axially aligned with via 244 and interconnect 254.

Routing line 242, interconnect 254 and pillar 286 in combination provide conductive trace 290 that is adapted for providing horizontal and vertical routing between pad 216 and a terminal on a printed circuit board (not shown) in a next level assembly. Interconnect 254 contacts and electrically connects routing line 242 and pillar 286.

FIGS. 5Q, 6Q, 7Q and 8Q are cross-sectional, top, bottom and cross-sectional views, respectively, of the structure after solder 246 is fractured so that it is confined to the tip of pillar 286. Solder 246 is fractured by air blowing. In particular, a burst of compressed air is directed at the structure in the direction normal to the tip of pillar 286. Solder 246 is relatively thin and brittle, and the compressed air fractures solder 246 at the corner between the tip of pillar 286 and the tapered sidewalls of pillar 286. As a result, solder 246 cracks at the corner, the portion of solder 246 outside the tip of pillar 286 is breaks off, and the portion of solder 246 on the tip of pillar 286 remains intact.

FIGS. 5R, 6R, 7R and 8R are cross-sectional, top, bottom and cross-sectional views, respectively, of the structure after opening 292 is formed through adhesive 264 to expose interconnect 254 using a laser etch.

At this stage, the manufacture of semiconductor chip assembly 294 that includes chip 210, insulative base 224, solder 246, adhesive 264, connection joint 280, insulator 284 and conductive trace 290 can be considered complete.

Figure 12A:
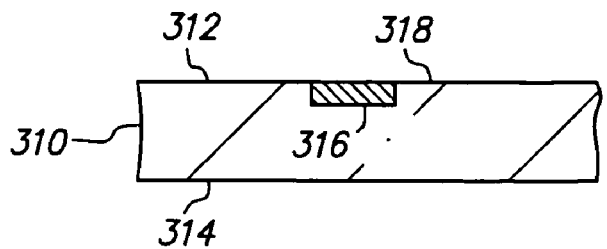
FIGS. 12A–12P are cross-sectional views corresponding to FIGS. 9A–9P, respectively.
Figure 12B:
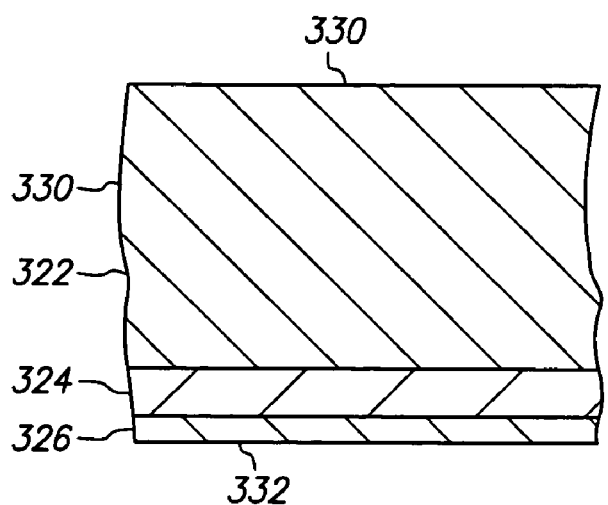
Figure 12C:
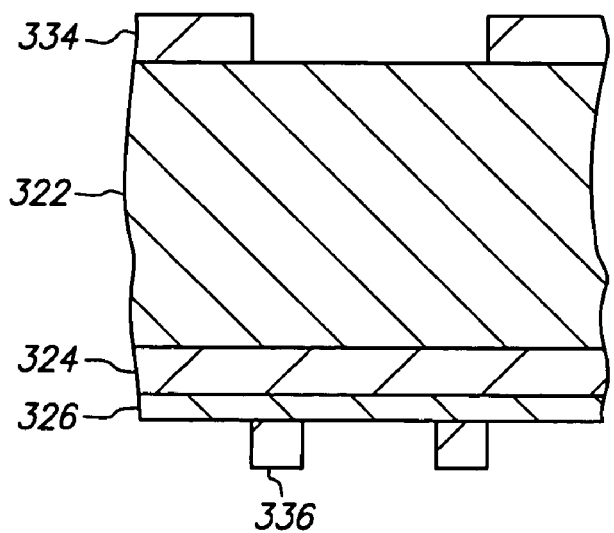
Figure 12D:
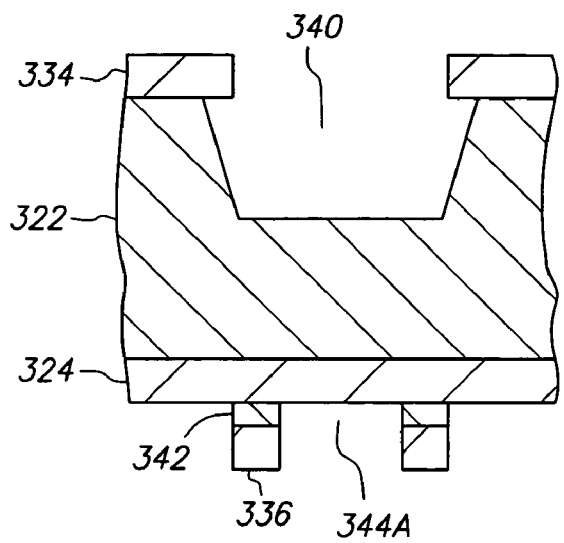
Figure 12E:
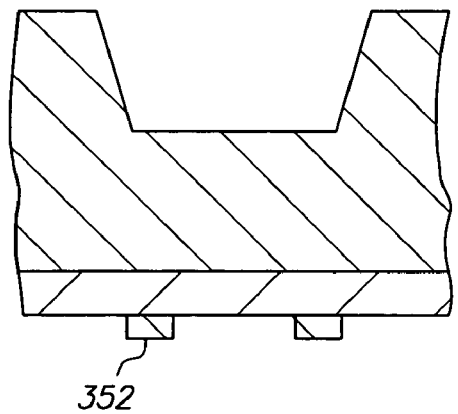
Figure 12F:
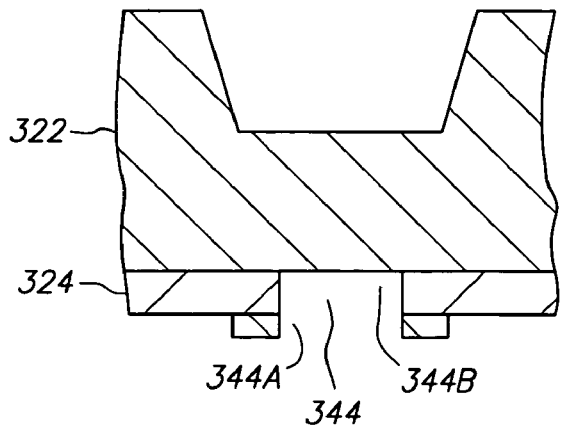
Figure 12G:
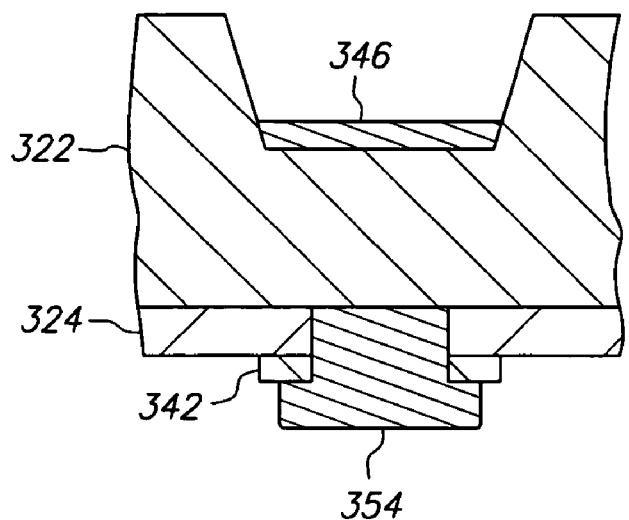
Figure 12H:
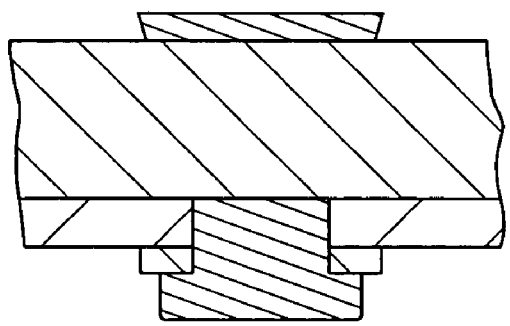
Figure 12I:
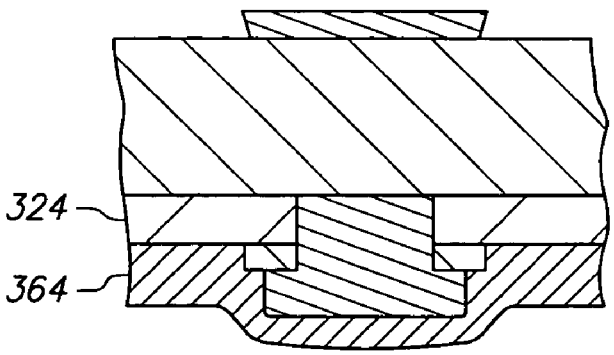
Figure 12J:
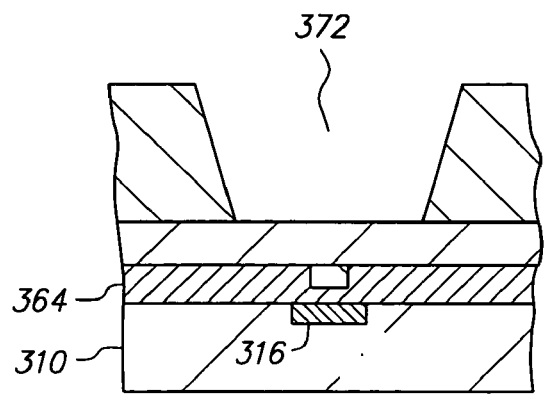
Figure 12K:
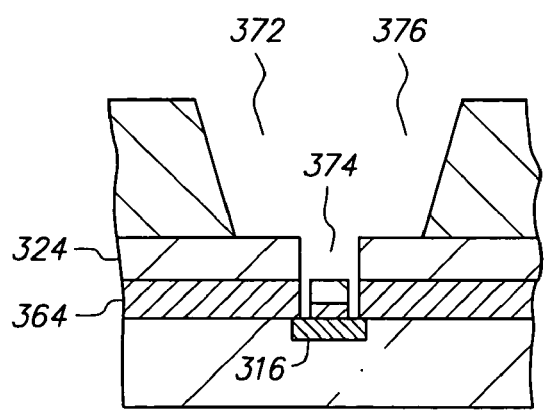
Figure 12L:
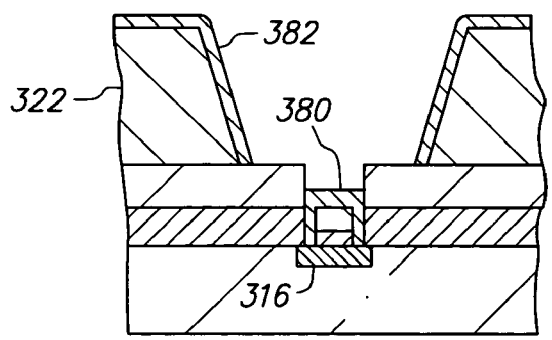
Figure 12M:
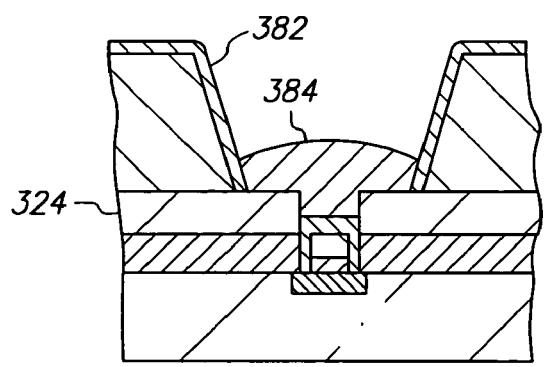
Figure 12N:
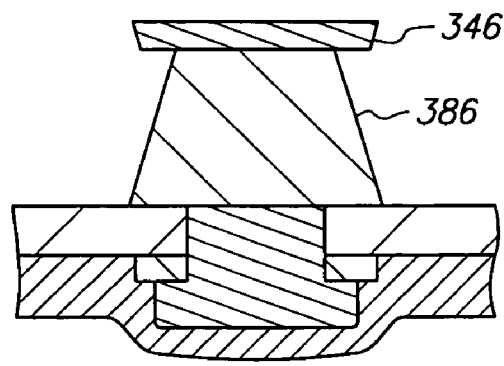
Figure 12O:
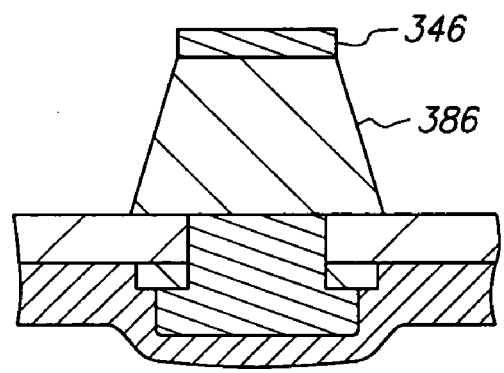
Figure 12P:
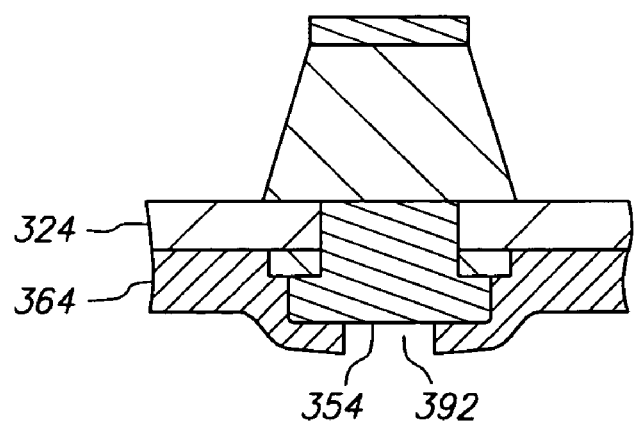
Figure 13A:
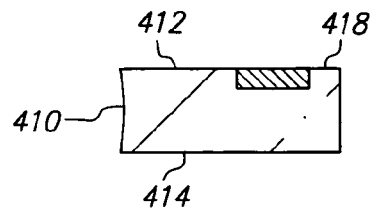
FIGS. 13A–13S are cross-sectional views showing a method of making a semiconductor chip assembly in accordance with a fourth embodiment of the present invention.
Figure 14A:
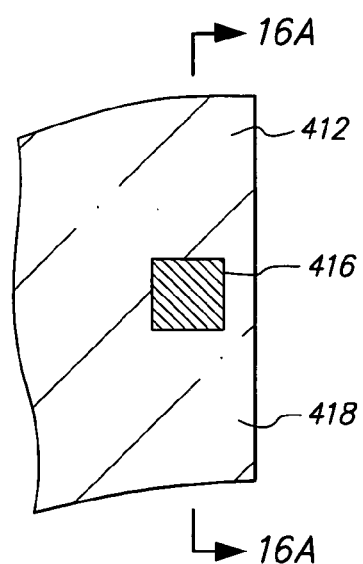
FIGS. 14A–14S are top plan views corresponding to FIGS. 13A–13S, respectively.
Figure 15A:
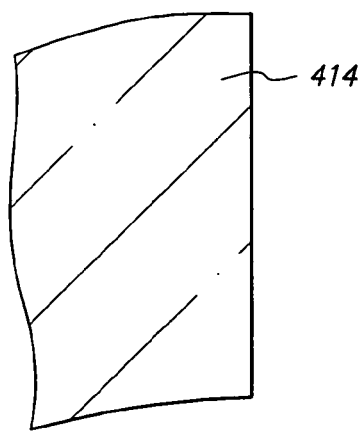
FIGS. 15A–15S are bottom plan views corresponding to FIGS. 13A–13S, respectively.
Figure 13B:
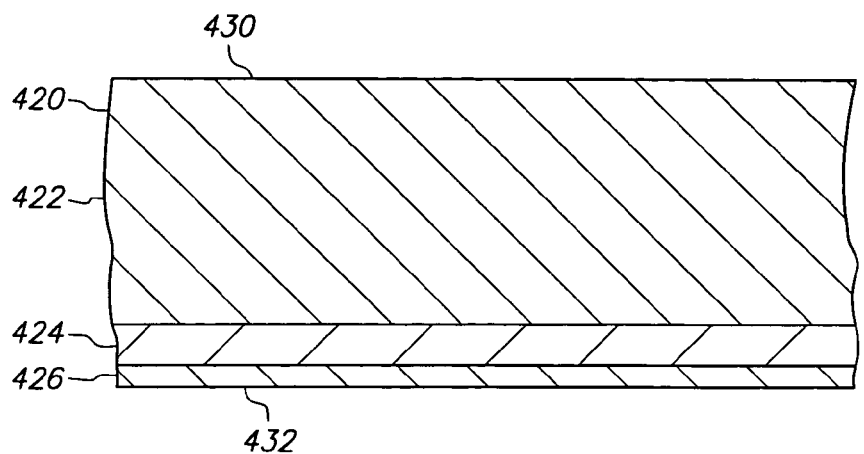
Figure 14B:
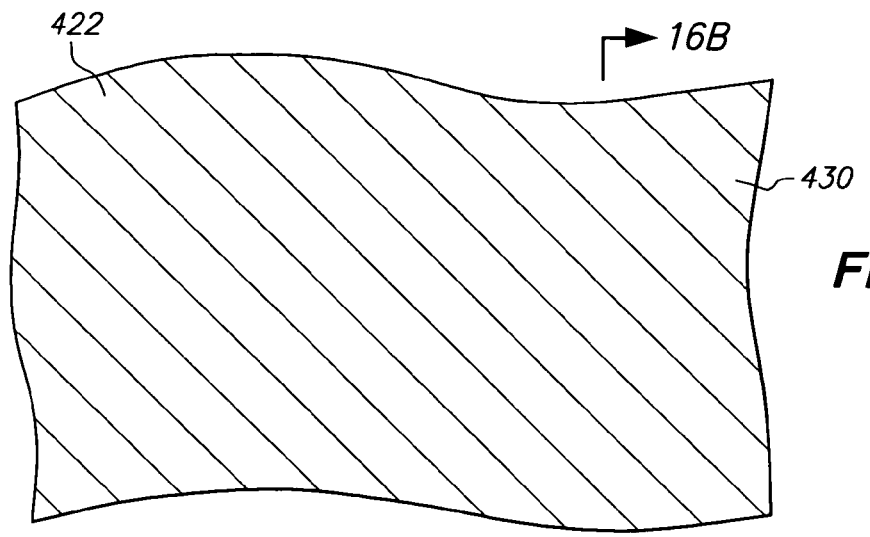
Figure 15B:
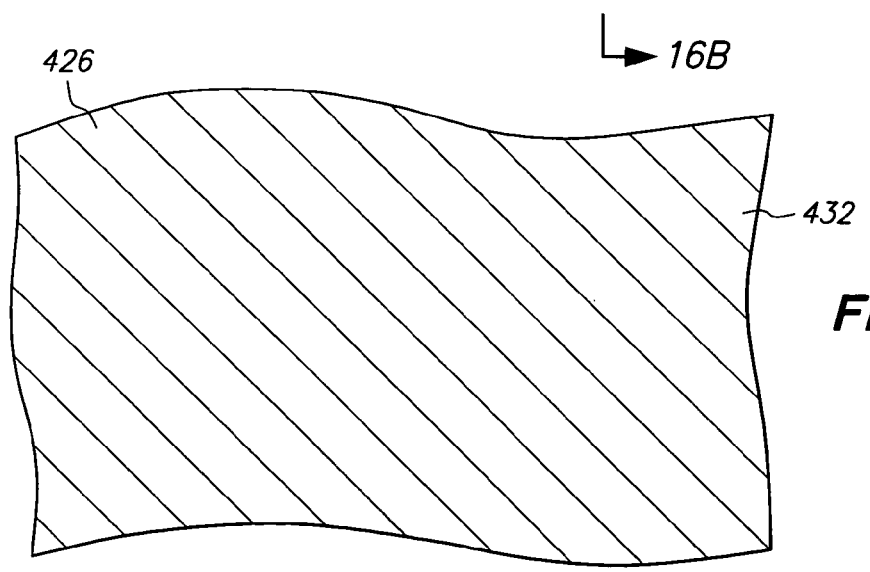
Figure 13C:
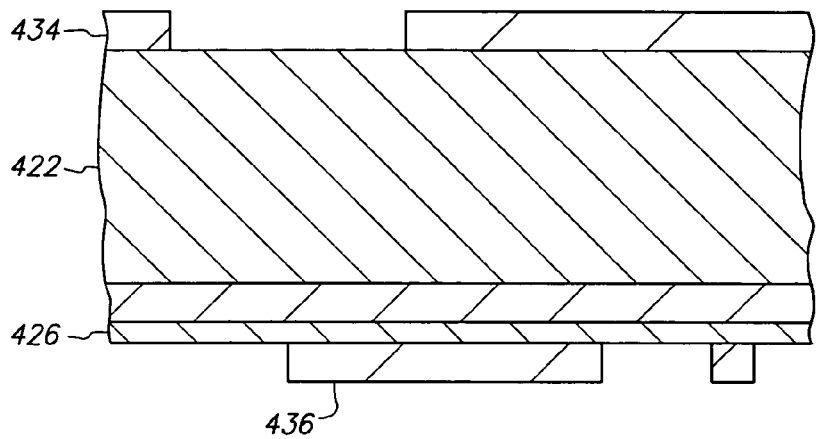
Figure 14C:
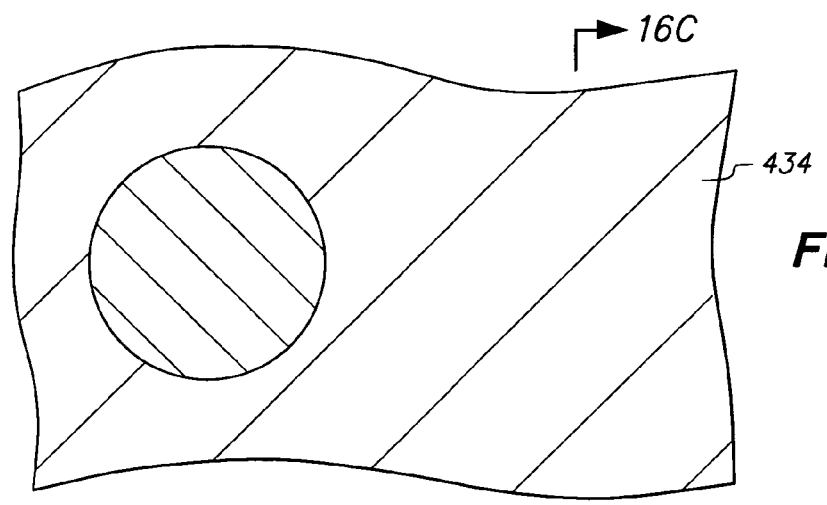
Figure 15C:
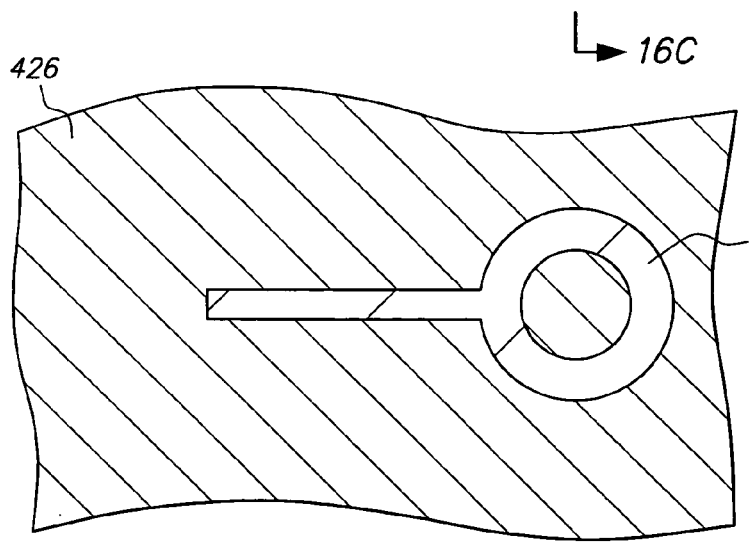
Figure 13D:
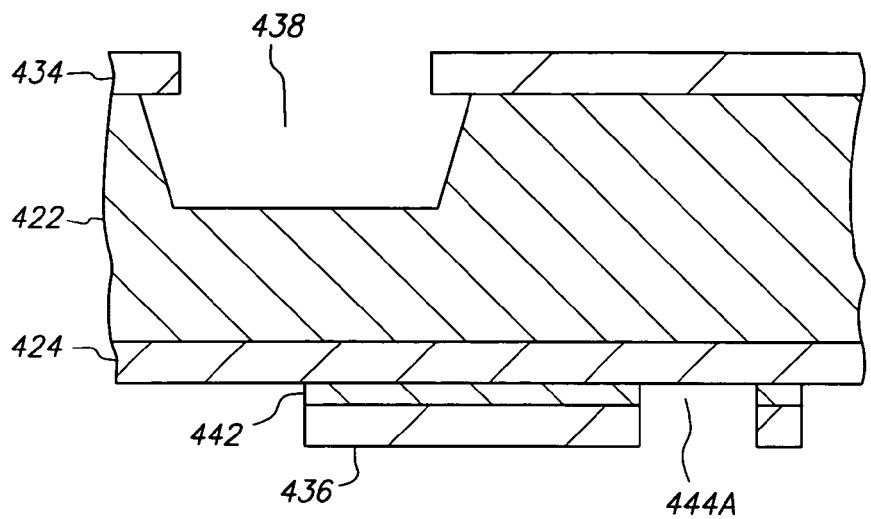
Figure 14D:
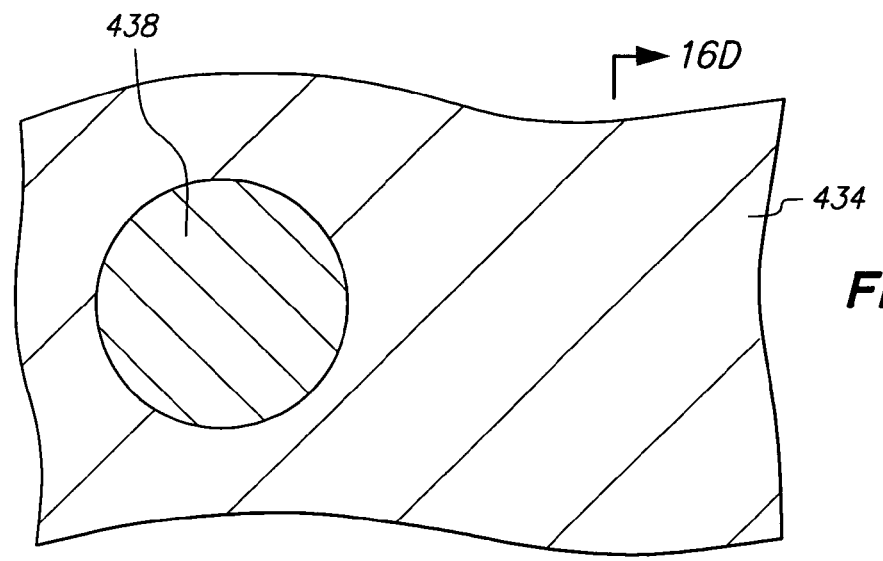
Figure 15D:
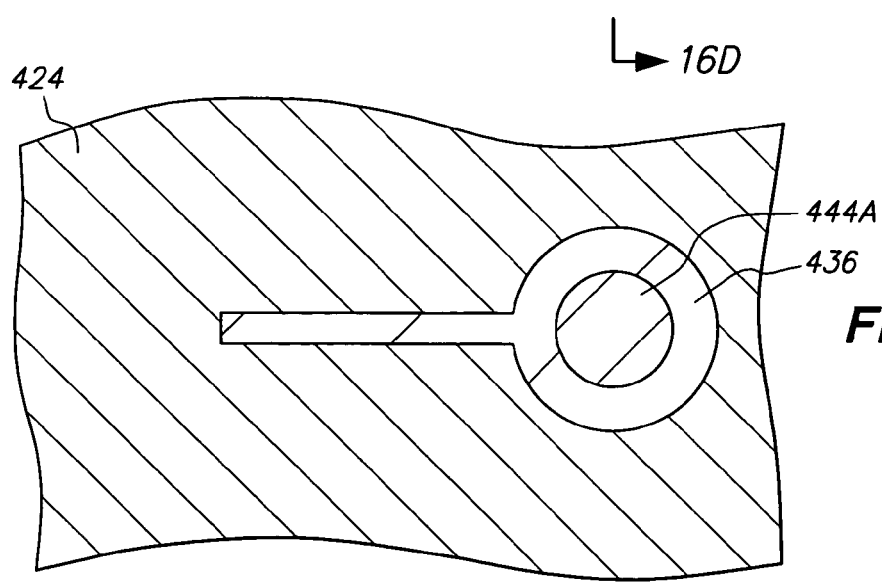
Figure 13E:
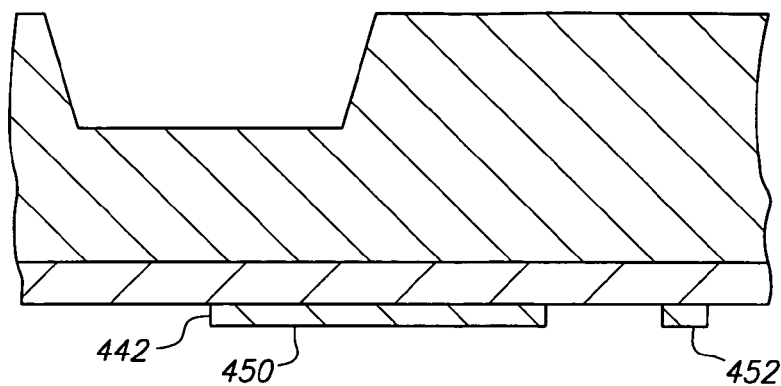
Figure 14E:
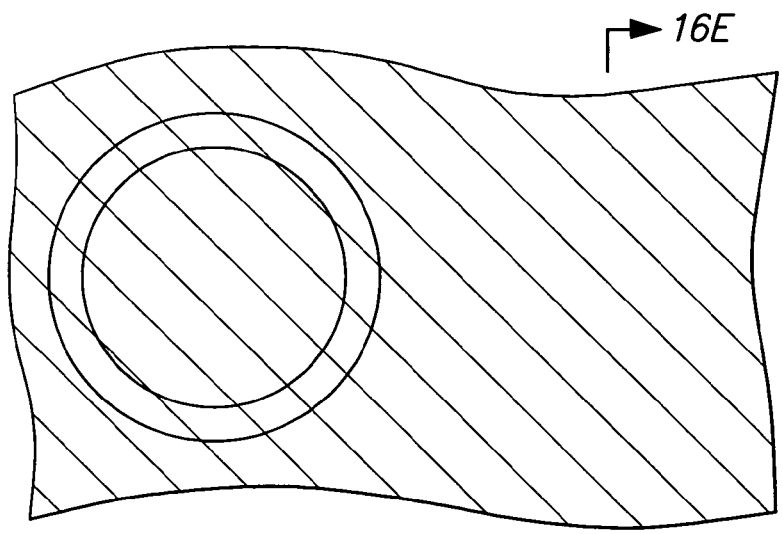
Figure 15E:
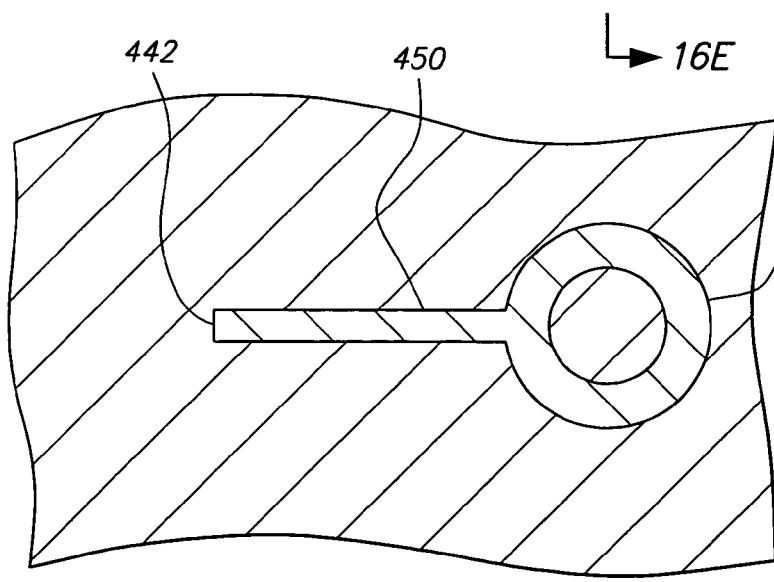
Figure 13F:
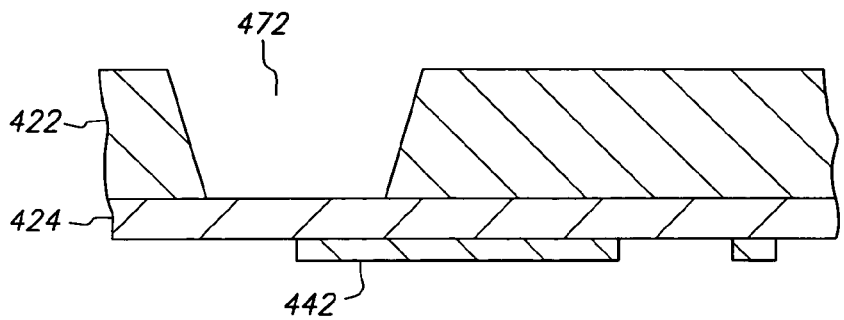
Figure 14F:
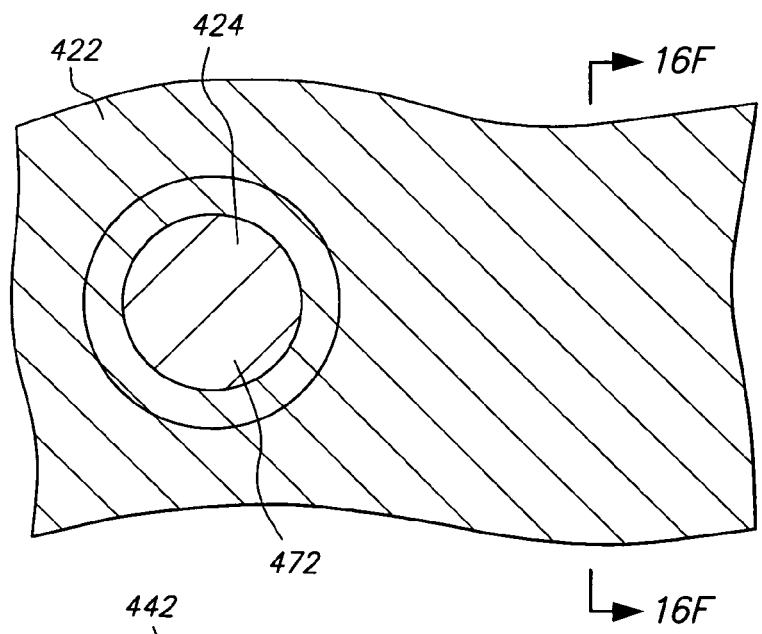
Figure 15F:
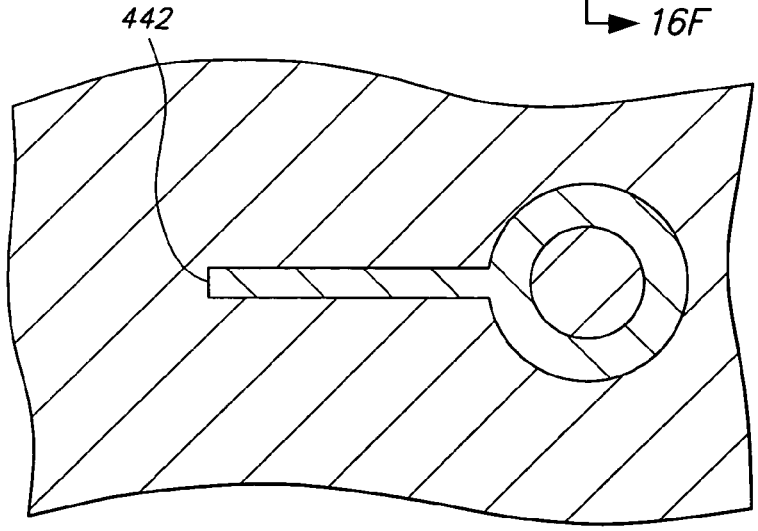
Figure 13G:
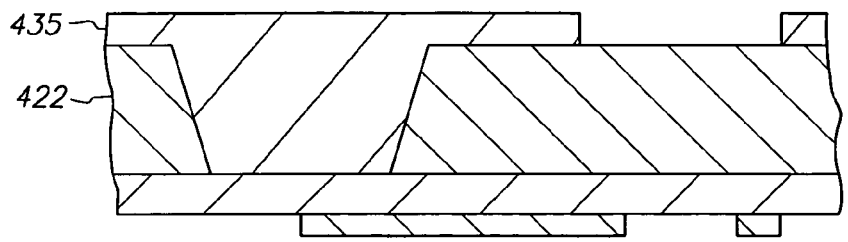
Figure 14G:
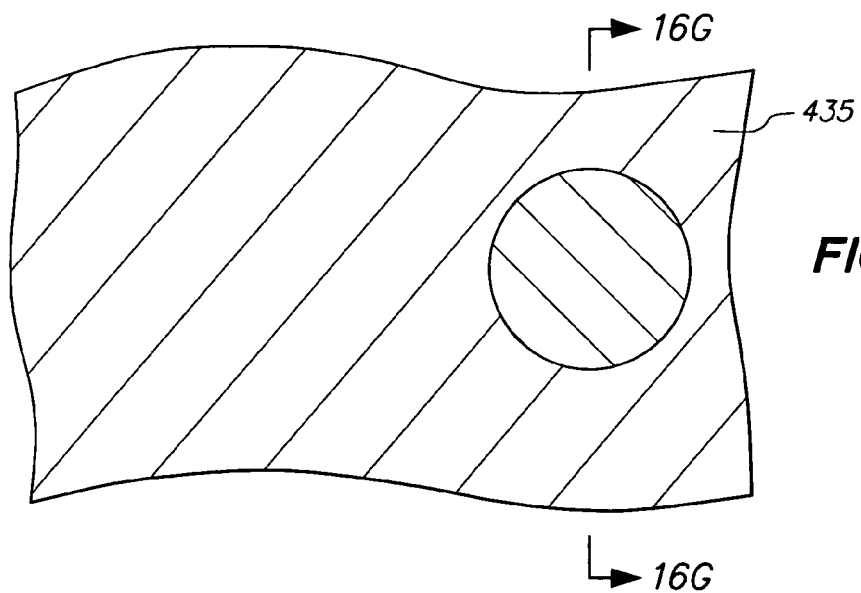
Figure 15G:
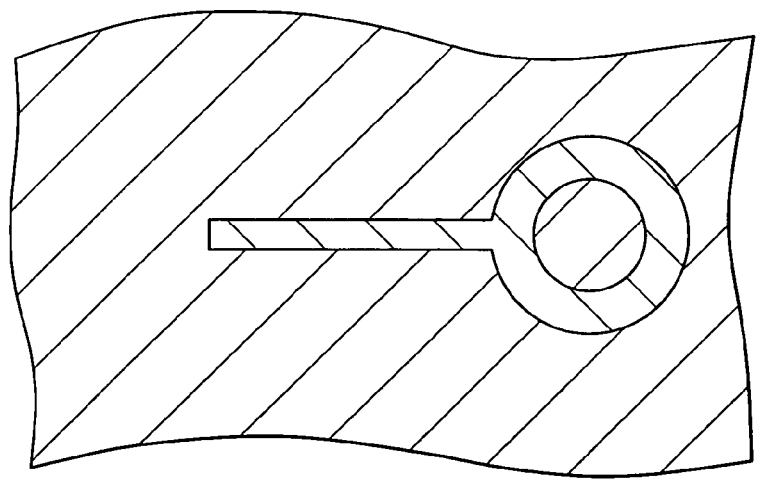
Figure 13H:
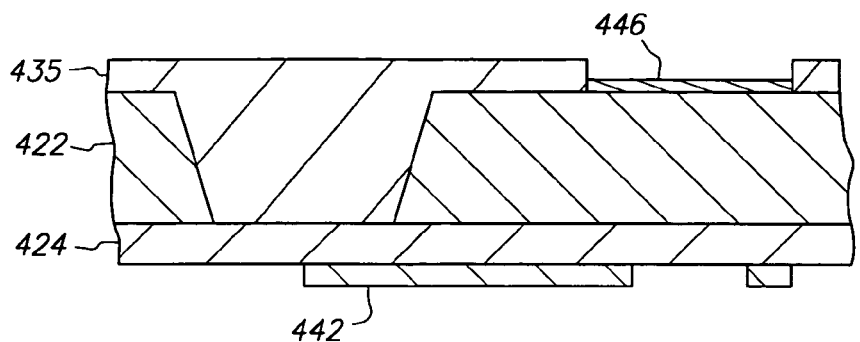
Figure 14H:
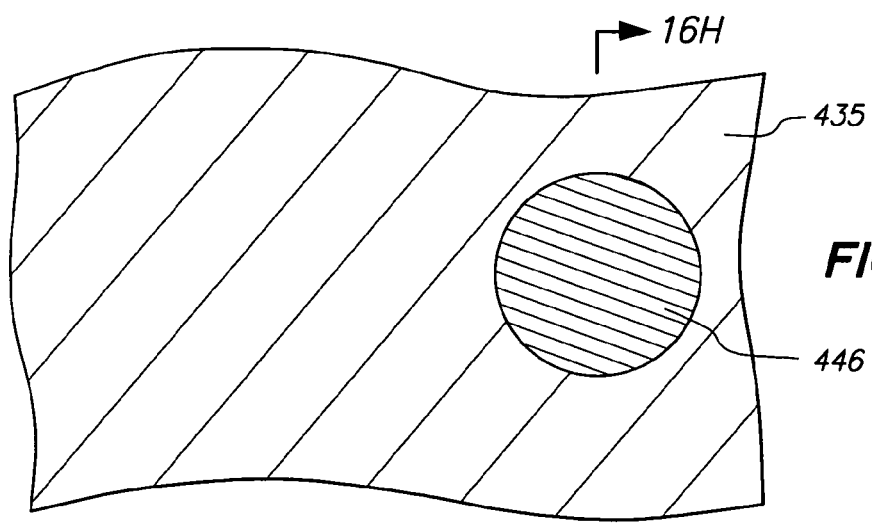
Figure 15H:
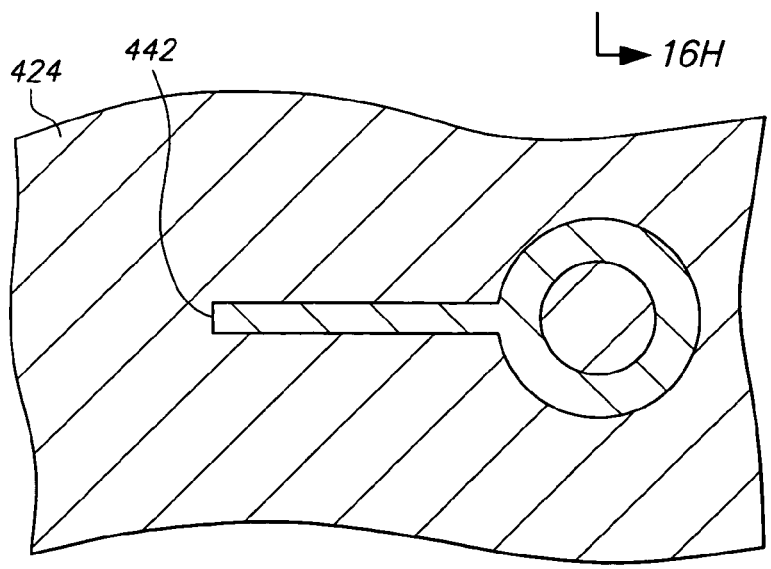
Figure 13I:
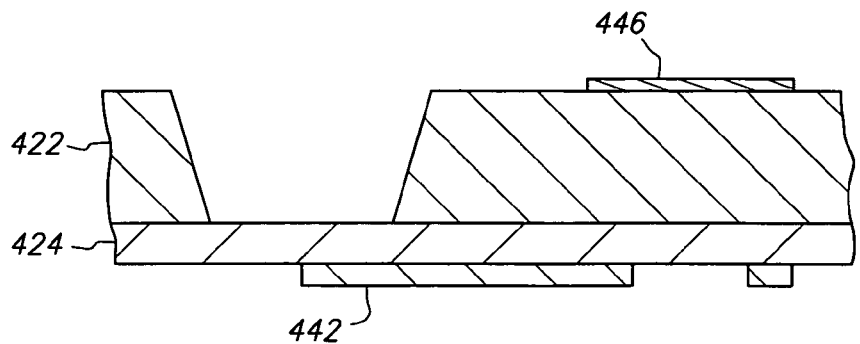
Figure 14I:
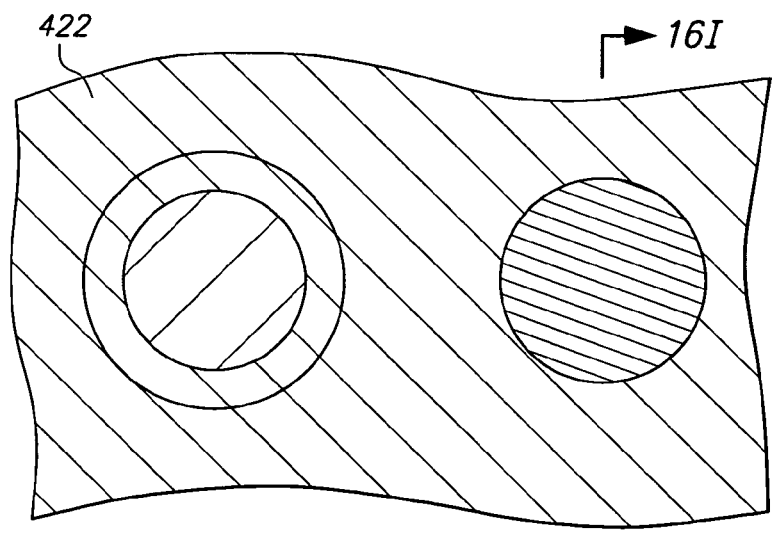
Figure 15I:
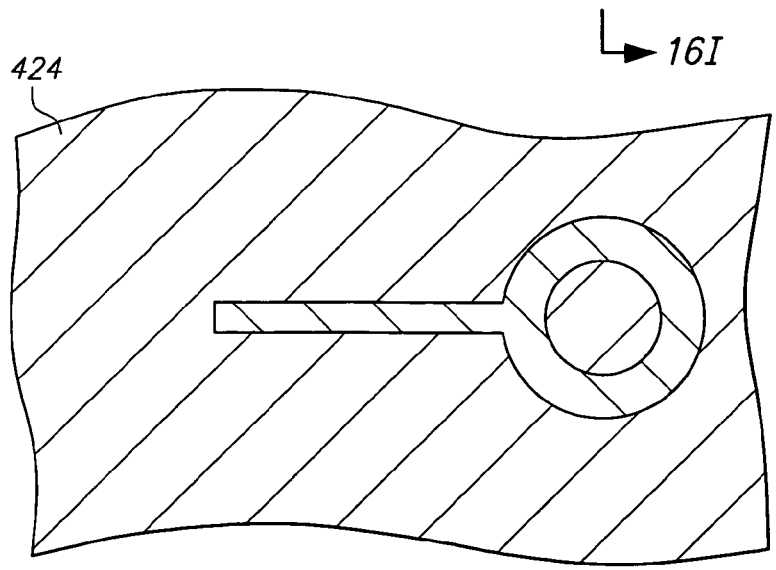
Figure 13J:
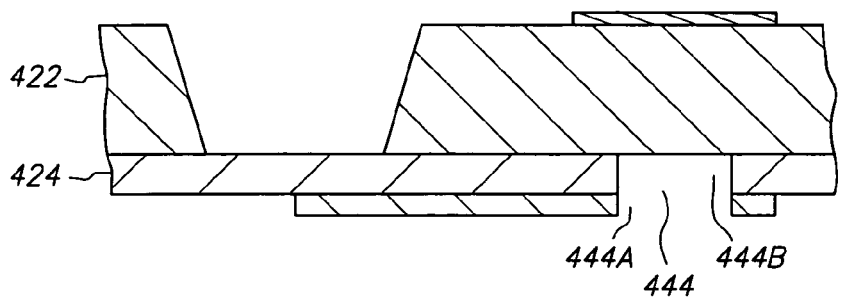
Figure 14J:
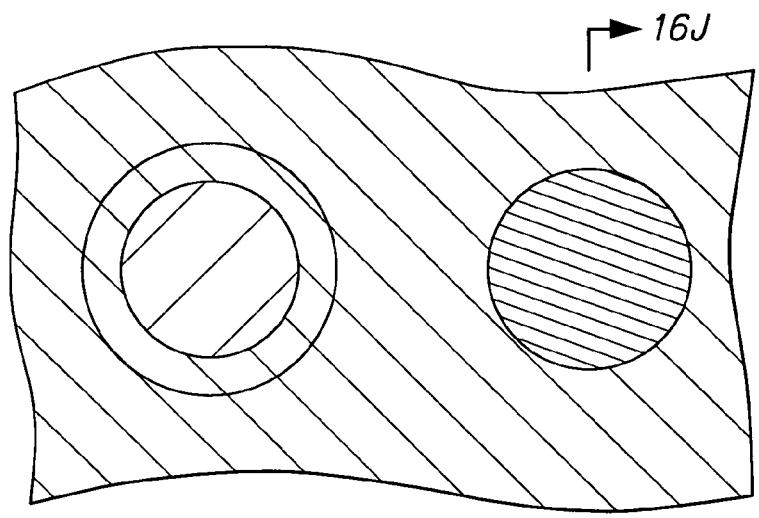
Figure 15J:
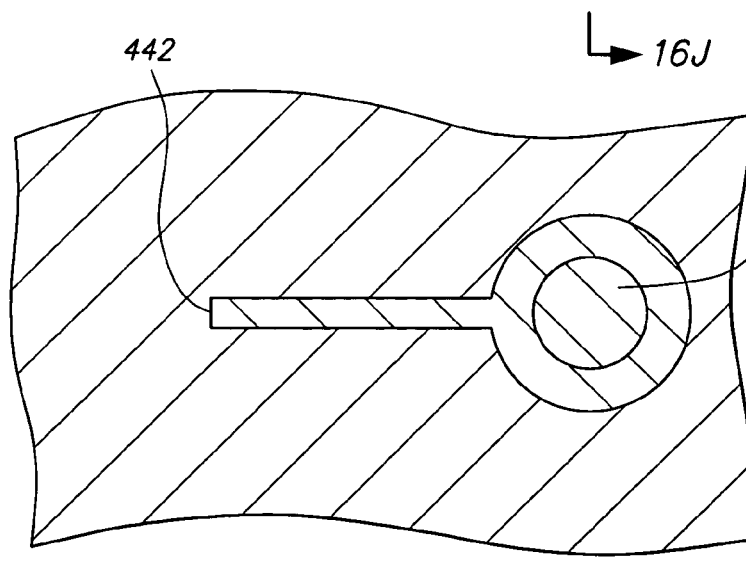
Figure 13K:
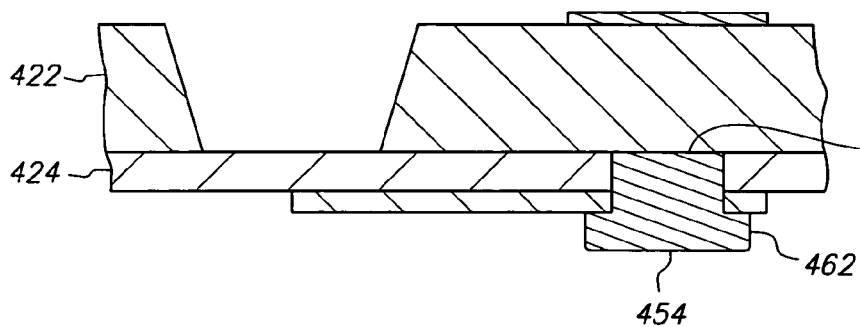
Figure 14K:
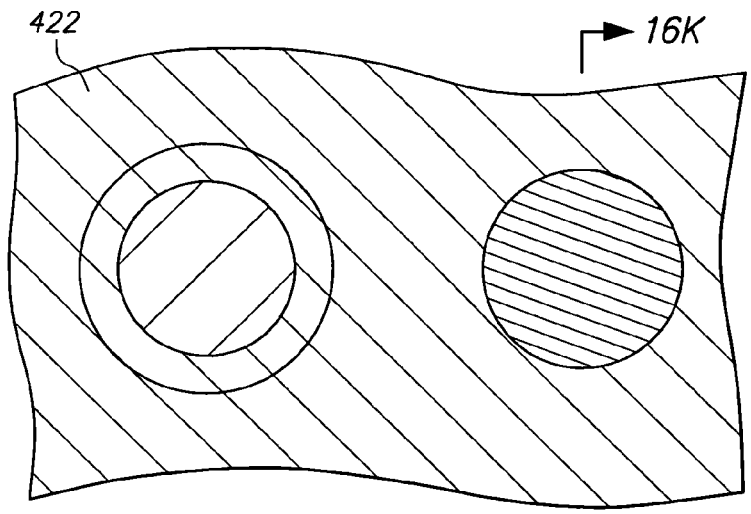
Figure 15K:
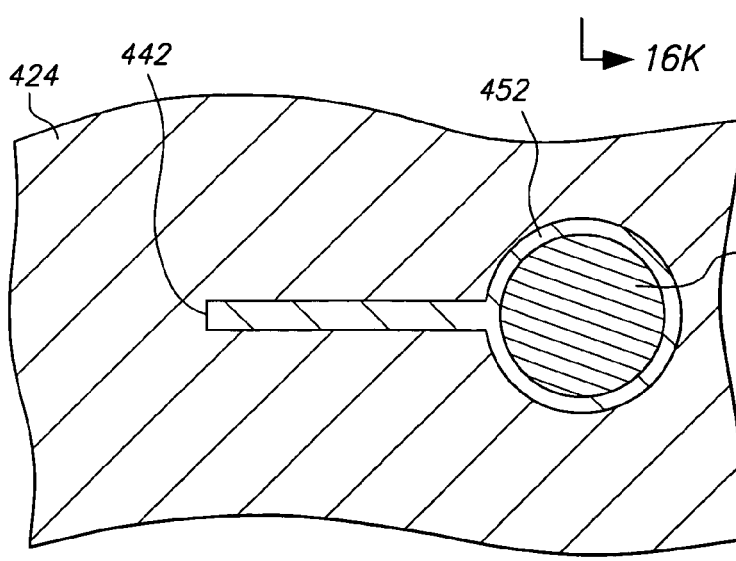
Figure 13L:
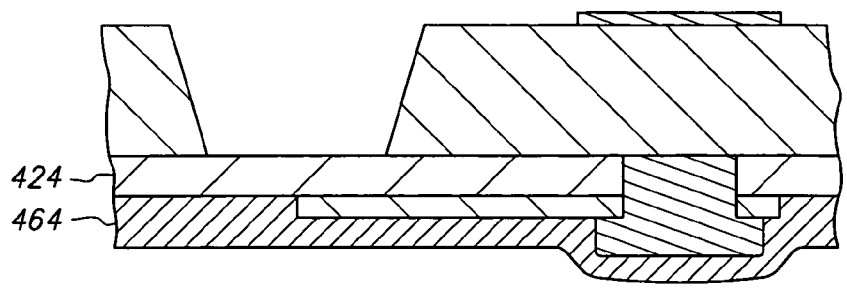
Figure 14L:
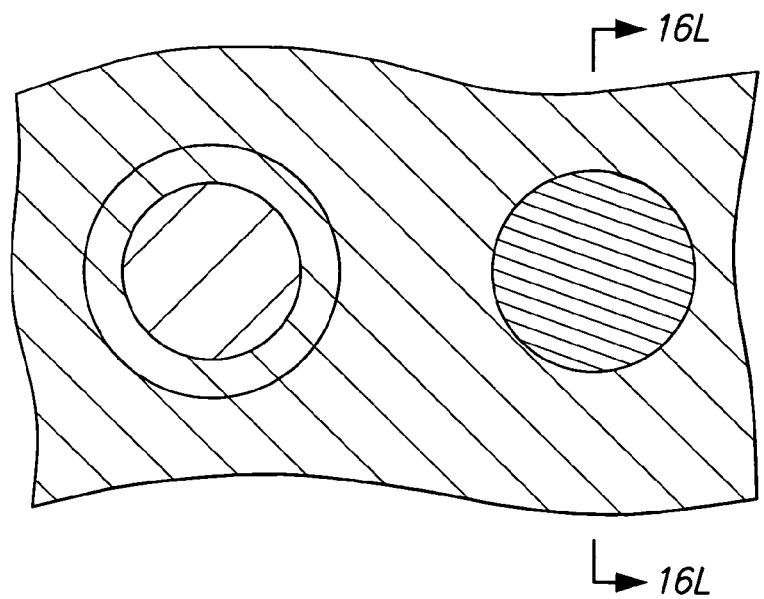
Figure 15L:
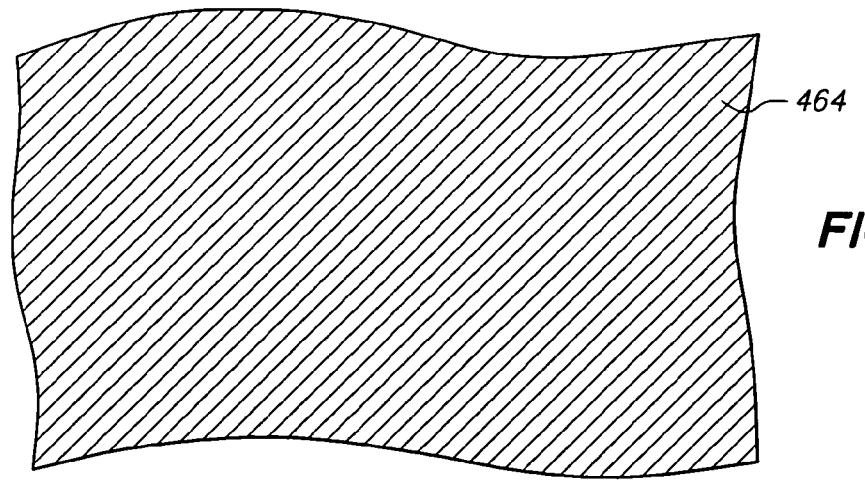
Figure 13M:
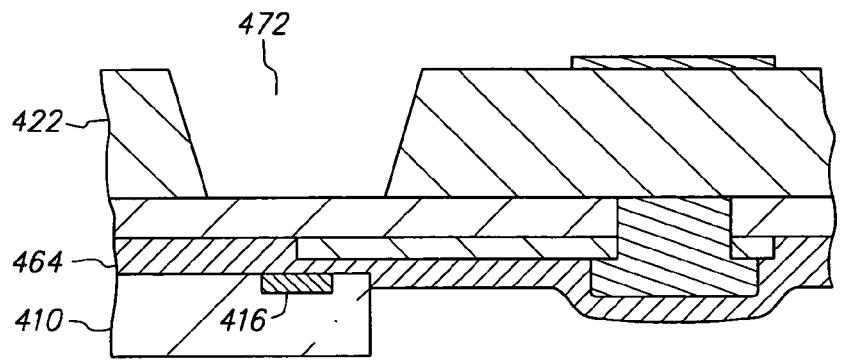
Figure 14M:
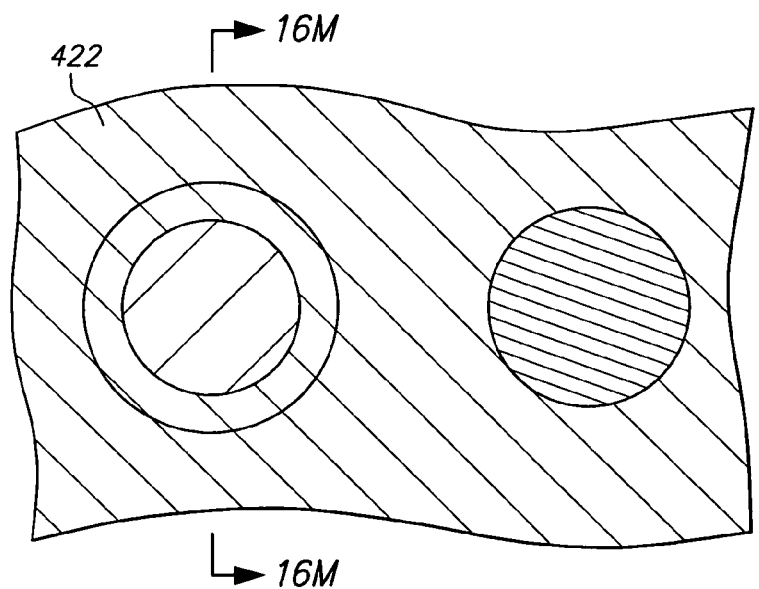
Figure 15M:
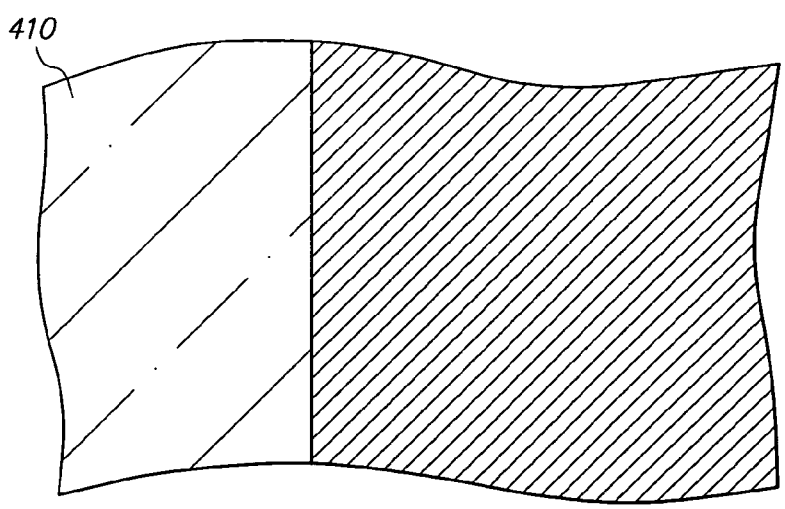
Figure 13N:
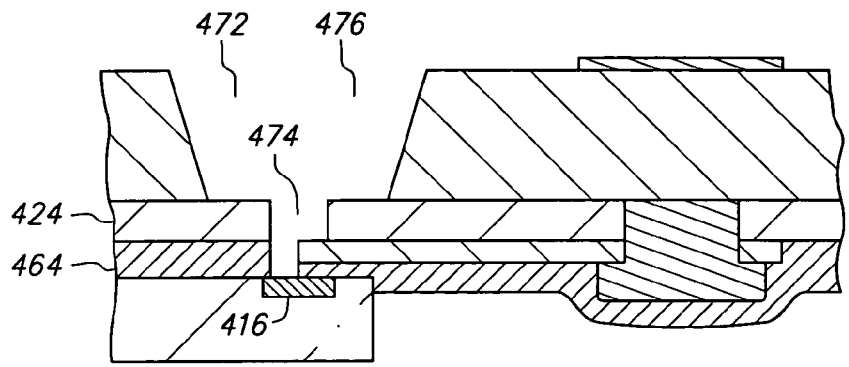
Figure 14N:
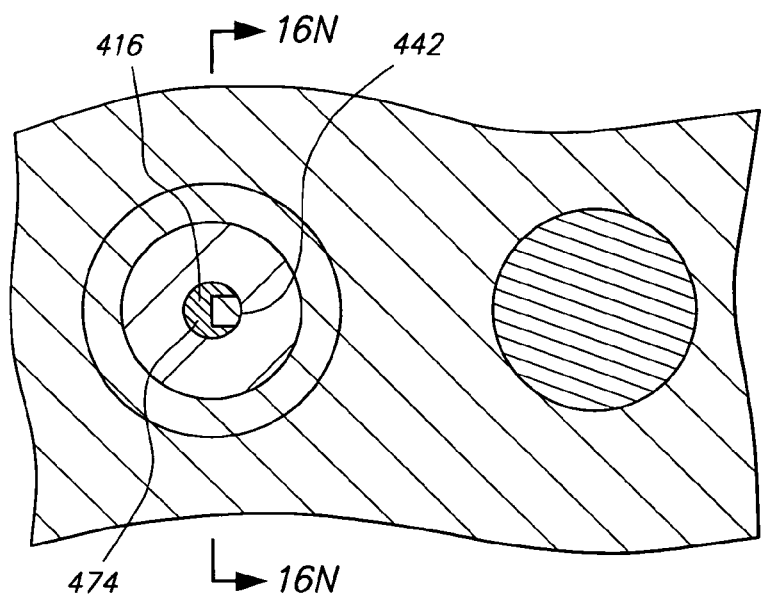
Figure 15N:
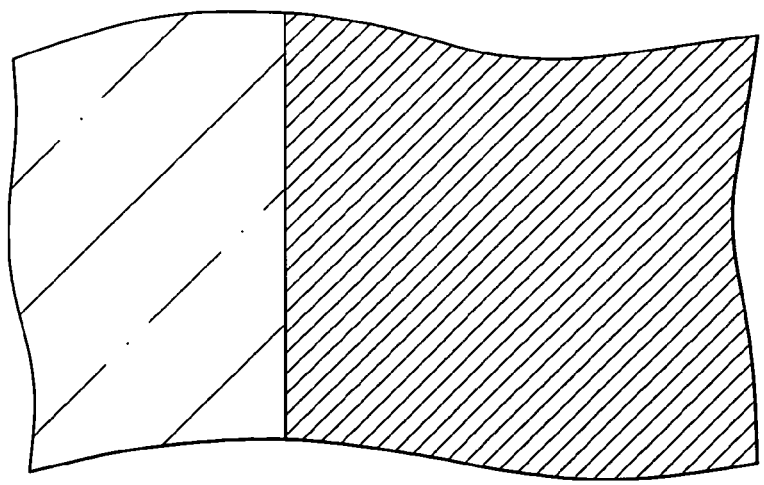
Figure 13O:
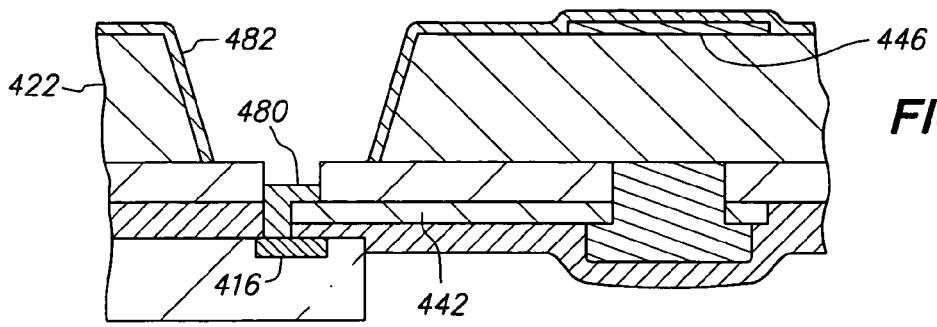
Figure 14O:
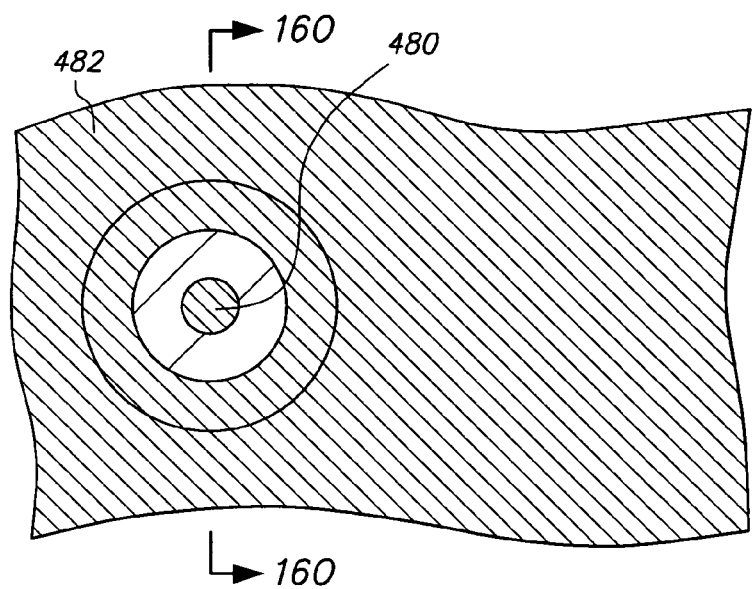
Figure 15O:
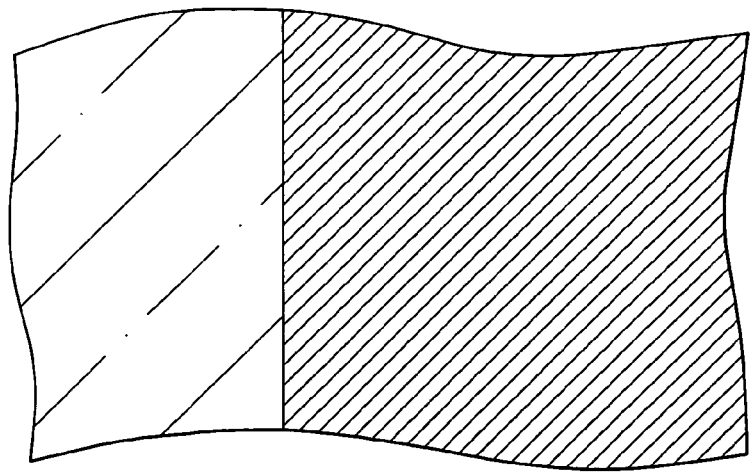
Figure 13P:
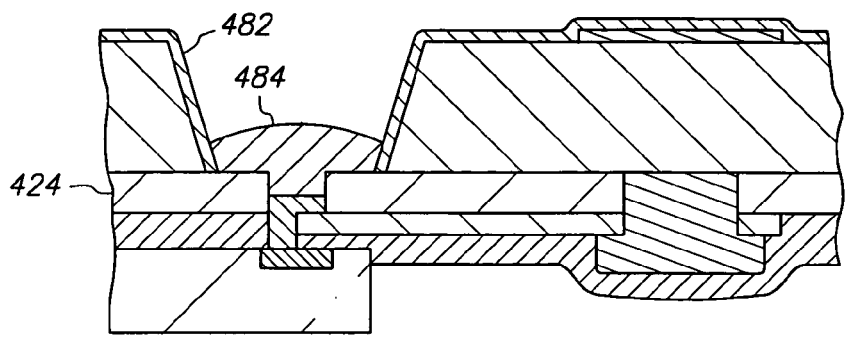
Figure 14P:
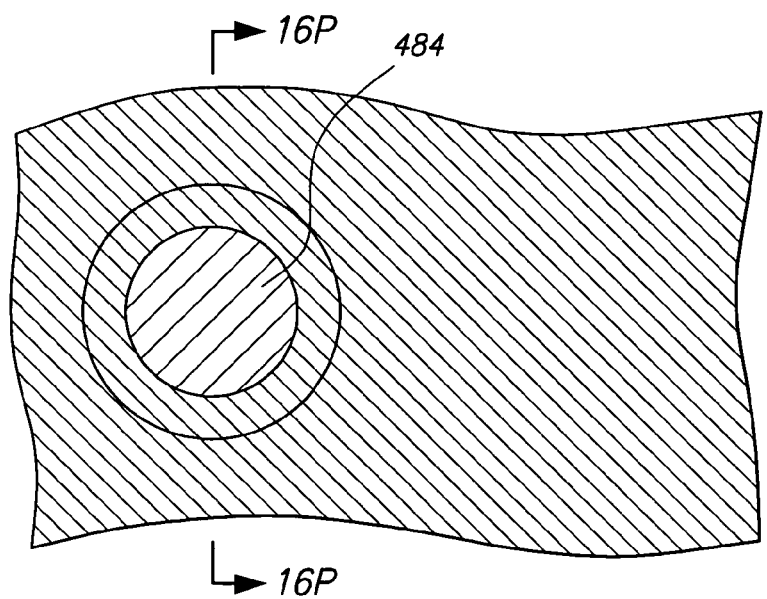
Figure 15P:
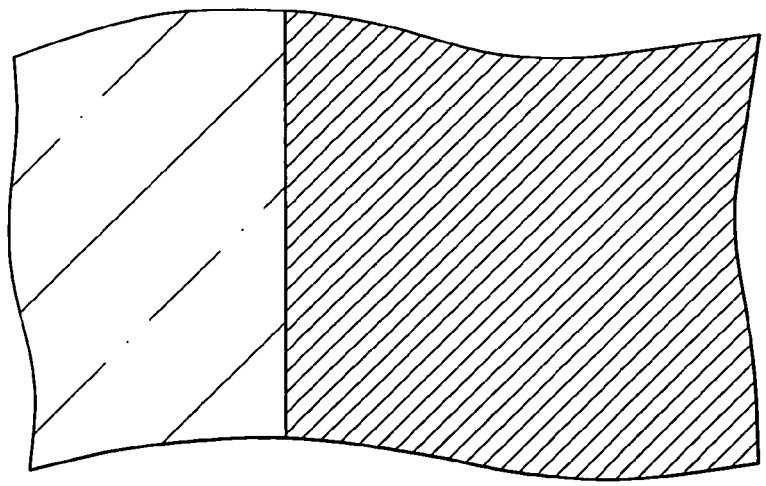
Figure 13Q:
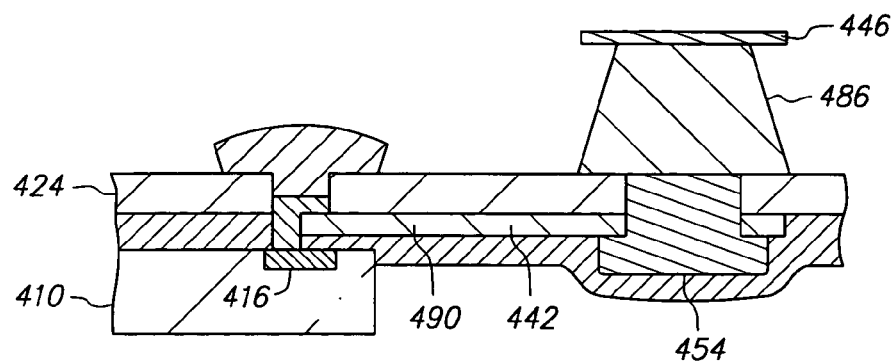
Figure 14Q:
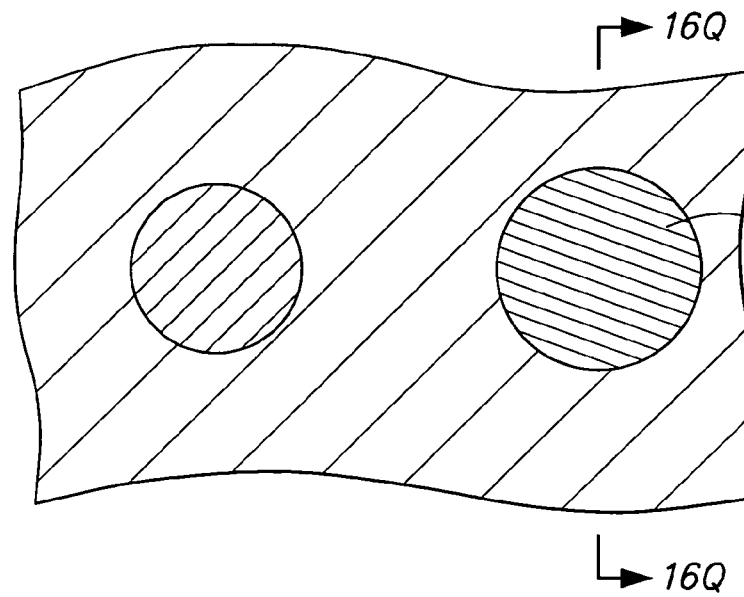
Figure 15Q:
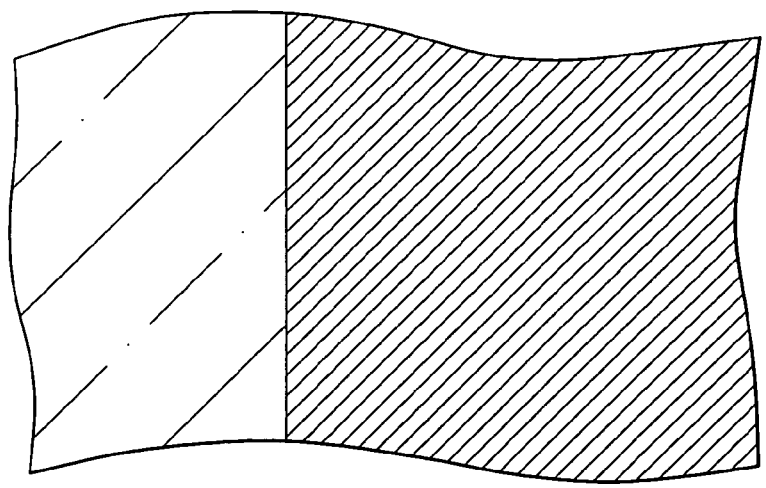
Figure 13R:
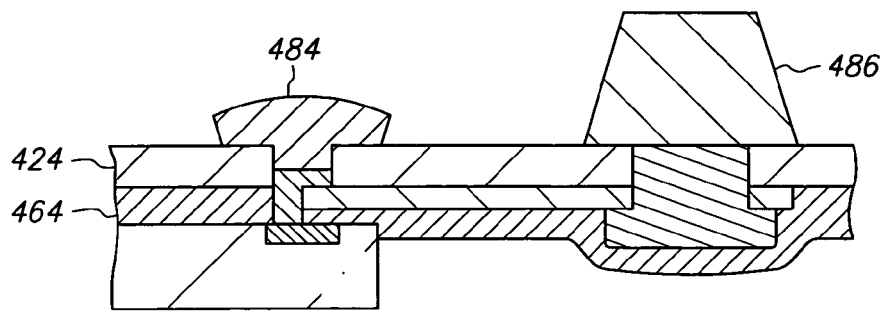
Figure 14R:
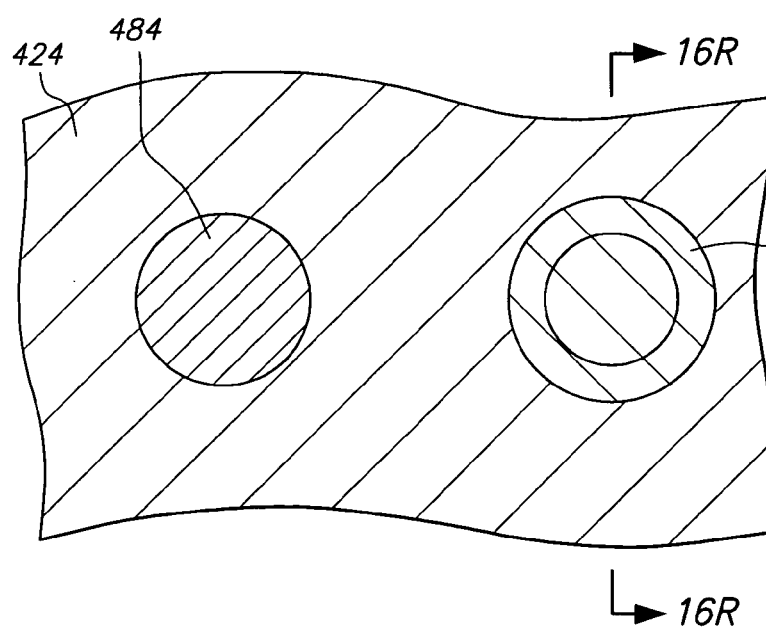
Figure 15R:
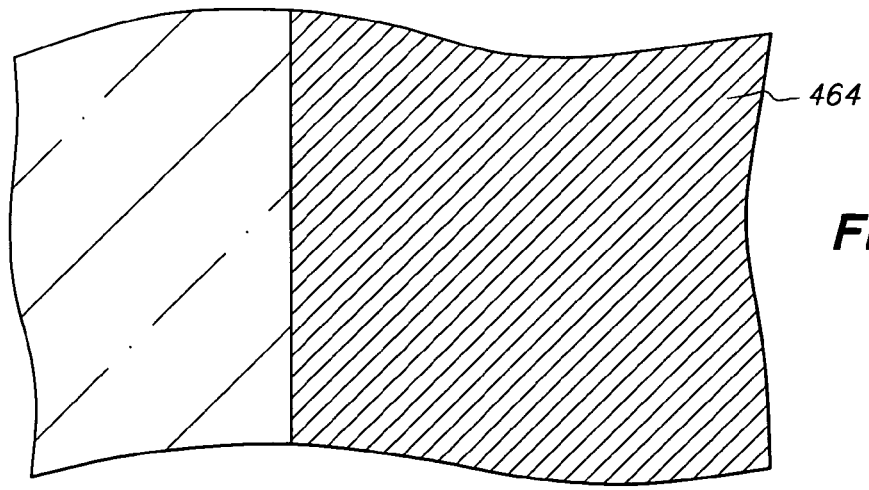
Figure 13S:
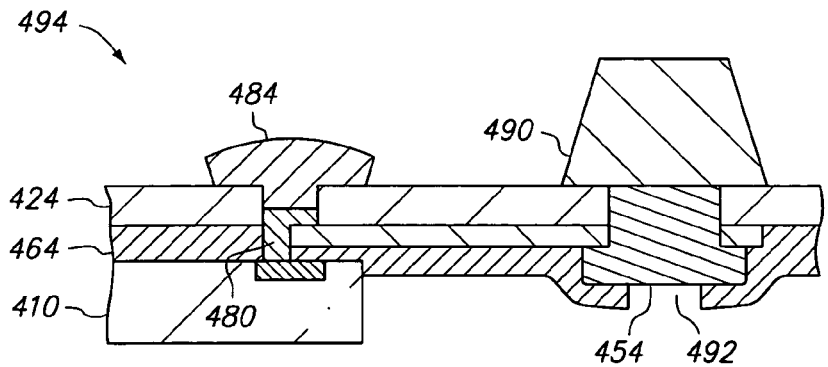
Figure 14S:
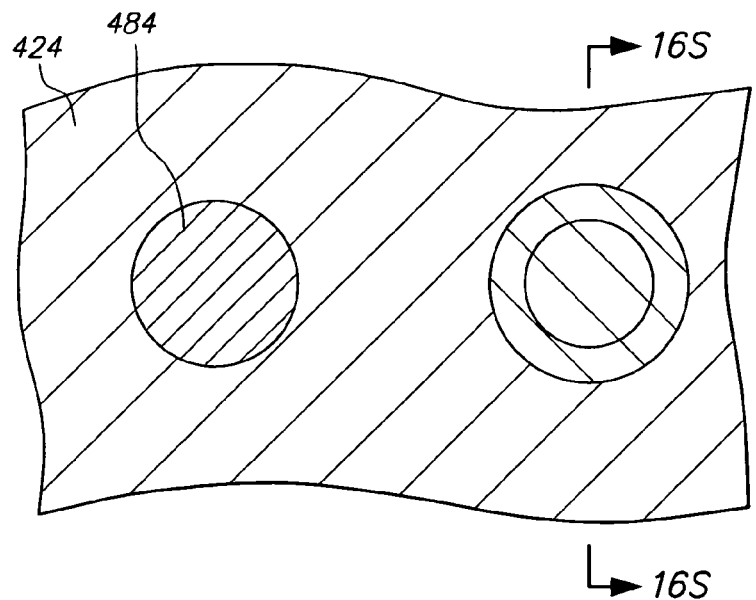
Figure 15S:
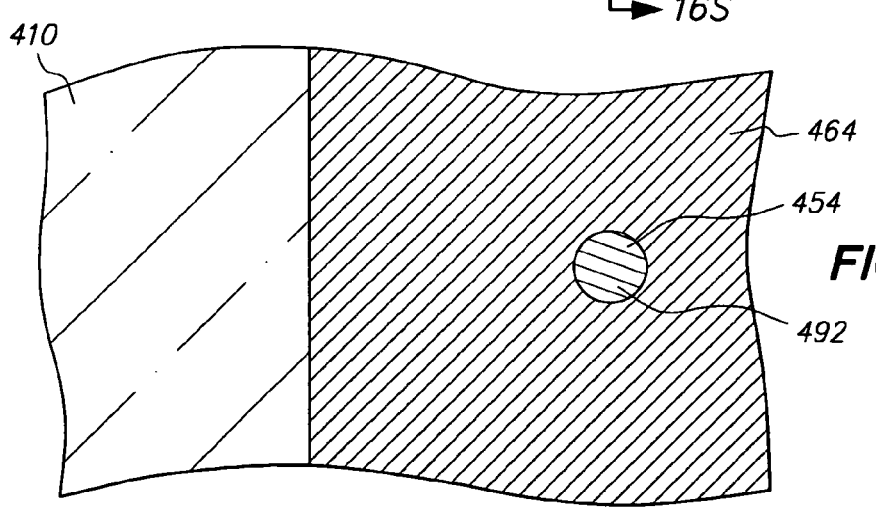

FIGS. 9A–9P, 10A–10P, 11A–11P and 12A–12P are cross-sectional, top, bottom and cross-sectional views, respectively, of a method of making a semiconductor chip assembly in accordance with a third embodiment of the present invention. FIGS. 12A–12P are oriented orthogonally with respect to FIGS. 9A–9P and depict FIGS. 9A–9P as viewed from left-to-right. In the third embodiment, the opening in the metal base is formed using blanket etching after the pillar etch mask is formed before mechanically attaching the chip to the laminated structure. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, metal base 322 corresponds to metal base 122, etc.

FIGS. 9A, 10A, 11A and 12A are cross-sectional, top, bottom and cross-sectional views, respectively, of semiconductor chip 310 which includes opposing major surfaces 312 and 314. Surface 312 includes conductive pad 316 and passivation layer 318.

FIGS. 9B, 10B, 11B and 12B are cross-sectional, top, bottom and cross-sectional views, respectively, of laminated structure 320 that includes metal base 322, insulative base 324 and metal layer 326. Metal base 322 includes surface 330, and metal layer 326 includes surface 332.

FIGS. 9C, 10C, 11C and 12C are cross-sectional, top, bottom and cross-sectional views, respectively, of photoresist layers 334 and 336 formed on metal base 322 and metal layer 326, respectively. Photoresist layer 334 contains openings that selectively expose metal base 322, and photoresist layer 336 contains openings that selectively expose metal layer 326.

FIGS. 9D, 10D, 11D and 12D are cross-sectional, top, bottom and cross-sectional views, respectively, of recess 338 and recess 340 formed in metal base 322, routing line 342 formed from metal layer 326, and first via portion 344A formed through routing line 342 by wet chemical etching using photoresist layers 334 and 336 as etch masks.

Recesses 338 and 340 have a depth of 100 microns. Therefore, metal base 322 receives more extensive wet chemical etching than metal layer 326 to form recesses 338 and 340 with the desired depth without damaging routing line 342 which is 12 microns thick and 40 microns wide at the elongated routing region.

In this instance, metal base 322 and metal layer 326 are exposed to a first wet chemical etch and then metal base 322 is exposed to a second wet chemical etch. In particular, top and bottom spray nozzles (not shown) simultaneously spray a first wet chemical etch on metal base 322 and metal layer 326 using photoresist layers 334 and 336 as etch masks. The first wet chemical etch etches 15 microns into metal base 322 and completely through metal layer 326, thereby partially forming recesses 338 and 340 and completely forming routing line 342 and first via portion 344A. Thereafter, the top spray nozzle sprays a second wet chemical etch on metal base 322 using photoresist layer 334 as an etch mask while the bottom spray nozzle is deactivated. The second wet chemical etch etches another 85 microns into metal base 322, thereby completely forming recesses 338 and 340. However, routing line 342 is not exposed to the second wet chemical etch.

FIGS. 9E, 10E, 11E and 12E are cross-sectional, top, bottom and cross-sectional views, respectively, of the structure after photoresist layers 334 and 336 are stripped. Routing line 342 includes elongated routing region 350 and enlarged annular region 352.

FIGS. 9F, 10F, 11F and 12F are cross-sectional, top, bottom and cross-sectional views, respectively, of the structure after via 344 is formed through insulative base 324 and routing line 342. A portion of insulative base 324 exposed by first via portion 344A is selectively removed using a laser etch to form second via portion 344B in insulative base 324. The combination of via portions 344A and 344B forms via 344 that exposes metal base 322.

FIGS. 9G, 10G, 11G and 12G are cross-sectional, top, bottom and cross-sectional views, respectively, of solder 346 deposited in recess 340 and interconnect 354 deposited in via 344. Solder 346 fills the bottom portion of recess 340 and is spaced from surface 330 of metal base 322. Interconnect 354 fills via 344 and contacts and electrically connects metal base 322 and routing line 342. Furthermore, interconnect 354 is composed of solder.

Solder 346 has a diameter of 400 microns and a thickness of 15 microns. Thus, solder 346 is spaced from surface 330 by 85 microns (100–15).

Interconnect 354 has a mushroom-shape that includes cylindrical base 360 and pileus or cap 361. Cylindrical base 360 fills via 344, and cap 361 extends outside via 344 and contacts enlarged annular region 352 without contacting insulative base 324 or elongated routing region 350. Cylindrical base 360 has a thickness of 37 microns and a diameter of 200 microns, and cap 361 has a thickness of 50 microns and a diameter of 300 microns. Cap 361 is axially aligned with via 344 and enlarged annular region 352. Thus, cap 361 is spaced from the peripheral sidewalls of enlarged annular region 352 by 50 microns ((400–300)/2).

Solder 346 is deposited into recess 340 by solder paste printing followed by solder reflow in the same manner as solder 246. Likewise, interconnect 354 is deposited into via 344 and onto routing line 342 outside via 344 by solder paste printing followed by solder reflow in the same manner as interconnect 254.

FIGS. 9H, 10H, 11H and 12H are cross-sectional, top, bottom and cross-sectional views, respectively, of the structure after a portion of metal base 322 is blanketly removed to form opening 372 in metal base 322 that exposes insulative base 324. In particular, the top spray nozzle sprays another wet chemical etch on metal base 322 while the bottom spray nozzle is deactivated. The wet chemical etch etches 100 microns into metal base 322, thereby reducing the thickness of metal base 322 to 100 microns (200–100) and effecting a pattern transfer of recess 338 to form opening 372. The wet chemical etch also removes recesses 338 and 340 and may slightly undercut metal base 322 beneath the peripheral sidewalls of solder 346. However, routing line 342 is not exposed to the wet chemical etch.

FIGS. 9I, 10I, 11I and 12I are cross-sectional, top, bottom and cross-sectional views, respectively, of adhesive 364 formed on insulative base 324, routing line 342 and interconnect 354.

FIGS. 9J, 10J, 11J and 12J are cross-sectional, top, bottom and cross-sectional views, respectively, of chip 310 mechanically attached to laminated structure 320 by adhesive 364. Chip 310 and routing line 342 are positioned relative to one another so that routing line 342 is disposed above and overlaps and is electrically isolated from pad 316. In addition, chip 310 and metal base 322 are positioned relative to one another so that pad 316 is within the periphery of opening 372.

FIGS. 9K, 10K, 11K and 12K are cross-sectional, top, bottom and cross-sectional views, respectively, of opening 374 formed in insulative base 324 and adhesive 364 by laser ablation. Opening 374 exposes pad 316 and the peripheral sidewalls and top surface of routing line 342, and adhesive 364 remains in contact with and sandwiched between pad 316 and routing line 342. The combination of openings 372 and 374 form opening 376 that exposes pad 316 and routing line 342.

FIGS. 9L, 10L, 11L and 12L are cross-sectional, top, bottom and cross-sectional views, respectively, of connection joint 380 formed on pad 316 and routing line 342, and metal layer 382 formed on metal base 322 and solder 346. Connection joint 380 and metal layer 382 are formed by a copper electroplating operation.

FIGS. 9M, 10M, 11M and 12M are cross-sectional, top, bottom and cross-sectional views, respectively, of insulator 384 formed on insulative base 324, connection joint 380 and metal layer 382 in opening 376.

FIGS. 9N, 10N, 11N and 12N are cross-sectional, top, bottom and cross-sectional views, respectively, of the structure after a selected portion of metal base 322 and metal layer 382 are removed and a remaining portion of metal base 322 outside the periphery of chip 310 forms pillar 386 that overlaps and is aligned with via 344 and interconnect 354. This is accomplished by applying a wet chemical etch to metal base 322 and metal layer 382 using solder 346 as an etch mask.

The wet chemical etch initially removes metal layer 382, thereby exposing metal base 322 and solder 346. Thereafter, the wet chemical etch etches completely through metal base 322, thereby effecting a pattern transfer of solder 346 onto metal base 322. The wet chemical etch removes all remaining portions of metal base 322 within the periphery of chip 310 but does not remove a portion of metal base 322 outside the periphery of chip 310 that overlaps and is aligned with via 344 and interconnect 354 and forms pillar 386. Pillar 386 overlaps and is axially aligned with via 344 and interconnect 354 and has a thickness of 100 microns, a diameter at insulative base 324 of 400 microns and a diameter at solder 346 of 250 microns.

Routing line 342, interconnect 354 and pillar 386 in combination provide conductive trace 390 that is adapted for providing horizontal and vertical routing between pad 316 and a terminal on a printed circuit board (not shown) in a next level assembly. Interconnect 354 contacts and electrically connects routing line 342 and pillar 386.

FIGS. 9O, 10O, 11O and 12O are cross-sectional, top, bottom and cross-sectional views, respectively, of the structure after solder 346 is fractured so that it is confined to the tip of pillar 386. Solder 346 is fractured by air blowing in the same manner as solder 246.

FIGS. 9P, 10P, 11P and 12P are cross-sectional, top, bottom and cross-sectional views, respectively, of the structure after opening 392 is formed through adhesive 364 to expose interconnect 354 using a laser etch.

At this stage, the manufacture of semiconductor chip assembly 394 that includes chip 310, insulative base 324, solder 346, adhesive 364, connection joint 380, insulator 384 and conductive trace 390 can be considered complete.

Figure 16A:
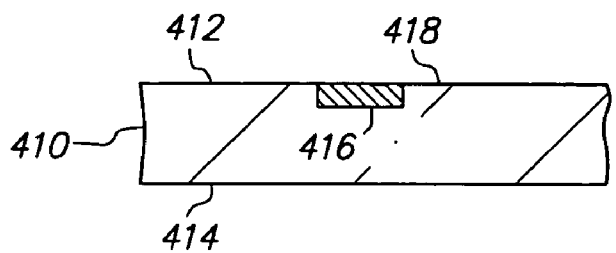
FIGS. 16A–16S are cross-sectional views corresponding to FIGS. 13A–13S, respectively.
Figure 16B:
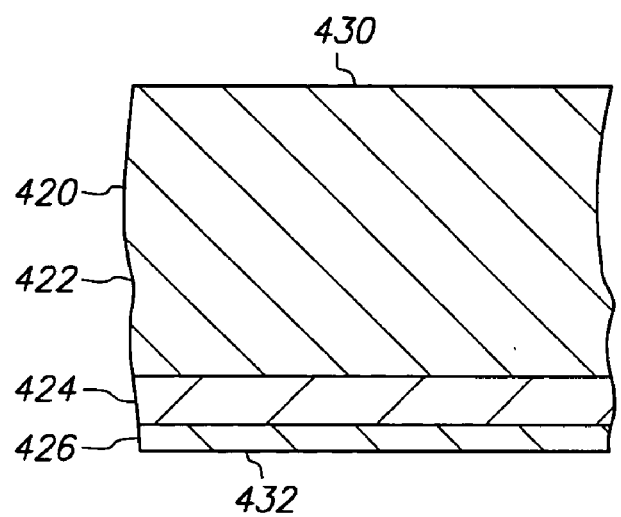
Figure 16C:
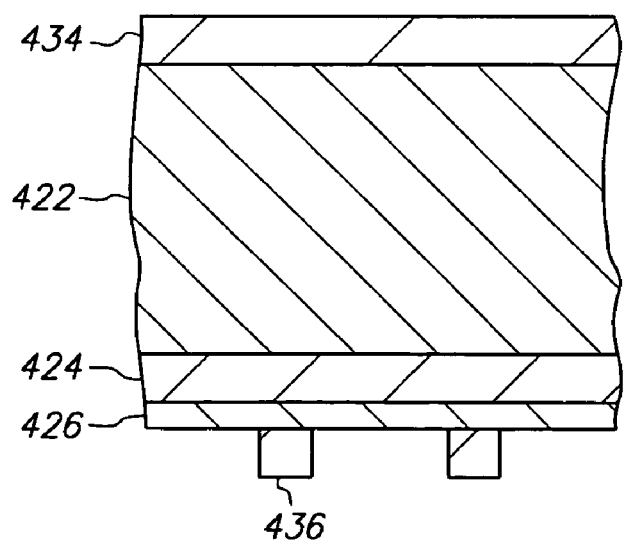
Figure 16D:
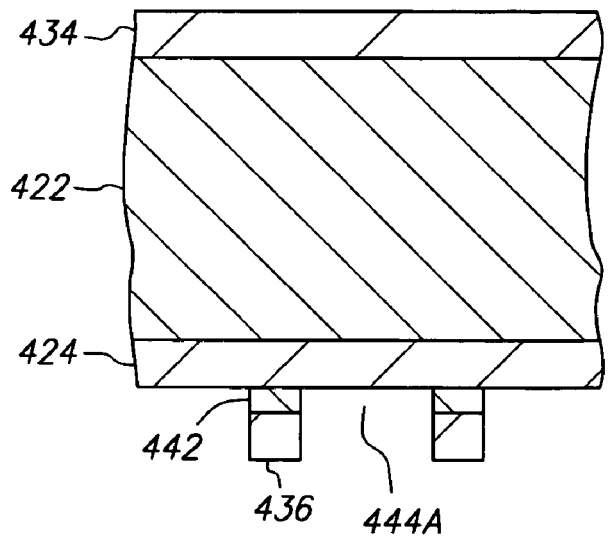
Figure 16E:
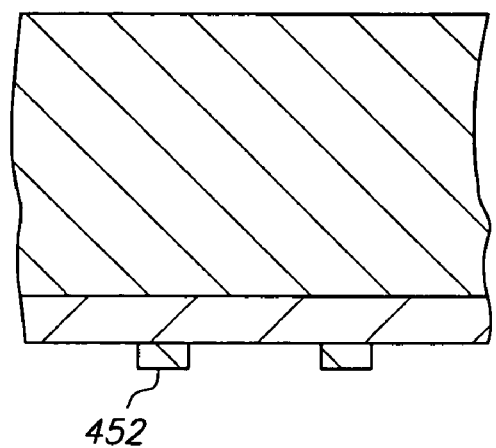
Figure 16F:
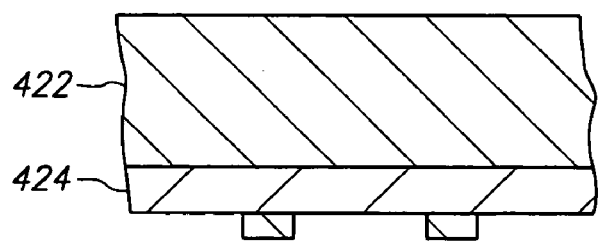
Figure 16G:
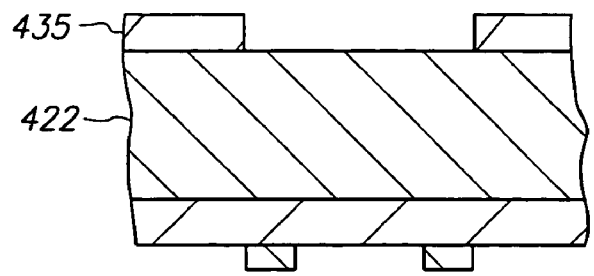
Figure 16H:
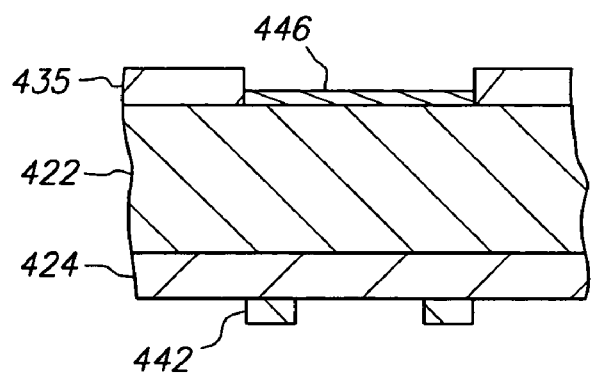
Figure 16I:
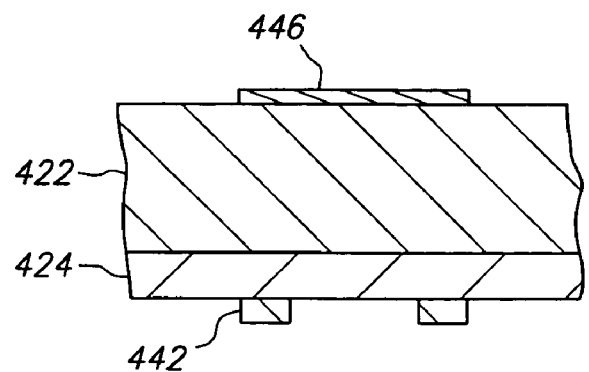
Figure 16J:
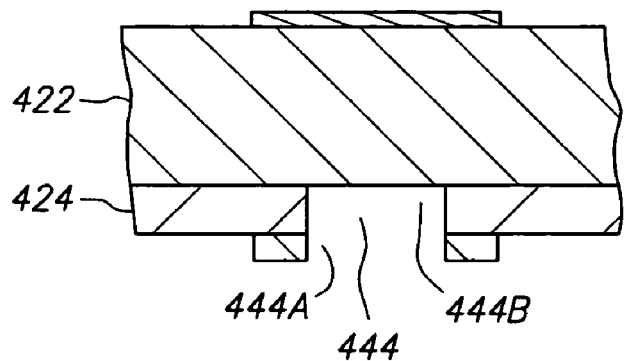
Figure 16K:
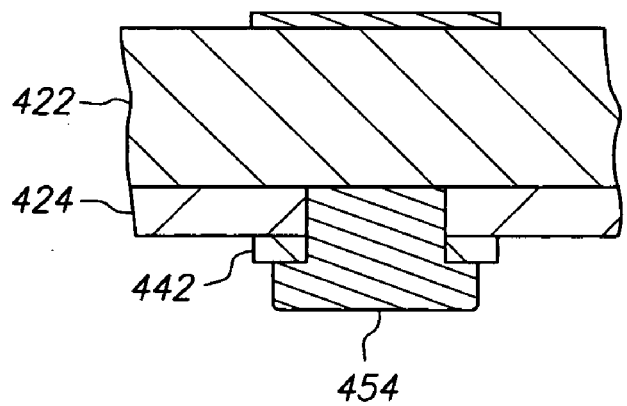
Figure 16L:
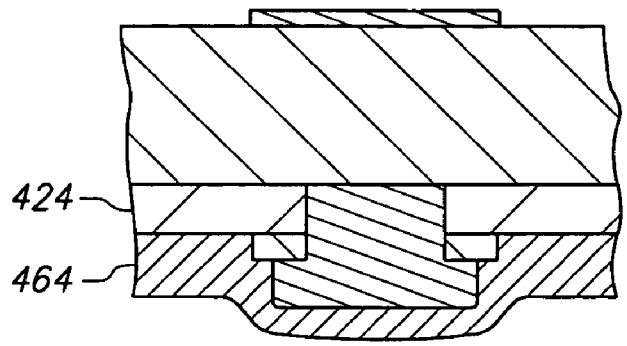
Figure 16M:
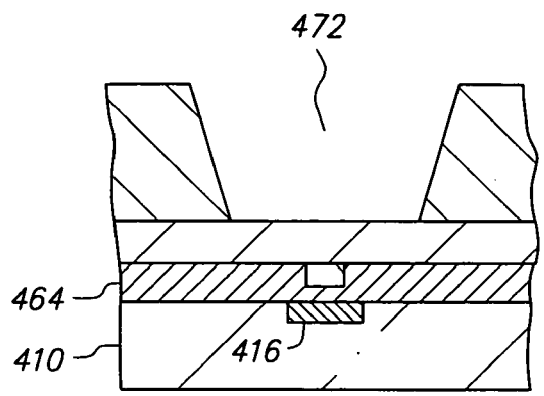
Figure 16N:
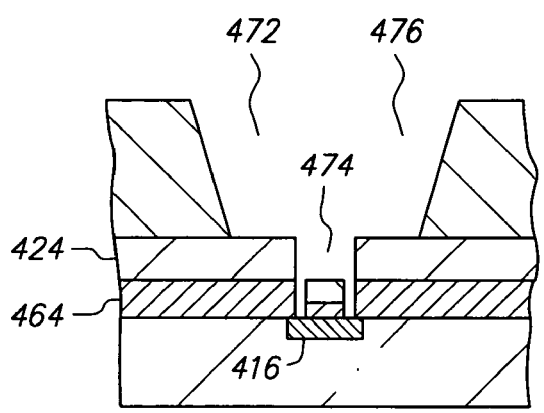
Figure 16O:
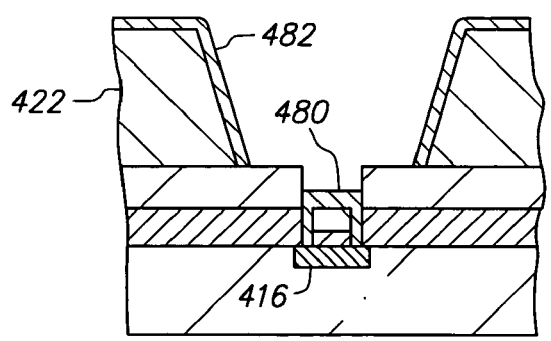
Figure 16P:
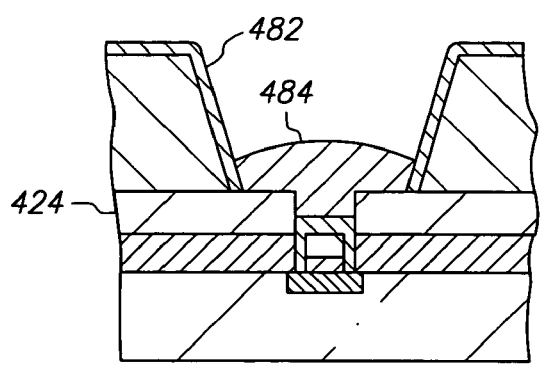
Figure 16Q:
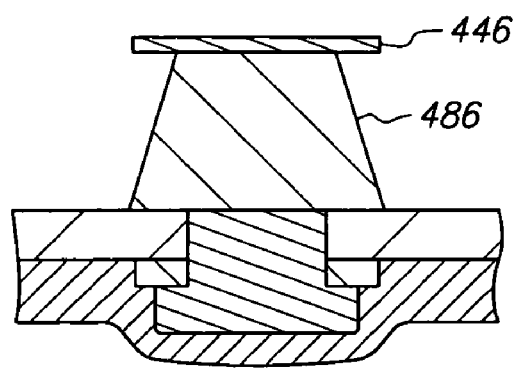
Figure 16R:
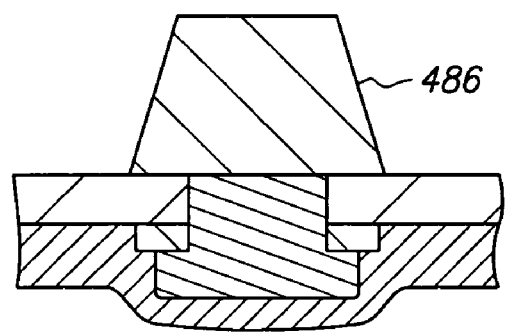
Figure 16S:
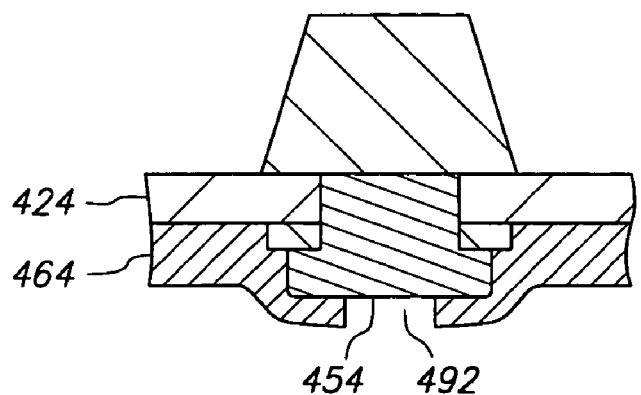
Figure 17A:
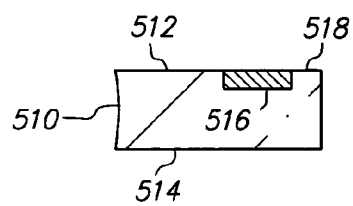
FIGS. 17A–17O are cross-sectional views showing a method of making a semiconductor chip assembly in accordance with a fifth embodiment of the present invention.
Figure 18A:
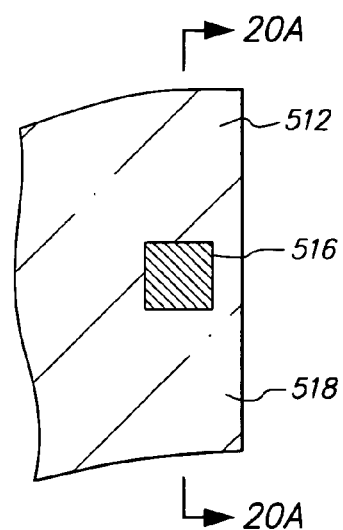
FIGS. 18A–18O are top plan views corresponding to FIGS. 17A–17O, respectively.
Figure 19A:
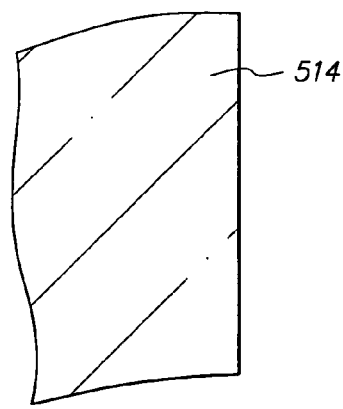
FIGS. 19A–19O are bottom plan views corresponding to FIGS. 17A–17O, respectively.
Figure 17B:
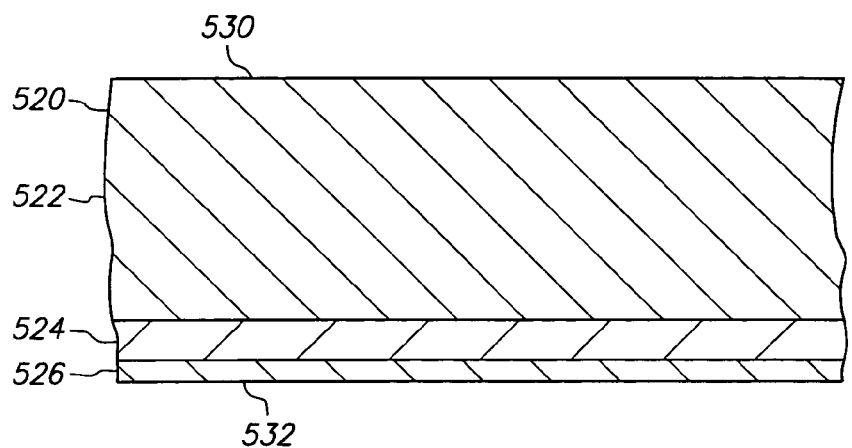
Figure 18B:
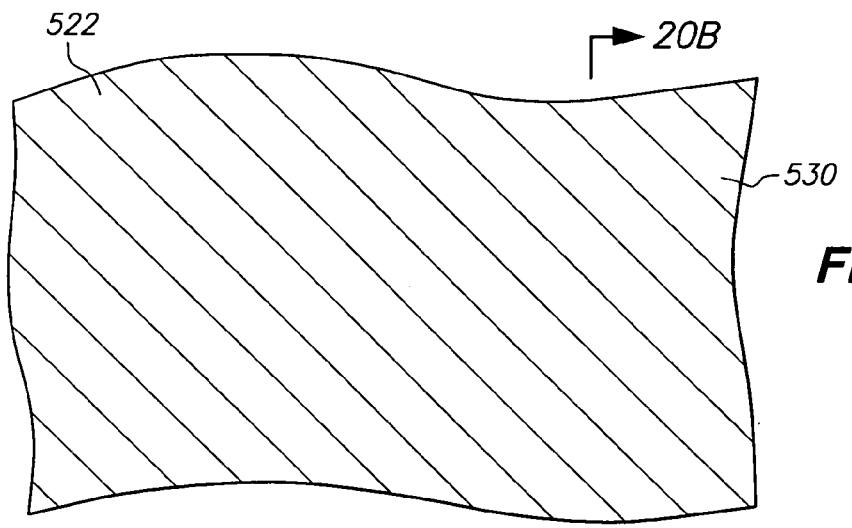
Figure 19B:
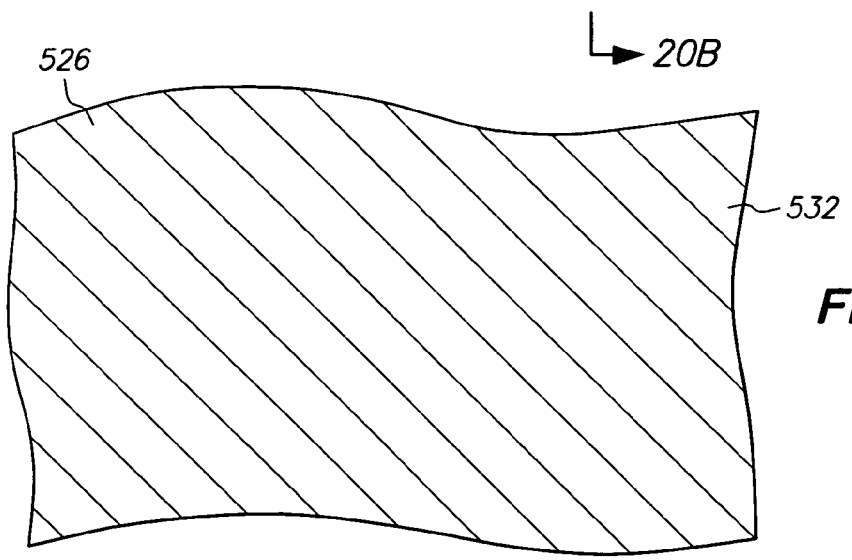
Figure 17C:
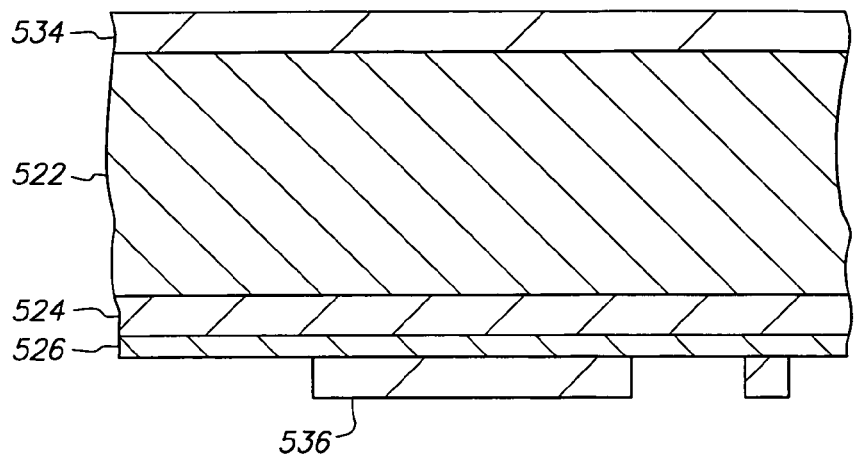
Figure 18C:
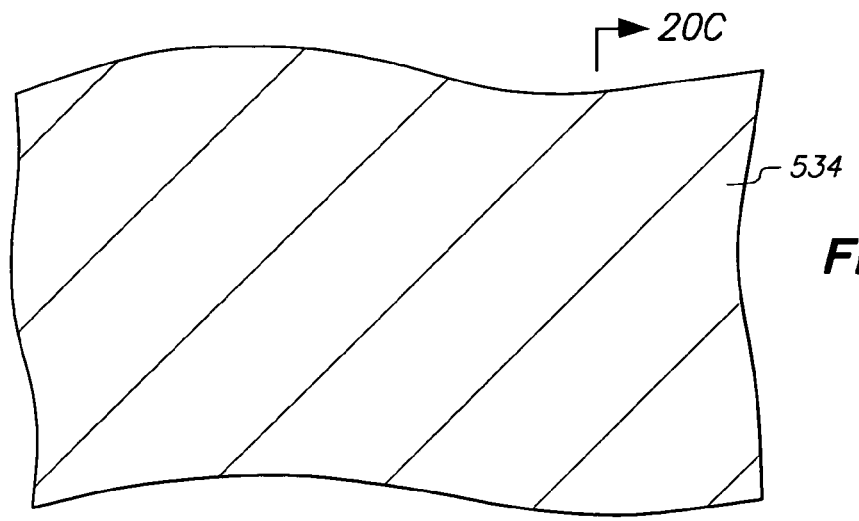
Figure 19C:
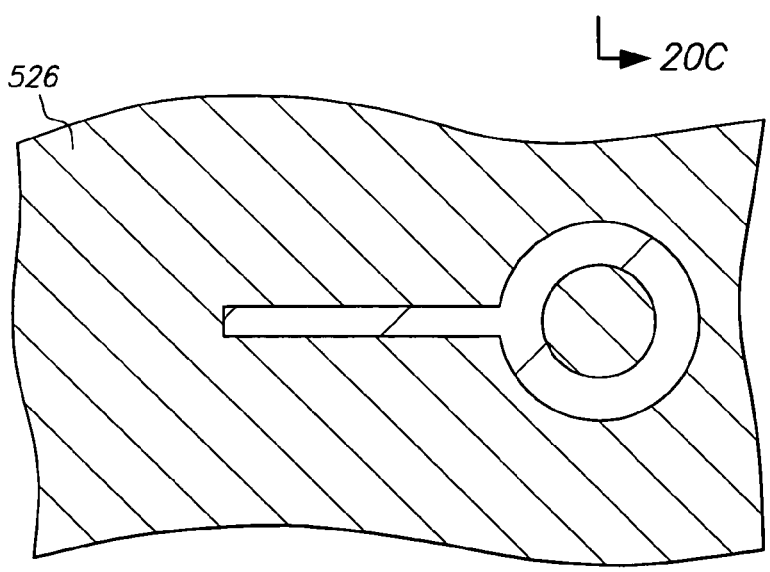
Figure 17D:
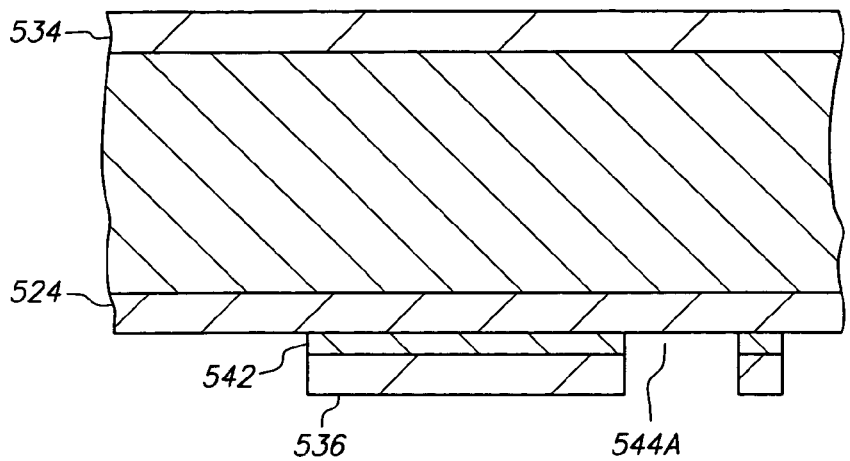
Figure 18D:
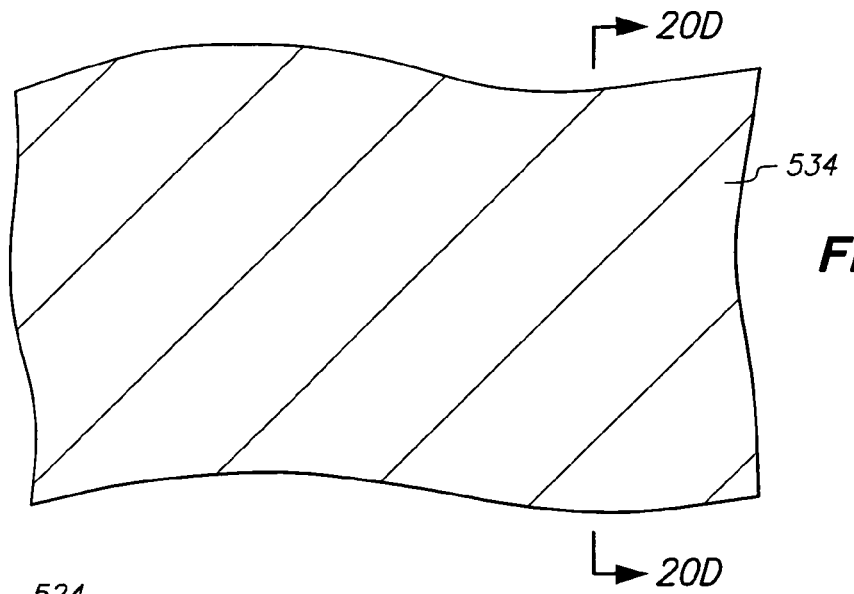
Figure 19D:
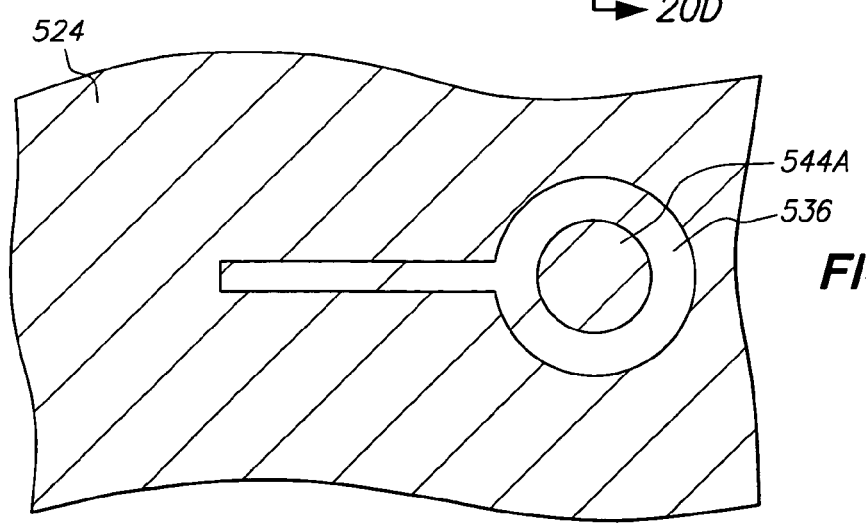
Figure 17E:
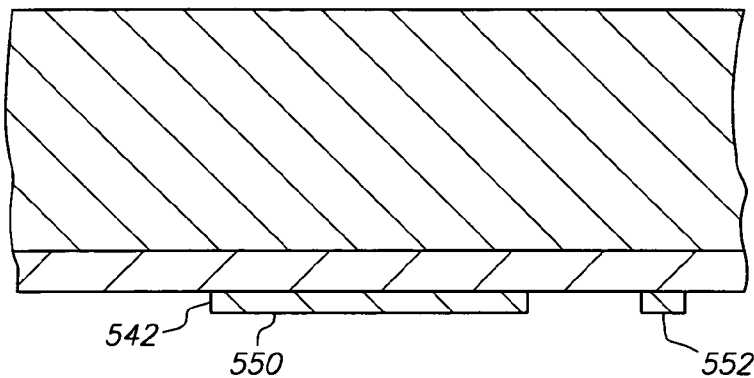
Figure 18E:
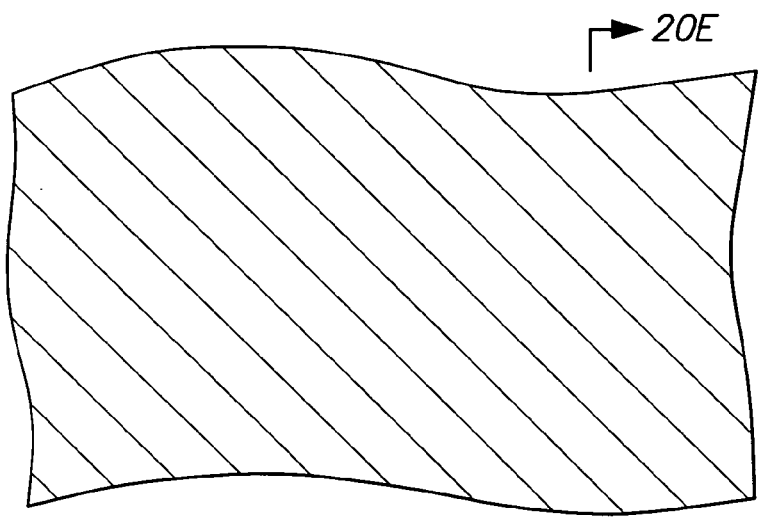
Figure 19E:
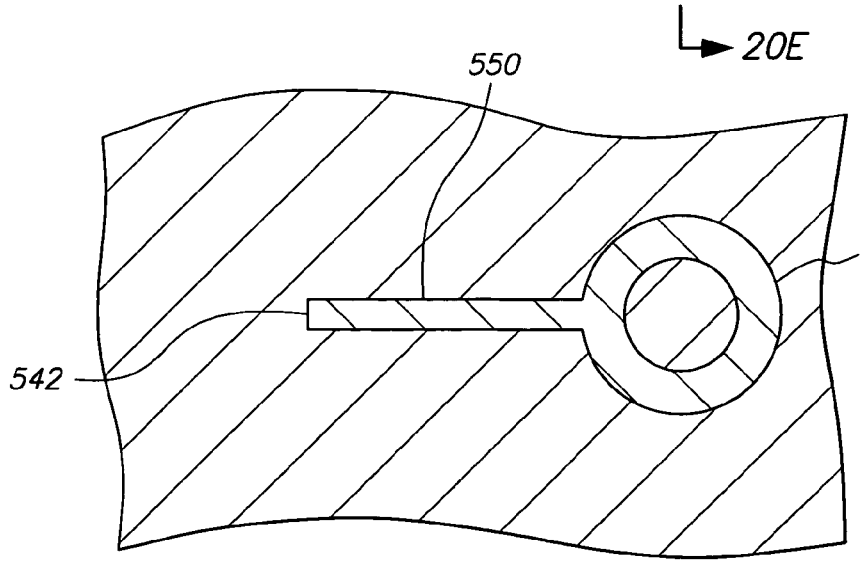
Figure 17F:
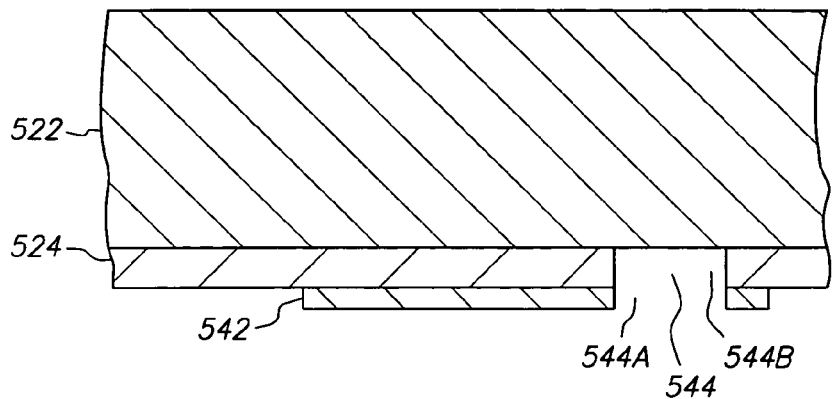
Figure 18F:
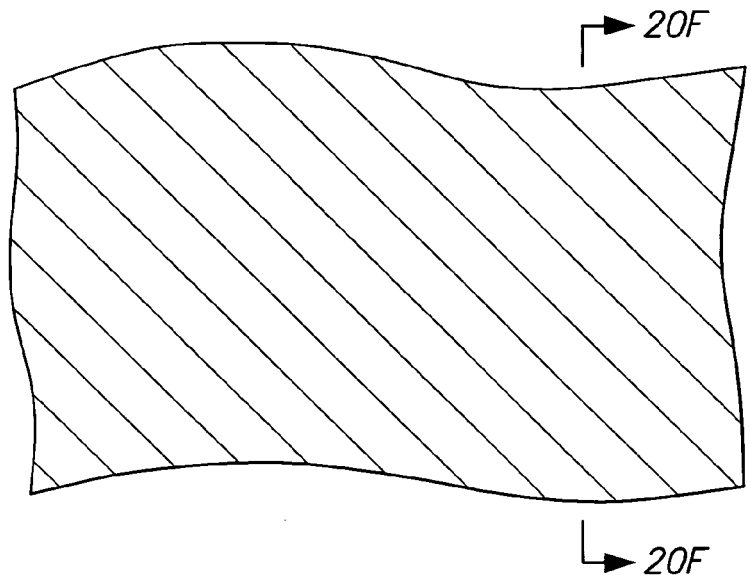
Figure 19F:
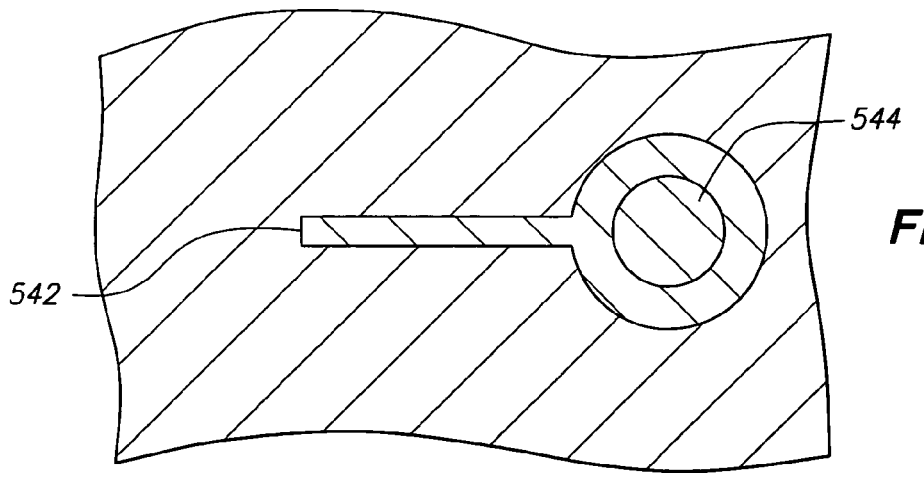
Figure 17G:
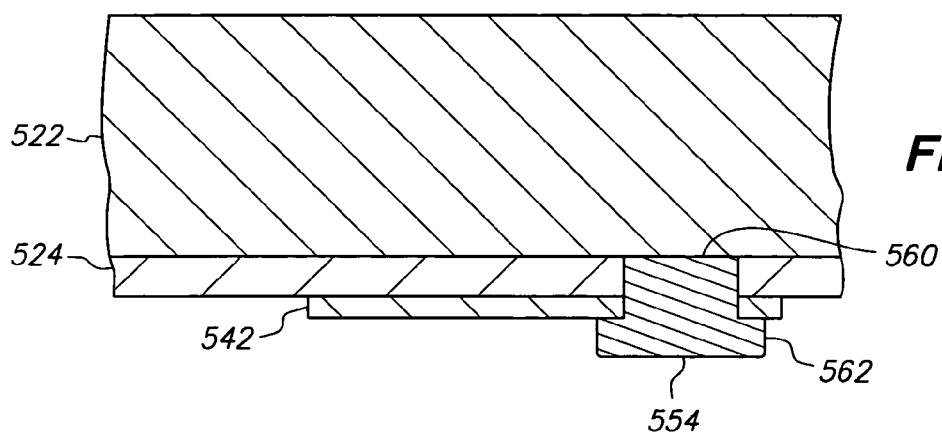
Figure 18G:
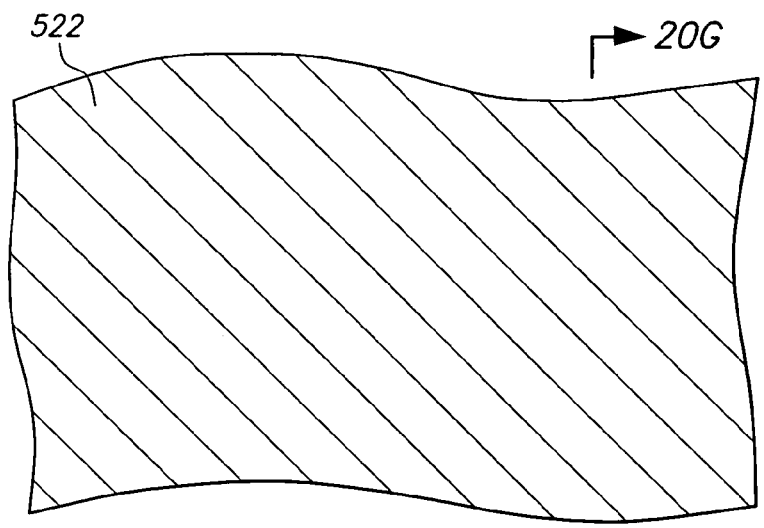
Figure 19G:
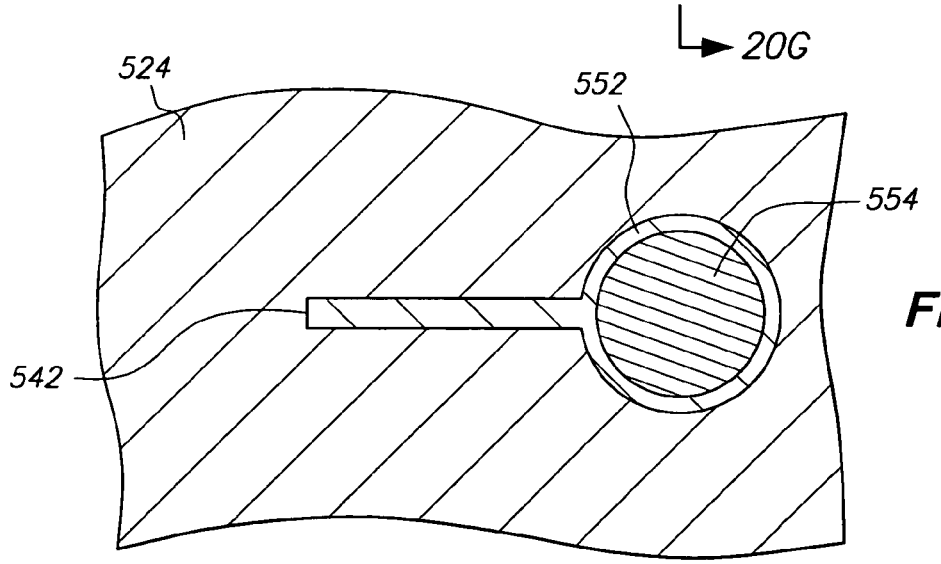
Figure 17H:
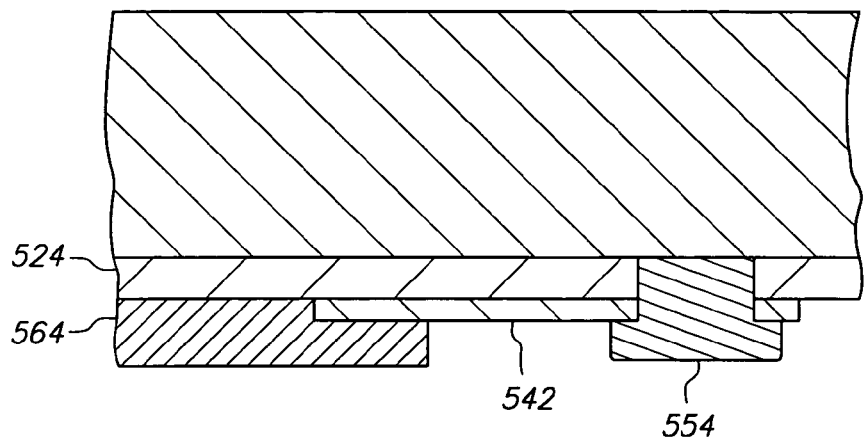
Figure 18H:
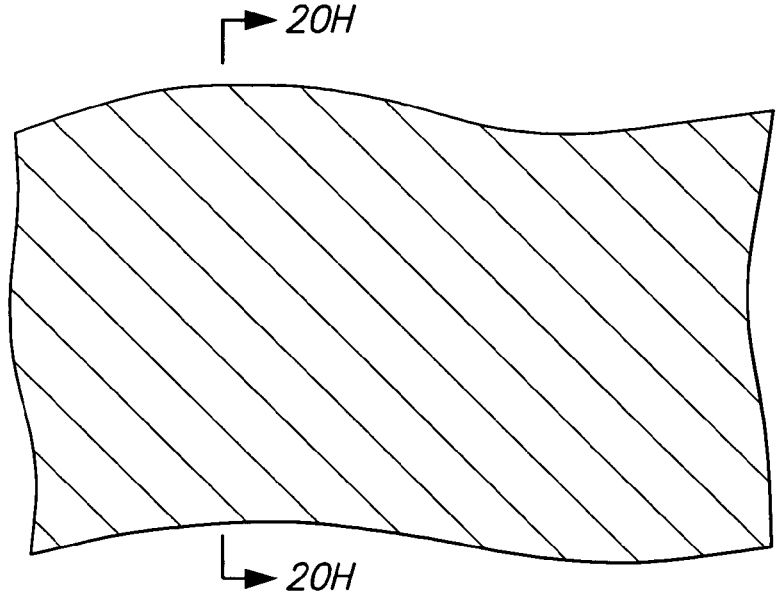
Figure 19H:
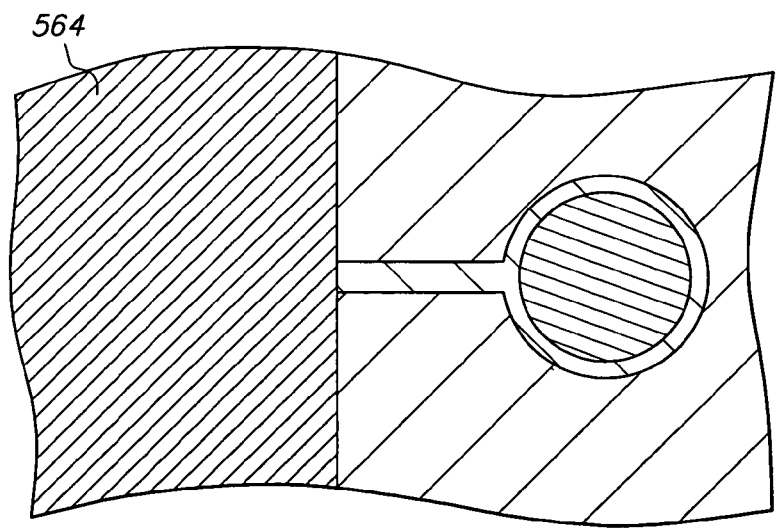
Figure 17I:
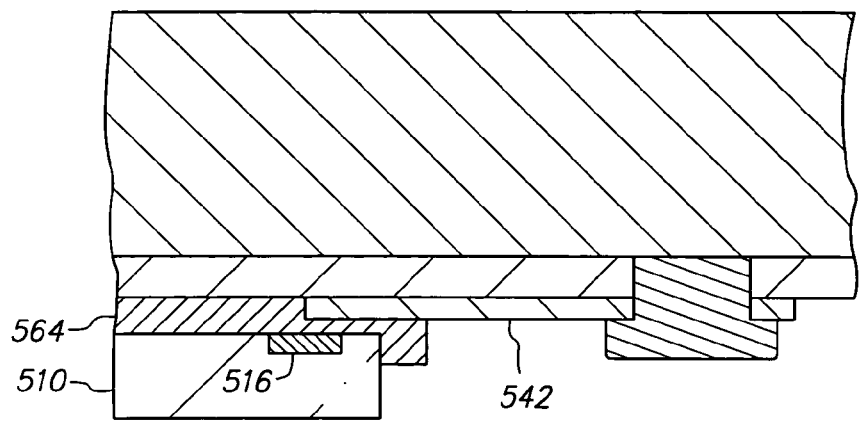
Figure 18I:
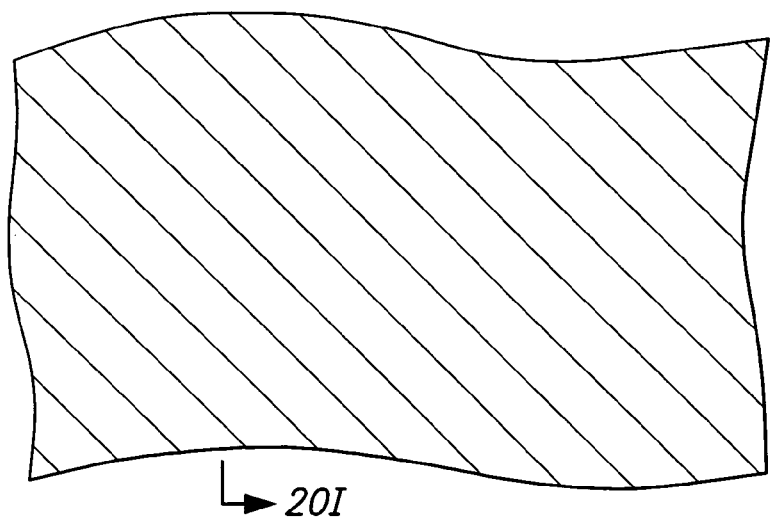
Figure 19I:
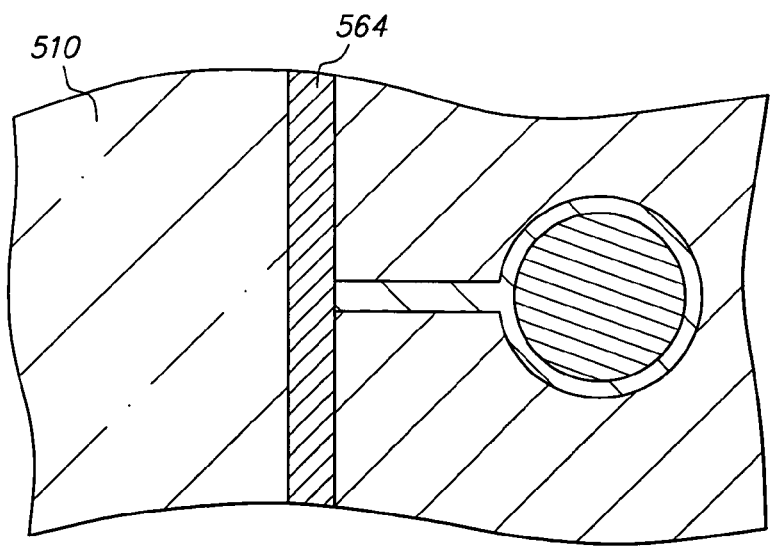
Figure 17J:
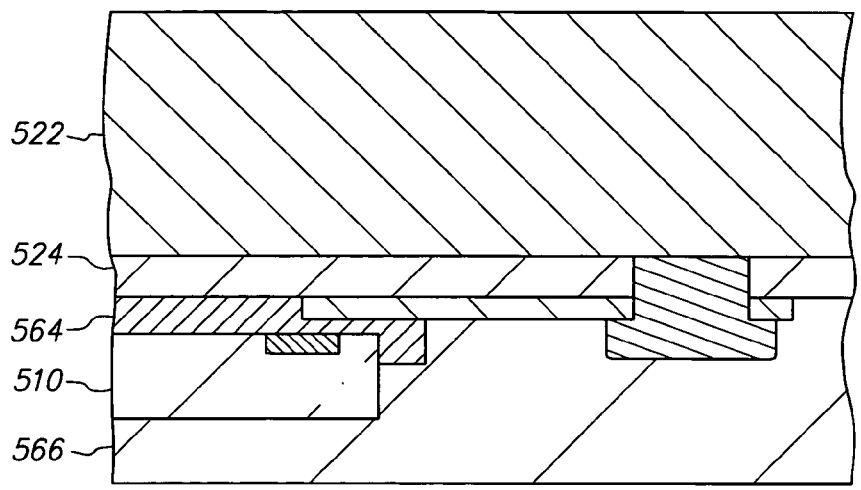
Figure 18J:
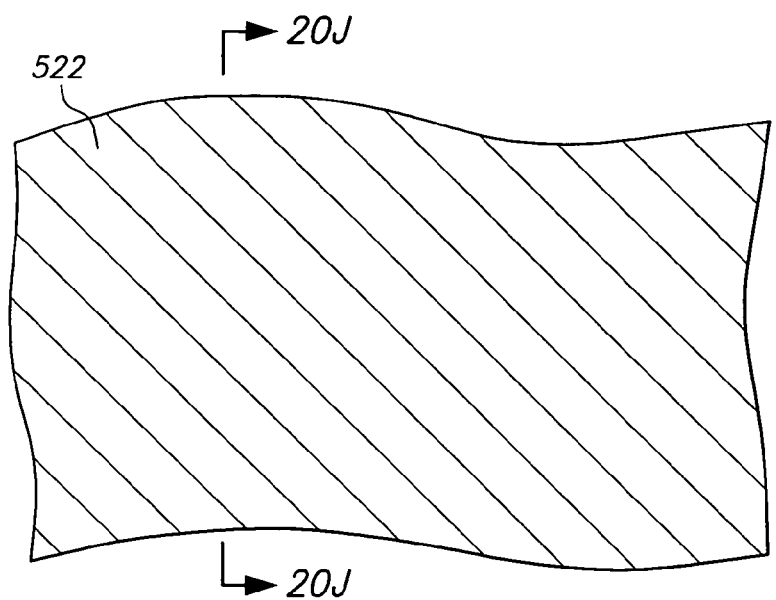
Figure 19J:
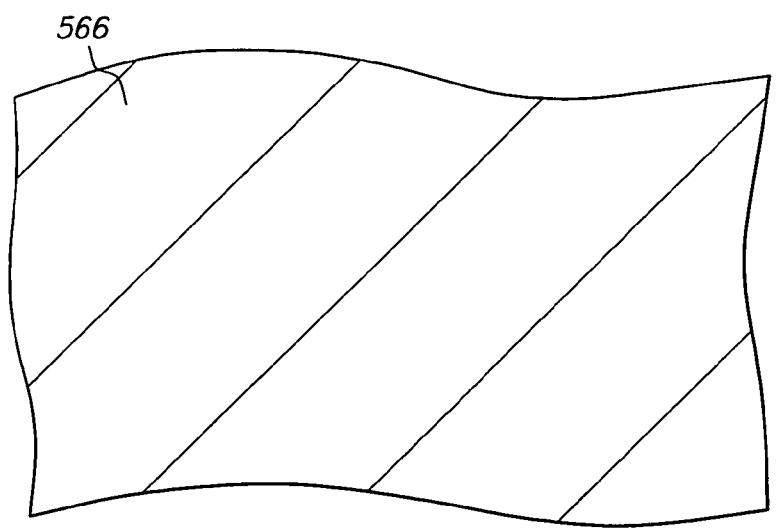
Figure 17K:
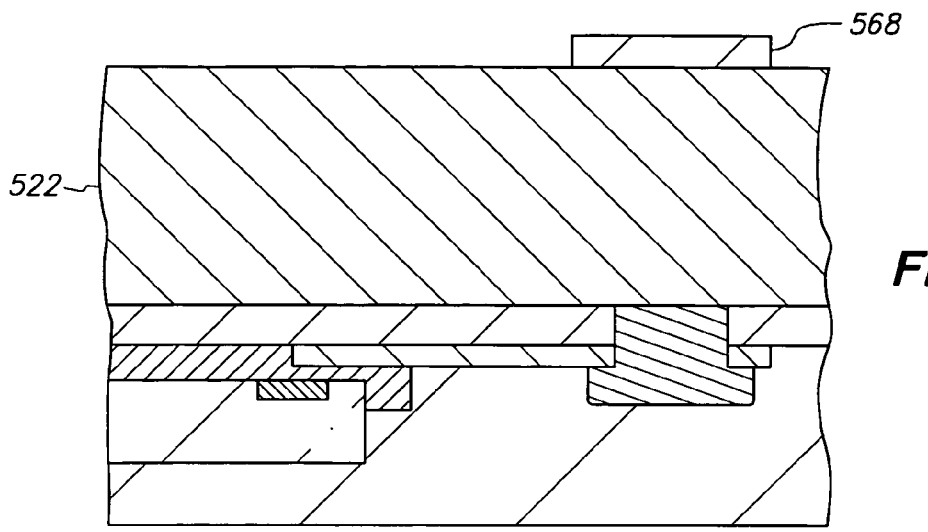
Figure 18K:
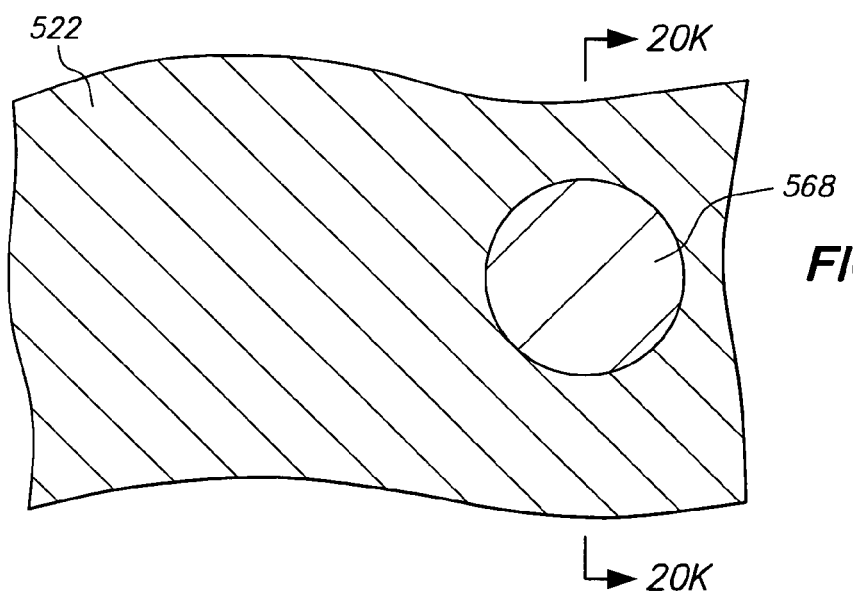
Figure 19K:
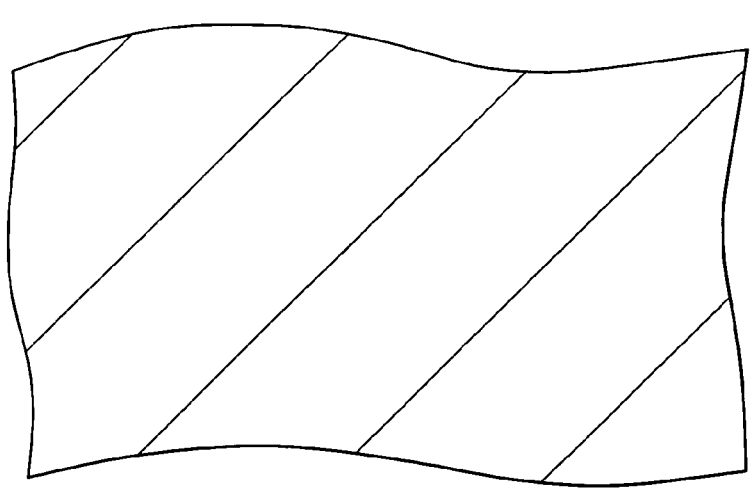
Figure 17L:
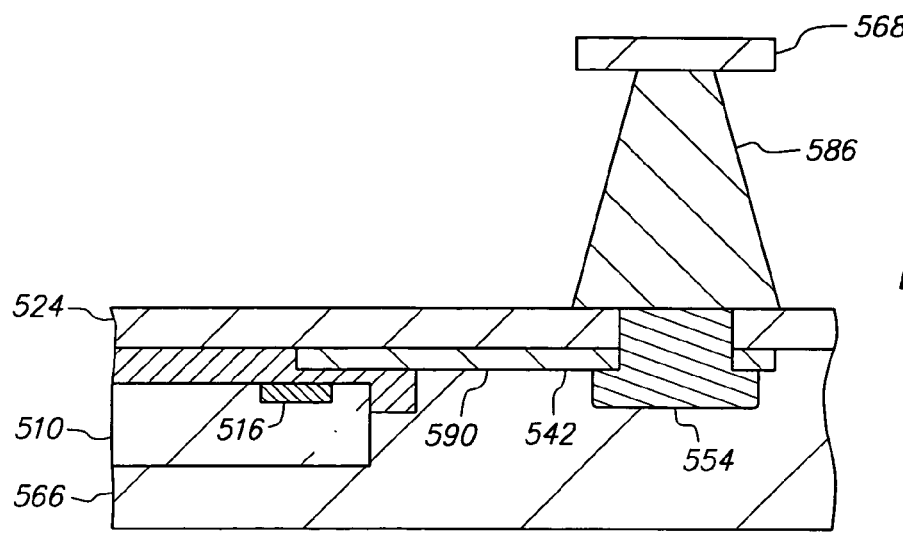
Figure 18L:
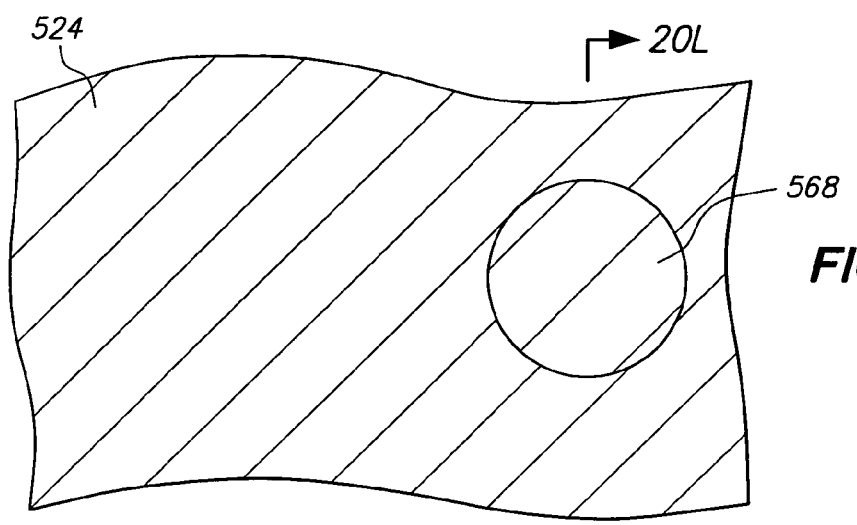
Figure 19L:
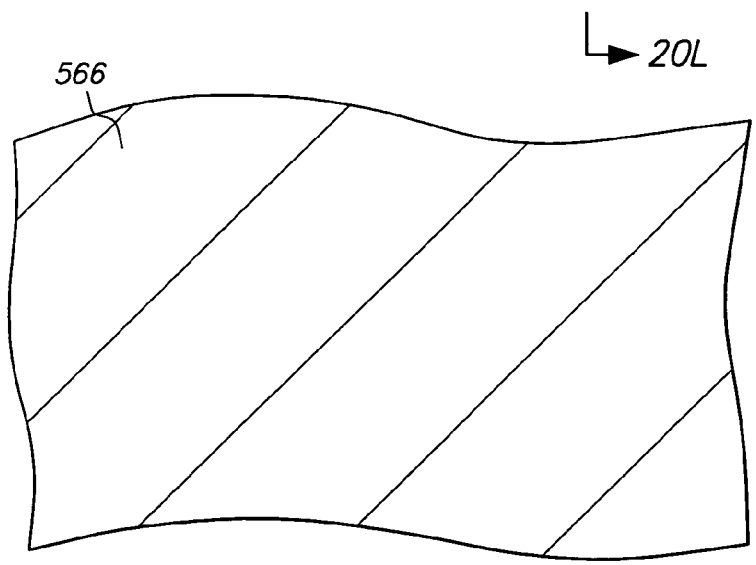
Figure 17M:
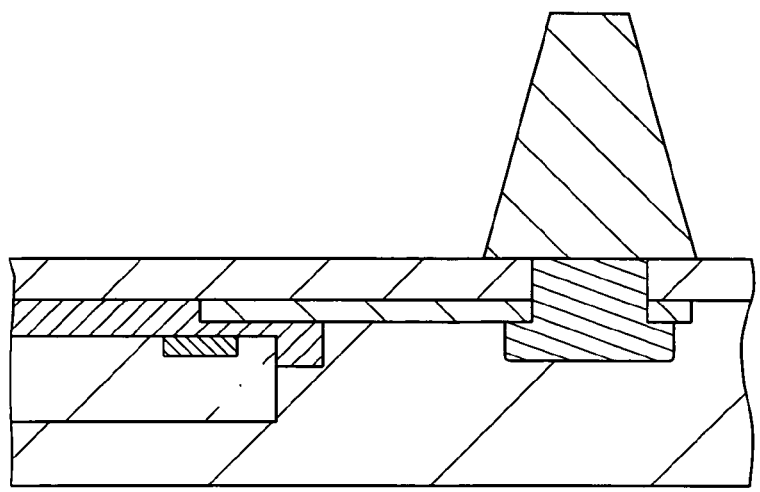
Figure 18M:
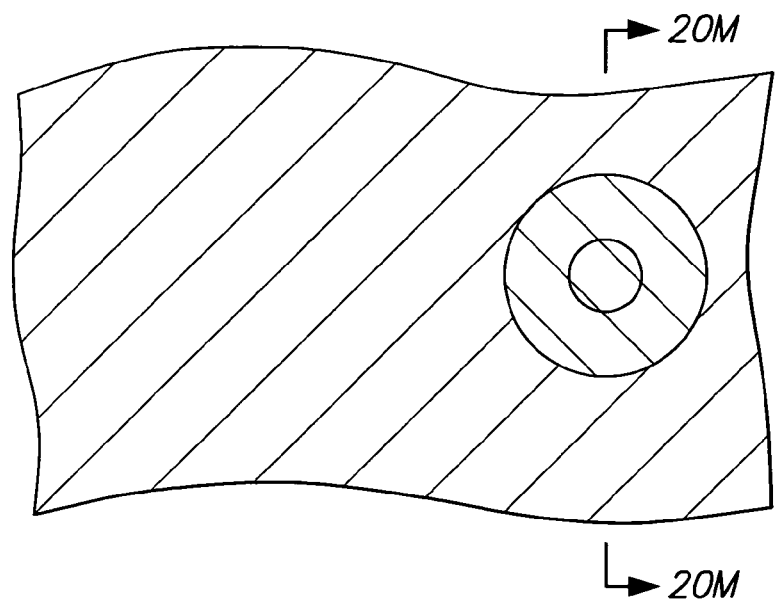
Figure 19M:
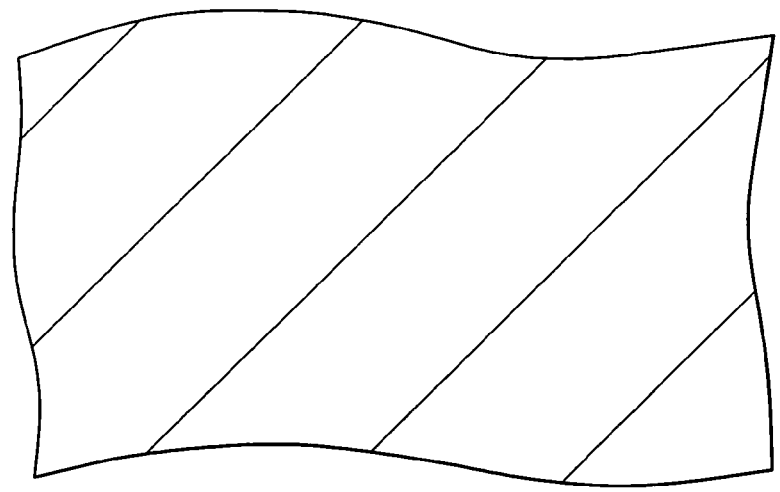
Figure 17N:
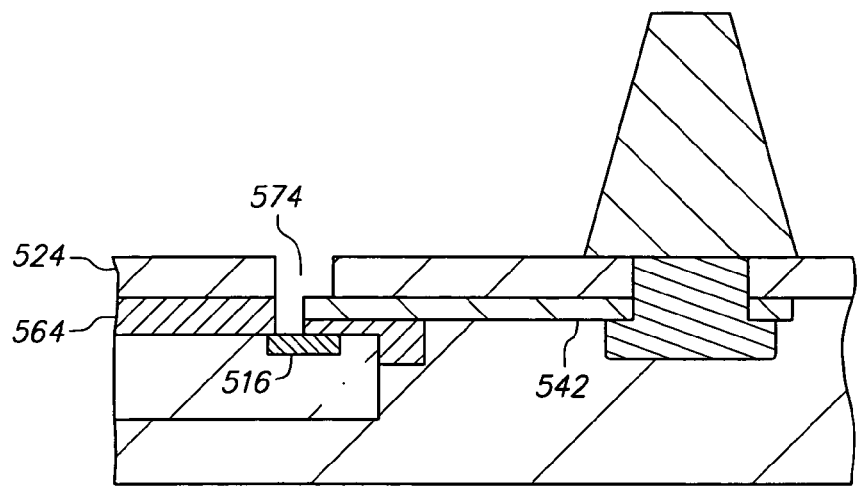
Figure 18N:
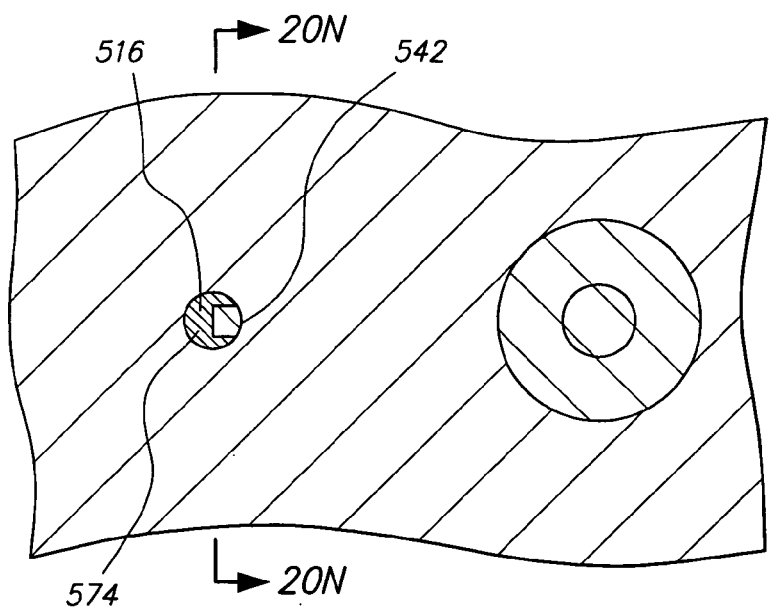
Figure 19N:
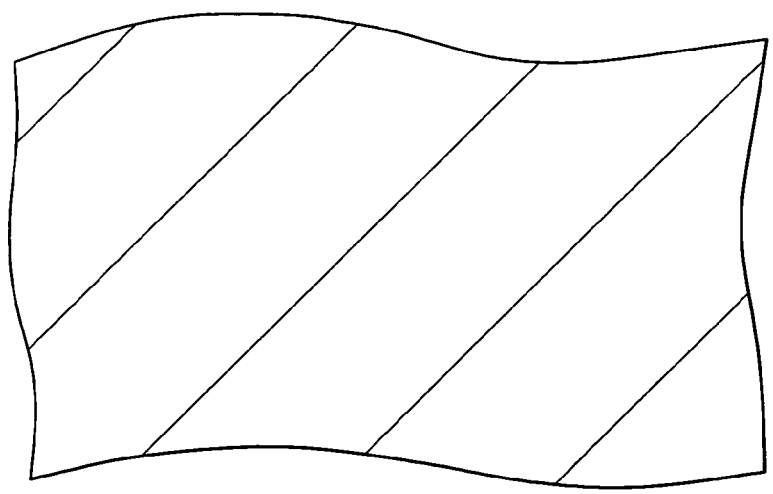
Figure 17O:
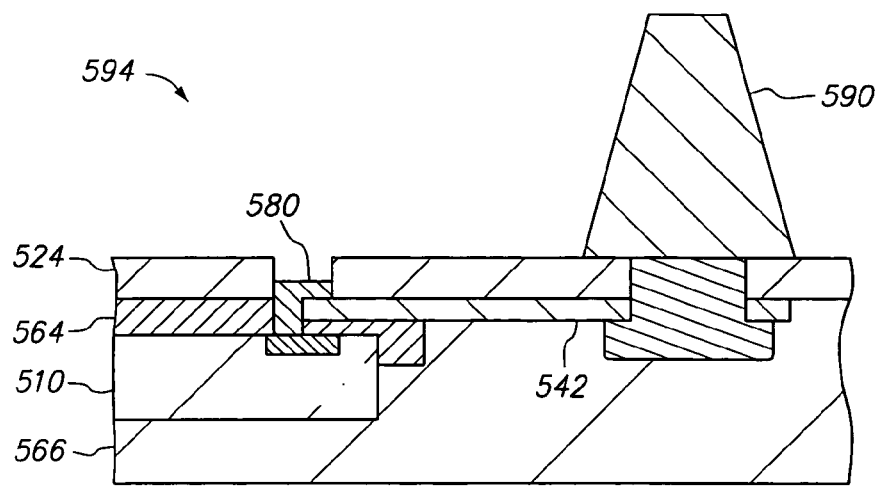
Figure 18O:
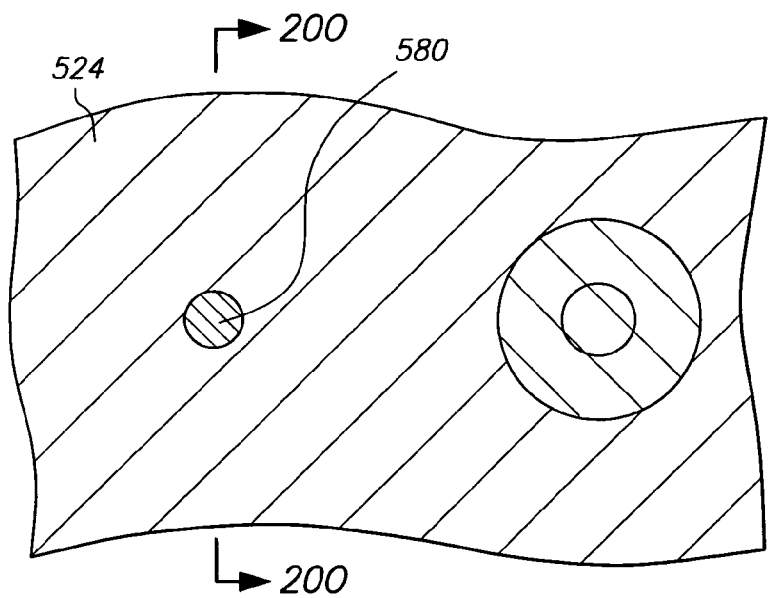
Figure 19O:
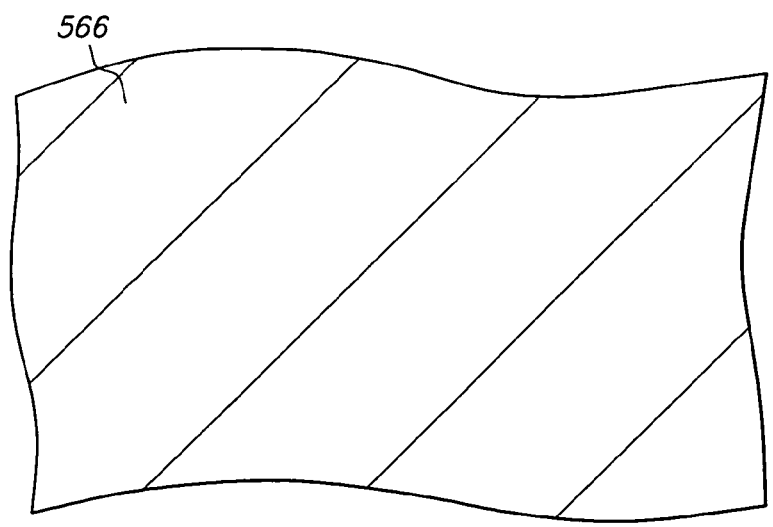

FIGS. 13A–13S, 14A–14S, 15A–15S and 16A–16S are cross-sectional, top, bottom and cross-sectional views, respectively, of a method of making a semiconductor chip assembly in accordance with a fourth embodiment of the present invention. FIGS. 16A–16S are oriented orthogonally with respect to FIGS. 13A–13S and depict FIGS. 13A–13S as viewed from left-to-right. In the fourth embodiment, the opening in the metal base is formed using blanket etching before the pillar etch mask is formed before mechanically attaching the chip to the laminated structure. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, metal base 422 corresponds to metal base 122, etc.

FIGS. 13A, 14A, 15A and 16A are cross-sectional, top, bottom and cross-sectional views, respectively, of semiconductor chip 410 which includes opposing major surfaces 412 and 414. Surface 412 includes conductive pad 416 and passivation layer 418.

FIGS. 13B, 14B, 15B and 16B are cross-sectional, top, bottom and cross-sectional views, respectively, of laminated structure 420 that includes metal base 422, insulative base 424 and metal layer 426. Metal base 422 includes surface 430, and metal layer 426 includes surface 432.

FIGS. 13C, 14C, 15C and 16C are cross-sectional, top, bottom and cross-sectional views, respectively, of photoresist layers 434 and 436 formed on metal base 422 and metal layer 426, respectively. Photoresist layer 434 contains an opening that selectively exposes metal base 422, and photoresist layer 436 contains openings that selectively expose metal layer 426.

FIGS. 13D, 14D, 15D and 16D are cross-sectional, top, bottom and cross-sectional views, respectively, of recess 438 formed in metal base 422, routing line 442 formed from metal layer 426, and first via portion 444A formed through routing line 442 by wet chemical etching using photoresist layers 434 and 436 as etch masks.

Recess 438 has a depth of 100 microns. Therefore, metal base 422 receives more extensive wet chemical etching than metal layer 426 to form recess 438 with the desired depth without damaging routing line 442 which is 12 microns thick and 40 microns wide at the elongated routing region.

In this instance, metal base 422 and metal layer 426 are exposed to a first wet chemical etch and then metal base 422 is exposed to a second wet chemical etch. In particular, top and bottom spray nozzles (not shown) simultaneously spray a first wet chemical etch on metal base 422 and metal layer 426 using photoresist layers 434 and 436 as etch masks. The first wet chemical etch etches 15 microns into metal base 422 and completely through metal layer 426, thereby partially forming recess 438 and completely forming routing line 442 and first via portion 444A. Thereafter, the top spray nozzle sprays a second wet chemical etch on metal base 422 using photoresist layer 434 as an etch mask while the bottom spray nozzle is deactivated. The second wet chemical etch etches another 85 microns into metal base 422, thereby completely forming recess 438. However, routing line 442 is not exposed to the second wet chemical etch.

FIGS. 13E, 14E, 15E and 16E are cross-sectional, top, bottom and cross-sectional views, respectively, of the structure after photoresist layers 434 and 436 are stripped. Routing line 442 includes elongated routing region 450 and enlarged annular region 452.

FIGS. 13F, 14F, 15F and 16F are cross-sectional, top, bottom and cross-sectional views, respectively, of the structure after a portion of metal base 422 is blanketly removed to form opening 472 in metal base 422 that exposes insulative base 424. In particular, the top spray nozzle sprays another wet chemical etch on metal base 422 while the bottom spray nozzle is deactivated. The wet chemical etch etches 100 microns into metal base 422, thereby reducing the thickness of metal base 422 to 100 microns (200–100) and effecting a pattern transfer of recess 438 to form opening 472. However, routing line 442 is not exposed to the wet chemical etch.

FIGS. 13G, 14G, 15G and 16G are cross-sectional, top, bottom and cross-sectional views, respectively, of photoresist layer 435 formed on metal base 422. Photoresist layer 435 is deposited in liquid form using roller coating. A reticle (not shown) is positioned proximate to photoresist layer 435. Thereafter, photoresist layer 435 is patterned by selectively applying light through the reticle, applying a developer solution to remove the photoresist portions rendered soluble by the light, and then hard baking, as is conventional. As a result, photoresist layer 435 contains an opening that selectively exposes metal base 422. Photoresist layer 435 has a thickness of 25 microns.

FIGS. 13H, 14H, 15H and 16H are cross-sectional, top, bottom and cross-sectional views, respectively, of nickel 446 deposited on metal base 422 using photoresist layer 435 as a plating mask.

Nickel 446 is formed by an electroplating operation. Initially, metal base 422 is connected to a plating bus (not shown), current is applied to the plating bus from an external power source, and the structure is submerged in an electrolytic nickel plating solution such as Technic Techni Nickel "S" at room temperature to electroplate nickel 446 on metal base 422. Thereafter, the structure is removed from the electrolytic nickel plating solution and rinsed in distilled water to remove contaminants.

The nickel does not deposit on routing line 442. To elaborate, insulative base 424 is an electrical insulator, and therefore cannot supply current from the plating bus to generate electroplating. Metal base 422 is connected to the plating bus, however routing line 442 is electrically isolated from metal base 422 by insulative base 424.

FIGS. 13I, 14I, 15I and 16I are cross-sectional, top, bottom and cross-sectional views, respectively, of the structure after photoresist layer 435 is stripped. Photoresist layer 435 is removed using a solvent, such as a mild alkaline solution with a pH of 9, that is highly selective of photoresist with respect to copper, polyimide and nickel. Therefore, no appreciable amount of metal base 422, insulative base 424, routing line 442 or nickel 446 is removed.

Nickel 446 has a diameter of 400 microns and a thickness of 2 microns. Furthermore, nickel 446 is axially aligned with first via portion 444A and enlarged annular region 452.

FIGS. 13J, 14J, 15J and 16J are cross-sectional, top, bottom and cross-sectional views, respectively, of the structure after via 444 is formed through insulative base 424 and routing line 442. A portion of insulative base 424 exposed by first via portion 444A is selectively removed using a laser etch to form second via portion 444B in insulative base 424. The combination of via portions 444A and 444B forms via 444 that exposes metal base 422.

FIGS. 13K, 14K, 15K and 16K are cross-sectional, top, bottom and cross-sectional views, respectively, of interconnect 454 deposited in via 444. Interconnect 454 fills via 444 and contacts and electrically connects metal base 422 and routing line 442. Furthermore, interconnect 454 is composed of solder.

Interconnect 454 has a mushroom-shape that includes cylindrical base 460 and pileus or cap 461. Cylindrical base 460 fills via 444, and cap 461 extends outside via 444 and contacts enlarged annular region 452 without contacting insulative base 424 or elongated routing region 450. Cylindrical base 460 has a thickness of 37 microns and a diameter of 200 microns, and cap 461 has a thickness of 50 microns and a diameter of 300 microns. Cap 461 is axially aligned with via 444 and enlarged annular region 452. Thus, cap 461 is spaced from the peripheral sidewalls of enlarged annular region 452 by 50 microns ((400−300)/2). Interconnect 454 is deposited into via 444 and onto routing line 442 outside via 444 by solder paste printing followed by solder reflow in the same manner as interconnect 254.

FIGS. 13L, 14L, 15L and 16L are cross-sectional, top, bottom and cross-sectional views, respectively, of adhesive 464 formed on insulative base 424, routing line 442 and interconnect 454.

FIGS. 13M, 14M, 15M and 16M are cross-sectional, top, bottom and cross-sectional views, respectively, of chip 410 mechanically attached to laminated structure 420 by adhesive 464. Chip 410 and routing line 442 are positioned relative to one another so that routing line 442 is disposed above and overlaps and is electrically isolated from pad 416. In addition, chip 410 and metal base 422 are positioned relative to one another so that pad 416 is within the periphery of opening 472.

FIGS. 13N, 14N, 15N and 16N are cross-sectional, top, bottom and cross-sectional views, respectively, of opening 474 formed in insulative base 424 and adhesive 464 by laser ablation. Opening 474 exposes pad 416 and the peripheral sidewalls and top surface of routing line 442, and adhesive 464 remains in contact with and sandwiched between pad 416 and routing line 442. The combination of openings 472 and 474 form opening 476 that exposes pad 416 and routing line 442.

FIGS. 13O, 14O, 15O and 16O are cross-sectional, top, bottom and cross-sectional views, respectively, of connection joint 480 formed on pad 416 and routing line 442, and metal layer 482 formed on metal base 422 and nickel 446. Connection joint 480 and metal layer 482 are formed by a copper electroplating operation.

FIGS. 13P, 14P, 15P and 16P are cross-sectional, top, bottom and cross-sectional views, respectively, of insulator 484 formed on insulative base 424, connection joint 480 and metal layer 482 in opening 476.

FIGS. 13Q, 14Q, 15Q and 16Q are cross-sectional, top, bottom and cross-sectional views, respectively, of the structure after a selected portion of metal base 422 and metal layer 482 are removed and a remaining portion of metal base 422 outside the periphery of chip 410 forms pillar 486 that overlaps and is aligned with via 444 and interconnect 454. This is accomplished by applying a wet chemical etch to metal base 422 and metal layer 482 using nickel 446 as an etch mask.

The wet chemical etch is highly selective of copper with respect to nickel, polyimide and epoxy. Therefore, no appreciable amount of insulative base 424, nickel 446 or insulator 484 is removed. A suitable wet chemical etch can be provided by a solution containing alkaline ammonia. The optimal etch time for exposing metal base 422 to the wet chemical etch in order to form pillar 486 with the desired dimensions can be established through trial and error.

The wet chemical etch initially removes metal layer 482, thereby exposing metal base 422 and nickel 446. Thereafter, the wet chemical etch etches completely through metal base 422, thereby effecting a pattern transfer of nickel 446 onto metal base 422. The wet chemical etch removes all remaining portions of metal base 422 within the periphery of chip 410 but does not remove a portion of metal base 422 outside the periphery of chip 410 that overlaps and is aligned with via 444 and interconnect 454 and forms pillar 486. Pillar 486 overlaps and is axially aligned with via 444 and interconnect 454 and has a thickness of 100 microns, a diameter at insulative base 424 of 400 microns and a diameter at nickel 446 of 250 microns.

Routing line 442, interconnect 454 and pillar 486 in combination provide conductive trace 490 that is adapted for providing horizontal and vertical routing between pad 416 and a terminal on a printed circuit board (not shown) in a next level assembly. Interconnect 454 contacts and electrically connects routing line 442 and pillar 486.

FIGS. 13R, 14R, 15R and 16R are cross-sectional, top, bottom and cross-sectional views, respectively, of the structure after nickel 446 is stripped. Nickel 446 is removed using a nickel etching solution, such as a dilute mixture of nitric and hydrochloric acid, that is highly selective of nickel with respect to polyimide and epoxy. Therefore, no appreciable amount of insulative base 424, adhesive 464 or insulator 484 is removed. Since nickel 446 is extremely thin relative to pillar 486, and the structure is removed from the nickel etching solution immediately after nickel 446 is stripped, it is not critical that the nickel etching solution be highly selective of nickel with respect to copper. The nickel etching solution has no significant impact on pillar 486. In addition, insulative base 424, adhesive 464 and insulator 484 protect routing line 442 and connection joint 480 from the nickel etching solution.

FIGS. 13S, 14S, 15S and 16S are cross-sectional, top, bottom and cross-sectional views, respectively, of the structure after opening 492 is formed through adhesive 464 to expose interconnect 454 using a laser etch.

At this stage, the manufacture of semiconductor chip assembly 494 that includes chip 410, insulative base 424, adhesive 464, connection joint 480, insulator 484 and conductive trace 490 can be considered complete.

Figure 20A:
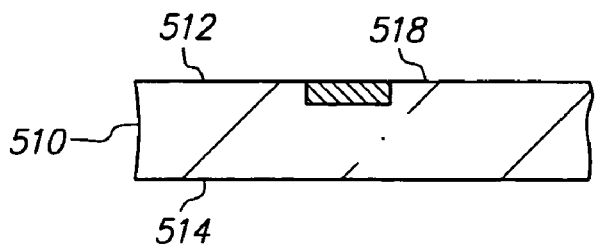
FIGS. 20A–20O are cross-sectional views corresponding to FIGS. 17A–17O, respectively.
Figure 20B:
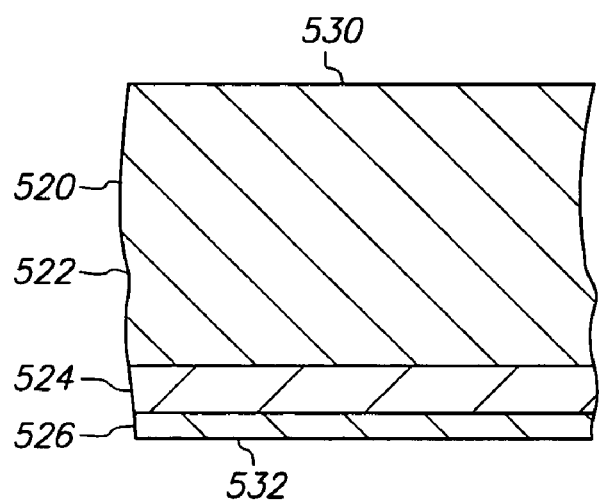
Figure 20C:
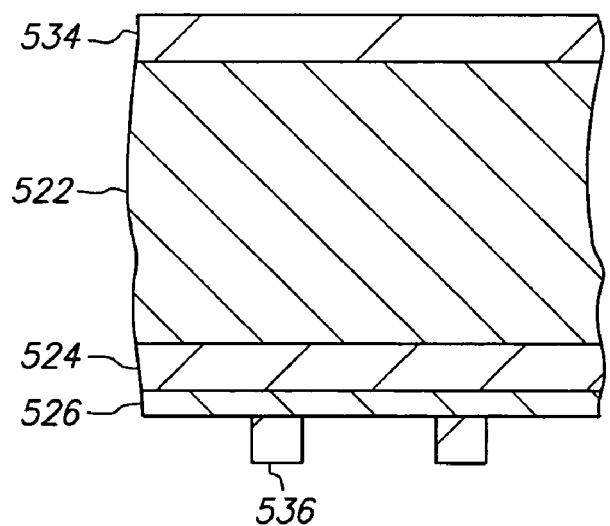
Figure 20D:
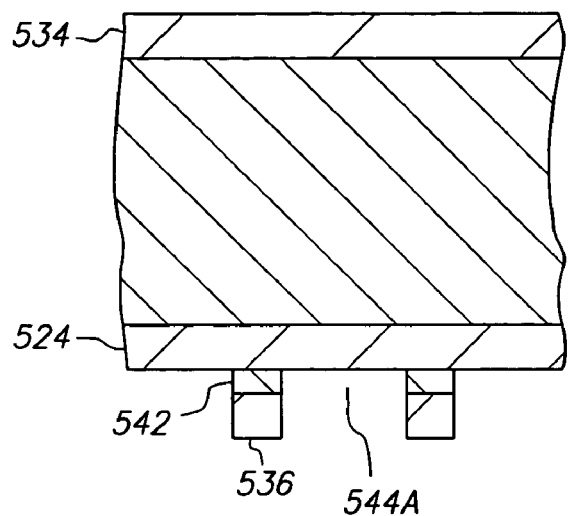
Figure 20E:
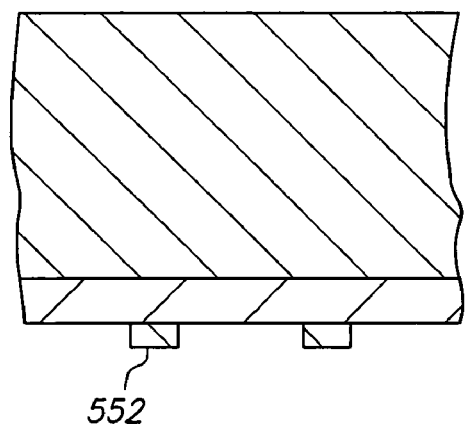
Figure 20F:
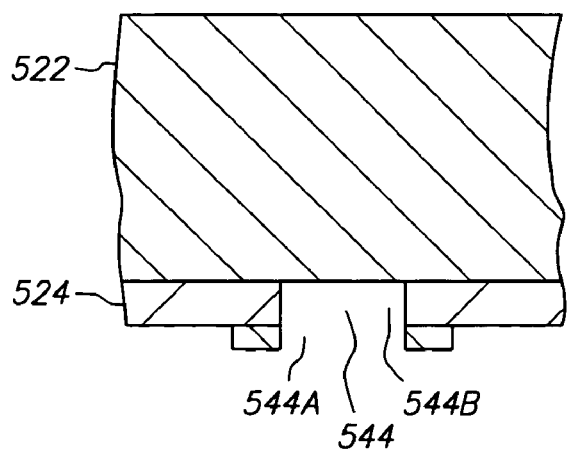
Figure 20G:
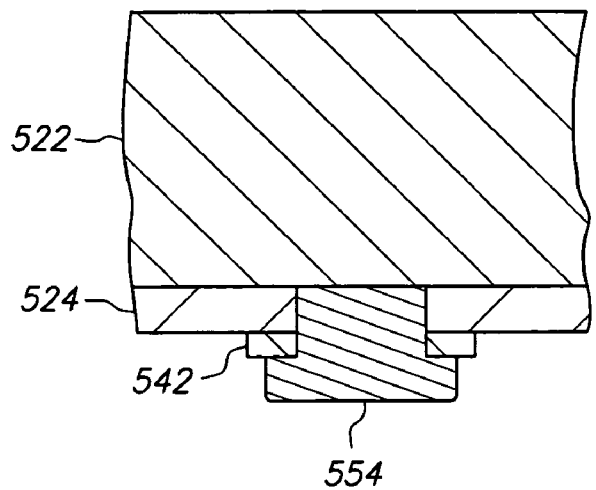
Figure 20H:
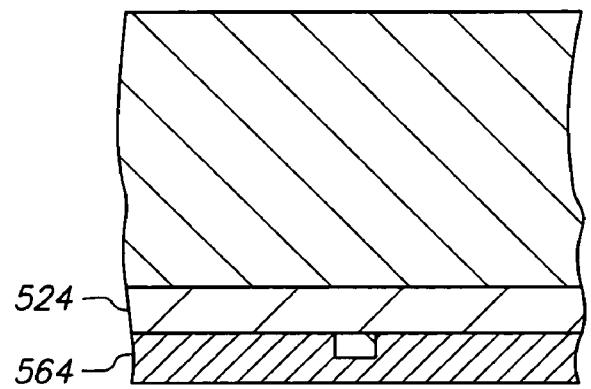
Figure 20I:
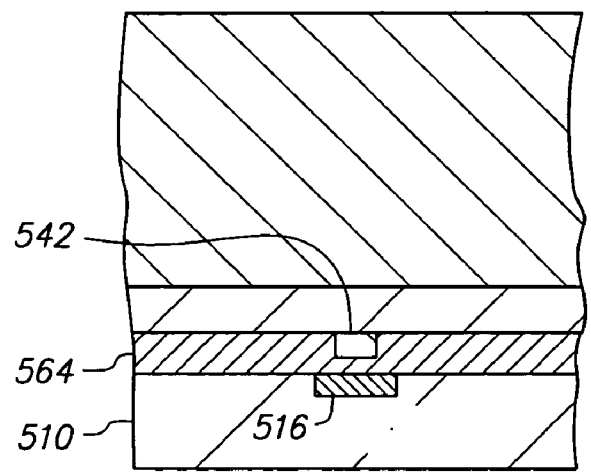
Figure 20J:
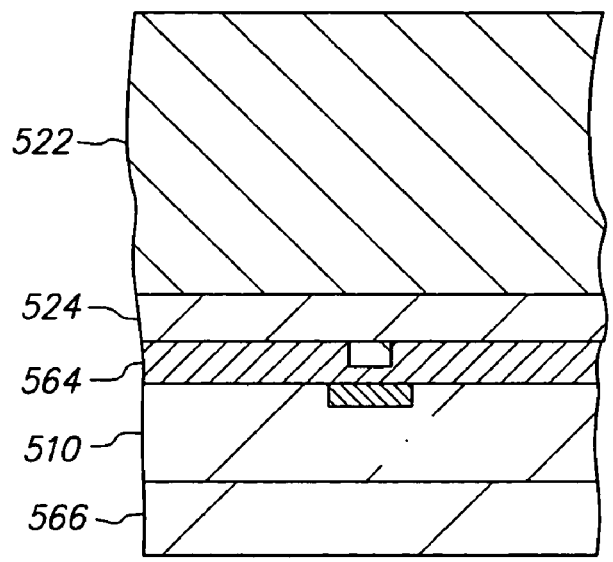
Figure 20K:
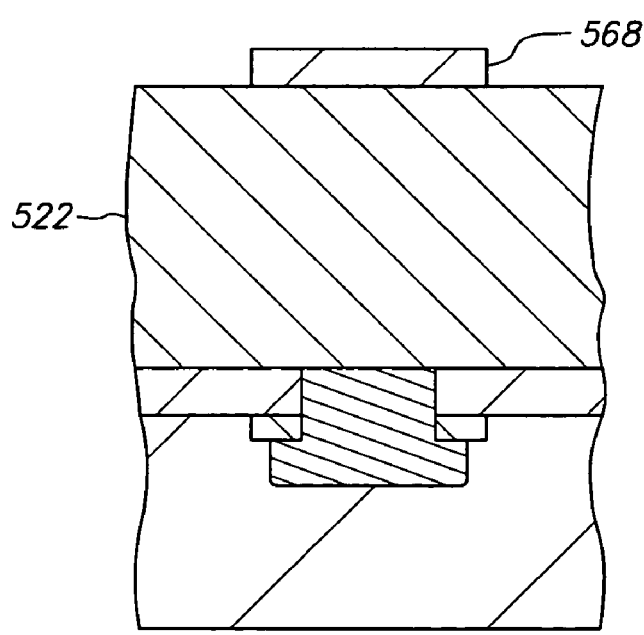
Figure 20L:
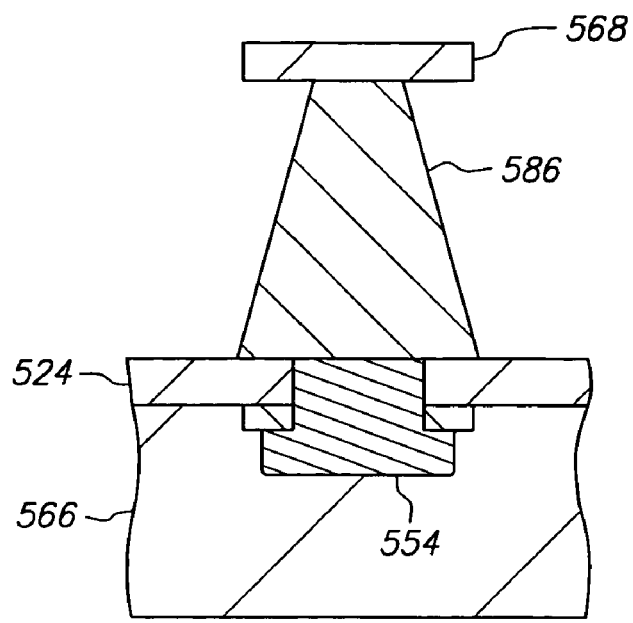
Figure 20M:
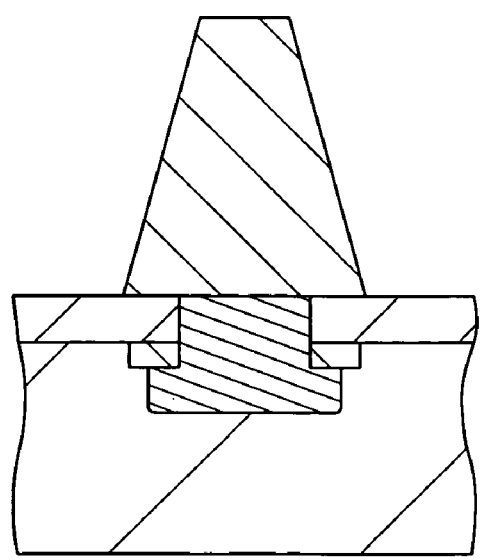
Figure 20N:
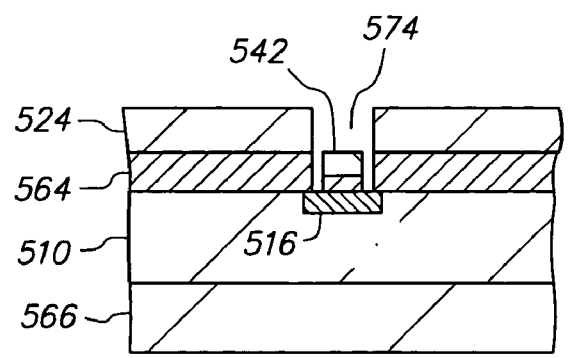
Figure 20O:
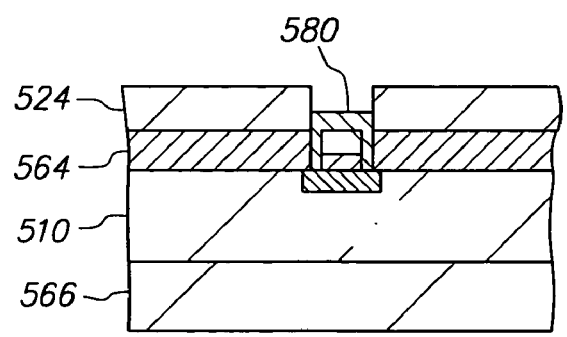

FIGS. 17A–17O, 18A–18O, 19A–19O and 20A–20O are cross-sectional, top, bottom and cross-sectional views, respectively, of a method of making a semiconductor chip assembly in accordance with a fifth embodiment of the present invention. FIGS. 20A–20O are oriented orthogonally with respect to FIGS. 17A–17O and depict FIGS. 17A–17O as viewed from left-to-right. In the fifth embodiment, an encapsulant is formed on the back-side of the chip, and the portion of the metal base above the pad is removed as the pillar is formed before the connection joint is formed. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, metal base 522 corresponds to metal base 122, etc.

FIGS. 17A, 18A, 19A and 20A are cross-sectional, top, bottom and cross-sectional views, respectively, of semiconductor chip 510 which includes opposing major surfaces 512 and 514. Surface 512 includes conductive pad 516 and passivation layer 518.

FIGS. 17B, 18B, 19B and 20B are cross-sectional, top, bottom and cross-sectional views, respectively, of laminated structure 520 that includes metal base 522, insulative base 524 and metal layer 526. Metal base 522 includes surface 530, and metal layer 526 includes surface 532.

FIGS. 17C, 18C, 19C and 20C are cross-sectional, top, bottom and cross-sectional views, respectively, of photoresist layers 534 and 536 formed on metal base 522 and metal layer 526, respectively. Photoresist layer 534 is unpatterned and covers the entire metal base 522, and photoresist layer 536 contains openings that selectively expose metal layer 526.

FIGS. 17D, 18D, 19D and 20D are cross-sectional, top, bottom and cross-sectional views, respectively, of routing line 542 formed from metal layer 526, and first via portion 544A formed through routing line 542 by wet chemical etching using photoresist layers 534 and 536 as etch masks.

FIGS. 17E, 18E, 19E and 20E are cross-sectional, top, bottom and cross-sectional views, respectively, of the structure after photoresist layers 534 and 536 are stripped. Routing line 542 includes elongated routing region 550 and enlarged annular region 552.

FIGS. 17F, 18F, 19F and 20F are cross-sectional, top, bottom and cross-sectional views, respectively, of the structure after via 544 is formed through insulative base 524 and routing line 542. A portion of insulative base 524 exposed by first via portion 544A is selectively removed using a laser etch to form second via portion 544B in insulative base 524. The combination of via portions 544A and 544B forms via 544 that exposes metal base 522.

FIGS. 17G, 18G, 19G and 20G are cross-sectional, top, bottom and cross-sectional views, respectively, of interconnect 554 deposited in via 544. Interconnect 554 fills via 544 and contacts and electrically connects metal base 522 and routing line 542. Furthermore, interconnect 554 is composed of conductive adhesive.

Interconnect 554 has a mushroom-shape that includes cylindrical base 560 and pileus or cap 561. Cylindrical base 560 fills via 544, and cap 561 extends outside via 544 and contacts enlarged annular region 552 without contacting insulative base 524 or elongated routing region 550. Cylindrical base 560 has a thickness of 37 microns and a diameter of 200 microns, and cap 561 has a thickness of 50 microns and a diameter of 300 microns. Cap 561 is axially aligned with to via 544 and enlarged annular region 552. Thus, cap 561 is spaced from the peripheral sidewalls of enlarged annular region 552 by 50 microns ((400−300)/2).

Interconnect 554 is deposited into via 544 and onto routing line 542 outside via 544 by conductive epoxy paste printing followed by curing. Conductive epoxy paste is deposited into via 544 using stencil printing. During the stencil printing process, a stencil (not shown) with a thickness of 100 microns is placed on routing line 542, a stencil opening with a diameter of 300 microns is axially aligned with via 544 and enlarged annular region 552, and then a squeegee (not shown) pushes the conductive epoxy paste along the surface of the stencil opposite routing line 542, through the stencil opening and into via 544 and onto enlarged annular region 552. The conductive epoxy paste is compliant enough at room temperature to conform to virtually any shape. As a result, the conductive epoxy paste fills via 544 and extends above via 544 in the stencil opening. Thereafter, the structure is heated to a temperature in the range of 100 to 250° C. The conductive epoxy paste includes an epoxy binder and silver powder. The heat causes the epoxy binder to solidify. As a result, the conductive epoxy paste contracts from its original size and curing occurs. Thereafter, the heat is removed and the fully cured conductive adhesive provides interconnect 554.

For convenience of illustration, metal base 522 is shown above insulative base 524 to retain a single orientation throughout the figures for ease of comparison between the figures, although the structure would be inverted during the formation of interconnect 554 so that gravitational force would assist with the conductive epoxy paste deposition.

FIGS. 17H, 18H, 19H and 20H are cross-sectional, top, bottom and cross-sectional views, respectively, of adhesive 564 formed on insulative base 524 and routing line 542. Adhesive 564 is spaced from interconnect 554.

FIGS. 17I, 18I, 19I and 20I are cross-sectional, top, bottom and cross-sectional views, respectively, of chip 510 mechanically attached to laminated structure 520 by adhesive 564. Chip 510 and routing line 542 are positioned relative to one another so that routing line 542 is disposed above and overlaps and is electrically isolated from pad 516.

FIGS. 17J, 18J, 19J and 20J are cross-sectional, top, bottom and cross-sectional views, respectively, of encapsulant 566 formed on chip 510, insulative base 524, routing line 542, interconnect 554 and adhesive 564 by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art. Encapsulant 566 contacts surface 514 of chip 510, the outer edges of chip 510, and surfaces of insulative base 524, routing line 542, interconnect 554 and adhesive 564 that face towards and are outside the periphery of chip 510 without contacting metal base 522. Encapsulant 566 is a solid adherent compressible protective layer that provides back-side environmental protection such as moisture resistance and particle protection for chip 510 as well as mechanical support for insulative base 524 and routing line 542 outside the periphery of chip 510. Encapsulant 566 is 100 microns thick beyond surface 514.

At this stage, adhesive 564 continues to cover pad 516, insulative base 524 and encapsulant 566 provide enhanced mechanical support for routing line 542, and encapsulant 566 provides protection for chip 510.

FIGS. 17K, 18K, 19K and 20K are cross-sectional, top, bottom and cross-sectional views, respectively, of photoresist layer 568 formed on metal base 522. Photoresist layer 568 is deposited in liquid form using roller coating. A reticle (not shown) is positioned proximate to photoresist layer 568. Thereafter, photoresist layer 568 is patterned by selectively applying light through the reticle, applying a developer solution to remove the photoresist portions rendered soluble by the light, and then hard baking, as is conventional. As a result, photoresist layer 568 contains an opening that selectively exposes surface 530 of metal base 522. Photoresist layer 568 has a thickness of 25 microns.

FIGS. 17L, 18L, 19L and 20L are cross-sectional, top, bottom and cross-sectional views, respectively, of the structure after a selected portion of metal base 522 is removed and a remaining portion of metal base 522 outside the periphery of chip 510 forms pillar 586 that overlaps and is aligned with via 544 and interconnect 554. This is accomplished by applying a wet chemical etch to metal base 522 using photoresist layer 568 as an etch mask.

The wet chemical etch can be sprayed on metal base 522, or the structure can be dipped in the wet chemical etch since routing line 542 is protected by insulative base 524 and encapsulant 566. A suitable wet chemical etch can be provided by the same solution used for etching metal layer 526 to form routing line 542. The wet chemical etch is highly selective of copper with respect to polyimide and the molding compound. Therefore, no appreciable amount of insulative base 524 or encapsulant 566 is removed. The optimal etch time for exposing the structure to the wet chemical etch in order to form pillar 586 with the desired dimensions can be established through trial and error.

The wet chemical etch etches completely through metal base 522, thereby effecting a pattern transfer of photoresist layer 568 onto metal base 522. The wet chemical etch removes all remaining portions of metal base 522 within the periphery of chip 510 but does not remove a portion of metal base 522 outside the periphery of chip 510 that overlaps and is aligned with via 544 and interconnect 554 and forms pillar 586. Pillar 586 overlaps and is axially aligned with via 544 and interconnect 554.

Routing line 542, interconnect 554 and pillar 586 in combination provide conductive trace 590 that is adapted for providing horizontal and vertical routing between pad 516 and a terminal on a printed circuit board (not shown) in a next level assembly. Interconnect 554 contacts and electrically connects routing line 542 and pillar 586.

FIGS. 17M, 18M, 19M and 20M are cross-sectional, top, bottom and cross-sectional views, respectively, of the structure after photoresist layer 568 is stripped.

FIGS. 17N, 18N, 19N and 20N are cross-sectional, top, bottom and cross-sectional views, respectively, of opening 574 formed in insulative base 524 and adhesive 564 by laser ablation. Opening 574 exposes pad 516 and the peripheral sidewalls and top surface of routing line 542, and adhesive 564 remains in contact with and sandwiched between pad 516 and routing line 542.

FIGS. 17O, 18O, 19O and 20O are cross-sectional, top, bottom and cross-sectional views, respectively, of connection joint 580 formed on pad 516 and routing line 542. Connection joint 580 is composed of conductive adhesive and is formed by dispensing conductive epoxy paste onto pad 516 and routing line 542 followed by curing. The conductive epoxy paste (with the same composition as that used for interconnect 554) is dispensed onto pad 516 and routing line 542 using a dispense head that is positioned above and axially aligned with and centered relative to opening 574, and then the structure is heated to a temperature in the range of 100 to 250° C. so that the conductive epoxy paste cures and hardens. Thereafter, the heat is removed and the fully cured conductive adhesive provides connection joint 580.

At this stage, the manufacture of semiconductor chip assembly 594 that includes chip 510, insulative base 524, adhesive 564, encapsulant 566, connection joint 580 and conductive trace 590 can be considered complete.

The semiconductor chip assemblies described above are merely exemplary. Numerous other embodiments are contemplated. In addition, various aspects of the embodiments described above can be combined with another. For instance, the opening in the metal base can be formed before or after the laminated structure is attached to the chip, regardless of whether the interconnect is a plated metal, solder or conductive adhesive. Likewise, the portion of the metal base above the pad can be removed before or during pillar formation, regardless of whether the pillar is defined by a solder, nickel or photoresist etch mask. In addition, the encapsulant can be formed on the back-side of the chip or omitted, regardless of whether the pillar is formed before of after the connection joint is formed. Various aspects of the embodiments described above can be mixed-and-matched with one another and other embodiments depending on design and reliability considerations.

Figure 21:
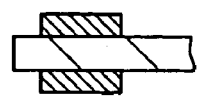
FIGS. 21–25 are top plan views of routing line variations in accordance with the present invention.
Figure 22:
Figure 23:
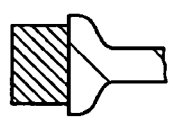
Figure 24:
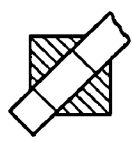
Figure 25:
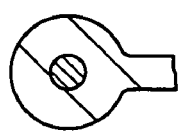

The conductive trace can have various shapes and sizes. The conductive trace can overlap various portions of the pad, such as one peripheral edge and the center of the pad (FIGS. 2N, 6M, 10K, 14N and 18N), two opposing peripheral edges and the center of the pad (FIG. 21), three peripheral edges but not the center of the pad (FIGS. 22 and 23), two corners and the center of the pad (FIG. 24) or four peripheral edges but not the center of the pad (FIG. 25).

The conductive trace can be various conductive metals including copper, gold, nickel, silver, palladium, tin, combinations thereof, and alloys thereof. The preferred composition of the conductive trace will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may function as a signal, power or ground layer depending on the purpose of the associated chip pad. Likewise, the conductive trace can fan-in or fan-out or both.

The laminated structure can be formed with a wide variety of materials through a wide variety of techniques. For instance, laminated structures that consist of a metal base, an insulative base and a metal layer (with the insulative base sandwiched between the metal base and the metal layer) are generally preferred, and laminated structures in which the metal base and the metal layer are copper are generally more preferred due to their widespread availability and tendency to remain flat without warpage. Commercially available laminates such as NEOFLEX™ diclad by Mitsui Chemicals of Tokyo, Japan are suitable. Resin-coated copper foil (RCC) laminates are also suitable. However, other laminated structures can also be employed.

The metal base and the metal layer can be various metals such as copper, gold, nickel, silver, palladium, tin, combinations thereof, and alloys, and need not necessarily have the same composition.

The metal base and the metal layer can each be a single layer or multiple layers. If desired, the metal layer (or routing line) can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. As another example, the metal layer can include a non-copper layer between a copper layer and the insulative base. Suitable non-copper layers include nickel, gold, palladium and silver. A gold layer is well-suited for receiving a gold ball bond connection joint.

The metal base need not necessarily be dedicated solely to pillar formation. For instance, a portion of the metal base above the pad can be selectively etched to permit formation of the opening in the insulative base and the adhesive, another portion of the metal base can be selectively etched to form the pillar, and another portion of the metal base that is disposed within the periphery of the chip and spaced from the pillar can remain intact and provide a heat sink.

The opening in the metal base can be formed before or after the routing line is formed, before or after the opening in the insulative base and the adhesive is formed, and before or after mechanically attaching the laminated structure to the chip. The opening in the metal base can be formed by various techniques including mechanical drilling, mechanical punching, laser drilling and wet chemical etching. In addition, the opening in the metal base can be formed by selectively etching the metal base through an etch mask or by blanketly etching a recess in the metal base. Furthermore, the opening in the metal base can expose a single pad or a plurality of pads. For instance, the opening in the metal base can expose multiple openings in the insulative base and the adhesive which each expose a respective routing line and a respective pad, thereby facilitating the flow of electrolytic plating solution for the connection joints. Thereafter, multiple connection joints can be formed which each contact and electrically connect a respective routing line and a respective pad, a single-piece insulator can be formed in the opening in the metal base and on the insulative base and the connection joints, and then the metal base can be etched to form the pillar while the insulator protects the connection joints from the wet chemical etch.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W. L. Gore & Associates of Eau Claire, Wisconsin are suitable.

The insulative base may be disposed between the metal base and the metal layer in numerous manners. For instance, an epoxy resin without reinforcement can be coated onto the metal base and then laminated to the metal layer as heat and pressure are applied. Alternatively, a prepreg with reinforcement can be a dry film that is sandwiched between the metal base and the metal layer and then laminated to the metal base and the metal layer as heat and pressure are applied.

The via can be formed in numerous manners. For instance, the via can be formed with a single removal step such as mechanical drilling, mechanical punching or laser drilling. For example, the via can be formed through the metal layer and the insulative base and into but not through the metal base using laser drilling, in which case the interconnect can extend into the metal base and the pillar. Alternatively, the via can be formed with multiple removal steps. For example, a first masking film can be deposited on the metal base, a second masking film can be deposited on the metal layer, and the via can be formed through the second masking film using laser drilling, then through the metal layer using wet chemical etching, then through the insulative base using laser drilling. As another example, the via can be formed through the metal layer using wet chemical etching, then through the insulative base using plasma etching.

The interconnect can be formed from a wide variety of materials including copper, gold, nickel, palladium, tin, alloys thereof, and combinations thereof, can be formed by a wide variety of processes including electroplating, electroless plating, solder reflowing, conductive adhesive curing, and combinations thereof, and can have a wide variety of shapes and sizes. For instance, the interconnect can be formed by applying a copper activator solution that renders the via sidewalls at the insulative base catalytic to electroless copper, then performing a copper electroless plating operation that deposits a thin electroless copper layer on the metal base, the insulative base and the metal layer as a first interconnect layer, and then performing a copper electroplating operation that deposits a thick electroplated copper layer on the electroless copper layer as a second interconnect layer. As another example, the interconnect can be formed by applying a copper activator solution that renders the via sidewalls at the insulative base catalytic to electroless copper, then performing a copper electroless plating operation that deposits a thin electroless copper layer on the metal base, the insulative base and the metal layer as a first interconnect layer, then performing a first copper electroplating operation that deposits a thin electroplated copper layer on the electroless copper layer as a second interconnect layer, then forming a photoresist layer on the thin electroplated copper layer that defines the routing line, then performing a second copper electroplating operation that selectively deposits a thick electroplated copper layer on the thin electroplated copper layer as a third interconnect layer using the photoresist layer as a plating mask, then stripping the photoresist layer, and then etching the metal layer using the thick electroplated copper layer as an etch mask to form the routing line.

The pillar is particularly well-suited for interconnecting to the next level assembly. The pillar can be disposed within or outside the periphery of the chip. Preferably, the pillar is aligned with and overlaps the via. The phrase "aligned with" as used in this context means that for given a conductive trace that includes a pillar, an interconnect and a routing line, where the interconnect extends through a via in the insulative base and contacts and electrically connects the pillar and the routing line, the pillar is positioned closer to that via than to another via associated with another conductive trace that includes another pillar, another interconnect and another routing line.

The pillar can be formed in numerous manners. For instance, the metal base can be etched to form a recess and expose what shall become the tip of the pillar, then an etch mask can be deposited in the recess, then the laminated structure can be attached to the chip, and then the metal base can be etched to undercut the metal base beneath the etch mask for the first time and form the pillar. Alternatively, the metal base can be etched to form a recess and expose what shall become the tip of the pillar, then an etch mask can be deposited in the recess, then the metal base can be etched to undercut the metal base beneath the etch mask for the first time, then the laminated structure can be attached to the chip, and then the metal base can be etched again to undercut the metal base beneath the etch mask for the second time and form the pillar. Preferably, etching the metal base forms the pillar from an unetched portion of the metal base that overlaps and is aligned with the via and also electrically isolates the pillar from other pillars (and thus the pad from other pads). In either case, etching the metal base to form the pillar does not preclude etching and undercutting the metal base beneath the etch mask at an earlier stage (such as the example described above). Furthermore, etching the metal base to form the pillar can include an overetch such as 20 to 30% that exposes the insulative base beneath the etch mask in order to assure that the pillar is aligned with the via and electrically isolated from other pillars and compensate for non-uniformities and manufacturing tolerances.

The etch mask that defines the pillar can be a wide variety of materials including copper, gold, nickel, palladium, tin, solder, photoresist and epoxy, can be formed by a wide variety of processes including electroplating, electroless plating, printing, reflowing and curing, and can have a wide variety of shapes and sizes. The etch mask can be deposited on the metal base before or after mechanically attaching the laminated structure to the chip, can be disposed on a planar top surface of the metal base or a recess in the metal base, and if disposed in a recess need not necessarily fill the recess. Furthermore, the etch mask can remain permanently attached to the pillar or be removed after the pillar is formed.

The etch mask that defines the pillar and is undercut by a wet chemical etch that forms the pillar can subsequently be confined to the tip of the pillar, for instance by dislodging a portion of the etch mask outside the tip of the pillar by mechanical brushing, sand blasting, air blowing or water rinsing, or by reflowing a solder etch mask when the pillar does not provide a wettable surface. Alternatively, a solder etch mask can be reflowed to conformally coat the entire pillar and contact the insulative base, for instance by depositing flux on the pillar so that the pillar provides a wettable surface before the solder reflow operation.

The recess in the metal base can be formed before or after the routing line is formed, before or after the via is formed, before or after the interconnect is formed, and before or after mechanically attaching the laminated structure to the chip. The recess can be formed by various techniques including mechanical drilling, mechanical punching, laser drilling and wet chemical etching. Furthermore, the recess can be formed by a single removal step or multiple removal steps. For instance, the recess can be formed by a single wet chemical etch step in which top and bottom spray nozzles simultaneously spray wet chemical etching solution on the metal base and the metal layer, respectively, to form the recess and the routing line. This approach is most useful when the recess depth is similar to the metal layer thickness. Alternatively, the recess can be formed by multiple wet chemical etch steps in which top and bottom spray nozzles simultaneously spray wet chemical etching solution on the metal base and the metal layer, respectively, to partially form the recess and completely form the routing line, and then the top spray nozzle sprays more wet chemical etching solution on the metal base to completely form the recess while the bottom spray nozzle is deactivated. This approach is most useful when the recess depth is substantially larger than the metal layer thickness.

The routing line can be formed in numerous manners. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. For example, the metal layer can be an ultra-thin copper foil with a thickness of 1–3 microns that is attached to an aluminum layer, then the metal layer can be laminated to the insulative base and sandwiched between the aluminum layer and the insulative base, then the aluminum layer can be peeled off the metal layer, the plated metal can be electroplated copper with a thickness of 10–15 microns, and a copper etching solution can be briefly applied to etch completely through the metal layer and remove a few microns of the plated metal. In this manner, the routing line can be formed semi-additively and composed of copper and include unetched portions of the metal layer and the plated metal. Likewise, the routing line can be formed subtractively from the metal layer, regardless of whether the plated metal etch mask remains attached to the routing line. Furthermore, the plated metal can form a layer of the interconnect.

The routing line can be formed at various stages. For instance, a photoresist layer can be formed over the metal layer before or after the recess is formed, before or after the via is formed, and before or after the interconnect is formed. Similarly, the metal layer can be etched using the photoresist layer as an etch mask to form the routing line before or after the recess is formed, before or after the via is formed, and before or after the interconnect is formed. Similarly, the photoresist layer can be stripped before or after the recess is formed, before or after the via is formed, and before or after the interconnect is formed. Preferably, the photoresist layer is stripped before the pillar is formed.

The pad can have numerous shapes including a flat rectangular shape and a bumped shape. For instance, a bump-shaped pad may extend into the opening in the insulative base and the adhesive and may even extend above the routing line. The pad can either be partially or completely exposed prior to forming the connection joint. The pad can have a length and width that are larger than, equal to, or smaller than the diameter of the opening. Preferably, the pad and opening have the same or similar size, and a substantial portion of the pad is directly beneath the opening. If desired, the pad can be treated to accommodate the connection joint. For instance, the pad can be rendered catalytic to an electroless nickel connection joint by depositing several metal layers, such as chromium/copper/gold or titanium/nickel/gold on the aluminum base, or alternatively, zincating the aluminum base and electrolessly plating a nickel surface layer on the zincated aluminum base.

Numerous adhesives can be applied between the chip and the conductive trace. For instance, the adhesive can be applied as a paste, a laminated layer, or a liquid applied by screen-printing, spin-on, or spray-on. If a paste or liquid adhesive is applied, the adhesive may contact the insulative base, whereas if a laminated adhesive is applied then no appreciable amount of adhesive may contact the insulative base. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The opening in the insulative base and the adhesive may be formed either before or after mechanically attaching the laminated structure to the chip. For instance, the adhesive can be applied as a liquid or paste (A stage) to the bottom surface of the conductive trace, the adhesive can be partially cured (B stage), a back-side etch can form the opening in the insulative base and the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the laminated structure to the chip, and then a front-side etch can form the opening in the insulative base and the adhesive.

The opening in the insulative base and the adhesive can be formed with numerous etching techniques. For instance, the opening can be formed by laser ablation (including laser direct write without a mask and projection laser ablation with a mask) or plasma etching. Similarly, the opening in the insulative base and the adhesive can be formed by a combination of laser ablation and plasma etching. See, for instance, U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference. In addition, the opening can have a circular, ovular, square, rectangular or other shape (as viewed from the top surface of the insulative base). The opening may be aligned with and expose a single pad or a plurality of pads. Likewise, the opening may expose one or more peripheral edges of the pad or just a central portion of the pad spaced from the peripheral edges of the pad. Furthermore, the opening sidewalls may have a wide variety of shapes and slopes including vertical sidewalls, tapered sidewalls, continuous sidewalls and stepped sidewalls.

The opening in the adhesive that exposes the interconnect can be also formed with numerous etching techniques, such as laser ablation and plasma etching, and can have a circular, ovular, square, rectangular or other shape (as viewed from the bottom surface of the insulative base). The opening in the adhesive that exposes the interconnect is particularly well-suited for allowing a conductive bond to contact the interconnect in the event the semiconductor chip assembly is used in a stacked arrangement. See, for instance, U.S. Pat. No. 6,451,626 by Charles W. C. Lin entitled "Three-Dimensional Stacked Semiconductor Package" which is incorporated by reference.

The encapsulant can be deposited on the chip using a wide variety of techniques including printing and transfer molding. For instance, the encapsulant can be printed on the chip as an epoxy paste and then cured or hardened to form a solid adherent protective layer. The encapsulant can be any of the adhesives mentioned above. Moreover, the encapsulant need not necessarily contact the chip. For instance, a glob-top coating can be deposited on the chip after mechanically attaching the chip to the laminated structure, and then the encapsulant can be formed on the glob-top coating.

The connection joint can be formed from a wide variety of materials including copper, gold, nickel, palladium, tin, alloys thereof, and combinations thereof, can be formed by a wide variety of processes including electroplating, electroless plating, ball bonding, solder reflowing, conductive adhesive curing, and welding, and can have a wide variety of shapes and sizes. The shape and composition of the connection joint depends on the composition of the routing line as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

After the pillar is formed, further encapsulation can be performed but is generally not necessary. However, it may be desirable to provide further encapsulation to enhance the mechanical strength of the assembly in the event the encapsulant and/or insulative base are particularly thin or omitted.

Likewise, further encapsulation can be used to cover the connection joint if the insulator is omitted.

After the pillar is formed, a soldering material or solder ball can be deposited over the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly. Moreover, the pillar may already be covered by a solder etch mask.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Alternatively, the plating bus can be disconnected as the pillar is formed.

Various cleaning steps, such as a brief oxygen plasma cleaning step, or a brief wet chemical cleaning step using a solution containing potassium permanganate, can be applied to the structure at various stages, such as after forming the via to clean the metal base, after forming the opening in the insulative base and the adhesive to clean the pad, and after forming the opening in the adhesive to clean the interconnect. A solution containing potassium permanganate that is highly alkaline with a pH of 14 may attack or degrade certain tin-lead solders. This can be mitigated in numerous manners. For instance, after the opening in the insulative base and the adhesive is formed, the connection joint and the metal layer that covers the metal base and a solder etch mask can be electroplated with a thickness of 3 microns such that the connection joint is spaced from the pad and the metal layer covers and protects the solder etch mask, then the solution containing potassium permanganate can be applied to clean the pad, and then the electroplating operation can continue to complete the connection joint. Alternatively, a solder etch mask that is less susceptible to potassium permanganate can be used, or an oxygen plasma cleaning step can be used.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a printed circuit board. Similarly, the conductive trace is disposed "above" the chip when the bottom surface of the conductive trace faces the upper surface of the chip regardless of whether the assembly is inverted, rotated or slanted. Likewise, the routing line is shown above the chip, the insulative base is shown above the routing line, and the metal base is shown above the insulative base with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, bump grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The insulative base and/or the encapsulant protect the chip from handling damage and provide a known dielectric barrier for the conductive trace. The insulative base and/or the encapsulant also provide critical mechanical support for the conductive trace during and after pillar formation. The insulative base prevents solder reflow from electrically shorting the underlying routing line. The tapered pillar yields enhanced reliability for the next level assembly that exceeds that of conventional BGA packages. The mode of the connection shifts from the initial mechanical coupling to metallurgical coupling to assure sufficient metallurgical bond strength. Furthermore, the conductive trace can be mechanically and metallurgically coupled to the chip without wire bonding, TAB or solder joints, although the process is flexible enough to accommodate these techniques if desired. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A method of connecting a conductive trace and an insulative base to a semiconductor chip, comprising:
   providing a semiconductor chip, a metal base, an insulative base, a routing line and an interconnect, wherein the chip includes a conductive pad, the metal base is disposed on a side of the insulative base that faces away from the chip, the routing line is disposed on a side of the insulative base that faces towards the chip, and the interconnect extends through a via in the insulative base and electrically connects the metal base and the routing line; then
   etching the metal base such that an unetched portion of the metal base forms a pillar that overlaps and is aligned with the via and contacts the interconnect, wherein a conductive trace includes the routing line, the interconnect and the pillar;
   forming an opening that extends through the insulative base and exposes the pad; and
   forming a connection joint that electrically connects the routing line and the pad.

2. The method of claim 1, including mechanically attaching the routing line to the chip using an adhesive before forming the opening.

3. The method of claim 2, including forming the opening through the adhesive.

4. The method of claim 3, wherein the adhesive contacts and is sandwiched between the routing line and the pad, and the routing line and the pad are electrically isolated from one another after forming the opening and before forming the connection joint.

5. The method of claim 1, wherein forming the opening includes applying a laser that ablates the insulative base.

6. The method of claim 1, wherein the pillar contacts the side of the insulative base that faces away from the chip.

7. The method of claim 1, including: providing a laminated structure that includes the metal base, the insulative base and a metal layer; then
etching the metal layer to form the routing line; then
forming the via in the insulative base; then
depositing the interconnect in the via; then
mechanically attaching the laminated structure to the chip; and then
etching the metal base to form the pillar.

8. The method of claim 1, including forming an encapsulant on a side of the chip opposite the pad after mechanically attaching the routing line to the chip and before etching the metal base to form the pillar.

9. The method of claim 1, including depositing an insulator into the opening and on the insulative base and the connection joint.

10. The method of claim 1, wherein the metal base, the routing line and the connection joint are copper.

11. A method of connecting a conductive trace and an insulative base to a semiconductor chip, comprising:
providing a semiconductor chip that includes a conductive pad;
providing a metal base, an insulative base and a routing line, wherein the metal base and the routing line are disposed on opposite sides of the insulative base;
forming a via that extends through the insulative base and exposes the metal base;
depositing an interconnect into the via that electrically connects the metal base and the routing line;
disposing an adhesive between the routing line and the chip, thereby mechanically attaching the routing line to the chip such that the metal base is disposed on a side of the insulative base that faces away from the chip, and the routing line is disposed on a side of the insulative base that faces towards the chip; then
etching the metal base such that an unetched portion of the metal base forms a pillar that overlaps and is aligned with the via and contacts the interconnect and the insulative base, wherein a conductive trace includes the routing line, the interconnect and the pillar;
forming an opening that extends through the insulative base and the adhesive and exposes the pad; and
forming a connection joint that electrically connects the routing line and the pad.

12. The method of claim 11, wherein forming the via includes applying a wet chemical etch to a metal layer, thereby exposing the insulative base, and then applying a laser that ablates the insulative base, thereby exposing the metal base.

13. The method of claim 11, wherein disposing the adhesive includes curing the adhesive.

14. The method of claim 11, wherein disposing the adhesive includes contacting the adhesive to the insulative base and the chip.

15. The method of claim 11, wherein forming the opening includes applying a laser that ablates the insulative base and the adhesive.

16. The method of claim 11, wherein forming the opening includes applying a plasma that etches the insulative base and the adhesive.

17. The method of claim 11, wherein forming the opening exposes the routing line.

18. The method of claim 11, wherein forming the opening exposes a portion of the adhesive that is sandwiched between the routing line and the pad.

19. The method of claim 11, wherein the routing line overlaps only one peripheral edge of the pad after mechanically attaching the routing line to the chip.

20. The method of claim 11, wherein the routing line overlaps only two peripheral edges of the pad, and the two peripheral edges are opposite one another, after mechanically attaching the routing line to the chip.

21. The method of claim 11, wherein the routing line overlaps only three peripheral edges of the pad, and two of the three peripheral edges are opposite one another, after mechanically attaching the routing line to the chip.

22. The method of claim 11, wherein the routing line extends within and outside a periphery of the chip, and the pillar is disposed outside the periphery of the chip.

23. The method of claim 11, wherein the via is disposed within and extends through the routing line.

24. The method of claim 11, wherein the via extends to but not into the metal base.

25. The method of claim 11, wherein the connection joint contacts a surface of the routing line that is disposed above and overlaps and faces away from the pad.

26. The method of claim 11, wherein the connection joint contacts a peripheral sidewall of the routing line that is disposed above and overlaps and is orthogonal to the pad.

27. The method of claim 11, including forming a recess in the metal base, and etching the metal base to form the pillar using an etch mask that is disposed in the recess and overlaps the via.

28. The method of claim 11, including forming an encapsulant on a side of the chip opposite the pad after mechanically attaching the routing line to the chip and before etching the metal base to form the pillar.

29. The method of claim 11, including depositing an insulator into the opening and on the insulative base and the connection joint.

30. The method of claim 11, wherein the steps are performed in the sequence set forth.

31. A method of connecting a conductive trace and an insulative base to a semiconductor chip, comprising the following steps in the sequence set forth:
providing a metal base, an insulative base and a metal layer, wherein the metal base and the metal layer are disposed on opposite sides of the insulative base;
forming a routing line, a via and an interconnect, wherein the routing line includes an unetched portion of the metal layer, the via extends through the insulative base, and the interconnect is disposed in the via and electrically connects the metal base and the routing line;
disposing an adhesive between the routing line and the chip, thereby mechanically attaching the routing line to the chip such that the metal base is disposed on a side of the insulative base that faces away from the chip, and the routing line is disposed on a side of the insulative base that faces towards the chip;

etching the metal base such that an unetched portion of the metal base forms a pillar that overlaps and is aligned with the via and contacts the interconnect and the insulative base, wherein the routing line extends within and outside a periphery of the chip, the pillar is disposed outside the periphery of the chip, and a conductive trace includes the routing line, the interconnect and the pillar;

forming an opening that extends through the insulative base and the adhesive, exposes the routing line and the pad and is spaced from the via; and forming a connection joint that electrically connects the routing line and the pad.

32. The method of claim 31, wherein forming the via includes applying a wet chemical etch to the metal layer, thereby exposing the insulative base, and then applying a laser that ablates the insulative base, thereby exposing the metal base.

33. The method of claim 31, wherein disposing the adhesive includes contacting the adhesive to the insulative base and the chip.

34. The method of claim 31, wherein forming the opening includes applying a laser that ablates the insulative base and the adhesive and exposes the routing line and the pad.

35. The method of claim 31, wherein the routing line overlaps only one peripheral edge of the pad after mechanically attaching the routing line to the chip.

36. The method of claim 31, wherein the via is disposed within and extends through the routing line, and the via extends to but not into the metal base.

37. The method of claim 31, wherein the connection joint contacts a surface of the routing line that is disposed above and overlaps and faces away from the pad and a peripheral sidewall of the routing line that is disposed above and overlaps and is orthogonal to the pad.

38. The method of claim 31, including forming a recess in the metal base, and etching the metal base to form the pillar using an etch mask that is disposed in the recess and overlaps the via.

39. The method of claim 31, including forming an encapsulant on a side of the chip opposite the pad after mechanically attaching the routing line to the chip and before etching the metal base to form the pillar.

40. The method of claim 31, including depositing an insulator into the opening and on the insulative base and the connection joint.

41. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

providing a first etch mask over the metal base;

providing a second etch mask over the metal layer;

etching the metal base using the first etch mask to selectively protect the metal base, thereby forming a recess in the metal base;

etching the metal layer using the second etch mask to selectively protect the metal layer, thereby forming a routing line that includes an unetched portion of the metal layer and exposing the insulative base;

providing a third etch mask in the recess;

forming a via that extends through the insulative base and exposes the metal base;

depositing an interconnect into the via, wherein the interconnect extends through the insulative base and contacts and electrically connects the metal base and the metal layer;

mechanically attaching the laminated structure to a chip using an adhesive, wherein the chip includes a conductive pad, the metal base is disposed on a side of the insulative base that faces away from the chip, the routing line is disposed on a side of the insulative base that faces towards the chip, the routing line is proximate to the pad and extends outside a periphery of the pad, the third etch mask overlaps the via, and the via is disposed outside the periphery of the pad;

etching the metal base using the third etch mask to selectively protect the metal base such that a portion of the metal base remains intact and forms a pillar that overlaps and is aligned with the via and contacts the interconnect and the insulative base, wherein a conductive trace includes the routing line, the interconnect and the pillar;

forming an opening that extends through the insulative base and the adhesive, exposes the routing line and the pad and is spaced from the via; and forming a connection joint in the opening that electrically connects the routing line and the pad.

42. The method of claim 41, wherein providing the first etch mask includes depositing a first photoresist layer over the metal base and selectively patterning the first photoresist layer, and providing the second etch mask includes depositing a second photoresist layer over the metal layer and selectively patterning the second photoresist layer.

43. The method of claim 41, wherein providing the third etch mask includes depositing the third etch mask into the recess before mechanically attaching the routing line to the chip.

44. The method of claim 41, wherein providing the third etch mask includes depositing the third etch mask into the recess before forming the via.

45. The method of claim 41, wherein providing the third etch mask includes depositing the third etch mask into the recess after simultaneously etching the metal base and the metal layer to form the recess and the routing line.

46. The method of claim 41, wherein providing the third etch mask includes depositing the third etch mask into the recess after etching the metal layer to form the routing line and a portion of the via that extends through and is disposed within the routing line and extends to but not into the metal base.

47. The method of claim 41, wherein providing the third etch mask includes depositing the third etch mask into the recess using the first etch mask as a deposition mask.

48. The method of claim 41, wherein the third etch mask is solder.

49. The method of claim 41, including reshaping the third etch mask such that the third etch mask continues to contact and cover a tip of the pillar and a spaced gap between the third etch mask and a sidewall of the pillar is removed.

50. The method of claim 41, wherein the steps are performed in the sequence set forth.

51. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a routing line that includes a first portion of the metal layer, wherein forming the routing line includes selectively removing a second portion of the metal layer;

forming a via in the laminated structure that extends through the metal layer and the insulative base and exposes the metal base;

depositing an interconnect into the via, wherein the interconnect extends through the insulative base and contacts and electrically connects the metal base and the metal layer; then mechanically attaching the laminated structure to a chip using an adhesive, wherein the chip includes a conductive pad, the metal base is disposed on a side of the insulative base that faces away from the chip, and the routing line is disposed on a side of the insulative base that faces towards the chip; then forming a pillar that includes a first portion of the metal base that overlaps and is aligned with the via and contacts the interconnect, wherein forming the pillar includes selectively removing a second portion of the metal base;

forming an opening that extends through the insulative base and the adhesive and exposes the routing line and the pad; and forming a connection joint in the opening that electrically connects the routing line and the pad.

52. The method of claim 51, wherein forming the via includes applying a wet chemical etch to the metal layer, thereby exposing the insulative base, and then applying a laser that ablates the insulative base, thereby exposing the metal base.

53. The method of claim 51, wherein disposing the adhesive includes contacting the adhesive to the insulative base and the chip.

54. The method of claim 51, wherein forming the opening includes applying a laser that ablates the insulative base and the adhesive and exposes the routing line and the pad.

55. The method of claim 51, wherein the pillar contacts the side of the insulative base that faces away from the chip.

56. The method of claim 51, wherein the via extends through the routing line and extends to but not into the metal base.

57. The method of claim 51, wherein the connection joint contacts a surface of the routing line that is disposed above and overlaps and faces away from the pad and a peripheral sidewall of the routing line that is disposed above and overlaps and is orthogonal to the pad.

58. The method of claim 51, including etching the metal base to form a recess in the metal base, depositing an etch mask into the recess before mechanically attaching the laminated structure to the chip, and then etching the metal base to form the pillar using the etch mask in the recess to define the pillar.

59. The method of claim 51, including forming an encapsulant on a side of the chip opposite the pad after mechanically attaching the laminated structure to the chip and before etching the metal base to form the pillar.

60. The method of claim 51, including depositing an insulator into the opening and on the insulative base and the connection joint.

61. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a routing line that includes a first portion of the metal layer, wherein forming the routing line includes selectively removing a second portion of the metal layer;

forming a via in the laminated structure that extends through the metal layer and the insulative base and exposes the metal base;

depositing an interconnect into the via, wherein the interconnect extends through the insulative base and contacts and electrically connects the metal base and the metal layer; then mechanically attaching the laminated structure to a chip using an adhesive, wherein the chip includes a conductive pad, the metal base is disposed on a side of the insulative base that faces away from the chip, and the routing line is disposed on a side of the insulative base that faces towards the chip; then forming a pillar that includes a first portion of the metal base that overlaps and is aligned with the via and contacts the interconnect and the insulative base, wherein forming the pillar includes selectively removing a second portion of the metal base; and forming a connection joint that electrically connects the routing line and the pad, wherein the connection joint is formed in an opening that extends through the insulative base and the adhesive.

62. The method of claim 61, wherein forming the opening includes applying a wet chemical etch to the metal base, thereby exposing the insulative base.

63. The method of claim 62, including applying the wet chemical etch before mechanically attaching the laminated structure to the chip.

64. The method of claim 62, including applying the wet chemical etch after mechanically attaching the laminated structure to the chip.

65. The method of claim 61, wherein forming the opening includes applying a wet chemical etch to the metal base, thereby exposing the insulative base, and then removing portions of the insulative base and the adhesive, thereby exposing the pad.

66. The method of claim 65, including applying the wet chemical etch before mechanically attaching the laminated structure to the chip.

67. The method of claim 65, including applying the wet chemical etch after mechanically attaching the laminated structure to the chip.

68. The method of claim 65, wherein forming the opening includes applying a laser that ablates the insulative base and the adhesive.

69. The method of claim 65, wherein forming the opening includes applying a plasma that etches the insulative base and the adhesive.

70. The method of claim 61, wherein forming the opening includes applying a wet chemical etch to the metal base before mechanically attaching the laminated structure to the chip, thereby exposing the insulative base, then mechanically attaching the laminated structure to the chip such that none of the metal base overlaps the pad, and then removing portions of the insulative base and the adhesive, thereby exposing the pad.

71. A method of connecting a conductive trace and an insulative base to a semiconductor chip, comprising:

providing a metal base, an insulative base and a metal layer, wherein the metal base and the metal layer are disposed on opposite sides of the insulative base;

providing a first etch mask on the metal base and a second etch mask on the metal layer;

etching the metal base and the metal layer using the first and second etch masks, respectively, thereby etching partially through the metal base to form a recess in the metal base and etching completely through the metal layer to form a routing line from the metal layer;

depositing a third etch mask into the recess;

electrically connecting the metal base and the routing line using an interconnect deposited into a via that extends through the insulative base;

mechanically attaching the routing line to a chip that includes a conductive pad; then etching the metal base using the third etch mask, thereby forming a pillar from the metal base that contacts the third etch mask and is electrically connected to the routing line by the interconnect; and electrically connecting the routing line and the pad.

72. The method of claim 71, wherein the routing line is a flat planar lead that is proximate to the pad.

73. The method of claim 71, wherein the routing line is a flat planar lead that overlaps the pad.

74. The method of claim 71, wherein the routing line is a flat planar lead that extends within and outside a periphery of the chip, and the pillar is disposed outside the periphery of the chip.

75. The method of claim 71, wherein the routing line is a flat planar lead that extends within and outside a periphery of the chip and is proximate to the pad, and the pillar is disposed outside the periphery of the chip and is proximate to a distal end of the routing line.

76. The method of claim 71, wherein the pillar overlaps and is aligned with the via.

77. The method of claim 71, wherein the pillar contacts a side of the insulative base that faces away from the chip.

78. The method of claim 71, wherein the pillar has a conical shape and a tip with a flat surface.

79. The method of claim 71, wherein the metal base and the metal layer are copper.

80. The method of claim 71, wherein the steps are performed in the sequence set forth.

81. A method of connecting a conductive trace and an insulative base to a semiconductor chip, comprising:

providing a structure that includes a metal base, an insulative base, a routing line, an interconnect and solder, wherein the metal base and the routing line are disposed on opposite sides of the insulative base, the solder and the insulative base are disposed on opposite sides of the metal base, and the interconnect extends through a via in the insulative base and contacts and electrically connects the metal base and the routing line;

mechanically attaching the structure to a chip using an adhesive, wherein the chip includes a conductive pad, the metal base is disposed on a side of the insulative base that faces away from the chip, and the routing line is disposed on a side of the insulative base that faces towards the chip;

etching the metal base using the solder as an etch mask, thereby removing a portion of the metal base while another portion of the metal base forms a pillar that contacts the solder, the interconnect and the insulative base, wherein a conductive trace includes the routing line, the interconnect and the pillar;

forming an opening that extends through the insulative base and the adhesive and exposes the pad; and forming a connection joint that electrically connects the routing line and the pad.

82. The method of claim 81, wherein providing the routing line includes:

providing a metal layer that contacts the insulative base;

forming a first mask on the metal layer; and etching the metal layer using the first mask as an etch mask.

83. The method of claim 82, wherein providing the solder includes:

forming a second mask on the metal base;

etching the metal base using the second mask as an etch mask, thereby forming a recess in the metal base; and depositing the solder into the recess.

84. The method of claim 83, wherein depositing the solder includes electroplating the solder into the recess using the second mask as a plating mask.

85. The method of claim 81, wherein forming the opening includes applying a laser that ablates the insulative base and the adhesive.

86. The method of claim 81, wherein the metal base and the routing line are copper.

87. The method of claim 81, wherein the interconnect is an electroplated metal, an electrolessly plated metal, solder or conductive adhesive.

88. The method of claim 81, wherein the adhesive is silicone, polyimide or epoxy.

89. The method of claim 81, wherein the connection joint is an electroplated metal, an electrolessly plated metal, a ball bond, a weld, solder or conductive adhesive.

90. The method of claim 81, wherein the steps are performed in the sequence set forth.

91. A method of connecting a conductive trace and an insulative base to a semiconductor chip, comprising:

providing a metal base, an insulative base and a metal layer, wherein the metal base and the metal layer are disposed on opposite sides of the insulative base;

forming a first mask on the metal base and a second mask on the metal layer;

etching partially but not completely through the metal base using the first mask as an etch mask for the metal base and completely through the metal layer using the second mask as an etch mask for the metal layer, thereby forming a recess in the metal base and a routing line from the metal layer;

depositing solder into the recess;

forming a via that extends through the insulative base and the metal layer and exposes the metal base;

depositing an interconnect into the via, wherein the interconnect extends through the insulative base and contacts and electrically connects the metal base and the metal layer;

mechanically attaching the routing line to a chip using an adhesive, wherein the chip includes a conductive pad, the metal base is disposed on a side of the insulative base that faces away from the chip, the routing line is disposed on a side of the insulative base that faces towards the chip, the solder is disposed on a side of the metal base that faces away from the chip, and the solder overlaps the via;

etching completely through the metal base using the solder as an etch mask, thereby forming a pillar from the metal base that overlaps and is aligned with the via and is disposed outside a periphery of the chip and contacts the solder, the interconnect and the insulative base, wherein a conductive trace includes the routing line, the interconnect and the pillar;

forming an opening that extends through the insulative base and the adhesive, exposes the routing line and the pad and is spaced from the pillar and the via; and forming a connection joint in the opening that electrically connects the routing line and the pad.

92. The method of claim 91, wherein depositing the solder includes electroplating the solder using the first mask as a deposition mask.

93. The method of claim 91, wherein forming the via includes etching completely through the metal layer by applying a wet chemical etch, thereby exposing the insulative base, and then applying a laser that ablates the insulative base, thereby exposing the metal base.

94. The method of claim 91, wherein forming the opening includes applying a laser that ablates the insulative base and the adhesive.

95. The method of claim 91, wherein the routing line is a flat planar lead that overlaps the pad, and the pillar is aligned with a distal end of the routing line.

96. The method of claim 91, wherein the connection joint contacts a surface of the routing line that is disposed above and overlaps and faces away from the pad, and the connection joint contacts a peripheral sidewall of the routing line that is disposed above and overlaps and is orthogonal to the pad.

97. The method of claim 91, wherein the metal base and the metal layer are copper, the first and second masks are photoresist, the interconnect is an electroplated metal, an electrolessly plated metal, solder or conductive adhesive, the adhesive is silicone, polyimide or epoxy, and the connection joint is an electroplated metal, an electrolessly plated metal, a ball bond, a weld, solder or conductive adhesive.

98. The method of claim 91, including reshaping the solder such that the solder continues to contact and cover a tip of the pillar and a spaced gap between the solder and a sidewall of the pillar is removed.

99. The method of claim 91, including forming an encapsulant on a side of the chip opposite the pad after attaching the chip to the routing line and before forming the opening.

100. The method of claim 91, wherein the steps are performed in the sequence set forth.

101. A method of connecting a conductive trace and an insulative base to a semiconductor chip, comprising:

providing a semiconductor chip, a metal base, an insulative base, a routing line and an interconnect, wherein the chip includes a conductive pad, the metal base is disposed on a side of the insulative base that faces away from the chip, the routing line is disposed on a side of the insulative base that faces towards the chip, and the interconnect extends through a via in the insulative base and electrically connects the metal base and the routing line; then forming an opening that extends through the insulative base and exposes the pad;

forming a connection joint that electrically connects the muting line and the pad; and then etching the metal base such that an unetched portion of the metal base forms a pillar that overlaps and is aligned with the via and contacts the interconnect, wherein a conductive trace includes the routing line, the interconnect and the pillar.

102. The method of claim 101, including mechanically attaching the muting line to the chip using an adhesive before forming the opening.

103. The method of claim 102, including forming the opening through the adhesive.

104. The method of claim 103, wherein the adhesive contacts and is sandwiched between the routing line and the pad, and the routing line and the pad are electrically isolated from one another after forming the opening and before forming the connection joint.

105. The method of claim 101, wherein forming the opening includes applying a wet chemical etch to the metal base and then applying a laser that ablates the insulative base.

106. The method of claim 101, wherein the pillar contacts the side of the insulative base that faces away from the chip.

107. The method of claim 101, including:

providing a laminated structure that includes the metal base, the insulative base and a metal layer, then etching the metal layer to form the routing line; then forming the via in the insulative base; then depositing the interconnect into the via; then mechanically attaching the laminated structure to the chip; and then etching the metal base to form the pillar.

108. The method of claim 101, including forming an encapsulant on a side of the chip opposite the pad after mechanically attaching the routing line to the chip and before etching the metal base to form the pillar.

109. The method of claim 101, including depositing an insulator into the opening and on the insulative base and the connection joint before etching the metal base to form the pillar.

110. The method of claim 101, wherein the metal base, the routing line and the connection joint are copper.

111. A method of connecting a conductive trace and an insulative base to a semiconductor chip, comprising:

providing a semiconductor chip that includes a conductive pad;

providing a metal base, an insulative base and a routing line, wherein the metal base and the routing line are disposed on opposite sides of the insulative base;

forming a via that extends through the insulative base and exposes the metal base;

depositing an interconnect into the via that electrically connects the metal base and the routing line;

disposing an adhesive between the routing line and the chip, thereby mechanically attaching the routing line to the chip such that the metal base is disposed on a side of the insulative base that faces away from the chip, and the routing line is disposed on a side of the insulative base that faces towards the chip; then forming an opening that extends through the insulative base and the adhesive and exposes the pad;

forming a connection joint that electrically connects the routing line and the pad; and then etching the metal base such that an unetched portion of the metal base forms a pillar that overlaps and is aligned with the via and contacts the interconnect and the insulative base, wherein a conductive trace includes the muting line, the interconnect and the pillar.

112. The method of claim 111, wherein forming the via includes applying a wet chemical etch to a metal layer, thereby exposing the insulative base, and then applying a laser that ablates the insulative base, thereby exposing the metal base.

113. The method of claim 111, wherein disposing the adhesive includes curing the adhesive.

114. The method of claim 111, wherein disposing the adhesive includes contacting the adhesive to the insulative base and the chip.

115. The method of claim 111, wherein forming the opening includes applying a wet chemical etch to the metal base and then applying a laser that ablates the insulative base and the adhesive.

116. The method of claim 111, wherein forming the opening includes applying a wet chemical etch to the metal base and then applying a plasma that etches the insulative base and the adhesive.

117. The method of claim 111, wherein forming the opening exposes the routing line.

118. The method of claim 111, wherein forming the opening exposes a portion of the adhesive that is sandwiched between the routing line and the pad.

119. The method of claim 111, wherein the routing line overlaps only one peripheral edge of the pad after mechanically attaching the routing line to the chip.

120. The method of claim 111, wherein the routing line overlaps only two peripheral edges of the pad, and the two peripheral edges are opposite one another, after mechanically attaching the routing line to the chip.

121. The method of claim 111, wherein the routing line overlaps only three peripheral edges of the pad, and two of the three peripheral edges are opposite one another, after mechanically attaching the routing line to the chip.

122. The method of claim 111, wherein the routing line extends within and outside a periphery of the chip, and the pillar is disposed outside the periphery of the chip.

123. The method of claim 111, wherein the via is disposed within and extends through the routing line.

124. The method of claim 111, wherein the via extends to but not into the metal base.

125. The method of claim 111, wherein the connection joint contacts a surface of the routing line that is disposed above and overlaps and faces away from the pad.

126. The method of claim 111, wherein the connection joint contacts a peripheral sidewall of the routing line that is disposed above and overlaps and is orthogonal to the pad.

127. The method of claim 111, including forming a recess in the metal base, and etching the metal base to form the pillar using an etch mask that is disposed in the recess and overlaps the via.

128. The method of claim 111, including forming an encapsulant on a side of the chip opposite the pad after mechanically attaching the routing line to the chip and before etching the metal base to form the pillar.

129. The method of claim 111, including depositing an insulator into the opening and on the insulative base and the connection joint before etching the metal base to form the pillar.

130. The method of claim 111, wherein the steps are performed in the sequence set forth.

131. A method of connecting a conductive trace and an insulative base to a semiconductor chip, comprising the following steps in the sequence set forth:
providing a metal base, an insulative base and a metal layer, wherein the metal base and the metal layer are disposed on opposite sides of the insulative base;
forming a routing line, a via and an interconnect, wherein the routing line includes an unetched portion of the metal layer, the via extends through the insulative base, and the interconnect is disposed in the via and electrically connects the metal base and the routing line;
disposing an adhesive between the routing line and the chip, thereby mechanically attaching the routing line to the chip such that the metal base is disposed on a side of the insulative base that faces away from the chip, and the routing line is disposed on a side of the insulative base that faces towards the chip;
forming an opening that extends through the insulative base and the adhesive, exposes the routing line and the pad and is spaced from the via;
forming a connection joint that electrically connects the routing line and the pad; and
etching the metal base such that an unetched portion of the metal base forms a pillar that overlaps and is aligned with the via and contacts the interconnect and the insulative base, wherein the routing line extends within and outside a periphery of the chip, the pillar is disposed outside the periphery of the chip, and a conductive trace includes the routing line, the interconnect and the pillar.

132. The method of claim 131, wherein forming the via includes applying a wet chemical etch to the metal layer, thereby exposing the insulative base, and then applying a laser that ablates the insulative base, thereby exposing the metal base.

133. The method of claim 131, wherein disposing the adhesive includes contacting the adhesive to the insulative base and the chip.

134. The method of claim 131, wherein forming the opening includes applying a wet chemical etch to the metal base and then applying a laser that ablates the insulative base and the adhesive and exposes the routing line and the pad.

135. The method of claim 131, wherein the routing line overlaps only one peripheral edge of the pad after mechanically attaching the routing line to the chip.

136. The method of claim 131, wherein the via is disposed within and extends through the routing line, and the via extends to but not into the metal base.

137. The method of claim 131, wherein the connection joint contacts a surface of the routing line that is disposed above and overlaps and faces away from the pad and a peripheral sidewall of the routing line that is disposed above and overlaps and is orthogonal to the pad.

138. The method of claim 131, including forming a recess in the metal base, and etching the metal base to form the pillar using an etch mask that is disposed in the recess and overlaps the via.

139. The method of claim 131, including forming an encapsulant on a side of the chip opposite the pad after mechanically attaching the routing line to the chip and before etching the metal base to form the pillar.

140. The method of claim 131, including depositing an insulator into the opening and on the insulative base and the connection joint before etching the metal base to form the pillar.

141. A method of connecting a conductive trace and an insulative base to a semiconductor chip, comprising:
providing a laminated structure that includes a metal base, an insulative base and a metal layer, wherein the metal base and the metal layer are disposed on opposite sides of the insulative base;
providing a first etch mask over the metal base;
providing a second etch mask over the metal layer;
etching the metal base using the first etch mask to selectively protect the metal base, thereby forming a recess in the metal base;
etching the metal layer using the second etch mask to selectively protect the metal layer, thereby forming a routing line that includes an unetched portion of the metal layer and exposing the insulative base;
providing a third etch mask in the recess;

forming a via that extends through the insulative base and exposes the metal base;

depositing an interconnect into the via, wherein the interconnect extends through the insulative base and contacts and electrically connects the metal base and the metal layer;

mechanically attaching the laminated structure to a chip using an adhesive, wherein the chip includes a conductive pad, the metal base is disposed on a side of the insulative base that faces away from the chip, the routing line is disposed on a side of the insulative base that faces towards the chip, the routing line is proximate to the pad and extends outside a periphery of the pad, the third etch mask overlaps the via, and the via is disposed outside the periphery of the pad;

forming an opening that extends through the insulative base and the adhesive, exposes the routing line and the pad and is spaced from the via;

forming a connection joint in the opening that electrically connects the routing line and the pad; and then etching the metal base using the third etch mask to selectively protect the metal base such that a portion of the metal base remains intact and forms a pillar that overlaps and is aligned with the via and contacts the interconnect and the insulative base, wherein a conductive trace includes the routing line, the interconnect and the pillar.

142. The method of claim 141, wherein providing the first etch mask includes depositing a first photoresist layer over the metal base and selectively patterning the first photoresist layer, and providing the second etch mask includes depositing a second photoresist layer over the metal layer and selectively patterning the second photoresist layer.

143. The method of claim 141, wherein providing the third etch mask includes depositing the third etch mask into the recess before mechanically attaching the routing line to the chip.

144. The method of claim 141, wherein providing the third etch mask includes depositing the third etch mask into the recess before forming the via.

145. The method of claim 141, wherein providing the third etch mask includes depositing the third etch mask into the recess after simultaneously etching the metal base and the metal layer to form the recess and the routing line.

146. The method of claim 141, wherein providing the third etch mask includes depositing the third etch mask into the recess after etching the metal layer to form the routing line and a portion of the via that extends through and is disposed within the routing line and extends to but not into the metal base.

147. The method of claim 141, wherein providing the third etch mask includes depositing the third etch mask into the recess using the first etch mask as a deposition mask.

148. The method of claim 141, wherein the third etch mask is solder.

149. The method of claim 141, including reshaping the third etch mask such that the third etch mask continues to contact and cover a tip of the pillar and a spaced gap between the third etch mask and a sidewall of the pillar is removed.

150. The method of claim 141, wherein the steps are performed in the sequence set forth.

151. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a routing line that includes a first portion of the metal layer, wherein forming the routing line includes selectively removing a second portion of the metal layer;

forming a via in the laminated structure that extends through the metal layer and the insulative base and exposes the metal base;

depositing an interconnect into the via, wherein the interconnect extends through the insulative base and contacts and electrically connects the metal base and the metal layer; then mechanically attaching the laminated structure to a chip using an adhesive, wherein the chip includes a conductive pad, the metal base is disposed on a side of the insulative base that faces away from the chip, and the routing line is disposed on a side of the insulative base that faces towards the chip; then forming an opening that extends through the insulative base and the adhesive and exposes the routing line and the pad;

forming a connection joint in the opening that electrically connects the routing line and the pad; and then forming a pillar that includes a first portion of the metal base that overlaps and is aligned with the via and contacts the interconnect, wherein forming the pillar includes selectively removing a second portion of the metal base.

152. The method of claim 151, wherein forming the via includes applying a wet chemical etch to the metal layer, thereby exposing the insulative base, and then applying a laser that ablates the insulative base, thereby exposing the metal base.

153. The method of claim 151, wherein disposing the adhesive includes contacting the adhesive to the insulative base and the chip.

154. The method of claim 151, wherein forming the opening includes applying a wet chemical etch to the metal base that exposes the insulative base and then applying a laser that ablates the insulative base and the adhesive and exposes the routing line and the pad.

155. The method of claim 151, wherein the pillar contacts the side of the insulative base that faces away from the chip.

156. The method of claim 151, wherein the via extends through the routing line and extends to but not into the metal base.

157. The method of claim 151, wherein the connection joint contacts a surface of the routing line that is disposed above and overlaps and faces away from the pad and a peripheral sidewall of the routing line that is disposed above and overlaps and is orthogonal to the pad.

158. The method of claim 151, including etching the metal base to form a recess in the metal base, depositing an etch mask into the recess before mechanically attaching the laminated structure to the chip, and then etching the metal base to form the pillar using the etch mask in the recess to define the pillar.

159. The method of claim 151, including forming an encapsulant on a side of the chip opposite the pad after mechanically attaching the laminated structure to the chip and before etching the metal base to form the pillar.

160. The method of claim 151, including depositing an insulator into the opening and on the insulative base and the connection joint before etching the metal base to form the pillar.

161. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

forming a routing line that includes a first portion of the metal layer, wherein forming the routing line includes selectively removing a second portion of the metal layer;

forming a via in the laminated structure that extends through the metal layer and the insulative base and exposes the metal base;

depositing an interconnect into the via, wherein the interconnect extends through the insulative base and contacts and electrically connects the metal base and the metal layer, then mechanically attaching the laminated structure to a chip using an adhesive, wherein the chip includes a conductive pad, the metal base is disposed on a side of the insulative base that faces away from the chip, and the routing line is disposed on a side of the insulative base that faces towards the chip; then forming a connection joint that electrically connects the routing line and the pad, wherein the connection joint is formed in an opening that extends through the metal base, the insulative base and the adhesive; and then forming a pillar that includes a first portion of the metal base that overlaps and is aligned with the via and contacts the interconnect and the insulative base, wherein forming the pillar includes selectively removing a second portion of the metal base.

162. The method of claim 161, wherein forming the opening includes applying a wet chemical etch to the metal base, thereby exposing the insulative base.

163. The method of claim 162, including applying the wet chemical etch before mechanically attaching the laminated structure to the chip.

164. The method of claim 162, including applying the wet chemical etch after mechanically attaching the laminated structure to the chip.

165. The method of claim 161, wherein forming the opening includes applying a wet chemical etch to the metal base, thereby exposing the insulative base, and then removing portions of the insulative base and the adhesive, thereby exposing the pad.

166. The method of claim 165, including applying the wet chemical etch before mechanically attaching the laminated structure to the chip.

167. The method of claim 165, including applying the wet chemical etch after mechanically attaching the laminated structure to the chip.

168. The method of claim 165, wherein forming the opening includes applying a laser that ablates the insulative base and the adhesive.

169. The method of claim 165, wherein forming the opening includes applying a plasma that etches the insulative base and the adhesive.

170. The method of claim 161, wherein forming the opening includes applying a wet chemical etch to the metal base before mechanically attaching the laminated structure to the chip, thereby exposing the insulative base, then mechanically attaching the laminated structure to the chip such that none of the metal base overlaps the pad, and then removing portions of the insulative base and the adhesive, thereby exposing the pad.

171. A method of connecting a conductive trace and an insulative base to a semiconductor chip, comprising:

providing a metal base, an insulative base and a metal layer, wherein the metal base and the metal layer are disposed on opposite sides of the insulative base;

providing a first etch mask on the metal base and a second etch mask on the metal layer;

etching the metal base and the metal layer using the first and second etch masks, respectively, thereby etching partially through the metal base to form a recess in the metal base and etching completely through the metal layer to form a routing line from the metal layer;

depositing a third etch mask into the recess;

electrically connecting the metal base and the routing line using an interconnect deposited into a via that extends through the insulative base; then mechanically attaching the routing line to a chip that includes a conductive pad;

electrically connecting the routing line and the pad; and then etching the metal base using the third etch mask, thereby forming a pillar from the metal base that contacts the third etch mask and is electrically connected to the routing line by the interconnect.

172. The method of claim 171, wherein the routing line is a flat planar lead that is proximate to the pad.

173. The method of claim 171, wherein the routing line is a flat planar lead that overlaps the pad.

174. The method of claim 171, wherein the routing line is a flat planar lead that extends within and outside a periphery of the chip, and the pillar is disposed outside the periphery of the chip.

175. The method of claim 171, wherein the routing line is a flat planar lead that extends within and outside a periphery of the chip and is proximate to the pad, and the pillar is disposed outside the periphery of the chip and is proximate to a distal end of the routing line.

176. The method of claim 171, wherein the pillar overlaps and is aligned with the via.

177. The method of claim 171, wherein the pillar contacts a side of the insulative base that faces away from the chip.

178. The method of claim 171, wherein the pillar has a conical shape and a tip with a flat surface.

179. The method of claim 171, wherein the metal base and the metal layer are copper.

180. The method of claim 171, wherein the steps are performed in the sequence set forth.

181. A method of connecting a conductive trace and an insulative base to a semiconductor chip, comprising:

providing a structure that includes a metal base, an insulative base, a routing line, an interconnect and solder, wherein the metal base and the routing line are disposed on opposite sides of the insulative base, the solder and the insulative base are disposed on opposite sides of the metal base, and the interconnect extends through a via in the insulative base and contacts and electrically connects the metal base and the routing line;

mechanically attaching the structure to a chip using an adhesive, wherein the chip includes a conductive pad, the metal base is disposed on a side of the insulative base that faces away from the chip, and the routing line is disposed on a side of the insulative base that faces towards the chip;

forming an opening that extends through the insulative base and the adhesive and exposes the pad;

forming a connection joint that electrically connects the routing line and the pad; and then etching the metal base using the solder as an etch mask such that a portion of the metal base forms a pillar that contacts the solder, the interconnect and the insulative base, wherein a conductive trace includes the routing line, the interconnect and the pillar.

182. The method of claim 181, wherein providing the routing line includes:
providing a metal layer that contacts the insulative base;
forming a first mask on the metal layer; and
etching the metal layer using the first mask as an etch mask.

183. The method of claim 182, wherein providing the solder includes:
forming a second mask on the metal base;
etching the metal base using the second mask as an etch mask, thereby forming a recess in the metal base; and
depositing the solder into the recess.

184. The method of claim 183, wherein depositing the solder includes electroplating the solder into the recess using the second mask as a plating mask.

185. The method of claim 181, wherein forming the opening includes applying a wet chemical etch to the metal base and then applying a laser that ablates the insulative base and the adhesive.

186. The method of claim 181, wherein the metal base and the routing line are copper.

187. The method of claim 181, wherein the interconnect is an electroplated metal, an electrolessly plated metal, solder or conductive adhesive.

188. The method of claim 181, wherein the adhesive is silicone, polyimide or epoxy.

189. The method of claim 181, wherein the connection joint is an electroplated metal, an electrolessly plated metal, a ball bond, a weld, solder or conductive adhesive.

190. The method of claim 181, wherein the steps are performed in the sequence set forth.

191. A method of connecting a conductive trace and an insulative base to a semiconductor chip, comprising:
providing a metal base, an insulative base and a metal layer, wherein the metal base and the metal layer are disposed on opposite sides of the insulative base;
forming a first mask on the metal base and a second mask on the metal layer;
etching partially but not completely through the metal base using the first mask as an etch mask for the metal base and completely through the metal layer using the second mask as an etch mask for the metal layer, thereby forming a recess in the metal base and a routing line from the metal layer;
depositing solder into the recess;
forming a via that extends through the insulative base and the metal layer and exposes the metal base;
depositing an interconnect into the via, wherein the interconnect extends through the insulative base and contacts and electrically connects the metal base and the metal layer;
mechanically attaching the routing line to a chip using an adhesive, wherein the chip includes a conductive pad, the metal base is disposed on a side of the insulative base that faces away from the chip, the routing line is disposed on a side of the insulative base that faces towards the chip, the solder is disposed on a side of the metal base that faces away from the chip, and the solder overlaps the via;
forming an opening that extends through the insulative base and the adhesive, exposes the routing line and the pad and is spaced from the pillar and the via;
forming a connection joint in the opening that electrically connects the routing line and the pad; and then
etching completely through the metal base using the solder as an etch mask, thereby forming a pillar from the metal base that overlaps and is aligned with the via and is disposed outside a periphery of the chip and contacts the solder, the interconnect and the insulative base, wherein a conductive trace includes the routing line, the interconnect and the pillar.

192. The method of claim 191, wherein depositing the solder includes electroplating the solder using the first mask as a deposition mask.

193. The method of claim 191, wherein forming the via includes etching completely through the metal layer by applying a wet chemical etch, thereby exposing the insulative base, and then applying a laser that ablates the insulative base, thereby exposing the metal base.

194. The method of claim 191, wherein forming the opening includes applying a wet chemical etch to the metal base and then applying a laser that ablates the insulative base and the adhesive.

195. The method of claim 191, wherein the routing line is a flat planar lead that overlaps the pad, and the pillar is aligned with a distal end of the routing line.

196. The method of claim 191, wherein the connection joint contacts a surface of the routing line that is disposed above and overlaps and faces away from the pad, and the connection joint contacts a peripheral sidewall of the routing line that is disposed above and overlaps and is orthogonal to the pad.

197. The method of claim 191, wherein the metal base and the metal layer are copper, the first and second masks are photoresist, the interconnect is an electroplated metal, an electrolessly plated metal, solder or conductive adhesive, the adhesive is silicone, polyimide or epoxy, and the connection joint is an electroplated metal, an electrolessly plated metal, a ball bond, a weld, solder or conductive adhesive.

198. The method of claim 191, including reshaping the solder such that the solder continues to contact and cover a tip of the pillar and a spaced gap between the solder and a sidewall of the pillar is removed.

199. The method of claim 191, including forming an encapsulant on a side of the chip opposite the pad after attaching the chip to the routing line and before forming the opening.

200. The method of claim 191, wherein the steps are performed in the sequence set forth.

201. A method of connecting a conductive trace and an insulative base to a semiconductor chip, comprising:
providing a semiconductor chip, a metal base, an insulative base, a routing line and an interconnect wherein the chip includes a conductive pad, the metal base is disposed on a side of the insulative base that faces away from the chip, the routing line is disposed on a side of the insulative base that faces towards the chip, and the interconnect extends through a via in the insulative base and electrically connects the metal base and the routing line; then
exposing the pad through an opening that extends through the metal base and the insulative base;
forming a connection joint that electrically connects the routing line and the pad; and then
etching the metal base such that an unetched portion of the metal base forms a pillar that overlaps the via and contacts the interconnect, thereby electrically isolating the pad from other conductive pads of the chip, wherein a conductive trace includes the routing line, the interconnect and the pillar.

202. The method of claim 201, including mechanically attaching the routing line to the chip using an adhesive before forming the opening.

203. The method of claim 202, including forming the opening through the adhesive.

204. The method of claim 203, wherein the adhesive contacts and is sandwiched between the routing line and the pad, and the routing line and the pad are electrically isolated from one another after forming the opening and before forming the connection joint.

205. The method of claim 201, wherein forming the opening includes applying a wet chemical etch to the metal base and then applying a laser that ablates the insulative base.

206. The method of claim 201, wherein the pillar contacts the side of the insulative base that faces away from the chip.

207. The method of claim 201, including:
providing a laminated structure that includes the metal base, the insulative base and a metal layer; then
etching the metal layer to form the routing line; then
forming the via in the insulative base; then
depositing the interconnect into the via; then
mechanically attaching the laminated structure to the chip; and then
etching the metal base to form the pillar.

208. The method of claim 201, including forming an encapsulant on a side of the chip opposite the pad after mechanically attaching the routing line to the chip and before etching the metal base to form the pillar.

209. The method of claim 201, including depositing an insulator into the opening and on the insulative base and the connection joint before etching the metal base to form the pillar.

210. The method of claim 201, wherein the metal base, the routing line and the connection joint are copper.

211. A method of connecting a conductive trace and an insulative base to a semiconductor chip, comprising:
providing a semiconductor chip that includes a conductive pad;
providing a metal base, an insulative base and a routing line, wherein the metal base and the routing line are disposed on opposite sides of the insulative base;
forming a via that extends through the insulative base and exposes the metal base;
depositing an interconnect into the via that electrically connects the metal base and the routing line;
disposing an adhesive between the routing line and the chip, thereby mechanically attaching the routing line to the chip such that the metal base is disposed on a side of the insulative base that faces away from the chip, and the routing line is disposed on a side of the insulative base that faces towards the chip; then
exposing the pad through an opening that extends through the metal base, the insulative base and the adhesive;
forming a connection joint that electrically connects the routing line and the pad; and then
etching the metal base such that an unetched portion of the metal base forms a pillar that overlaps the via and contacts the interconnect and the insulative base, thereby electrically isolating the pad from other conductive pads of the chip, wherein a conductive trace includes the routing line, the interconnect and the pillar.

212. The method of claim 211, wherein forming the via includes applying a wet chemical etch to a metal layer, thereby exposing the insulative base, and then applying a laser that ablates the insulative base, thereby exposing the metal base.

213. The method of claim 211, wherein disposing the adhesive includes curing the adhesive.

214. The method of claim 211, wherein disposing the adhesive includes contacting the adhesive to the insulative base and the chip.

215. The method of claim 211, wherein forming the opening includes applying a wet chemical etch to the metal base and then applying a laser that ablates the insulative base and the adhesive.

216. The method of claim 211, wherein forming the opening includes applying a wet chemical etch to the metal base and then applying a plasma that etches the insulative base and the adhesive.

217. The method of claim 211, wherein forming the opening exposes the routing line.

218. The method of claim 211, wherein forming the opening exposes a portion of the adhesive that is sandwiched between the routing line and the pad.

219. The method of claim 211, wherein the routing line overlaps only one peripheral edge of the pad after mechanically attaching the routing line to the chip.

220. The method of claim 211, wherein the routing line overlaps only two peripheral edges of the pad, and the two peripheral edges are opposite one another, after mechanically attaching the routing line to the chip.

221. The method of claim 211, wherein the routing line overlaps only three peripheral edges of the pad, and two of the three peripheral edges are opposite one another, after mechanically attaching the routing line to the chip.

222. The method of claim 211, wherein the routing line extends within and outside a periphery of the chip, and the pillar is disposed outside the periphery of the chip.

223. The method of claim 211, wherein the via is disposed within and extends through the routing line.

224. The method of claim 211, wherein the via extends to but not into the metal base.

225. The method of claim 211, wherein the connection joint contacts a surface of the routing line that is disposed above and overlaps and faces away from the pad.

226. The method of claim 211, wherein the connection joint contacts a peripheral sidewall of the routing line that is disposed above and overlaps and is orthogonal to the pad.

227. The method of claim 211, including forming a recess in the metal base, and etching the metal base to form the pillar using an etch mask that is disposed in the recess and overlaps the via.

228. The method of claim 211, including forming an encapsulant on a side of the chip opposite the pad after mechanically attaching the routing line to the chip and before etching the metal base to form the pillar.

229. The method of claim 211, including depositing an insulator into the opening and on the insulative base and the connection joint before etching the metal base to form the pillar.

230. The method of claim 211, wherein the steps are performed in the sequence set forth.

231. A method of connecting a conductive trace and an insulative base to a semiconductor chip, comprising the following steps in the sequence set forth:
providing a metal base, an insulative base and a metal layer, wherein the metal base and the metal layer are disposed on opposite sides of the insulative base;
forming a routing line, a via and an interconnect, wherein the routing line includes an unetched portion of the metal layer, the via extends through the insulative base, and the interconnect is disposed in the via and electrically connects the metal base and the routing line;

disposing an adhesive between the routing fine and the chip, thereby mechanically attaching the routing line to the chip such that the metal base is disposed on a side of the insulative base that faces away from the chip, and the routing line is disposed on a side of the insulative base that faces towards the chip;

exposing the routing line and the pad through an opening that extends through the metal base, the insulative base and the adhesive and is spaced from the via;

forming a connection joint that electrically connects the routing line and the pad; and etching the metal base such that an unetched portion of the metal base forms a pillar that overlaps the via and contacts the interconnect and the insulative base, thereby electrically isolating the pad from other conductive pads of the chip, wherein the routing line extends within and outside a periphery of the chip, the pillar is disposed outside the periphery of the chip, and a conductive trace includes the routing line, the interconnect and the pillar.

232. The method of claim 231, wherein forming the via includes applying a wet chemical etch to the metal layer, thereby exposing the insulative base, and then applying a laser that ablates the insulative base, thereby exposing the metal base.

233. The method of claim 231, wherein disposing the adhesive includes contacting the adhesive to the insulative base and the chip.

234. The method of claim 231, wherein forming the opening includes applying a wet chemical etch to the metal base and then applying a laser that ablates the insulative base and the adhesive and exposes the routing line and the pad.

235. The method of claim 231, wherein the routing line overlaps only one peripheral edge of the pad after mechanically attaching the routing line to the chip.

236. The method of claim 231, wherein the via is disposed within and extends through the routing line, and the via extends to but not into the metal base.

237. The method of claim 231, wherein the connection joint contacts a surface of the routing line that is disposed above and overlaps and faces away from the pad and a peripheral sidewall of the routing line that is disposed above and overlaps and is orthogonal to the pad.

238. The method of claim 231, including forming a recess in the metal base, and etching the metal base to form the pillar using an etch mask that is disposed in the recess and overlaps the via.

239. The method of claim 231, including forming an encapsulant on a side of the chip opposite the pad after mechanically attaching the routing line to the chip and before etching the metal base to form the pillar.

240. The method of claim 231, including depositing an insulator into the opening and on the insulative base and the connection joint before etching the metal base to form the pillar.

241. A method of connecting a conductive trace and an insulative base to a semiconductor chip, comprising:

providing a laminated structure that includes a metal base, an insulative base and a metal layer, wherein the metal base and the metal layer are disposed on opposite sides of the insulative base;

providing a first etch mask over the metal base;
providing a second etch mask over the metal layer;

etching the metal base using the first etch mask to selectively protect the metal base, thereby forming a recess in the metal base;

etching the metal layer using the second etch mask to selectively protect the metal layer, thereby forming a routing line that includes an unetched portion of the metal layer and exposing the insulative base;

providing a third etch mask in the recess;

forming a via that extends through the insulative base and exposes the metal base;

depositing an interconnect into the via, wherein the interconnect extends through the insulative base and contacts and electrically connects the metal base and the metal layer;

mechanically attaching the laminated structure to a chip using an adhesive, wherein the chip Includes a conductive pad, the metal base is, disposed on a side of the insulative base that faces away from the chip, the routing line is disposed on a side of the insulative base that faces towards the chip, the routing line is proximate to the pad and extends outside a periphery of the pad, the third etch mask overlaps the via, and the via is disposed outside the periphery of the pad;

exposing the routing line and the pad through an opening that extends through the metal base, the insulative base and the adhesive and is spaced from the via;

forming a connection joint in the opening that electrically connects the routing line and the pad; and then etching the metal base using the third etch mask to selectively protect the metal base such that a portion of the metal base remains intact and forms a pillar that overlaps the via and contacts the interconnect and the insulative base, thereby electrically isolating the pad from other conductive pads of the chip, wherein a conductive trace includes the routing line, the interconnect and the pillar.

242. The method of claim 241, wherein providing the first etch mask includes depositing a first photoresist layer over the metal base and selectively patterning the first photoresist layer, and providing the second etch mask includes depositing a second photoresist layer over the metal layer and selectively patterning the second photoresist layer.

243. The method of claim 241, wherein providing the third etch mask includes depositing the third etch mask into the recess before mechanically attaching the routing line to the chip.

244. The method of claim 241, wherein providing the third etch mask includes depositing the third etch mask into the recess before forming the via.

245. The method of claim 241, wherein providing the third etch mask includes depositing the third etch mask into the recess after simultaneously etching the metal base and the metal layer to form the recess and the routing line.

246. The method of claim 241, wherein providing the third etch mask includes depositing the third etch mask into the recess after etching the metal layer to form the routing line and a portion of the via that extends through and is disposed within the routing line and extends to but not into the metal base.

247. The method of claim 241, wherein providing the third etch mask includes depositing the third etch mask into the recess using the first etch mask as a deposition mask.

248. The method of claim 241, wherein the third etch mask is solder.

249. The method of claim 241, including reshaping the third etch mask such that the third etch mask continues to contact and cover a tip of the pillar and a spaced gap between the third etch mask and a sidewall of the pillar is removed.

250. The method of claim 241, wherein the steps are performed in the sequence set forth.

251. A method of connecting a conductive trace and an insulative base to a semiconductor chip, comprising:
   providing a laminated structure that includes a metal base, an insulative base and a metal layer, wherein the metal base and the metal layer are disposed on opposite sides of the insulative base;
   forming a routing line that includes a first portion of the metal layer, wherein forming the routing line includes selectively removing a second portion of the metal layer;
   forming a via in the laminated structure that extends through the metal layer and the insulative base and exposes the metal base;
   depositing an interconnect into the via, wherein the interconnect extends through the insulative base and contacts and electrically connects the metal base and the metal layer; then
   mechanically attaching the laminated structure to a chip using an adhesive, wherein the chip includes a conductive pad, the metal base is disposed on a side of the insulative base that faces away from the chip, and the routing line is disposed on a side of the insulative base that faces towards the chip; then
   exposing the routing line and the pad through an opening that extends through the metal base, the insulative base and the adhesive;
   forming a connection joint in the opening that electrically connects the routing line and the pad; and then
   forming a pillar that includes a first portion of the metal base that overlaps the via and contacts the interconnect, wherein forming the pillar includes selectively removing a second portion of the metal base, thereby electrically isolating the pad from other conductive pads of the chip.

252. The method of claim 251, wherein forming the via includes applying a wet chemical etch to the metal layer, thereby exposing the insulative base, and then applying a laser that ablates the insulative base, thereby exposing the metal base.

253. The method of claim 251, wherein disposing the adhesive includes contacting the adhesive to the insulative base and the chip.

254. The method of claim 251, wherein forming the opening includes applying a wet chemical etch to the metal base that exposes the insulative base and then applying a laser that ablates the insulative base and the adhesive and exposes the routing line and the pad.

255. The method of claim 251, wherein the pillar contacts the side of the insulative base that faces away from the chip.

256. The method of claim 251, wherein the via extends through the routing line and extends to but not into the metal base.

257. The method of claim 251, wherein the connection joint contacts a surface of the routing line that is disposed above and overlaps and faces away from the pad and a peripheral sidewall of the routing line that is disposed above and overlaps and is orthogonal to the pad.

258. The method of claim 251, including etching the metal base to form a recess in the metal base, depositing an etch mask into the recess before mechanically attaching the laminated structure to the chip, and then etching the metal base to form the pillar using the etch mask in the recess to define the pillar.

259. The method of claim 251, including forming an encapsulant on a side of the chip opposite the pad after mechanically attaching the laminated structure to the chip and before etching the metal base to form the pillar.

260. The method of claim 251, including depositing an insulator into the opening and on the insulative base and the connection joint before etching the metal base to form the pillar.

261. A method of connecting a conductive trace and an insulative base to a semiconductor chip, comprising:
   providing a laminated structure that includes a metal base, an insulative base and a metal layer, wherein the metal base and the metal layer are disposed on opposite sides of the insulative base;
   forming a routing line that includes a first portion of the metal layer, wherein forming the routing line includes selectively removing a second portion of the metal layer;
   forming a via in the laminated structure that extends through the metal layer and the insulative base and exposes the metal base;
   depositing an interconnect into the via, wherein the interconnect extends through the insulative base and contacts and electrically connects the metal base and the metal layer; then
   mechanically attaching the laminated structure to a chip using an adhesive, wherein the chip includes a conductive pad, the metal base is disposed on a side of the insulative base that faces away from the chip, and the routing line is disposed on a side of the insulative base that faces towards the chip; then
   forming a connection joint that electrically connects the routing line and the pad, wherein the connection joint is formed in an opening that extends through the metal base, the insulative base and the adhesive; and then
   forming a pillar that includes a first portion of the metal base that overlaps the via and contacts the interconnect and the insulative base, wherein forming the pillar includes selectively removing a second portion of the metal base, thereby electrically isolating the pad from other conductive pads of the chip.

262. The method of claim 261, wherein forming the opening includes applying a wet chemical etch to the metal base, thereby exposing the insulative base.

263. The method of claim 262, including applying the wet chemical etch before mechanically attaching the laminated structure to the chip.

264. The method of claim 262, including applying the wet chemical etch after mechanically attaching the laminated structure to the chip.

265. The method of claim 261, wherein forming the opening includes applying a wet chemical etch to the metal base, thereby exposing the insulative base, and then removing portions of the insulative base and the adhesive, thereby exposing the pad.

266. The method of claim 265, including applying the wet chemical etch before mechanically attaching the laminated structure to the chip.

267. The method of claim 265, including applying the wet chemical etch after mechanically attaching the laminated structure to the chip.

268. The method of claim 265, wherein forming the opening includes applying a laser that ablates the insulative base and the adhesive.

269. The method of claim 265, wherein forming the opening includes applying a plasma that etches the insulative base and the adhesive.

270. The method of claim 261, wherein forming the opening includes applying a wet chemical etch to the metal base before mechanically attaching the laminated structure to the chip, thereby exposing the insulative base, then mechanically attaching the laminated structure to the chip such that none of the metal base overlaps the pad, and then removing portions of the insulative base and the adhesive, thereby exposing the pad.

271. A method of connecting a conductive trace and an insulative base to a semiconductor chip, comprising:
providing a metal base, an insulative base and a metal layer, wherein the metal base and the metal layer are disposed on opposite sides of the insulative base;
providing a first etch mask on the metal base and a second etch mask on the metal layer;
etching the metal base and the metal layer using the first and second etch masks, respectively, thereby etching partially through the metal base to form a recess in the metal base and etching completely through the metal layer to form a routing line from the metal layer,
depositing a third etch mask into the recess;
electrically connecting the metal base and the routing line using an interconnect deposited into a via that extends through the insulative base; then
mechanically attaching the routing line to a chip that includes a conductive pad;
electrically connecting the routing line and the pad; and then
etching the metal base using the third etch mask, thereby forming a pillar from the metal base that contacts the third etch mask and is electrically connected to the routing line by the interconnect and electrically isolating the pad from other conductive pads of the chip.

272. The method of claim 271, wherein the routing line is a flat planar lead that is proximate to the pad.

273. The method of claim 271, wherein the routing line is a flat planar lead that overlaps te pad.

274. The method of claim 271, wherein the routing line is a flat planar lead that extends within and outside a periphery of the chip, and the pillar is disposed outside the periphery of the chip.

275. The method of claim 271, wherein the routing line is a flat planar lead that extends within and outside a periphery of the chip and is proximate to the pad, and the pillar is disposed outside the periphery of the chip and is proximate to a distal end of the routing line.

276. The method of claim 271, wherein the pillar overlaps and is aligned with the via.

277. The method of claim 271, wherein the pillar contacts a side of the insulative base that faces away from the chip.

278. The method of claim 271, wherein the pillar has a conical shape and a tip with a flat surface.

279. The method of claim 271, wherein the metal base and the metal layer are copper.

280. The method of claim 271, wherein the steps are performed in the sequence set forth.

281. A method of connecting a conductive trace and an insulative base to a semiconductor chip, comprising:
providing a structure that includes a metal base, an insulative base, a routing line, an interconnect and solder, wherein the metal base and the routing line are disposed on opposite sides of the insulative base, the solder and the insulative base are disposed on opposite sides of the metal base, and the interconnect extends through a via in the insulative base and contacts and electrically connects the metal base and the routing line;
mechanically attaching the structure to a chip using an adhesive, wherein the chip includes a conductive pad, the metal base is disposed on a side of the insulative base that faces away from the chip, and the routing line is disposed on a side of the insulative base that faces towards the chip;
exposing the pad through an opening that extends through the metal base, the insulative base and the adhesive;
forming a connection joint that electrically connects the routing line and the pad;
and then etching the metal base using the solder as an etch mask such that a portion of the metal base forms a pillar that contacts the solder, the interconnect and the insulative base, thereby electrically isolating the pad from other conductive pads of the chip, wherein a conductive trace includes the routing line, the interconnect and the pillar.

282. The method of claim 281, wherein providing the routing line includes:
providing a metal layer that contacts the insulative base;
forming a first mask on the metal layer; and
etching the metal layer using the first mask as an etch mask.

283. The method of claim 282, wherein providing the solder includes:
forming a second mask on the metal base;
etching the metal base using the second mask as an etch mask, thereby forming a recess in the metal base; and
depositing the solder into the recess.

284. The method of claim 283, wherein depositing the solder includes electroplating the solder into the recess using the second mask as a plating mask.

285. The method of claim 281, wherein forming the opening includes applying a wet chemical etch to the metal base and then applying a laser that ablates the insulative base and the adhesive.

286. The method of claim 281, wherein the metal base and the routing line are copper.

287. The method of claim 281, wherein the interconnect is an electroplated metal, an electrolessly plated metal, solder or conductive adhesive.

288. The method of claim 281, wherein the adhesive is silicone, polyimide or epoxy.

289. The method of claim 281, wherein the connection joint is an electroplated metal, an electrolessly plated metal, a ball bond, a weld, solder or conductive adhesive.

290. The method of claim 281, wherein the steps are performed in the sequence set forth.

291. A method of connecting a conductive trace and an insulative base to a semiconductor chip, comprising:
providing a metal base, an insulative base and a metal layer, wherein the metal base and the metal layer are disposed on opposite sides of the insulative base;
forming a first mask on the metal base and a second mask on the metal layer;
etching partially but not completely through the metal base using the first mask as an etch mask for the metal base and completely through the metal layer using the second mask as an etch mask for the metal layer, thereby forming a recess in the metal base and a routing line from the metal layer;
depositing solder into the recess;
forming a via that extends through the insulative base and the metal layer and exposes the metal base;

depositing an interconnect into the via, wherein the interconnect extends through the insulative base and contacts and electrically connects the metal base and the metal layer;

mechanically attaching the routing line to a chip using an adhesive, wherein the chip includes a conductive pad, the metal base is disposed on a side of the insulative base that faces away from the chip, the routing line is disposed on a side of the insulative base that faces towards the chip, the solder is disposed on a side of the metal base that faces away from the chip, and the solder overlaps the via;

exposing the routing line and the pad through an opening that extends through the metal base, the insulative base and the adhesive and is spaced from the pillar and the via;

forming a connection joint in the opening that electrically connects the routing line and the pad; and then etching completely through the metal base using the solder as an etch mask, thereby forming a pillar from the metal base that overlaps the via and is disposed outside a periphery of the chip and contacts the solder, the interconnect and the insulative base and electrically isolating the pad from other conductive pads of the chip, wherein a conductive trace includes the routing line, the interconnect and the pillar.

292. The method of claim 291, wherein depositing the solder includes electroplating the solder using the first mask as a deposition mask.

293. The method of claim 291, wherein forming the via includes etching completely through the routing line by applying a wet chemical etch, thereby exposing the insulative base, and then applying a laser that ablates the insulative base, thereby exposing the metal base.

294. The method of claim 291, wherein forming the opening includes applying a wet chemical etch to the metal base and then applying a laser that ablates the insulative base and the adhesive.

295. The method of claim 291, wherein the routing line is a flat planar lead that overlaps the pad, and the pillar is aligned with a distal end of the routing line.

296. The method of claim 291, wherein the connection joint contacts a surface of the routing line that is disposed above and overlaps and faces away from the pad, and the connection joint contacts a peripheral sidewall of the routing line that is disposed above and overlaps and is orthogonal to the pad.

297. The method of claim 291, wherein the metal base and the metal layer are copper, the first and second masks are photoresist, the interconnect is an electroplated metal, an electrolessly plated metal, solder or conductive adhesive, the adhesive is silicone, polyimide or epoxy, and the connection joint is an electroplated metal, an electrolessly plated metal, a ball bond, a weld, solder or conductive adhesive.

298. The method of claim 291, including reshaping the solder such that the solder continues to contact and cover a tip of the pillar and a spaced gap between the solder and a sidewall of the pillar is removed.

299. The method of claim 291, including forming an encapsulant on a side of the chip opposite the pad after attaching the chip to the routing line and before forming the opening.

300. The method of claim 291, wherein the steps are performed in the sequence set forth.

* * * * *

UNITED STATES PATENT AND TRADEMARK OFFICE
CERTIFICATE OF CORRECTION

PATENT NO. : 6,984,576 B1
DATED : January 10, 2006
INVENTOR(S) : Charles W.C. Lin et al.

It is certified that error appears in the above-identified patent and that said Letters Patent is hereby corrected as shown below:

<u>Column 47,</u>
Lines 56 and 63, change "muting" to -- routing --.

<u>Column 59,</u>
Line 4, change "fine" to -- line --.

<u>Column 60,</u>
Line 16, change "Includes" to -- includes --.

Signed and Sealed this

Fourteenth Day of March, 2006

JON W. DUDAS
*Director of the United States Patent and Trademark Office*